(12) United States Patent
Lin et al.

(10) Patent No.: US 12,136,686 B2
(45) Date of Patent: Nov. 5, 2024

(54) DIODE ARRAY

(71) Applicant: Visionlabs Corporation, Taipei (TW)

(72) Inventors: Hung-Cheng Lin, New Taipei (TW); Hung-Kuang Hsu, Taipei (TW); Hua-Chen Hsu, Zhubei (TW)

(73) Assignee: VISIONLABS CORPORATION, Taipei (TW)

( * ) Notice: Subject to any disclaimer, the term of this patent is extended or adjusted under 35 U.S.C. 154(b) by 0 days.

(21) Appl. No.: 18/481,334

(22) Filed: Oct. 5, 2023

(65) Prior Publication Data
US 2024/0047609 A1    Feb. 8, 2024

Related U.S. Application Data

(63) Continuation of application No. 17/678,318, filed on Feb. 23, 2022, now Pat. No. 11,881,540, which is a
(Continued)

(30) Foreign Application Priority Data

May 27, 2020  (TW) .................................. 109117578

(51) Int. Cl.
*H01L 33/14*     (2010.01)
*H01L 25/075*    (2006.01)
(Continued)

(52) U.S. Cl.
CPC ........ *H01L 33/145* (2013.01); *H01L 25/0753* (2013.01); *H01L 25/167* (2013.01);
(Continued)

(58) Field of Classification Search
CPC . H01L 33/145; H01L 25/0753; H01L 25/167; H01L 33/0095; H01L 33/0093; H01L 33/382; H01L 27/156; H01L 33/42
See application file for complete search history.

(56) References Cited

U.S. PATENT DOCUMENTS 6,410,942 B1   6/2002   Thibeault et al.
6,579,745 B2   6/2003   Sanaka et al.
(Continued)

FOREIGN PATENT DOCUMENTS

CN   101339739 A   1/2009
CN   101567417 A   10/2009
(Continued)

OTHER PUBLICATIONS

Oh, et al.: "Light output performance of red AlGaInP-based light emitting diodes with different chip geometries and structures"; vol. 26, No. 9 | Apr. 30, 2018 | Optics Express 11194; pp. 1-7.
(Continued)

*Primary Examiner* — Victor A Mandala
(74) *Attorney, Agent, or Firm* — McClure, Qualey & Rodack, LLP

(57) ABSTRACT

A diode array includes a substrate and a plurality of light emitting diodes disposed on the substrate and arranged in an array. Each of the light emitting diodes includes a stack of functional layers includes a first semiconductor layer, a second semiconductor layer, and a light emitting layer located between the first semiconductor layer and the second semiconductor layer. At least one of the light emitting diodes includes a first current limiting region covering at least a portion of the first semiconductor layer, the light emitting layer or the second semiconductor layer; a first electrode electrically connected to the first semiconductor layer; and a second electrode electrically connected to the second semiconductor layer, wherein the first electrode and the second electrode are disposed at the same side of the first semiconductor layer.

20 Claims, 130 Drawing Sheets

Related U.S. Application Data continuation of application No. 16/917,346, filed on Jun. 30, 2020, now Pat. No. 11,296,254, which is a continuation of application No. PCT/CN2019/088648, filed on May 27, 2019.

(60) Provisional application No. 62/824,313, filed on Mar. 27, 2019, provisional application No. 62/773,202, filed on Nov. 30, 2018, provisional application No. 62/716,995, filed on Aug. 10, 2018.

(51) Int. Cl.
  H01L 25/16 (2023.01)
  H01L 33/00 (2010.01)
  H01L 33/38 (2010.01)

(52) U.S. Cl.
  CPC ...... H01L 33/0095 (2013.01); *H01L 33/0093* (2020.05); *H01L 33/382* (2013.01)

(56) References Cited

U.S. PATENT DOCUMENTS

| | | | |
|---|---|---|---|
| 8,022,427 B2 | 9/2011 | Miyake et al. | |
| 9,231,153 B2 | 1/2016 | Chen et al. | |
| 9,245,875 B2 | 1/2016 | Karlicek et al. | |
| 9,590,137 B2 | 3/2017 | Chen et al. | |
| 9,607,907 B2 | 3/2017 | Wu et al. | |
| 9,705,035 B1 | 7/2017 | Huang et al. | |
| 9,773,711 B2 | 9/2017 | Wu et al. | |
| 9,980,341 B2 | 5/2018 | Bower et al. | |
| 10,223,962 B2 | 3/2019 | Meitl et al. | |
| 10,297,719 B2 | 5/2019 | Chen et al. | |
| 11,114,423 B2 | 9/2021 | Iguchi | |
| 11,296,254 B2* | 4/2022 | Lin | H01L 33/44 |
| 11,557,694 B2* | 1/2023 | Huang | H01L 33/0075 |
| 11,621,375 B2* | 4/2023 | Liu | H01L 33/38 257/99 |
| 11,881,540 B2* | 1/2024 | Lin | H01L 33/44 |
| 2005/0045978 A1* | 3/2005 | Zoelfl | H01L 33/145 257/428 |
| 2008/0211416 A1* | 9/2008 | Negley | H01L 33/38 257/E33.001 |
| 2009/0009439 A1 | 1/2009 | Chan et al. | |
| 2010/0080001 A1* | 4/2010 | Kunoh | B82Y 20/00 372/45.011 |
| 2011/0095332 A1* | 4/2011 | Hwang | H01L 33/44 257/E33.063 |
| 2011/0254044 A1* | 10/2011 | Kuo | H01L 33/145 438/42 |
| 2012/0032218 A1* | 2/2012 | Choi | H01L 33/0075 257/E33.064 |
| 2012/0187424 A1* | 7/2012 | Kim | H01L 27/156 257/E33.062 |
| 2014/0367693 A1* | 12/2014 | Peng | H01L 33/007 438/29 |
| 2015/0349205 A1 | 12/2015 | Chen et al. | |
| 2016/0155906 A1 | 6/2016 | Lin et al. | |
| 2016/0315068 A1 | 10/2016 | Lee et al. | |
| 2017/0179343 A1* | 6/2017 | Chou | H01L 33/38 |
| 2017/0194531 A1* | 7/2017 | Huang | H01L 33/145 |
| 2017/0294558 A1* | 10/2017 | Huang | H01L 33/145 |
| 2018/0007750 A1* | 1/2018 | Meitl | H01L 22/24 |
| 2018/0097145 A1 | 4/2018 | Bour et al. | |
| 2018/0198023 A1* | 7/2018 | Kim | H01L 33/14 |
| 2018/0374991 A1* | 12/2018 | Bour | H01L 33/145 |
| 2019/0088820 A1 | 3/2019 | Danesh et al. | |
| 2019/0157512 A1 | 5/2019 | Jung et al. | |
| 2019/0168222 A1 | 6/2019 | Kojima et al. | |
| 2019/0237940 A1* | 8/2019 | Wong | H01S 5/0421 |
| 2019/0280157 A1* | 9/2019 | Hu | H01L 33/46 |
| 2019/0305185 A1* | 10/2019 | Lauermann | H01L 33/0095 |
| 2020/0075665 A1 | 3/2020 | Park et al. | |
| 2020/0168663 A1 | 5/2020 | Choi et al. | |
| 2020/0220020 A1 | 7/2020 | Zhang et al. | |
| 2020/0220050 A1* | 7/2020 | Huang | H01L 33/007 |
| 2021/0057607 A1* | 2/2021 | Lin | H01L 25/167 |
| 2022/0165914 A1* | 5/2022 | Lee | H01L 33/06 |

FOREIGN PATENT DOCUMENTS

| | | |
|---|---|---|
| CN | 202196806 U | 4/2012 |
| CN | 103972350 B | 8/2014 |
| EP | 3 093 834 A1 | 11/2016 |
| JP | S59-124184 U | 7/1984 |
| JP | 1997506742 A | 6/1997 |
| JP | 2001257218 A | 9/2001 |
| JP | 2006113258 A | 4/2006 |
| JP | 2009283912 A | 12/2009 |
| JP | 2015515149 A | 5/2015 |
| JP | 2016213441 A | 12/2016 |
| WO | 2017094461 A1 | 6/2017 |

OTHER PUBLICATIONS

Wong, et al.: "High efficiency of III-nitride micro-lightemitting diodes by sidewall passivation using atomic layer deposition"; vol. 26, No. 16 | Apr. 6, 2018 | Optics Express 21324; pp. 1-8.

Office Action for corresponding Chinese patent application No. 201980021931.0 dated Mar. 24, 2021.

Extended European Search Report dated Apr. 4, 2022, issued in application No. EP 19846917.3.

JP Office Action dated Feb. 7, 2023 in JP application No. 2021-531158.

JP Office Action dated Aug. 8, 2023 in JP application No. 2021-531158.

* cited by examiner

A-A'

B-B'

B-B'

A-A'

B-B'

B-B'

A-A'

A-A'

B-B'

A-A'

B-B'

B-B'

A-A'

B-B'

A-A'

B-B'

B-B'

D-D'

DIODE ARRAY

CROSS-REFERENCE TO RELATED APPLICATION

This application is a continuation application of U.S. application Ser. No. 17/678,318, filed Feb. 23, 2022, which is a continuation application of U.S. application Ser. No. 16/917,346, filed Jun. 30, 2020, now patented as U.S. Pat. No. 11,296,254, issued Apr. 5, 2022, which claims the benefit of priority to Taiwan Patent Application No. 109117578 filed on May 27, 2020 and is a Continuation Application of PCT Application No. PCT/CN2019/088648 filed on May 27, 2019, which claims the benefit of priority to Provisional Patent Application Ser. No. 62/716,995 filed on Aug. 10, 2018, Provisional Patent Application Ser. No. 62/773,202 filed on Nov. 30, 2018, and Provisional Patent Application Ser. No. 62/824,313 filed on Mar. 27, 2019. The entirety of the above-mentioned patent applications are hereby incorporated by reference herein and made a part of this specification.

TECHNICAL FIELD

The present disclosure relates to a diode array, more particularly to a light emitting diode array.

BACKGROUND

Micro-LED displays have advantages such as high contrast ratio, fast response speed, wide color gamut, low power consumption and long lifespan in comparison with traditional display technique, liquid crystal display (LCD) and organic LED (OLED). However, there are still some technical challenges that have not been fully solved to commercialize mass production, which include: (1) epitaxial chip and process, (2) mass transfer, and (3) inspection and repair.
  (1) Epitaxial chip and process: When the size of the LED chip is reduced, its external quantum efficiency (EQE) is also reduced. The main loss of EQE comes from a non-radiative recombination formed by the defects and surface energy states of sidewalls or surfaces of LED, therefore reducing the efficiency of the micro LED. Thus, to reduce non-radiative recombination, so as to increase light emitting efficiency, is a key technology.
  (2) Mass transfer: Transferring a huge amount of micro-LEDs onto a display substrate or circuit through a high-accuracy equipment is called mass transfer technology, such as electrostatic transfer technology, micro transfer print technology, fluid assembly technology, optical transfer. The critical challenge that all above technologies are facing today is how to achieve massive transfer within reasonable time and reasonable cost.
  (3) Inspection and repair: Quickly and accurately detecting and repairing is also a bottleneck faced by micro-LED technology at current stage.

SUMMARY

A diode array is provided according to an embodiment. The diode array comprises a substrate; and a plurality of light emitting diodes disposed on the substrate and arranged in an array, wherein each of the light emitting diodes includes a stack of functional layers comprising a first semiconductor layer, a second semiconductor layer, and a light emitting layer located between the first semiconductor layer and the second semiconductor layer. At least one of the light emitting diodes includes a first current limiting region covering at least a portion of the first semiconductor layer, the light emitting layer or the second semiconductor layer; a first electrode electrically connected to the first semiconductor layer; and a second electrode electrically connected to the second semiconductor layer, wherein the first electrode and the second electrode are disposed at the same side of the first semiconductor layer, a first width of the first electrode near the substrate is wider than a second width of the first electrode near the first semiconductor layer and a third width of the second electrode near the substrate is equal to or narrower than the first width, and at least a portion of the first current limiting region is formed about an outer edge of the at least one of the light emitting diodes.

According to an embodiment, with respect to a top-down view, an outline of the stack of the light emitting diode includes an arc.

According to an embodiment, the diode array further comprising a second current limiting region surrounded by the first current limiting region, wherein a shortest distance between the first current limiting region and the second current limiting region is equal to or less than 50 micrometers.

According to an embodiment, the first current limiting region located at the first semiconductor layer has a first lateral width, the first current limiting region located at the light emitting layer has a second lateral width, and the first current limiting region located at the second semiconductor layer has a third lateral width, wherein a vertical projection of the first lateral width is partially overlapped with a vertical projections of the second lateral width and the third lateral width.

According to an embodiment, the diode array further comprises a wall structure located between adjacent light emitting diodes; and a wavelength conversion material covers the at least one of the light emitting diodes, wherein a first wavelength of light radiated from the wavelength conversion material is different from a second wavelength of light radiated from the at least one of the light emitting elements, wherein the wavelength conversion material includes a blue phosphor, a green phosphor, a yellow phosphor, a red phosphor, or quantum dots.

According to an embodiment, the light emitting diode further comprises an etching groove formed by removing a portion of the second semiconductor layer and the light emitting layer, and the groove exposes the first semiconductor layer; wherein the groove has a first depth, the first current limiting region has a second depth, and the first depth is less than or equal to the second depth.

According to an embodiment, the first electrode and the second electrode include a multi-layer structure, which includes an ohm contact layer, a diffusion blocking layer, a connecting layer and a reflective mirror layer.

According to an embodiment, the substrate further comprises redistribution layers respectively electrical connected to the first semiconductor layer, and the second semiconductor layer.

According to an embodiment, the diode array further comprises sealing materials located between adjacent ones of the plurality of light emitting diodes, and wherein the sealing materials include light-absorber materials to prevent light crosstalk between the adjacent ones of the plurality of light emitting diodes.

According to an embodiment, the diode array further comprises at least one wall structure located between adjacent ones of the plurality of light emitting diodes, and the wall structure includes a reflecting mirror.

According to an embodiment, the diode array further comprises a wavelength conversion layer covering at least part of the diode array, and the wavelength conversion layer includes windows in matrix form; a matrix frame surrounding the windows; and phosphors included in at least one of the windows; wherein the matrix frame is not light transmissive; wherein the phosphors included in any two of the windows are different from each other.

According to an embodiment, an amount of the light emitting diodes, which are below one of the windows, is more than one.

According to an embodiment, at least two of the light emitting diodes, below the one of the windows, are individually controlled.

A diode is provided according to an embodiment. The diode comprises a stack of functional layers including a first semiconductor layer, a second semiconductor layer, and a light emitting layer located between the first semiconductor layer and the second semiconductor layer; a first electrode disposed on the first semiconductor layer; a second electrode disposed on the second semiconductor layer; and a first current limiting region covering at least a portion of the first semiconductor layer, the light emitting layer or the second semiconductor layer; and a second current limiting region surrounded by the first current limiting region, and a shortest distance between the first current limiting region and the second current limiting region is equal to or less than 50 micrometers; wherein the first electrode and the second electrode are disposed at the same side of the first semiconductor layer.

According to an embodiment, with respect to a cross-section view, a sidewall region which covered with the first current limiting region has an obtuse angle which is greater than 90 degrees.

According to an embodiment, the first electrode and the second electrode include a semiconductor contact surface and a bonding surface; wherein a width of the bonding surface of the first electrode is wider than a width of the semiconductor contact surface of the first electrode layer; wherein a width of the bonding surface of the first electrode is equal to or wider than a width of the bonding surface of the second electrode.

According to an embodiment, with respect to a top-down view, an outline of the stack includes an arc.

A diode is provided according to an embodiment. The diode comprises a stack of functional layers including a first semiconductor layer, a second semiconductor layer, and a light emitting layer located between the first semiconductor layer and the second semiconductor layer; a first electrode and a second electrode located at the same side of the first semiconductor layer, wherein the first electrode is electrically connected to the first semiconductor layer and the second electrode is electrically connected to the second semiconductor layer; and a current limiting region or a current blocking region covering at least a portion of the first semiconductor layer, the light emitting layer or the second semiconductor layer; wherein, with respect to a top-down view, an outline of the stack includes an arc.

According to an embodiment, the outline of the stack shows a circular shape.

According to an embodiment, the outline of the stack shows a polygon with arc corners.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The drawings are used for better understanding of the present invention, but not intended to limit the scope of the present invention.

FIG. 9-1 schematically illustrates a semiconductor structure.

FIG. 9-2 schematically illustrates forming a mask and defining current limiting area by ion implantation.

FIG. 9-3 schematically illustrates the removal of mask.

FIG. 9-4 schematically illustrates the formation of transparent electrode, metal electrode and extension part of the metal electrode.

FIG. 9-5 schematically illustrates the formation of recesses.

FIG. 9-6 schematically illustrates connecting the light emitting diode to a test substrate by a sacrificing layer.

FIG. 9-7 schematically illustrates the removal of growth substrate.

FIG. 9-8 schematically illustrates forming a metal electrode on the first type semiconductor layer.

FIG. 9-9 schematically illustrates performing electroluminescence (EL) detection of light emitting diode by test substrate and photoelectric sensor.

FIG. 9-10 schematically illustrates optionally removing defected component to a collecting substrate.

FIG. 9-11 schematically illustrates mass transfer of array of light emitting components on a permanent substrate.

FIG. 9-12 schematically illustrates transferring light emitting components on the permanent substrate to fill the vacancy.

FIG. 9-13 schematically illustrates finishing the transfer of the light emitting component on the permanent substrate.

FIG. 9-14 schematically illustrates forming walls and transparent adhesive on the permanent substrate.

FIG. 9-15 schematically illustrates forming walls and phosphor with adhesive on the permanent substrate.

FIG. 9-16 schematically illustrates forming walls, transparent adhesive and phosphor with adhesive on the permanent substrate.

FIG. 10-1 schematically illustrates a semiconductor structure.

FIG. 10-2 schematically illustrates the formation of recesses.

FIG. 10-3 schematically illustrates the removal of mask.

FIG. 10-4 schematically illustrates forming a current blocking area by dielectric material.

FIG. 10-5 schematically illustrates the formation of transparent electrode, metal electrode and extension part of the metal electrode.

FIG. 10-6 schematically illustrates connecting the light emitting diode to a test substrate by a sacrificing layer.

FIG. 10-7 schematically illustrates the removal of growth substrate.

FIG. 10-8 schematically illustrates forming a metal electrode on the first type semiconductor layer.

FIG. 10-9 schematically illustrates performing electroluminescence (EL) detection of light emitting diode by test substrate and photoelectric sensor.

FIG. 10-10 schematically illustrates optionally removing defected component to a collecting substrate.

FIG. 10-11 schematically illustrates mass transfer of array of light emitting components on a permanent substrate.

FIG. 10-12 schematically illustrates transferring light emitting components on the permanent substrate to fill the vacancy.

FIG. 10-13 schematically illustrates finishing the transfer of the light emitting component on the permanent substrate.

FIG. 10-14 schematically illustrates forming walls and transparent adhesive on the permanent substrate.

FIG. 10-15 schematically illustrates forming walls and phosphor with adhesive on the permanent substrate.

FIG. 10-16 schematically illustrates forming walls, transparent adhesive and phosphor with adhesive on the permanent substrate.

FIG. 11-1 schematically illustrates a top view of the micro light emitting diode according to the present invention, which shows rectangular shape.

FIG. 11-2 schematically illustrates a top view of the micro light emitting diode according to the present invention, which shows circular shape.

FIG. 11-3 schematically illustrates a top view of the micro light emitting diode according to the present invention, which shows triangular shape.

FIG. 12 schematically illustrates performing optional mass transfer of light emitting components after detection to a first container, and performing fluid transfer of the micro light emitting diodes to a receiving substrate through a first solution.

FIG. 13 schematically illustrates a top view of the receiving substrate.

FIG. 14 schematically illustrates a first flow chart according to the present invention.

FIG. 15 schematically illustrates a second flow chart according to the present invention.

FIG. 28-1 schematically illustrates epitaxial growth of semiconductor structures on a growth substrate.

FIG. 28-2 schematically illustrates forming a mask and defining current limiting area by ion implantation.

FIG. 28-3 schematically illustrates the removal of mask.

FIG. 28-4 schematically illustrates the formation of recesses and etching areas.

FIG. 28-5 schematically illustrates the formation of transparent electrodes and electrodes.

FIG. 28-6 schematically illustrates connecting the light emitting diode to a test substrate by a sacrificing layer.

FIG. 28-7 schematically illustrates removing the growth substrate by laser.

FIG. 28-8 is the schematic diagram after the growth substrate is removed.

FIG. 28-9 schematically illustrates performing electroluminescence (EL) detection of light emitting diode by test substrate and photoelectric sensor.

FIG. 28-10 schematically illustrates transferring to a transfer substrate.

FIG. 28-11 schematically illustrates optionally removing defected component to a collecting substrate.

FIG. 28-12 schematically illustrates mass transfer of array of light emitting components on a permanent substrate.

FIG. 28-13 schematically illustrates transferring light emitting components on the permanent substrate to fill the vacancy.

FIG. 28-14 schematically illustrates finishing the transfer of the light emitting component on the permanent substrate.

FIG. 28-15 schematically illustrates forming walls and transparent adhesive on the permanent substrate.

FIG. 28-16 schematically illustrates forming walls and phosphor with adhesive on the permanent substrate.

FIG. 28-17 schematically illustrates forming walls, transparent adhesive and phosphor with adhesive on the permanent substrate.

FIG. 28-18 schematically illustrates a circuit block diagram of the flexible display.

FIG. 33-1 schematically illustrates forming a first epitaxial layer structure on a first epitaxial substrate.

FIG. 33-2 schematically illustrates a horizontal cross-sectional view along line A-A' of first micro light emitting diodes formed through photolithography and etching process, and the pitch between the first micro light emitting diodes is P1.

FIG. 33-3 schematically illustrates a top view of FIG. 33-2.

FIG. 34-1 schematically illustrates a horizontal cross-sectional view along line A-A', wherein the first ion implantation area and the first sub-pixel area are defined by ion implantation.

FIG. 34-2 schematically illustrates a top view of FIG. 34-1.

FIG. 35-1 schematically illustrates a horizontal cross-sectional view along line A-A', wherein a conductive layer is formed on the first sub-pixel area.

FIG. 35-2 schematically illustrates a horizontal cross-sectional view along line A"-A'", wherein the conductive layer is formed on the first sub-pixel area.

FIG. 35-3 schematically illustrates a top view of FIG. 35-2.

Figure 2A:
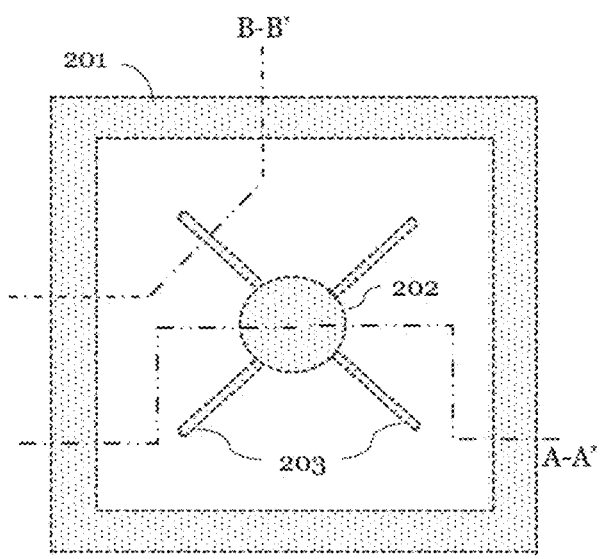
FIG. 2A, FIG. 2Q and FIG. 2T schematically illustrate a top view according to an embodiment of the present invention.
Figure 2B:
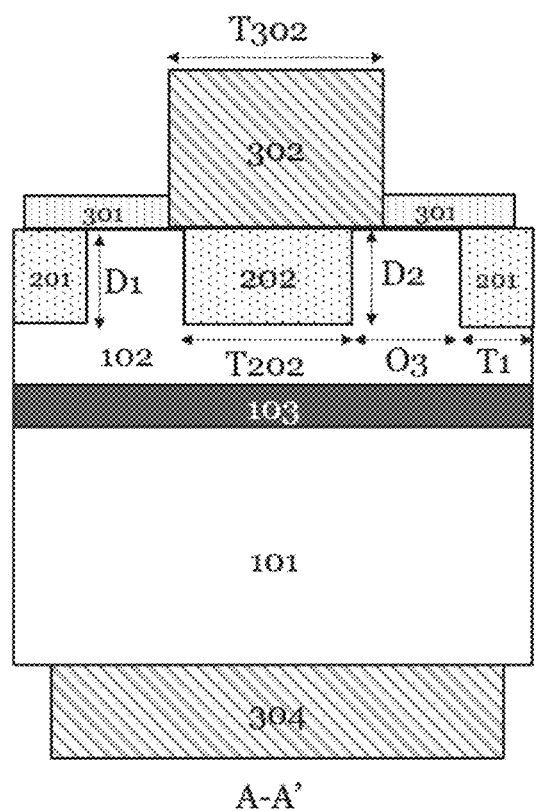
FIG. 2B, FIG. 2D, FIG. 2F, FIG. 2H, FIG. 2J, FIG. 2L, FIG. 2N, FIG. 2R and FIG. 2U schematically illustrate a cross-sectional view along line A-A according to an embodiment of the present invention.
Figure 2C:
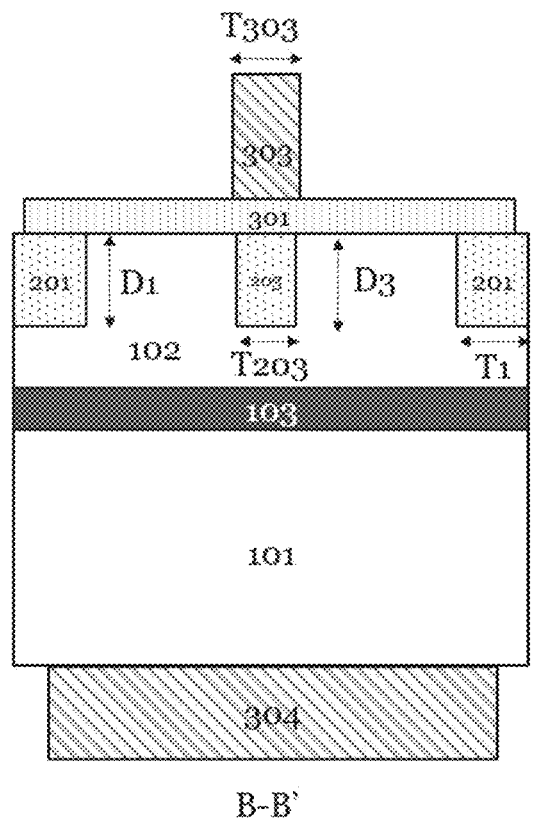
FIG. 2C, FIG. 2E, FIG. 2G, FIG. 2I, FIG. 2K, FIG. 2M, FIG. 2O and FIG. 2V schematically illustrate a cross-sectional view along line B-B' according to an embodiment of the present invention.
Figure 2D:
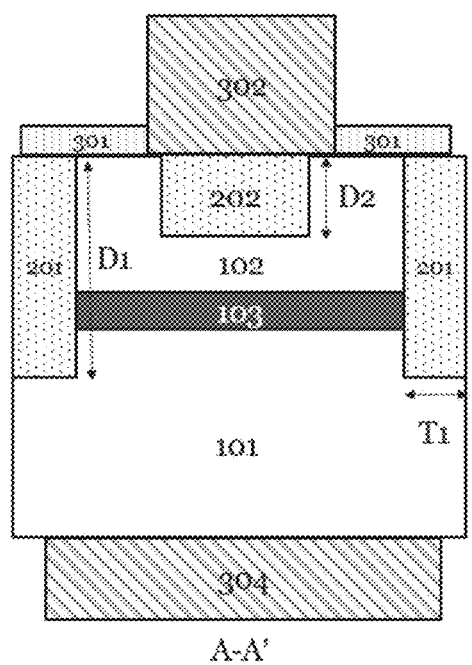
Figure 2E:
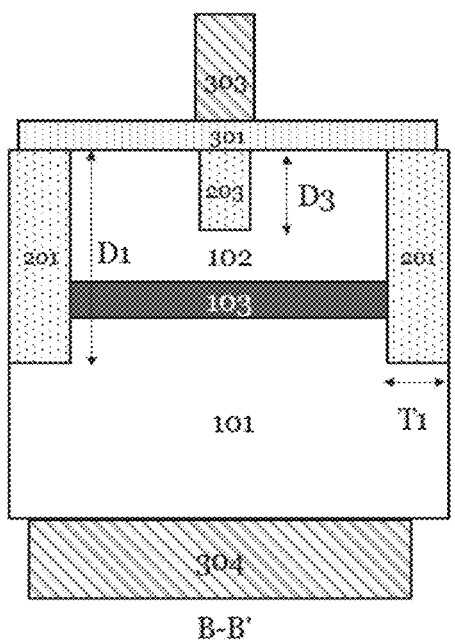
Figure 2F:
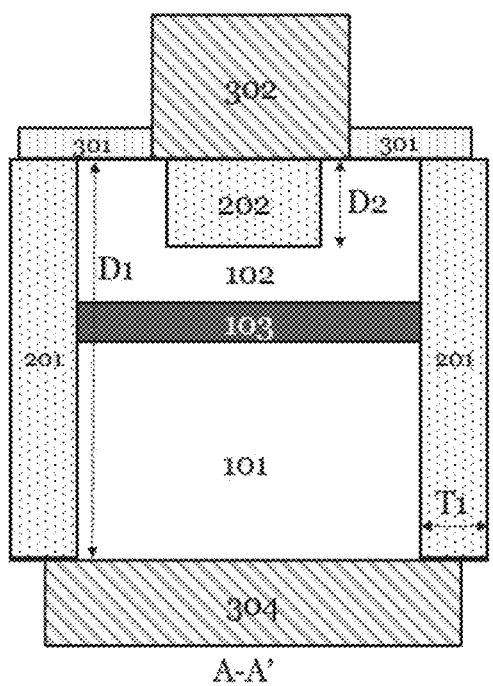
Figure 2G:
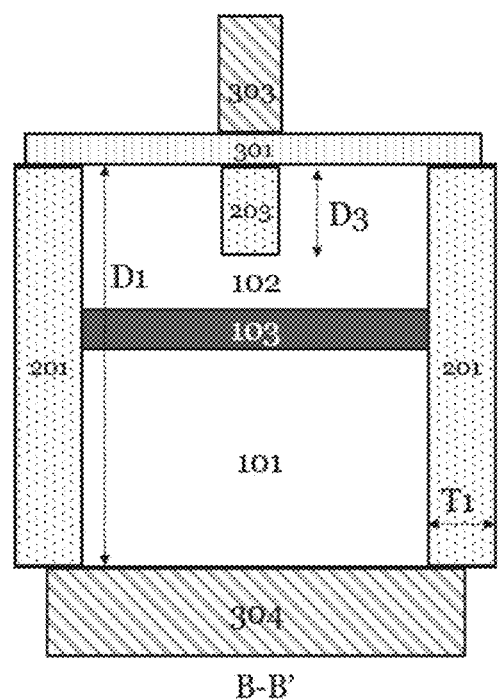
Figure 2H:
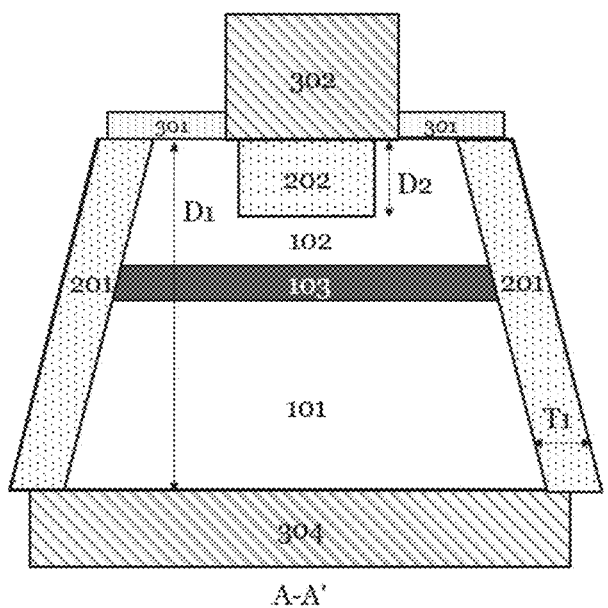
Figure 2I:
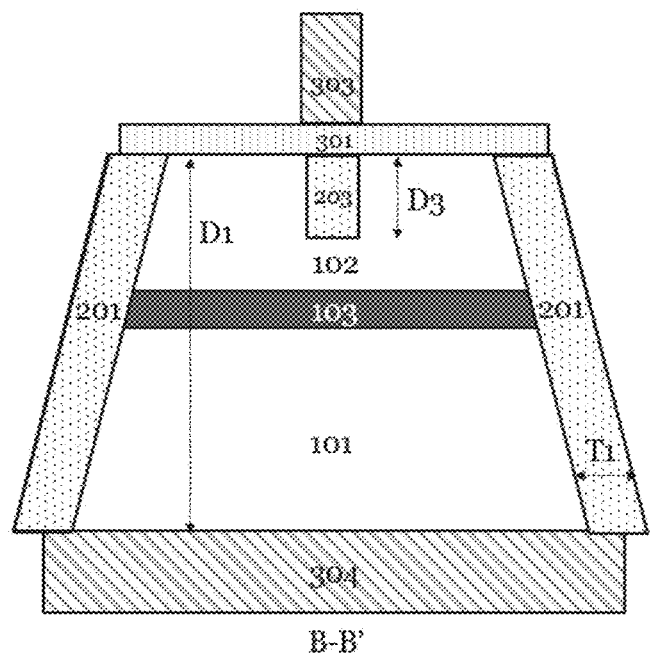
Figure 2J:
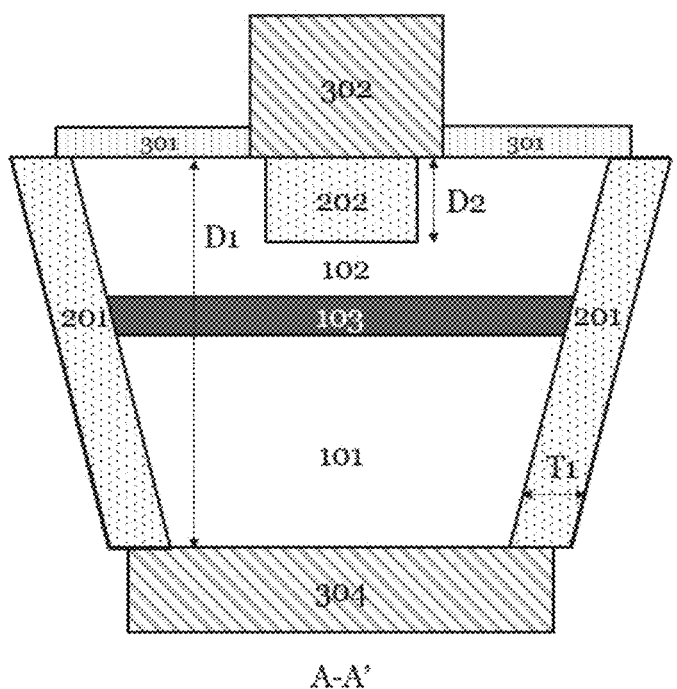
Figure 2K:
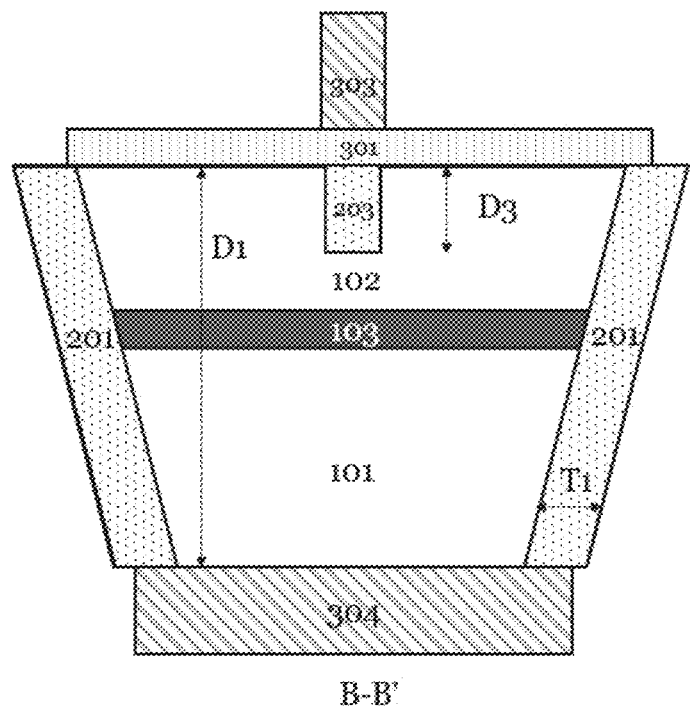
Figure 2L:
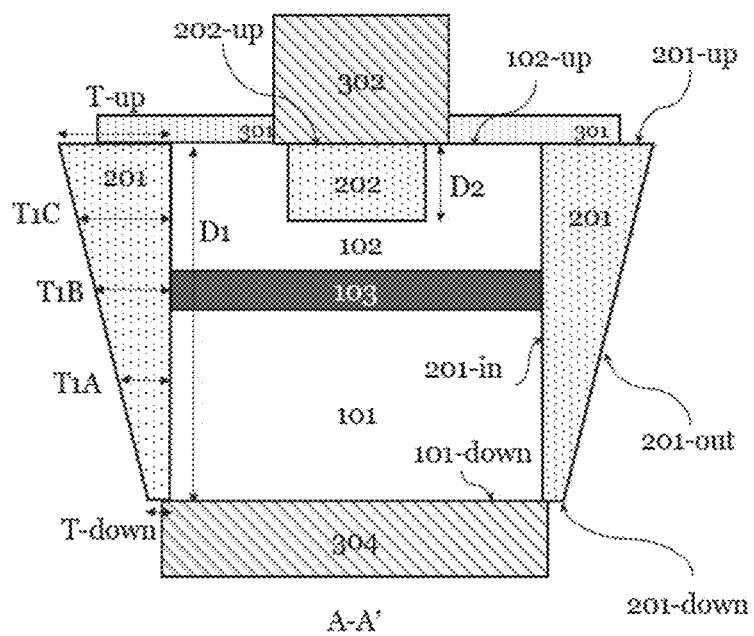
Figure 2M:
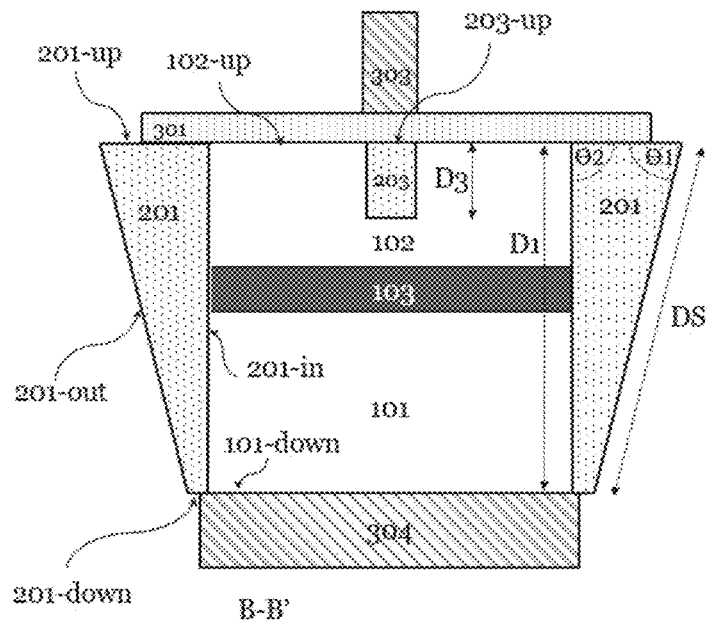
Figure 2N:
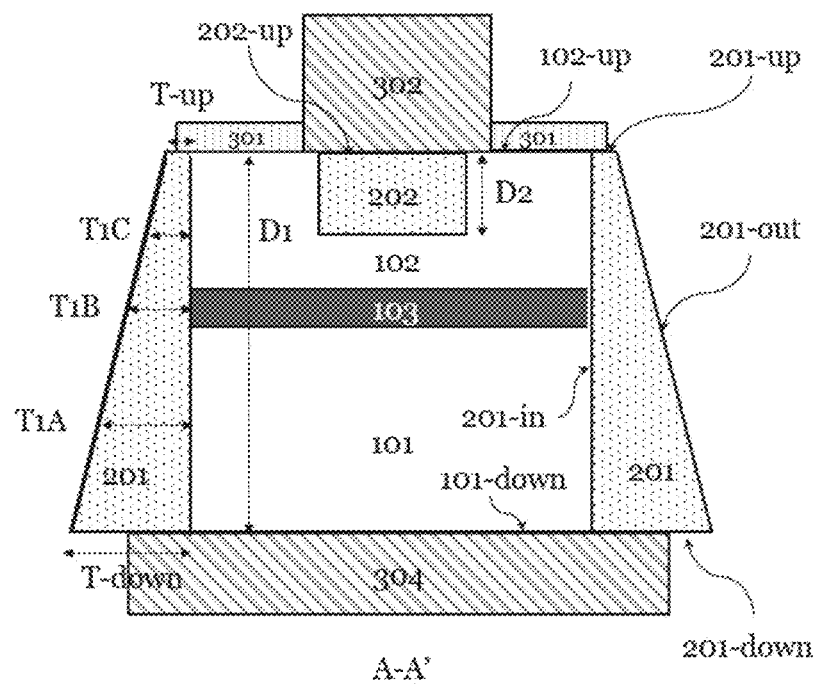
Figure 2O:
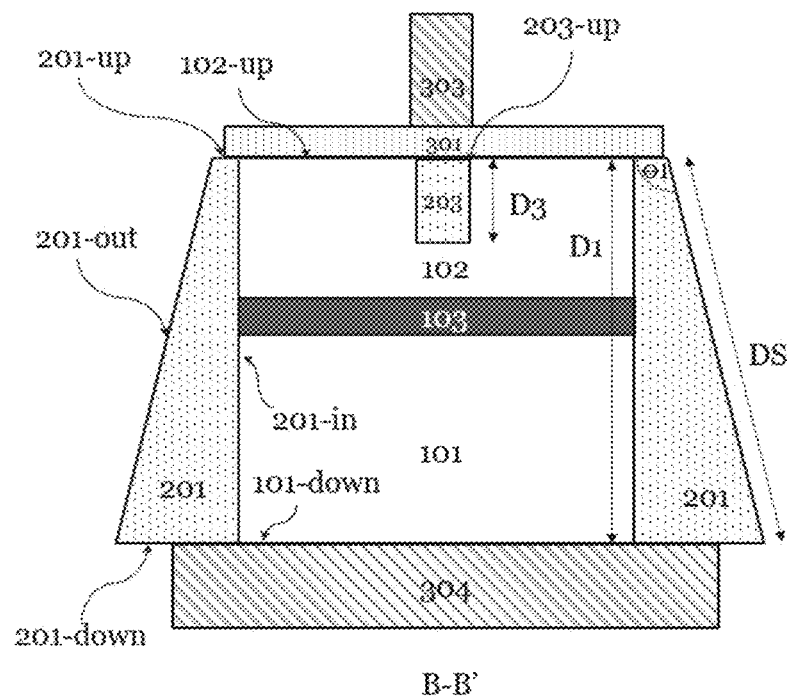
Figure 2P:
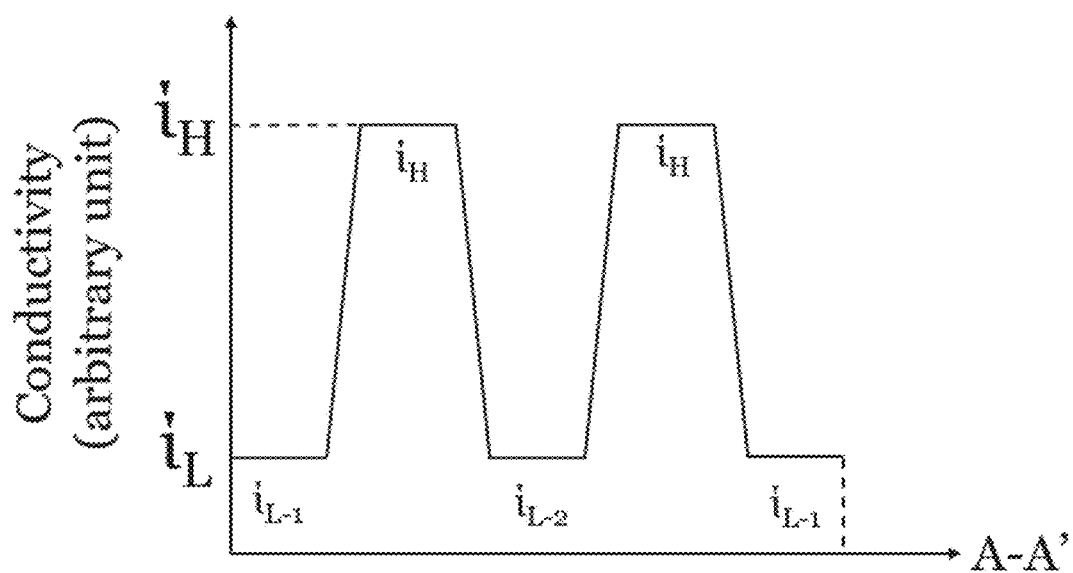
FIG. 2P, FIG. 2S-1, FIG. 2S-2, and FIG. 2W schematically illustrate the results of conductivity measurement by conductive atomic force microscope.
Figure 2Q:
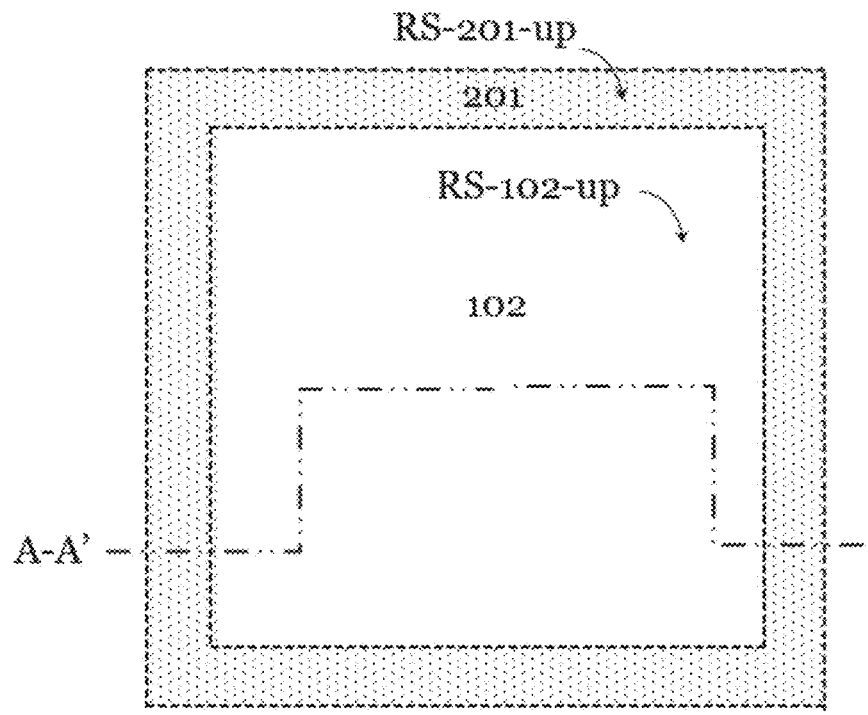
Figure 2R:
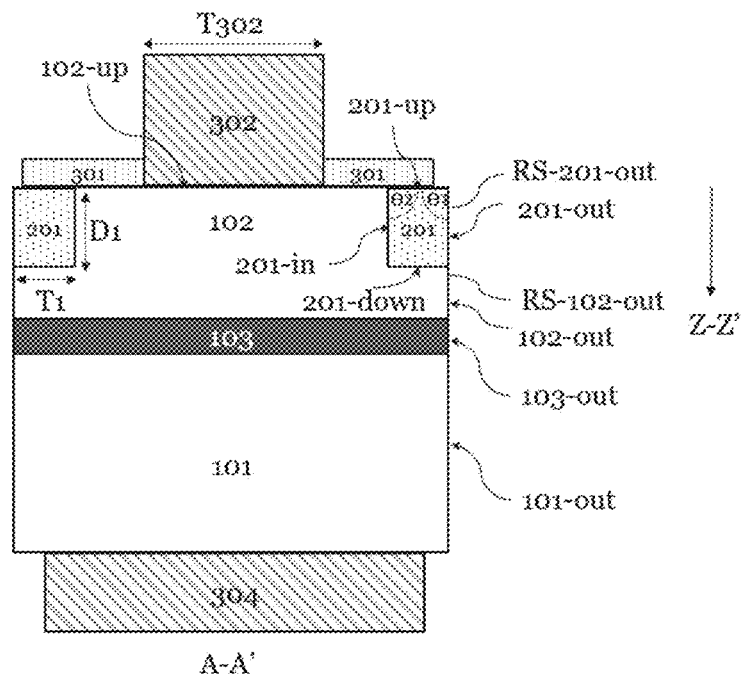
Figures 1, 2S:
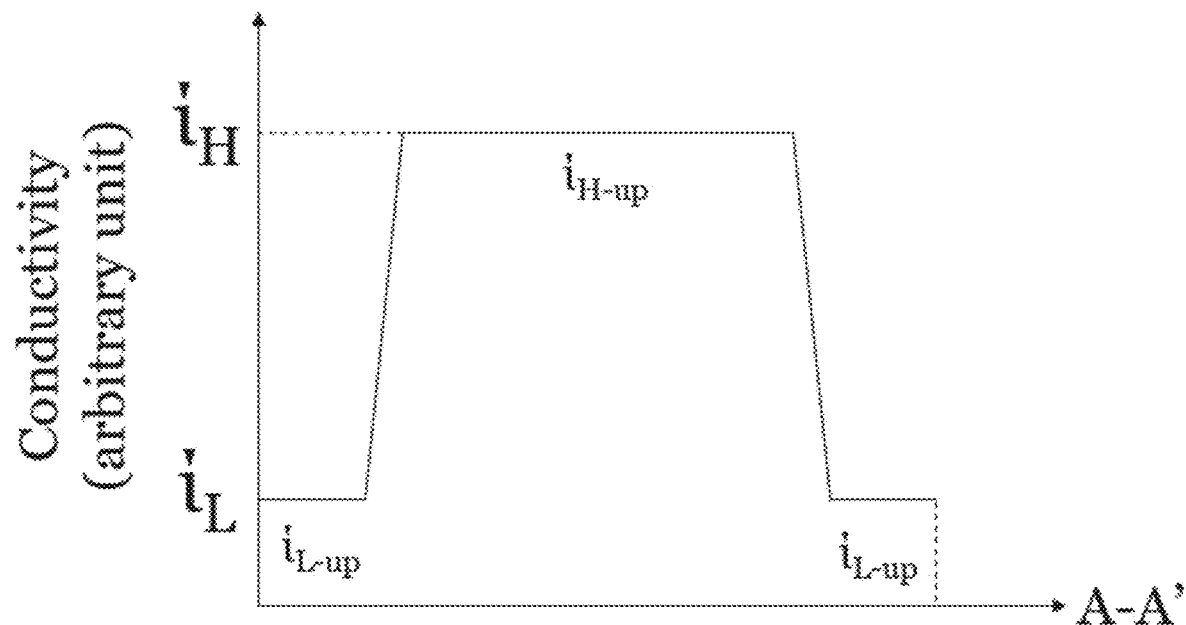
Figures 1, 36:
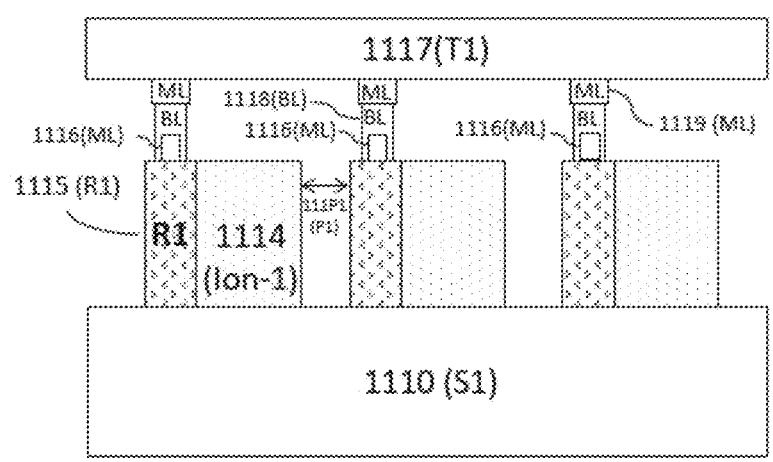
Figures 2, 36:
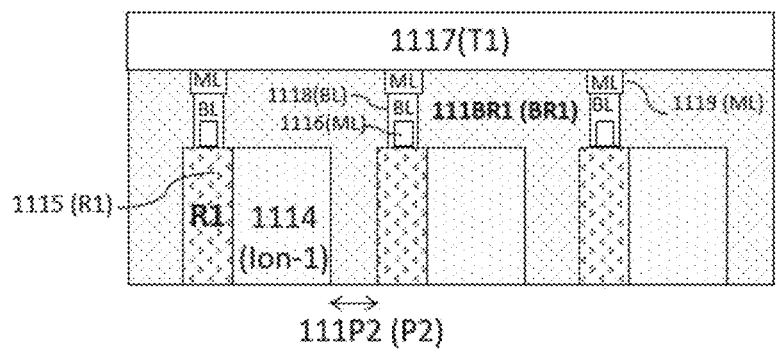
Figures 3, 36:
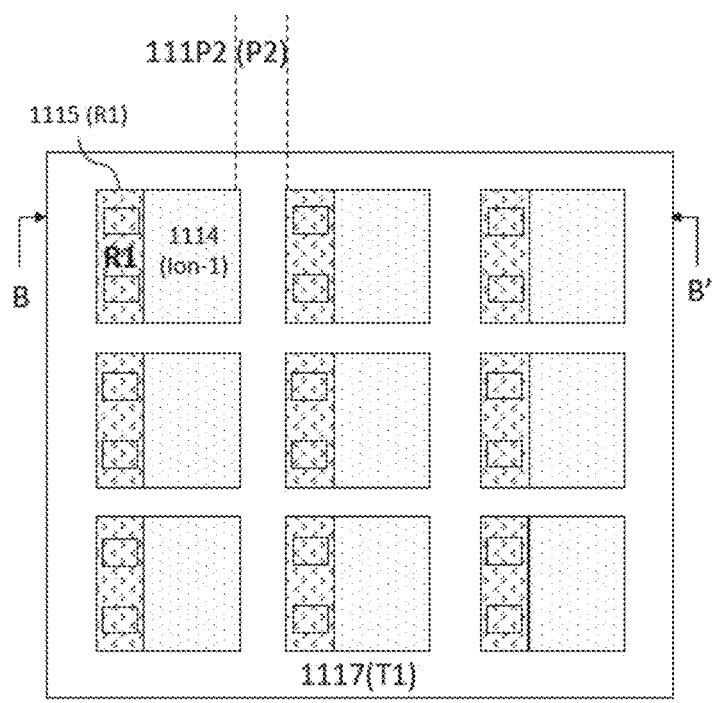

FIG. 36-1 schematically illustrates electrically connecting the first sub-pixel area including conductive layer and the first transparent substrate through bonding pads.

Figures 2, 2S:
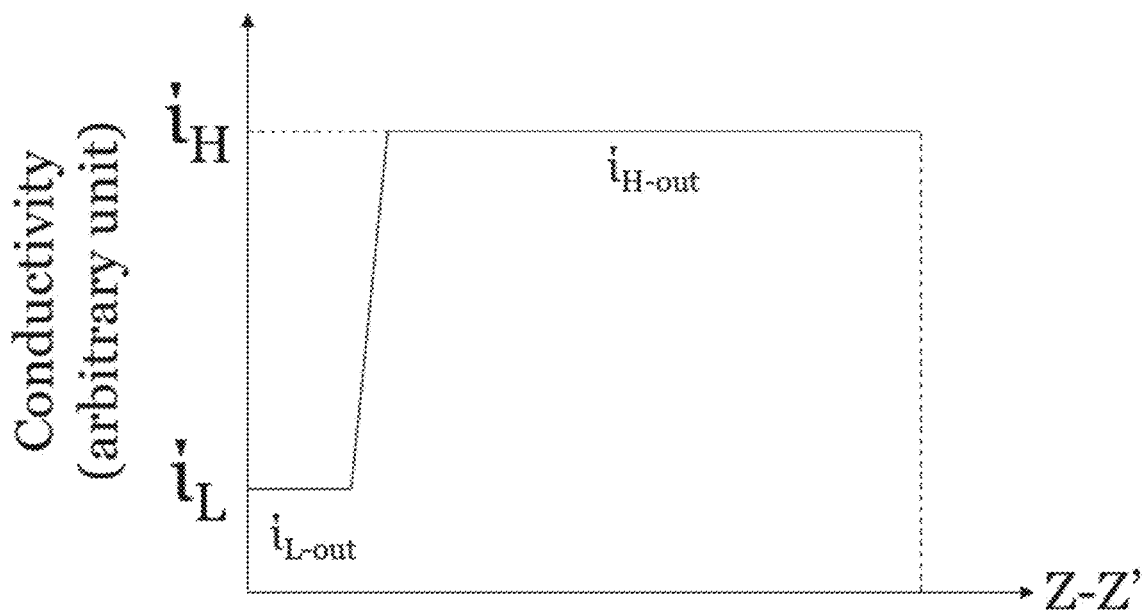
Figure 2T:
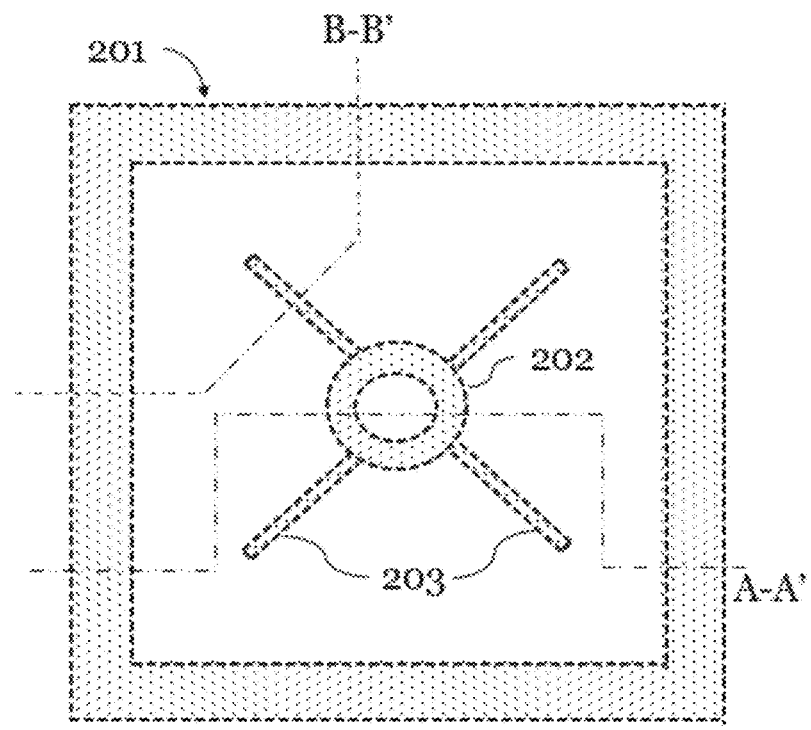
Figure 2U:
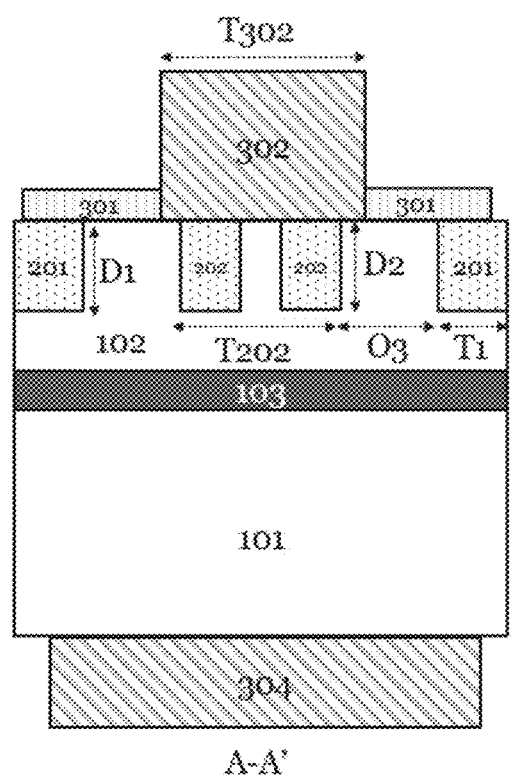
Figure 2V:
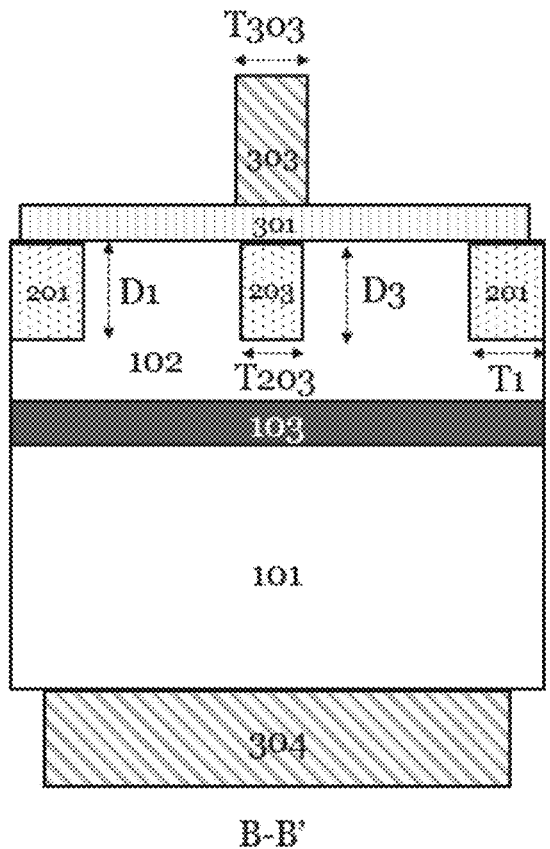
Figure 2W:
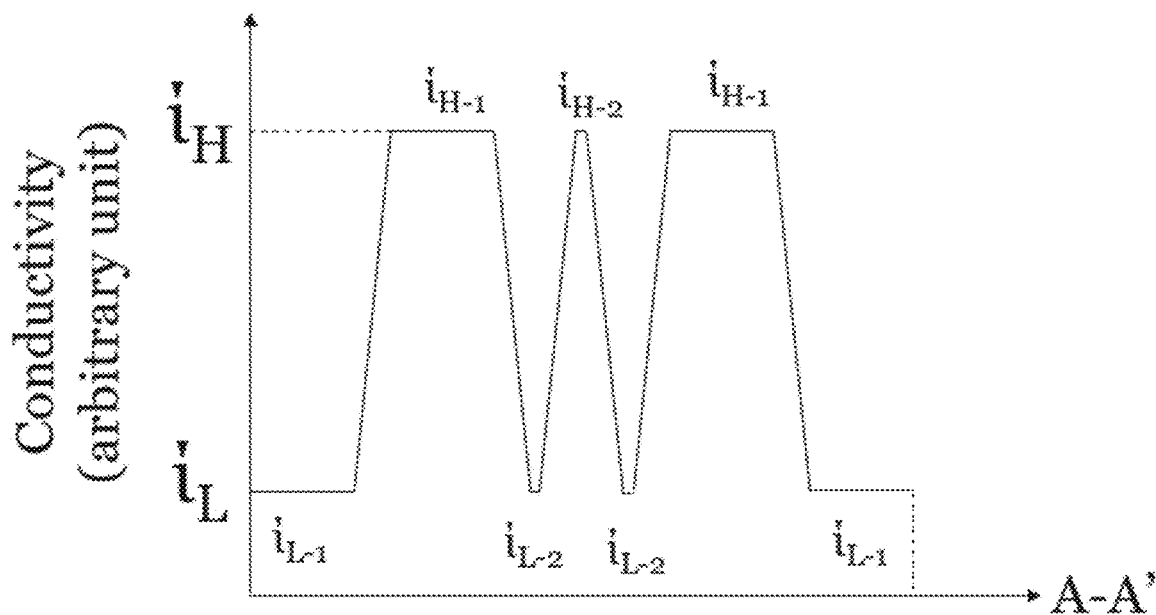

FIG. 36-2 schematically illustrates removing the first epitaxial substrate, and filling a first light-transmissive intermediate layer between the first transparent substrate and the first sub-pixel area.

Figures 1, 9:
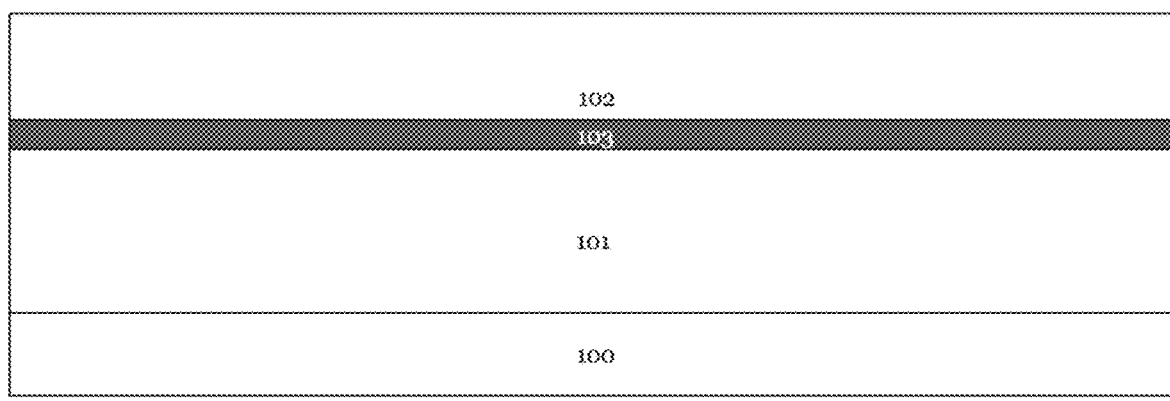
Figures 2, 9:
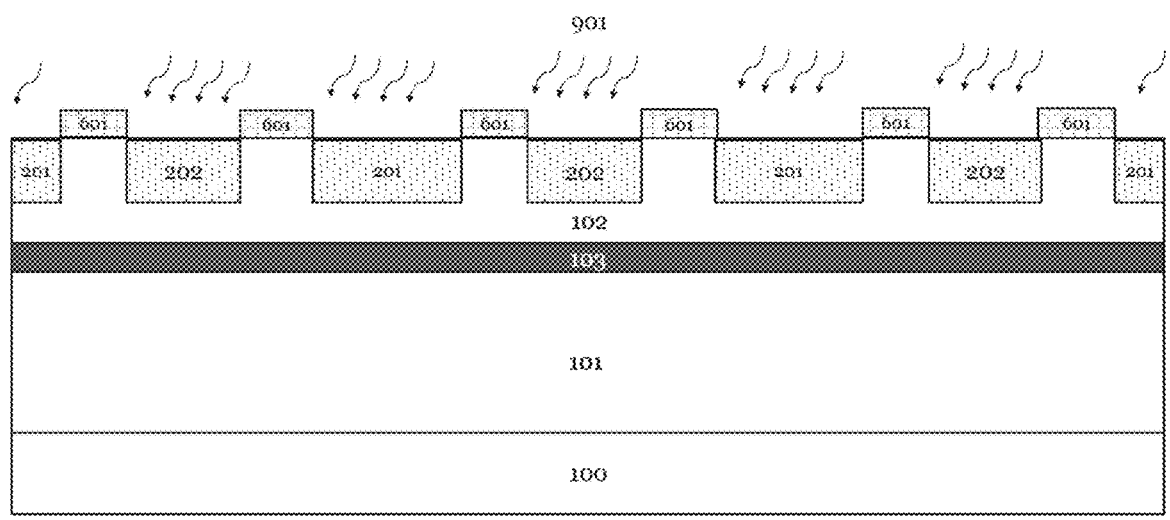
Figures 3, 9:
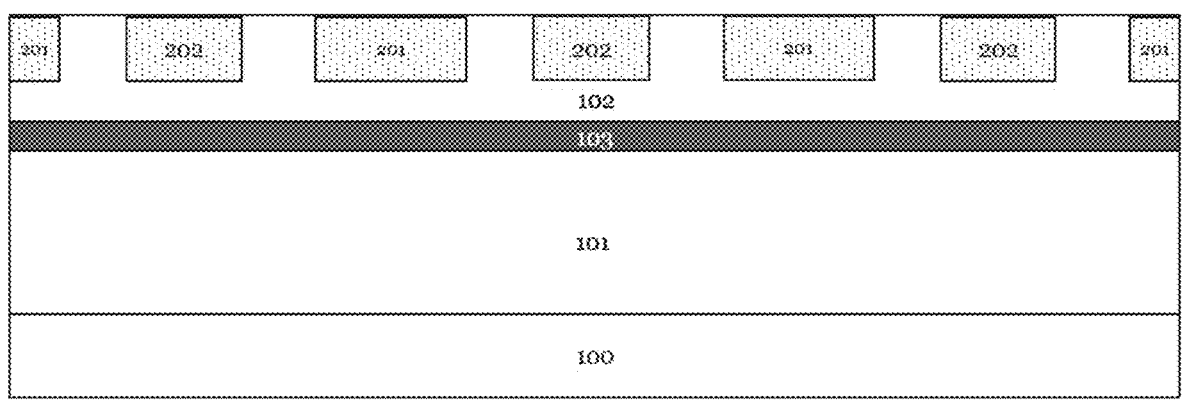

FIG. 36-3 schematically illustrates a top view of FIG. 36-2.

Figures 1, 37:
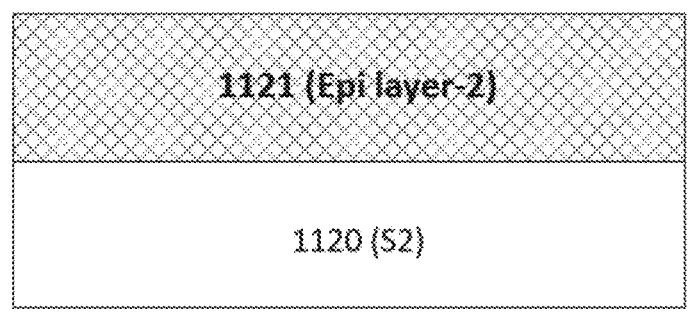
Figures 2, 37:
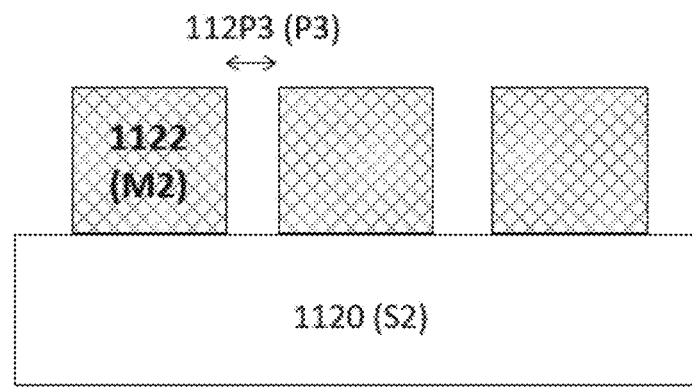
Figures 3, 37:
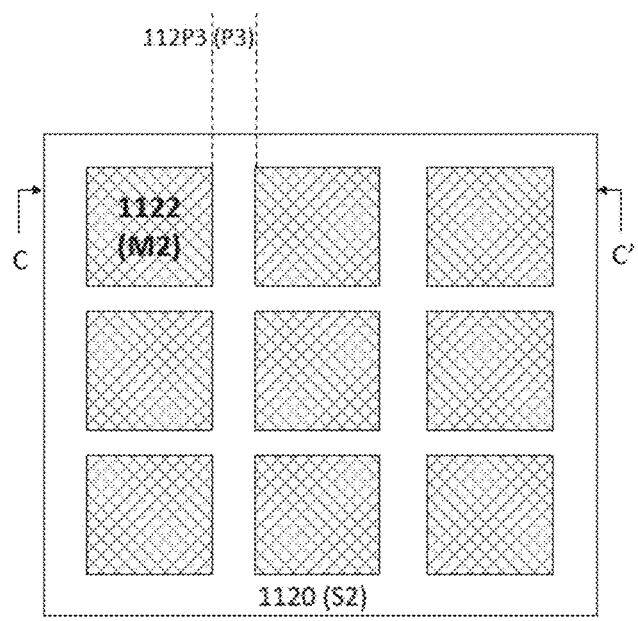

FIG. 37-1 schematically illustrates forming a second epitaxial layer structure on a second epitaxial substrate.

FIG. 37-2 schematically illustrates a horizontal cross-sectional view along line C-C' of second micro light emitting diodes formed through photolithography and etching process, and the pitch between the second micro light emitting diodes is P3.

FIG. 37-3 schematically illustrates a top view of FIG. 37-2.

Figures 1, 38:
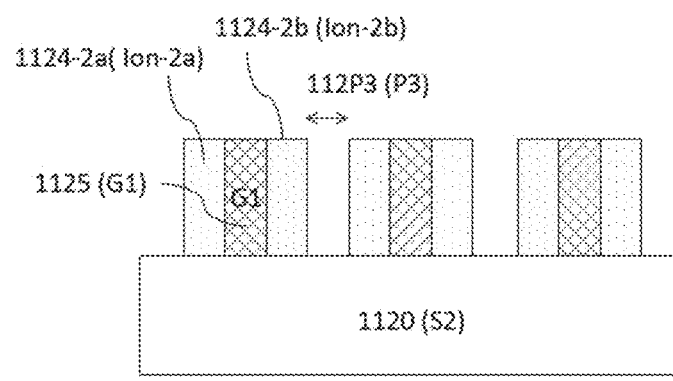
Figures 2, 38:
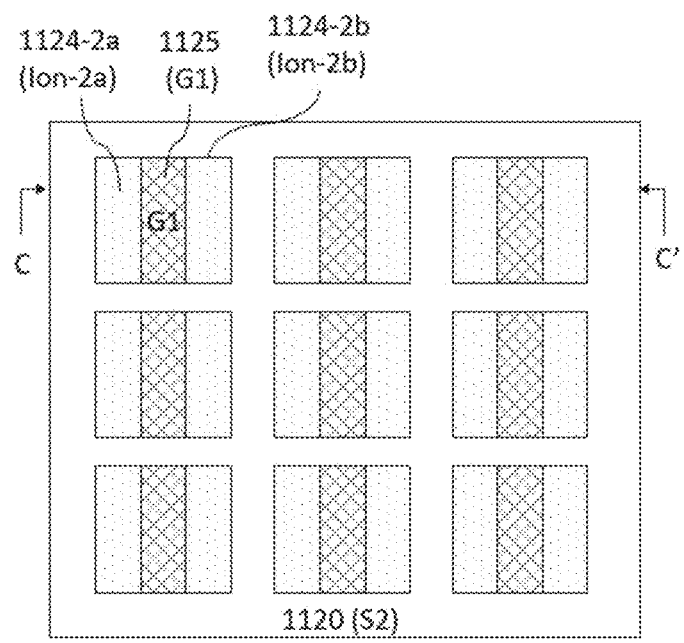

FIG. 38-1 schematically illustrates a horizontal cross-sectional view along line C-C', wherein a first region of a second ion implantation area, a second region of the second ion implantation area, and a second sub-pixel area of the second micro light emitting diode are defined by ion implantation.

FIG. 38-2 schematically illustrates a top view of FIG. 38-1.

Figures 1, 39:
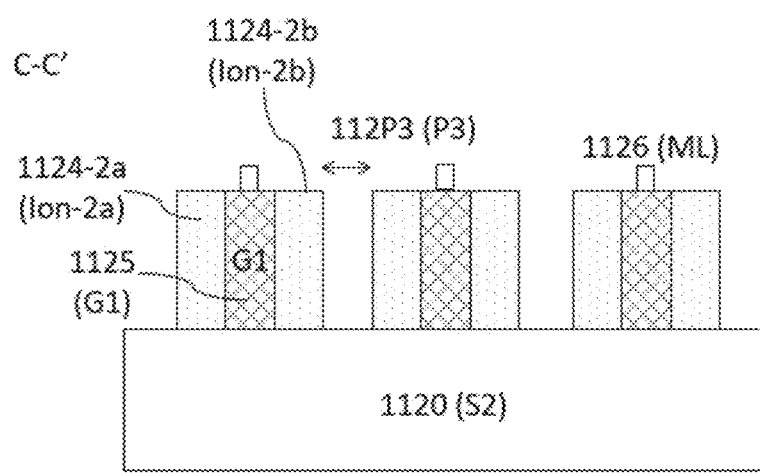
Figures 2, 39:
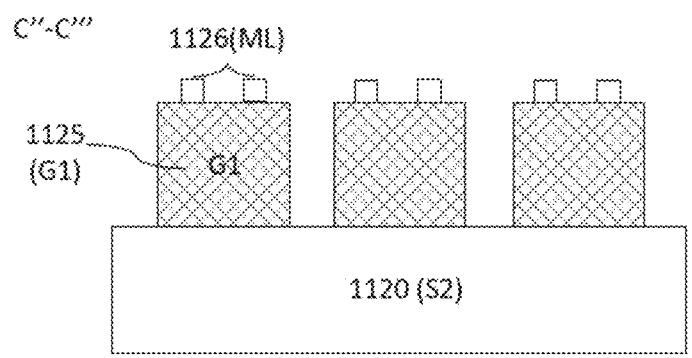
Figures 3, 39:
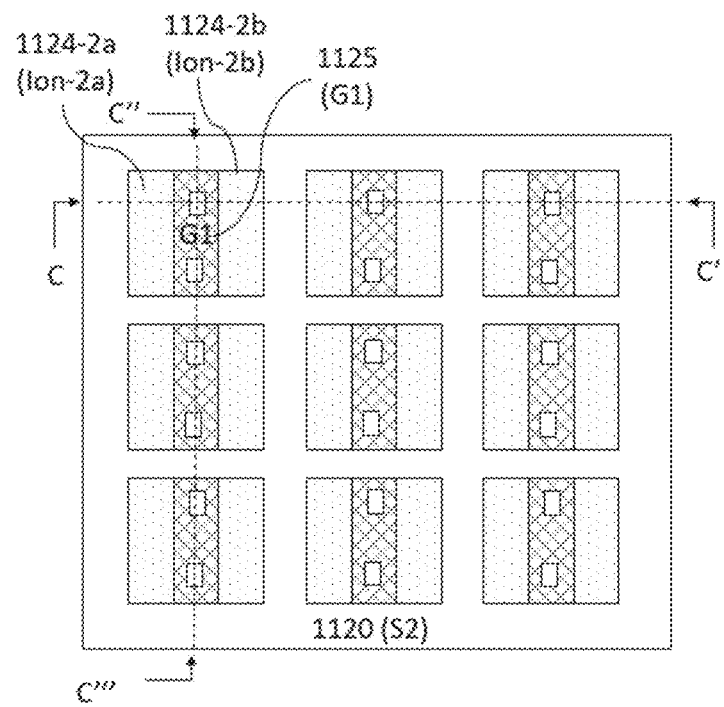

FIG. 39-1 schematically illustrates a horizontal cross-sectional view along line C-C', wherein a conductive layer is formed on the second sub-pixel area.

FIG. 39-2 schematically illustrates a horizontal cross-sectional view along line C"-C'", wherein a conductive layer is formed on the second sub-pixel area.

FIG. 39-3 schematically illustrates a top view of FIG. 39-1.

Figures 1, 40:
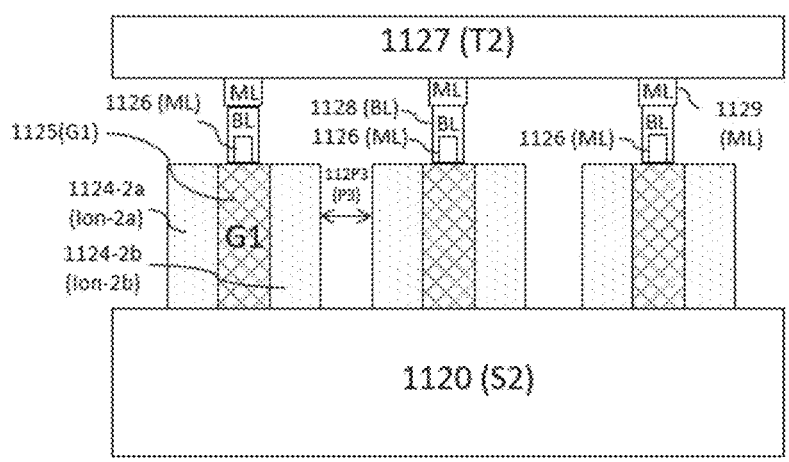
Figures 2, 40:
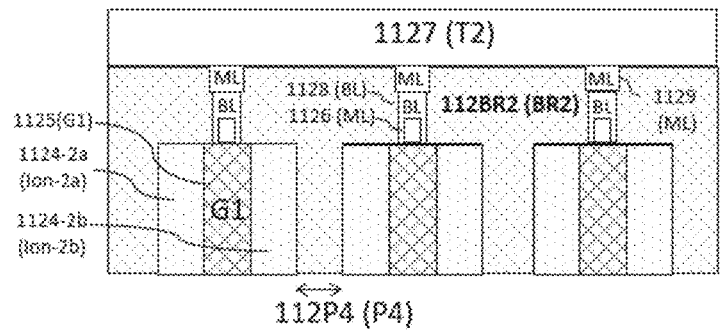
Figures 3, 40:
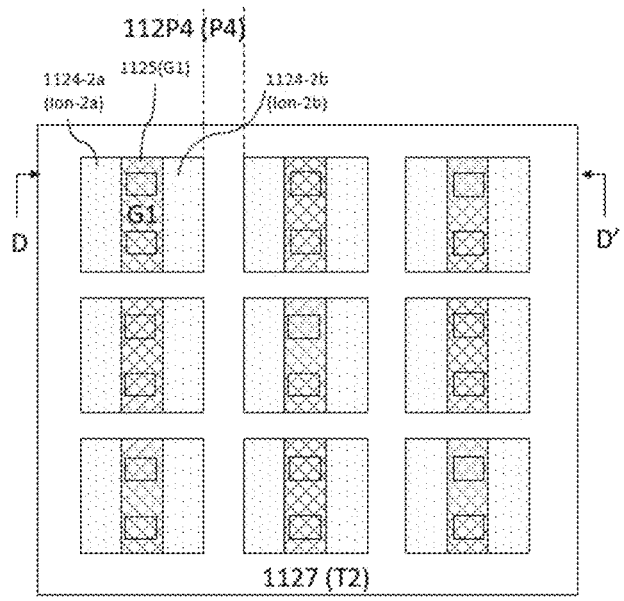

FIG. 40-1 schematically illustrates electrically connecting the second sub-pixel area including conductive layer structure and a second transparent substrate through bonding pads.

FIG. 40-2 schematically illustrates removing the second epitaxial substrate, and filling a second light-transmissive intermediate layer between the second transparent substrate and the second sub-pixel area.

FIG. 40-3 schematically illustrates a top view of FIG. 40-1.

Figures 1, 41:
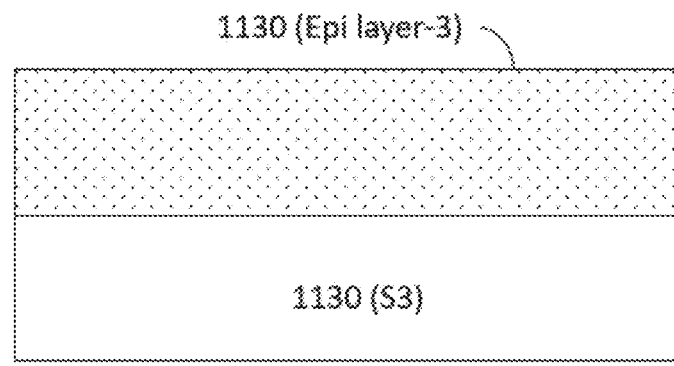
Figures 2, 41:
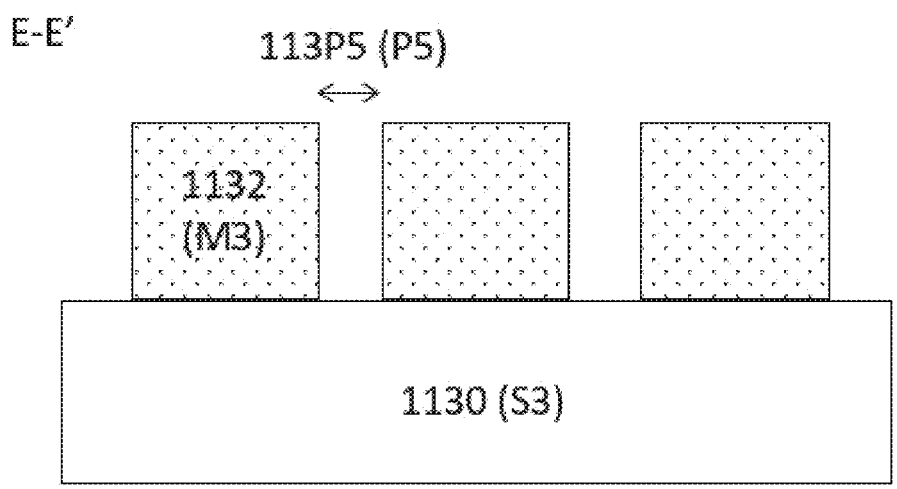
Figures 3, 41:
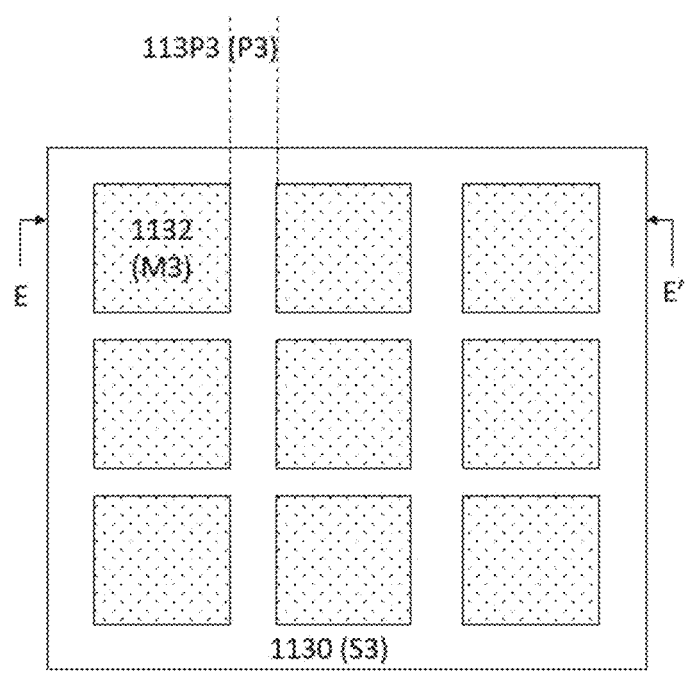

FIG. 41-1 schematically illustrates forming a third epitaxial layer structure on a third epitaxial substrate.

FIG. 41-2 schematically illustrates a horizontal cross-sectional view along line E-E', wherein a third ion implantation area and a third sub-pixel area are defined by ion implantation.

FIG. 41-3 schematically illustrates a top view of FIG. 41-2.

Figures 1, 42:
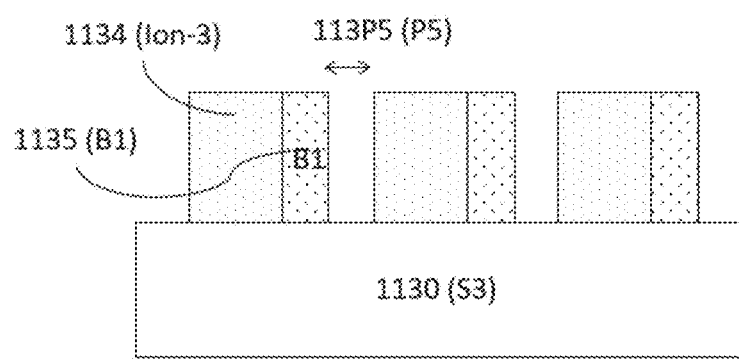
Figures 2, 42:
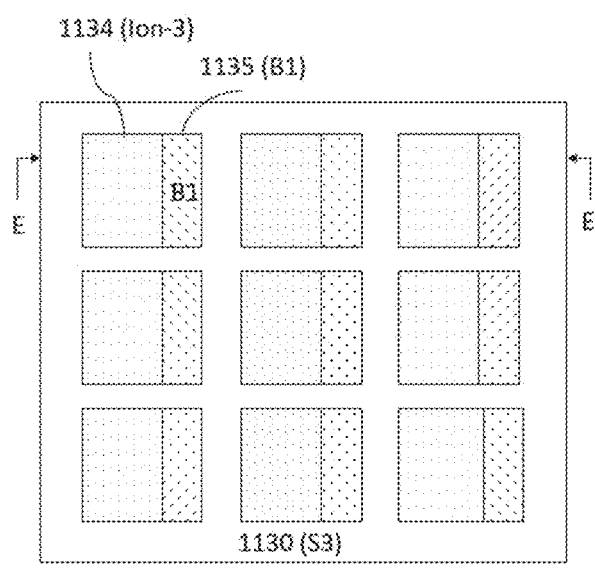

FIG. 42-1 schematically illustrates a horizontal cross-sectional view of a third micro light emitting diode along line C-C', wherein a third ion implantation area and a third sub-pixel area are defined by ion implantation.

FIG. 42-2 schematically illustrates a top view of FIG. 42-1.

Figures 1, 43:
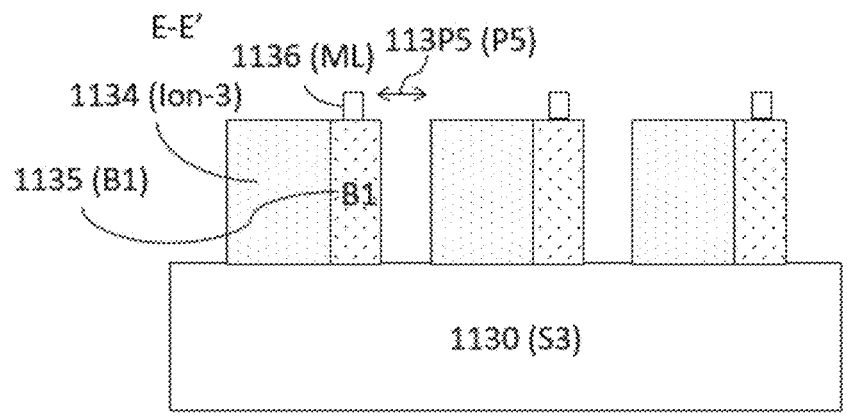
Figures 2, 43:
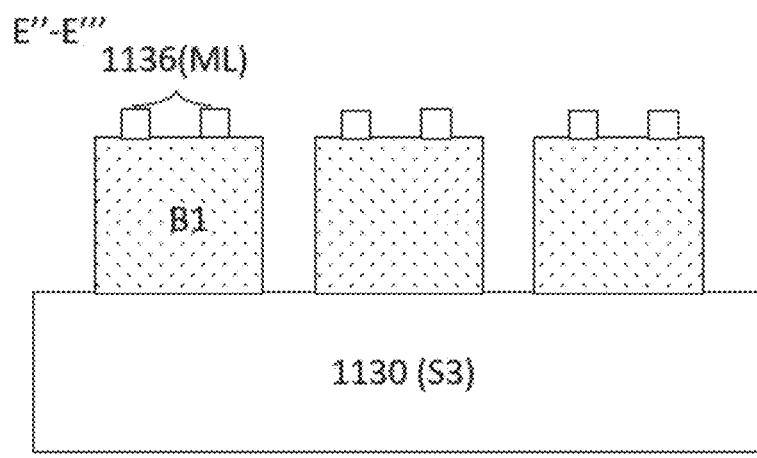
Figures 3, 43:
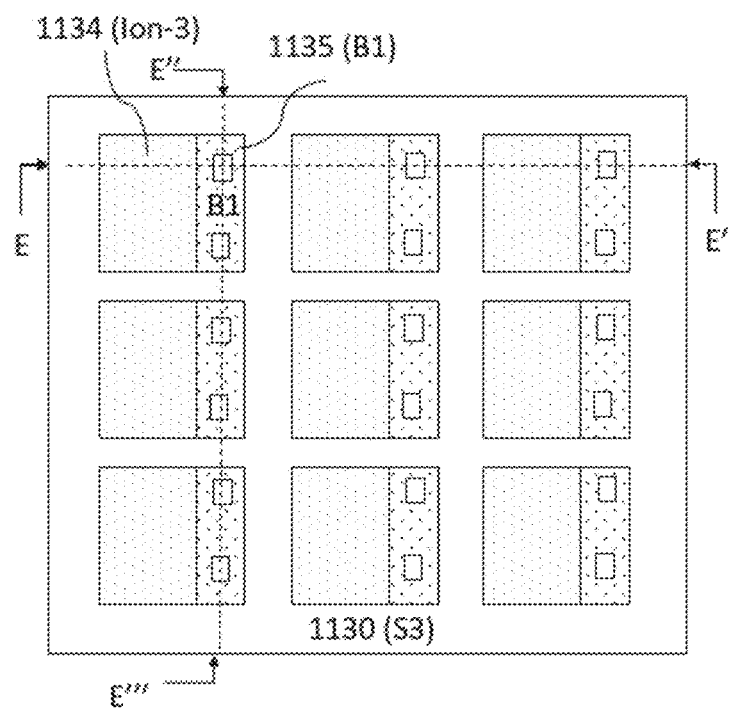

FIG. 43-1 schematically illustrates a horizontal cross-sectional view along line E-E', wherein a conductive layer is formed on the third sub-pixel area.

FIG. 43-2 schematically illustrates a horizontal cross-sectional view along line E"-E"'.

FIG. 43-3 schematically illustrates a top view of FIG. 43-1.

Figures 1, 44:
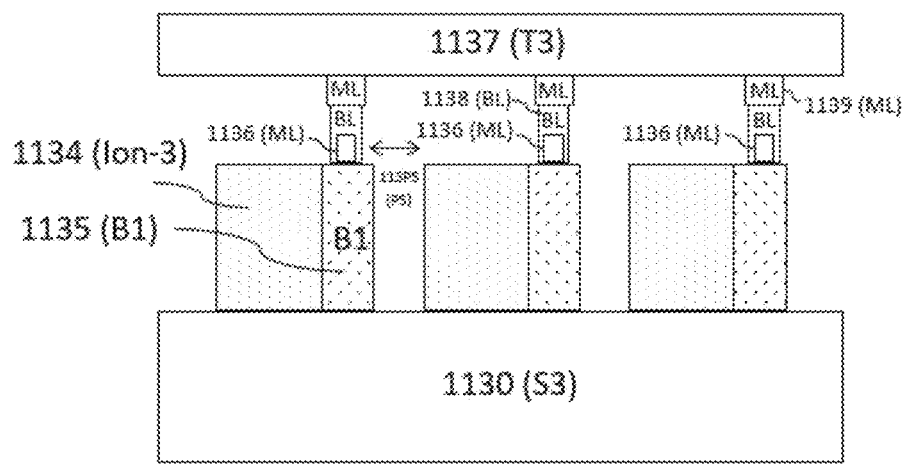
Figures 2, 44:
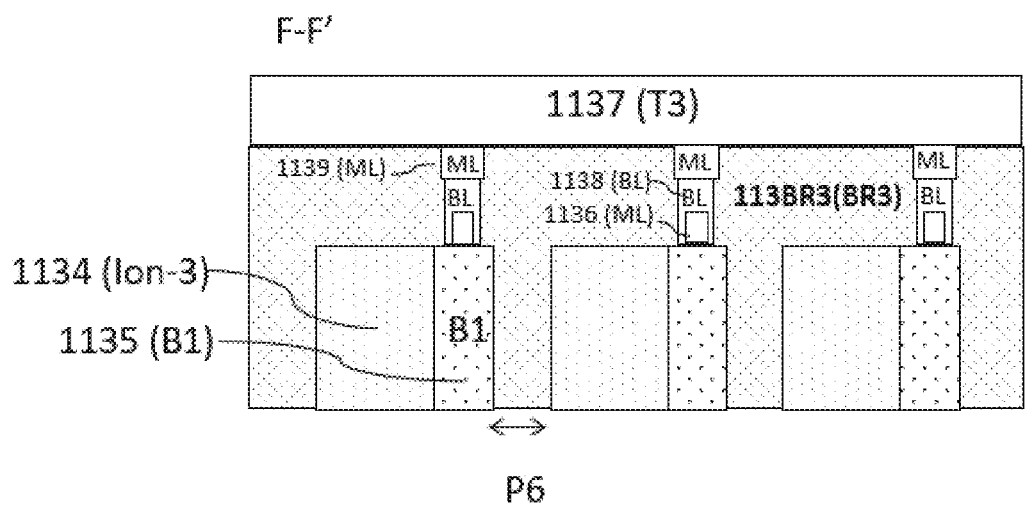
Figures 3, 44:
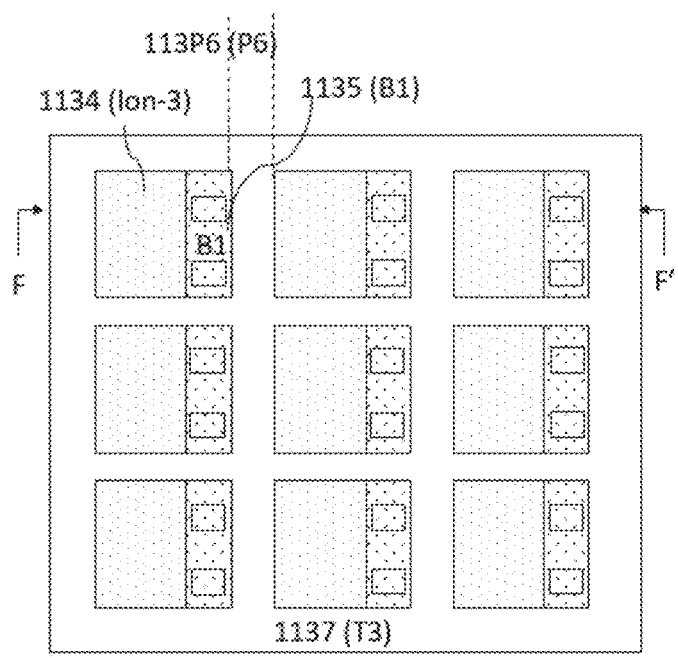

FIG. 44-1 schematically illustrates electrically connecting the third sub-pixel area including conductive layer structure and a third transparent substrate through bonding pads.

FIG. 44-2 schematically illustrates removing the third epitaxial substrate, and filling a third light-transmissive intermediate layer between the third transparent substrate and the third sub-pixel area.

FIG. 44-3 schematically illustrates a top view of FIG. 44-1.

Figures 1, 45:
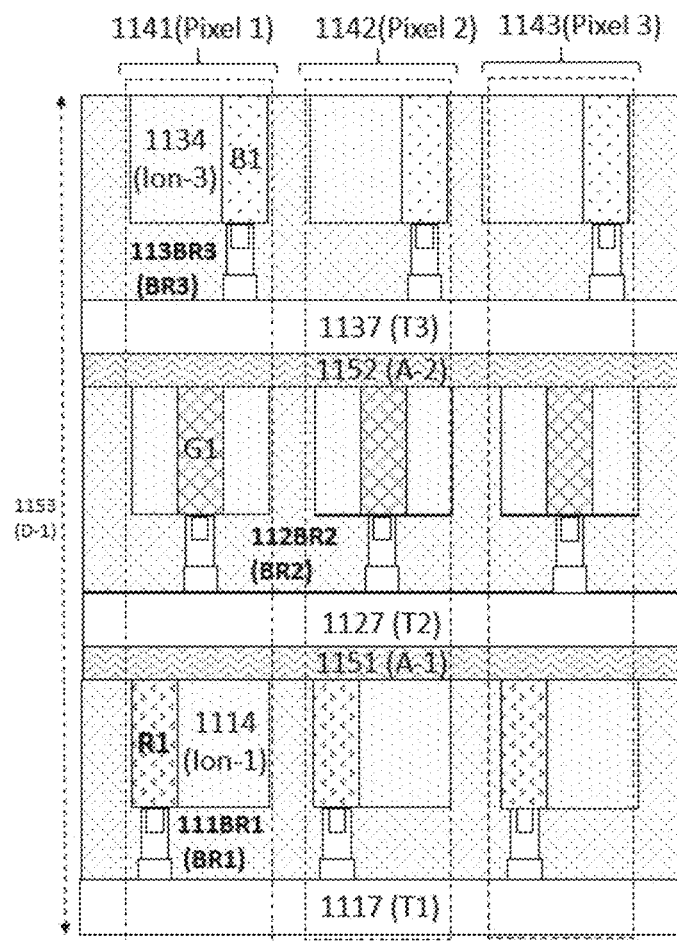
Figures 2, 45:
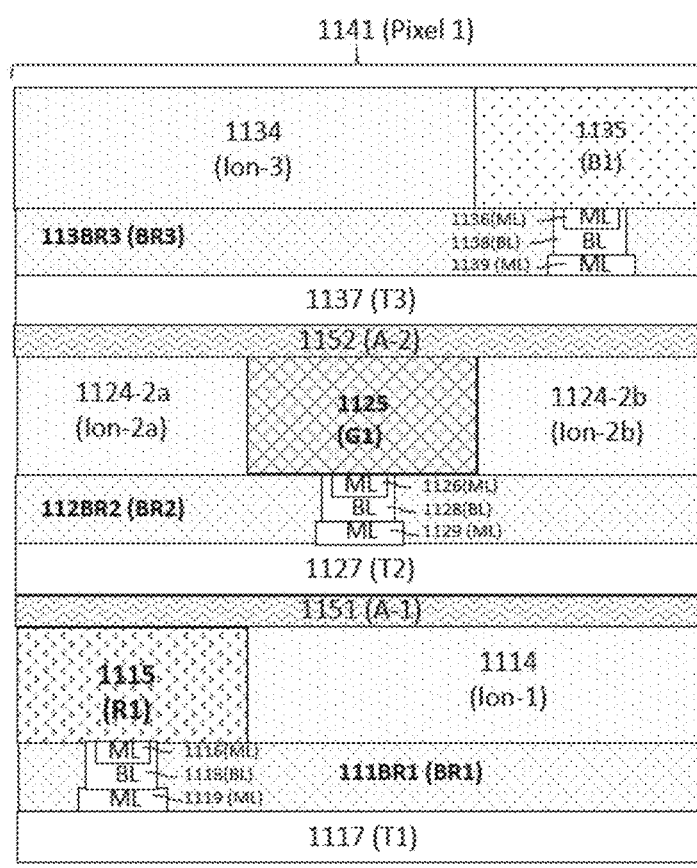
Figures 3, 45:
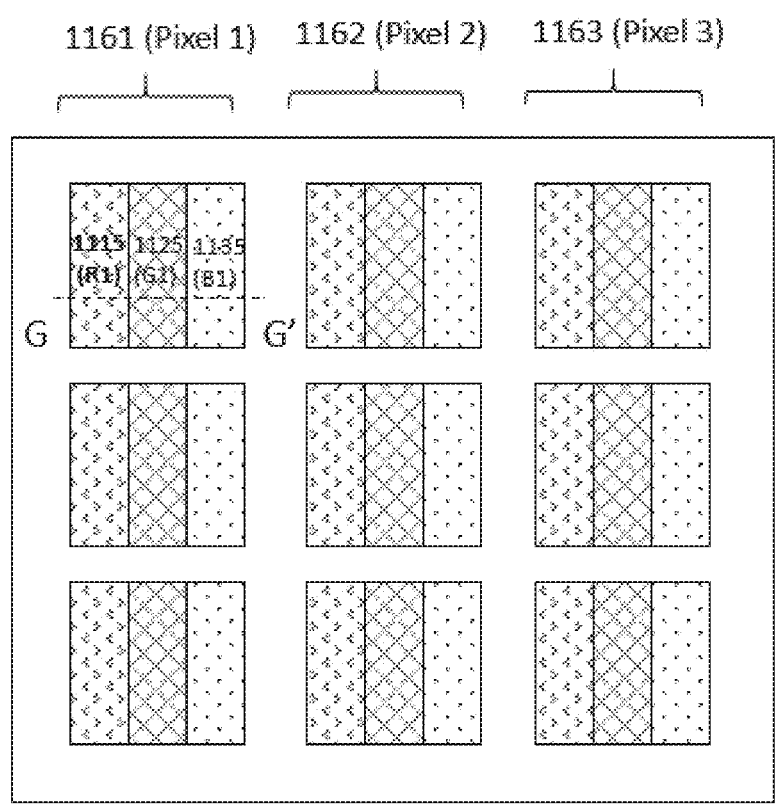

FIG. 45-1 schematically illustrates stacking a first sub-pixel structure, a second sub-pixel structure, and a third sub-pixel structure by light light-transmissive adhesive layers (A-1 and A-2) to form a three-dimensional stack of RGB pixels array, thereby achieving the micro light emitting diode.

FIG. 45-2 schematically illustrates an enlargement horizontal cross-sectional view of a first pixel along line G-G'.

FIG. 45-3 schematically illustrates a top view of FIG. 45-2.

Figures 1, 46:
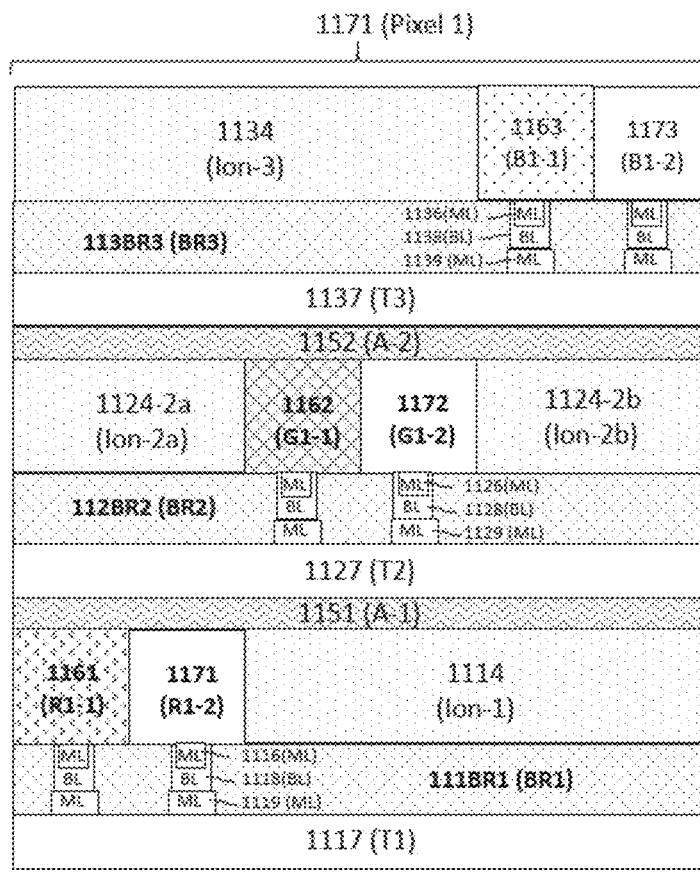
Figures 2, 46:
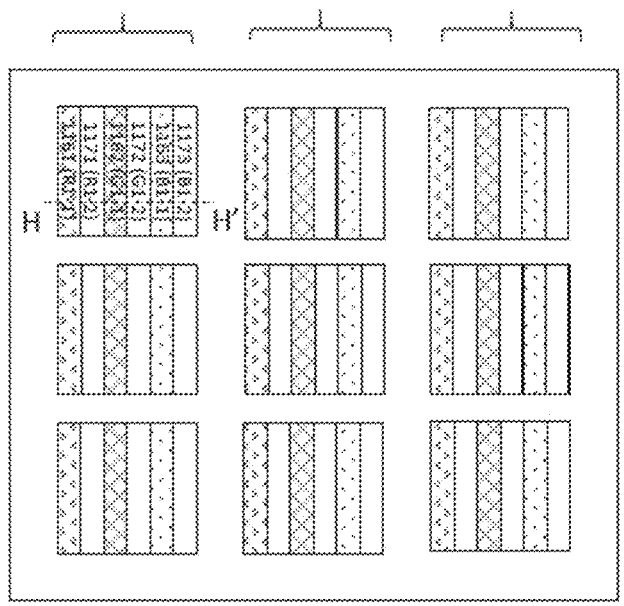

FIG. 46-1 schematically illustrates a horizontal cross-sectional view along line H-H' according to another embodiment of the present invention, wherein R1-1 is the first sub-pixel, R1-2 is the first redundancy sub-pixel, G1-1 is the second sub-pixel, G1-2 is the second redundancy sub-pixel, B1-1 is the third sub-pixel, and B1-2 is the third redundancy sub-pixel.

FIG. 46-2 schematically illustrates a top view of FIG. 46-1.

Figures 1, 47:
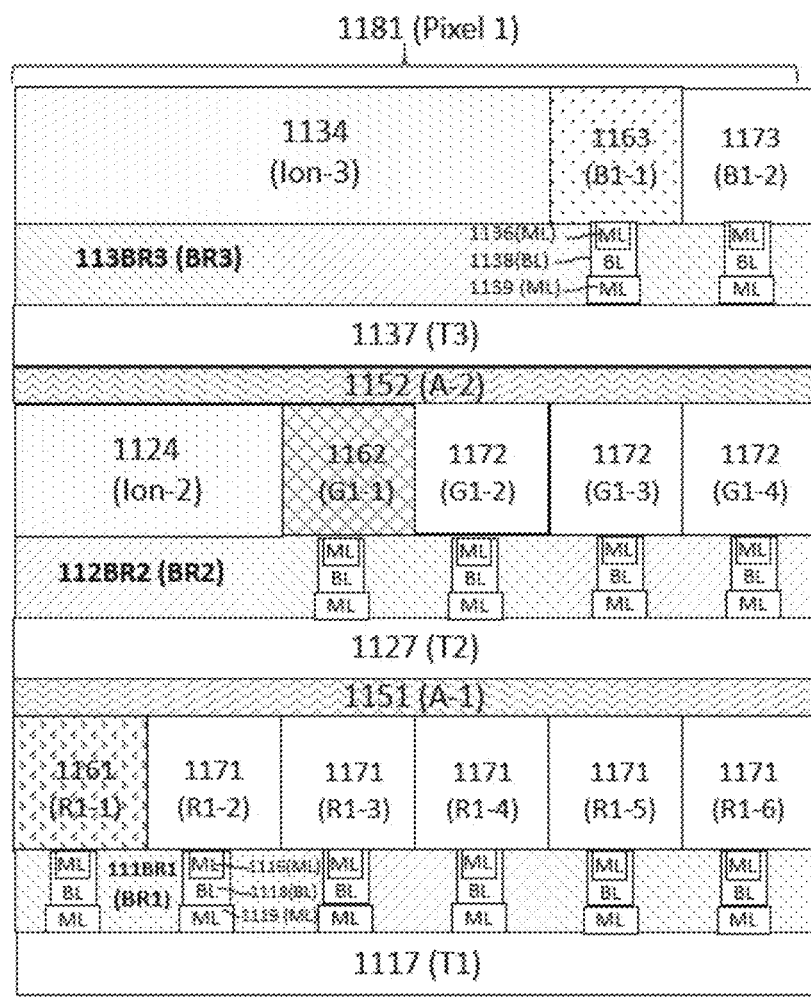
Figures 2, 47:
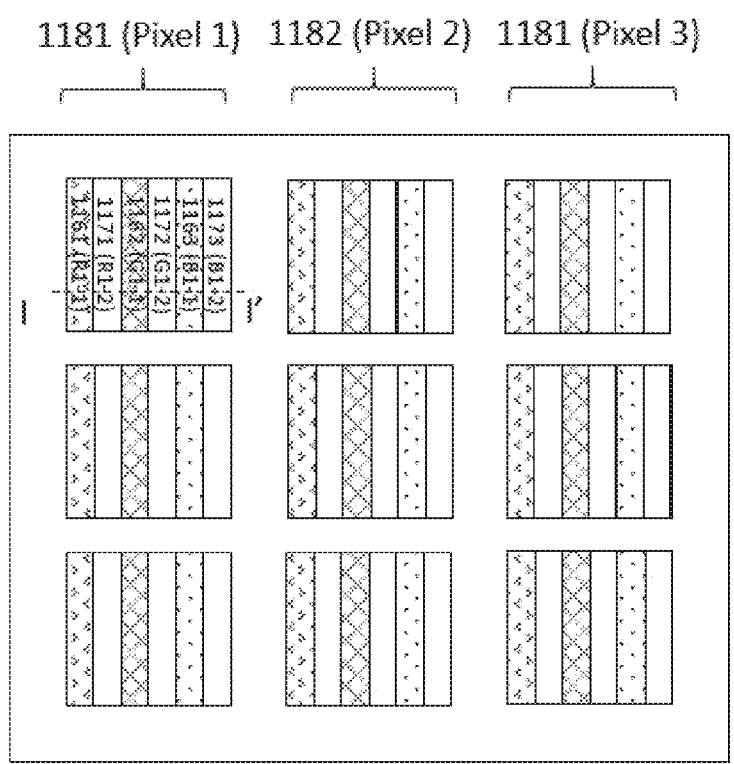

FIG. 47-1 schematically illustrates a horizontal cross-sectional view along line I-I' according to another embodiment of the present invention, wherein R1-1 is first sub-pixel, R1-2, R1-3, R1-4, R1-5 and R1-6 are first redundancy sub-pixels, G1-1 is second sub-pixel, G1-2, G1-3 and G1-4 are second redundancy sub-pixels, B1-1 is third sub-pixel, and B1-2 is third redundancy sub-pixel.

FIG. 47-2 schematically illustrates a top view of FIG. 47-1.

Figures 1, 48:
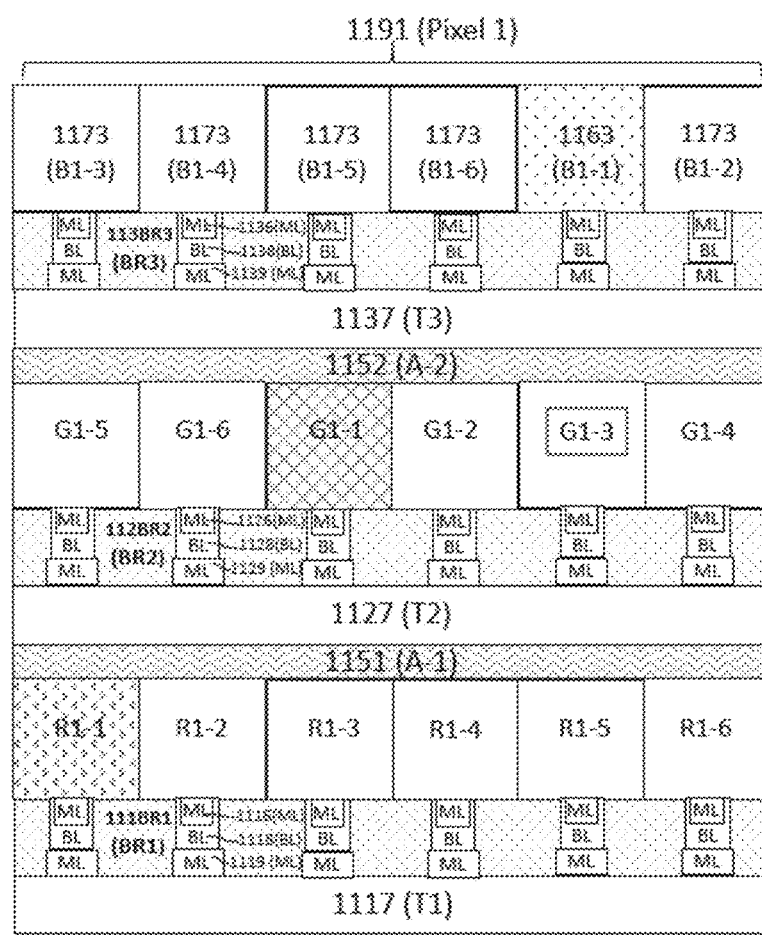
Figures 2, 48:
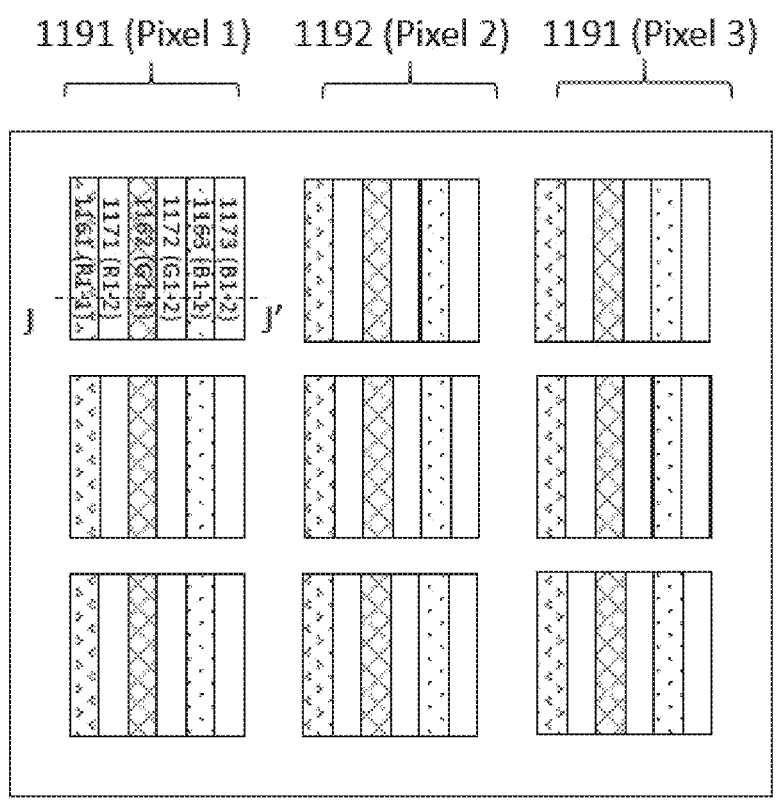

FIG. 48-1 schematically illustrates a horizontal cross-sectional view along line J-J' according to another embodiment of the present invention, wherein R1-1 is first sub-pixel, R1-2, R1-3, R1-4, R1-5 and R1-6 are first redundancy sub-pixels, G1-1 is second sub-pixel, G1-2, G1-3, G1-4, G1-5 and G1-6 are second redundancy sub-pixels, B1-1 is third sub-pixel, and B1-2, B1-3, B1-4, B1-5 and B1-6 are third redundancy sub-pixels.

FIG. 48-2 schematically illustrates a top view of FIG. 48-1.

Figures 1, 49:
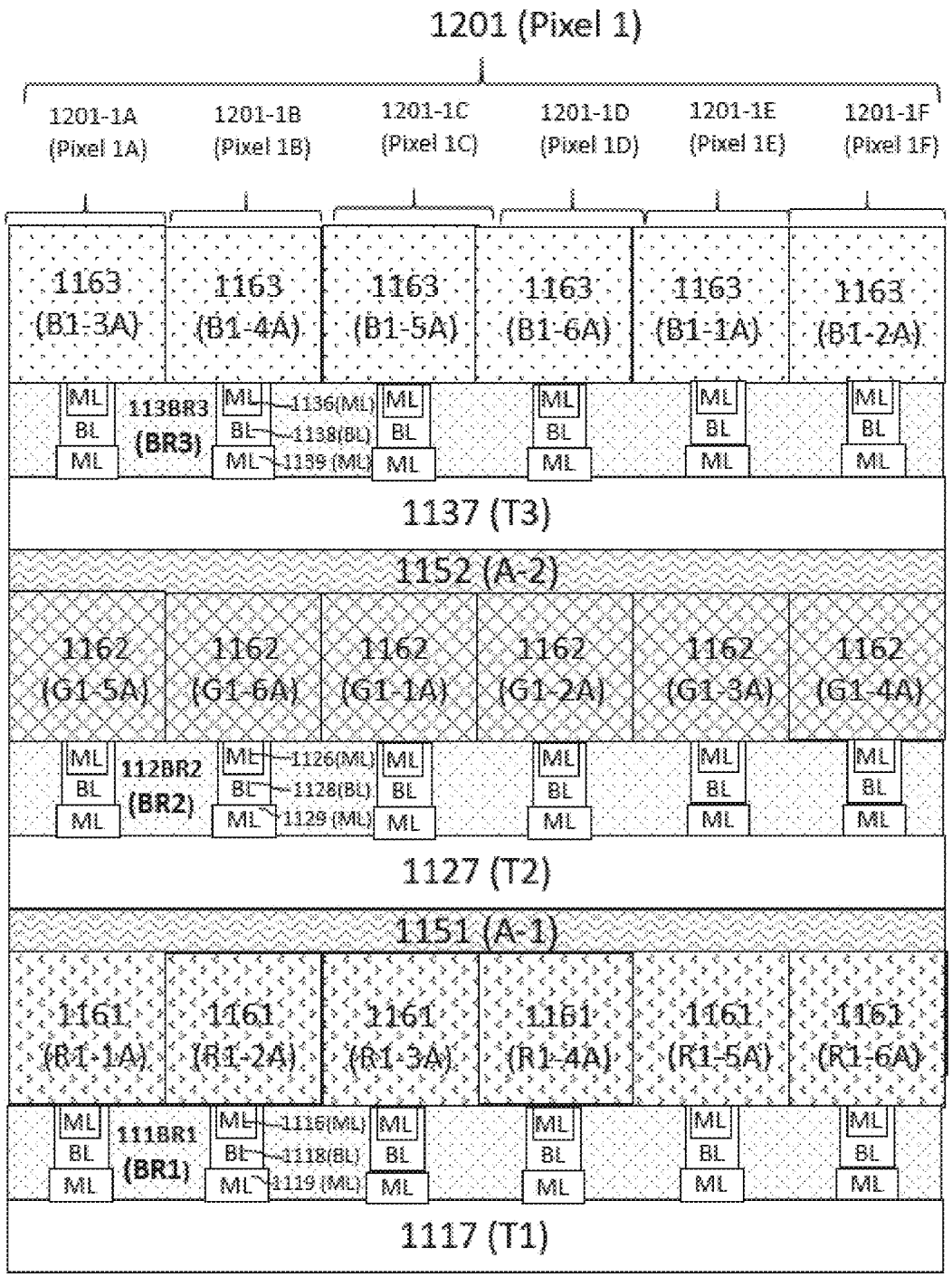
Figures 2, 49:
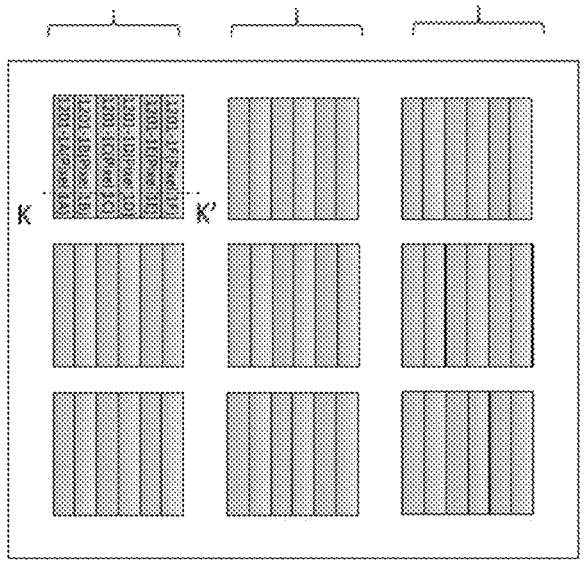

FIG. 49-1 schematically illustrates a horizontal cross-sectional view along line K-K' according to another embodiment of the present invention, wherein R1-1, R1-2, R1-3, R1-4, R1-5 and R1-6 are first sub-pixels, G1-1, G1-2, G1-3, G1-4, G1-5 and G1-6 are second sub-pixels, and B1-1, B1-2, B1-3, B1-4, B1-5 and B1-6 are third sub-pixels.

FIG. 49-2 schematically illustrates a top view of FIG. 49-1.

Figure 50:
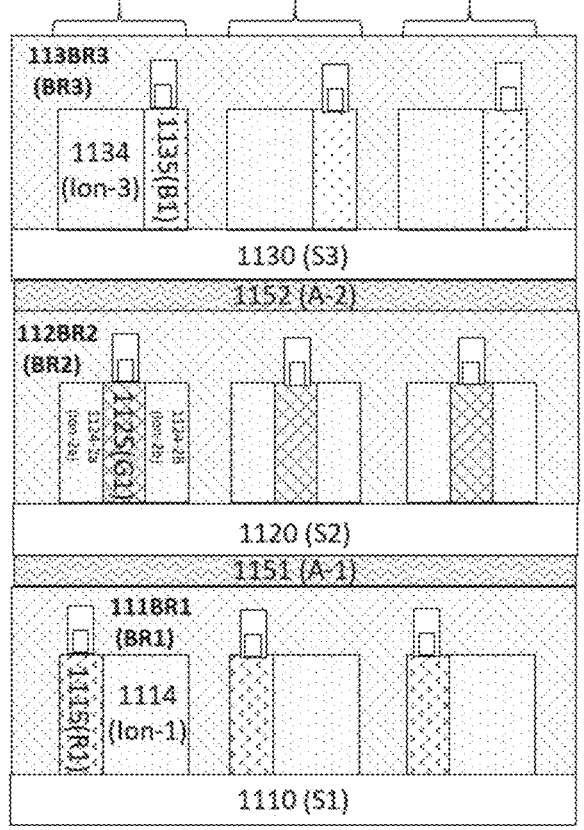

FIG. 50 schematically illustrates another embodiment of the present invention, wherein the epitaxial substrates (S1, S2 and S3) are transparent substrates, and the RGB micro light emitting diode may be directly stacked in 3D without transferring to a transparent substrate, thereby simplifying the process.

Figure 51:
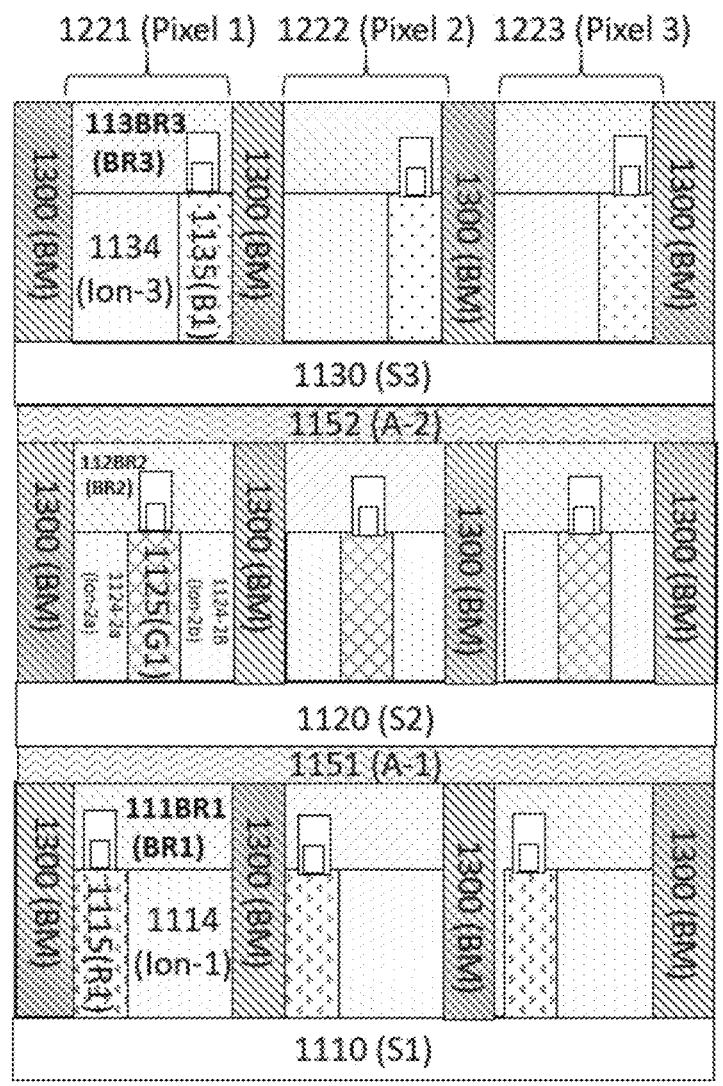

FIG. 51 schematically illustrates another embodiment of the present invention further including a black mattress layer to increase the contrast of pixels.

Figure 52:
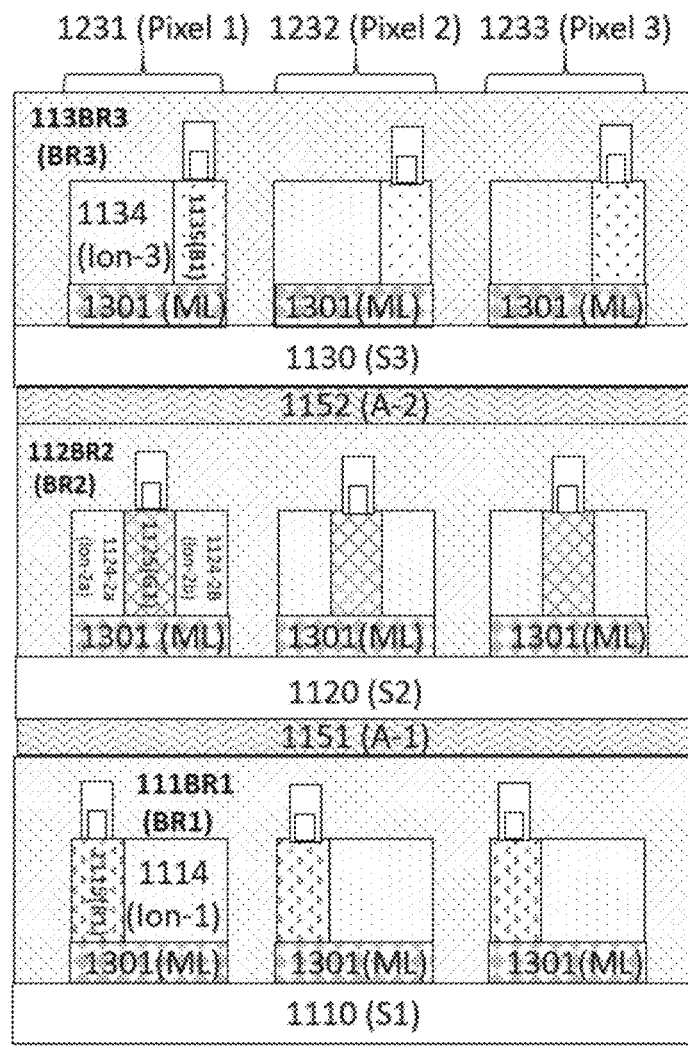

FIG. 52 schematically illustrates another embodiment of the present invention further including a magnetic layer in each of the micro light emitting diodes to increase precision of 3D stacking.

Figure 53:
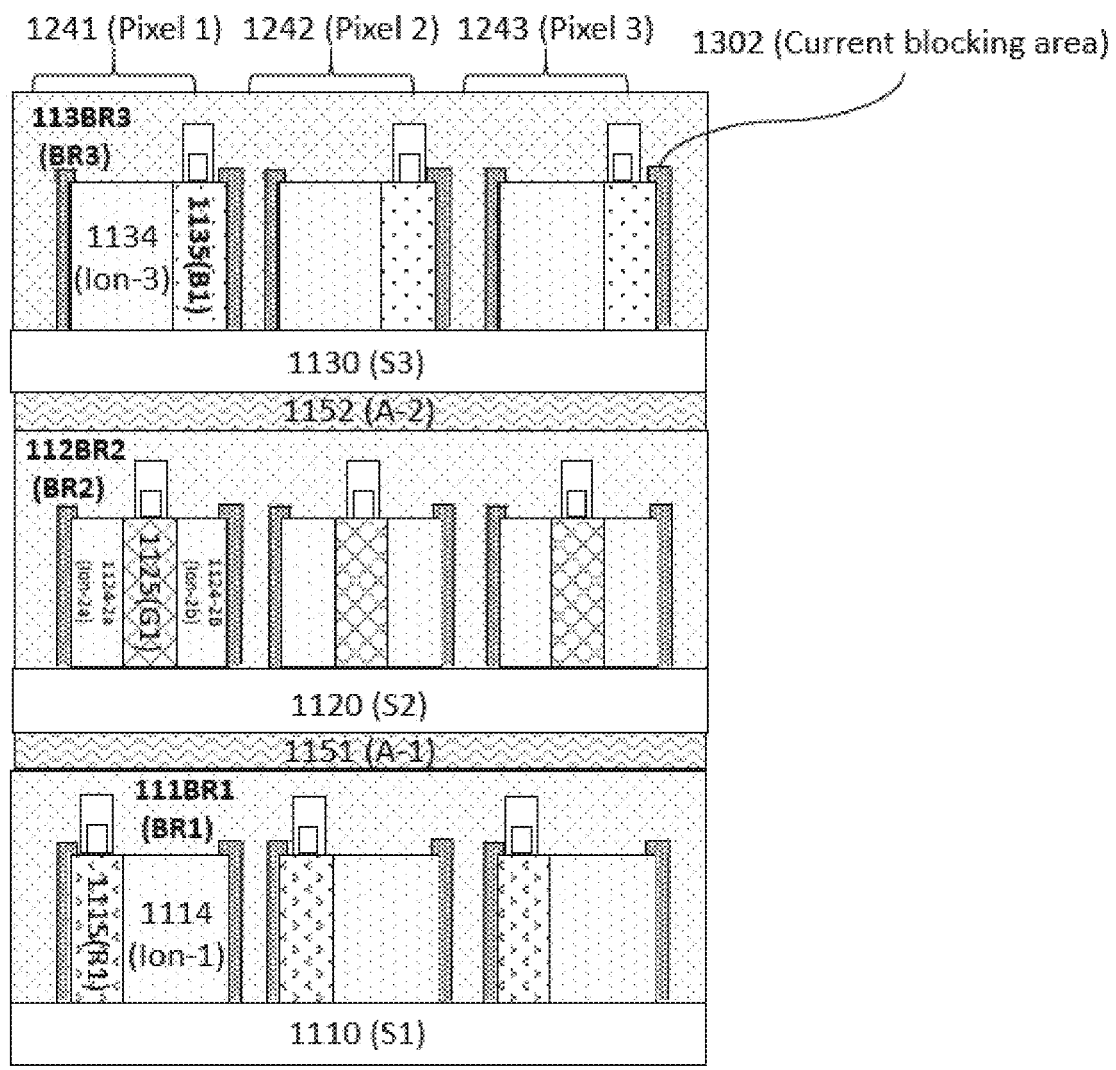

FIG. 53 schematically illustrates another embodiment of the present invention further including a current blocking area located at surface and side area of the micro light emitting diode in each of the micro light emitting diodes.

Figure 54:
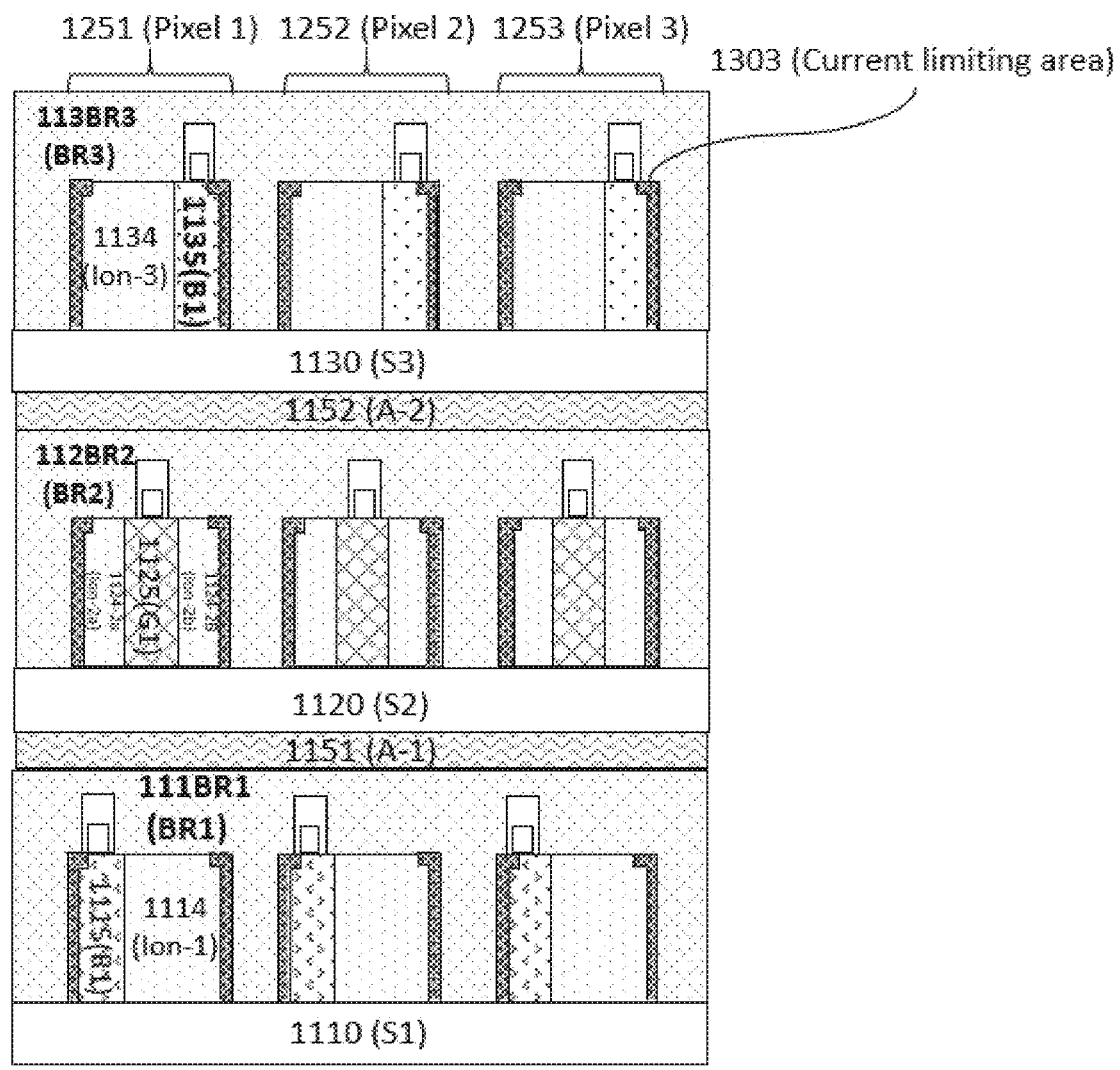

FIG. 54 schematically illustrates another embodiment of the present invention further including a current limiting area located at surface and side area of the micro light emitting diode in each of the micro light emitting diodes.

Figures 1, 55:
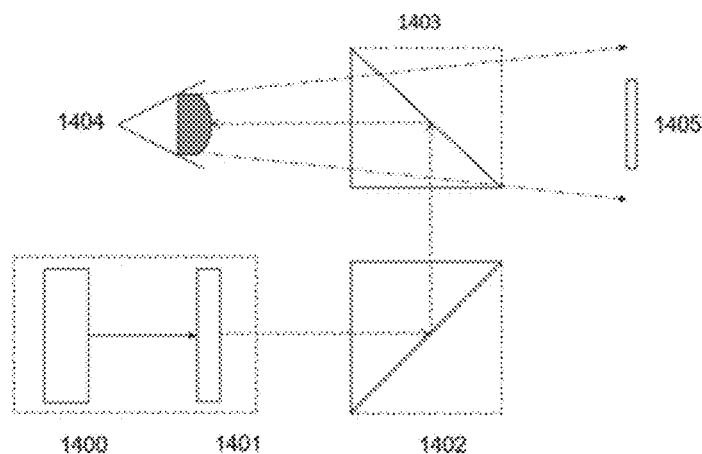
Figures 2, 55:
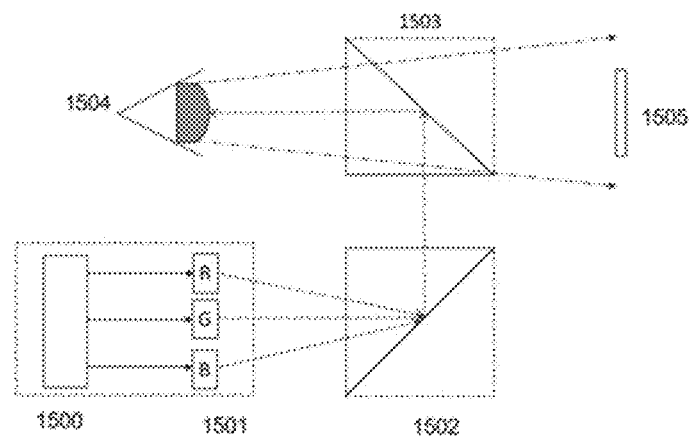
Figures 3, 55:
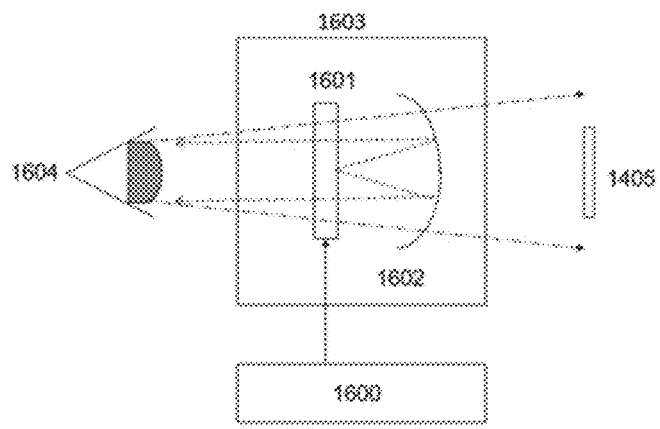
Figures 4, 55:
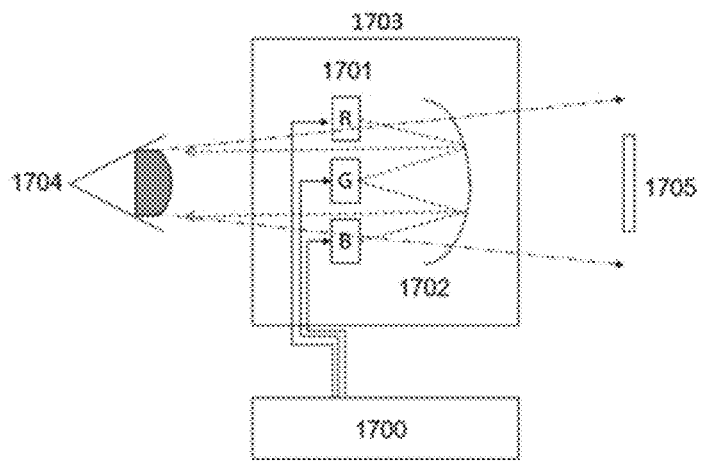
Figures 5, 55:
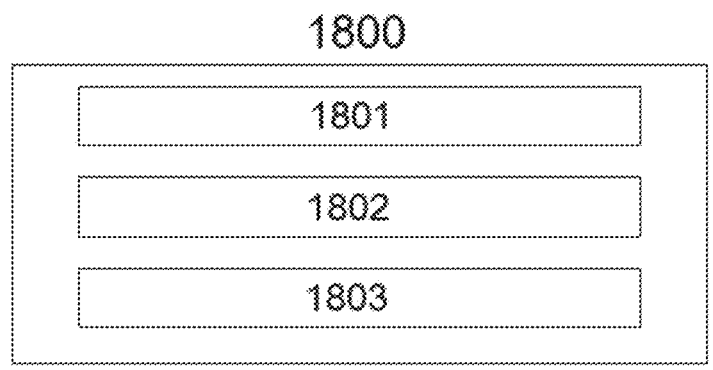

FIG. 55-1 schematically illustrates another embodiment of the present application which can be applied to augmented reality (AR).

FIG. 55-2 schematically illustrates another embodiment of the present application which can be applied to augmented reality (AR).

FIG. 55-3 schematically illustrates another embodiment of the present application which can be applied to augmented reality (AR).

Figures 4, 9:
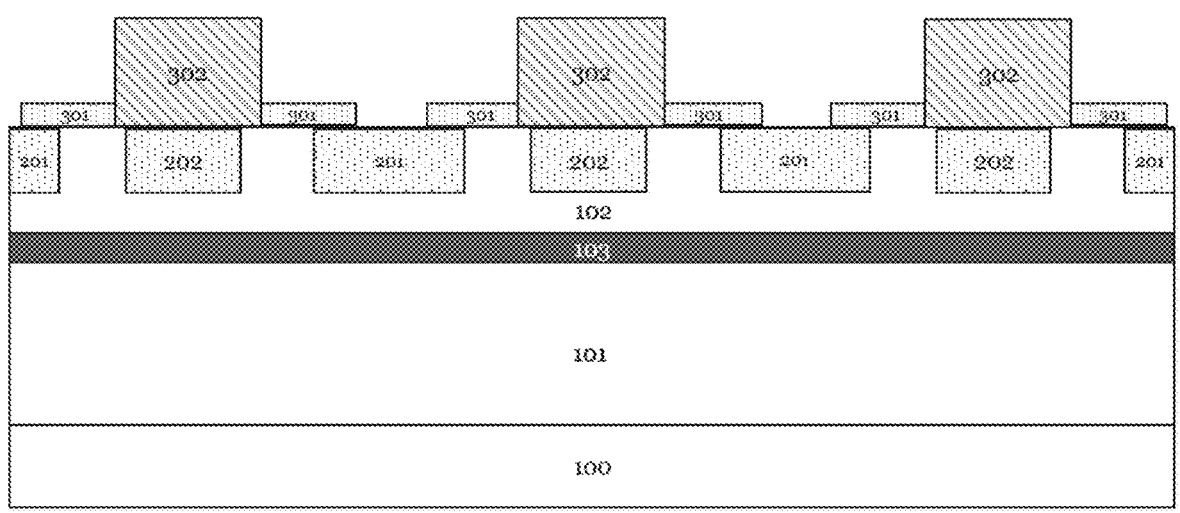

FIG. 55-4 schematically illustrates another embodiment of the present application which can be applied to augmented reality (AR).

Figures 5, 9:
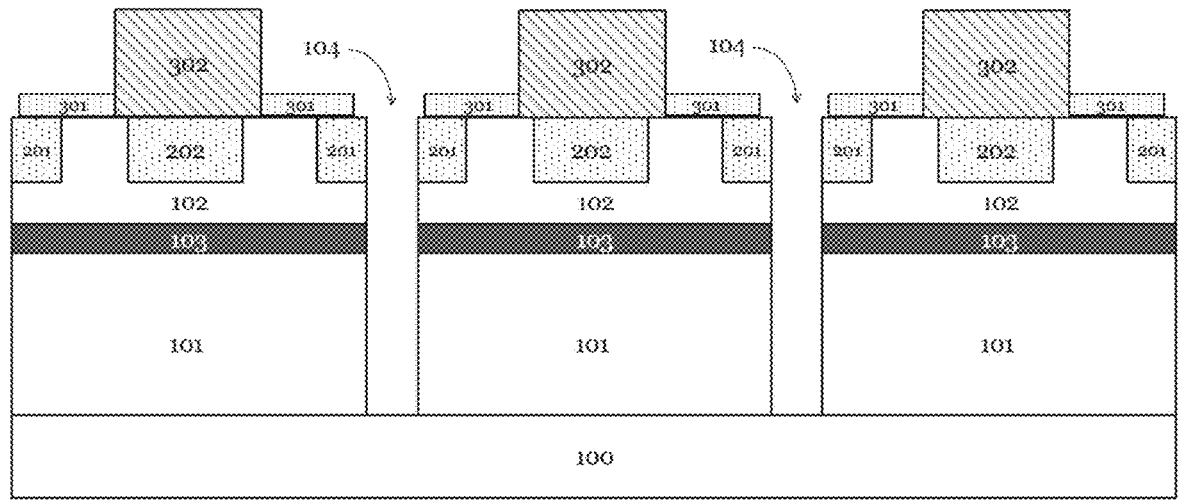

FIG. 55-5 schematically illustrates an integrated control system.

Figures 1, 56:
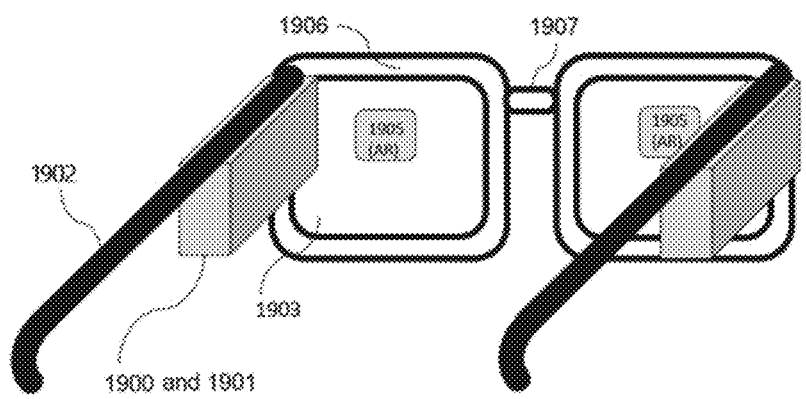
Figures 2, 56:
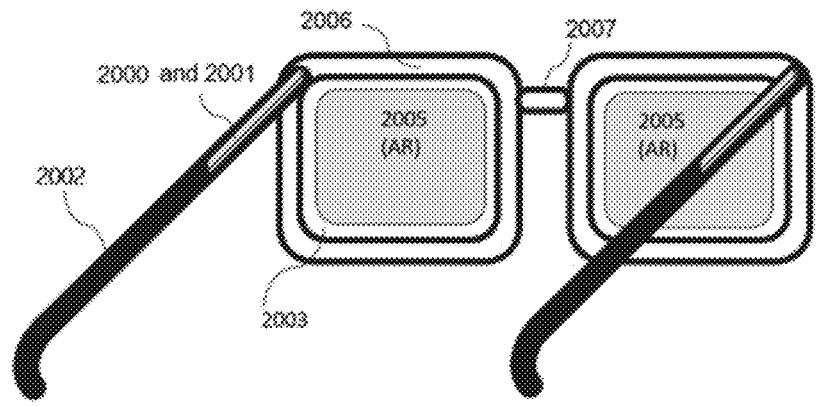
Figures 3, 56:
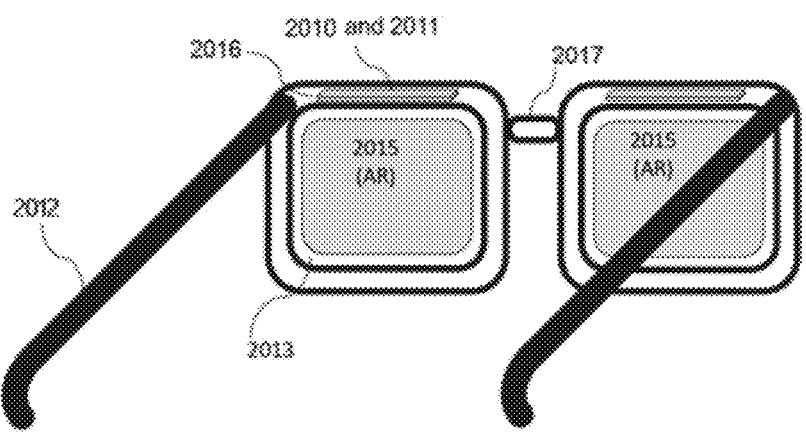
Figures 4, 56:
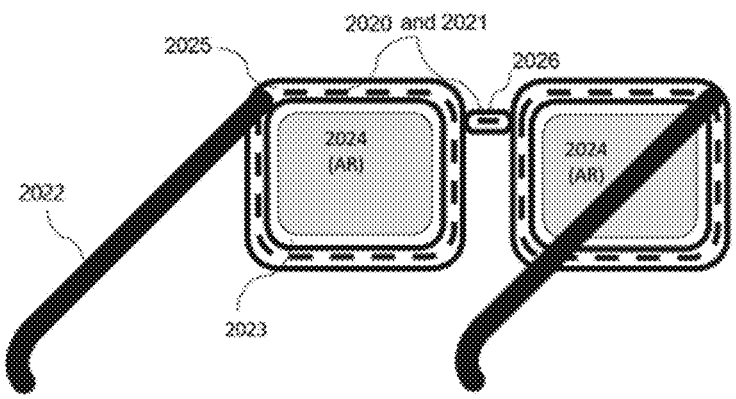
Figures 5, 56:
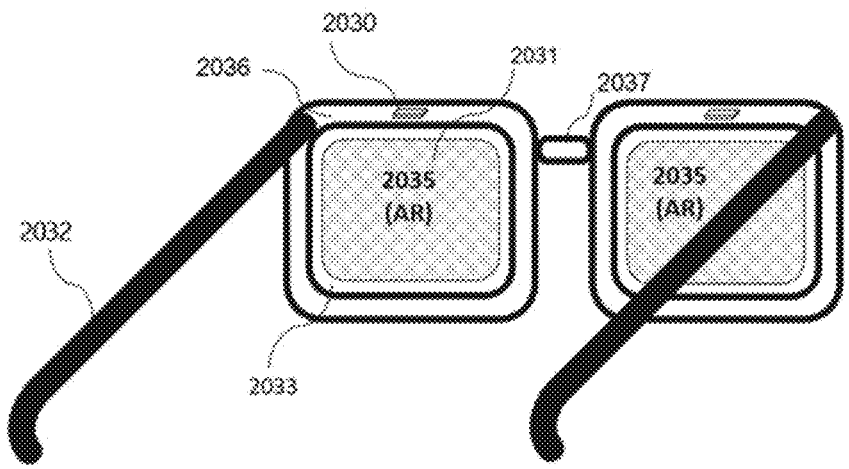

FIG. 56-1 schematically illustrates a smart glass structure.

FIG. 56-2 schematically illustrates an embodiment of the present invention which is applied to the smart glass structure.

FIG. 56-3 schematically illustrates an embodiment of the present invention which is applied to the smart glass structure.

FIG. 56-4 schematically illustrates an embodiment of the present invention which is applied to the smart glass structure.

FIG. 56-5 schematically illustrates an embodiment of the present invention which is applied to the smart glass structure.

Figures 1, 57:
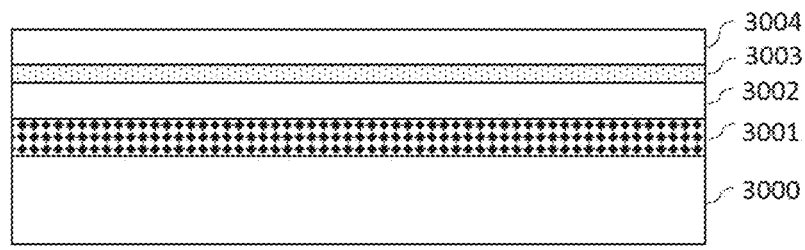
Figures 2, 57:
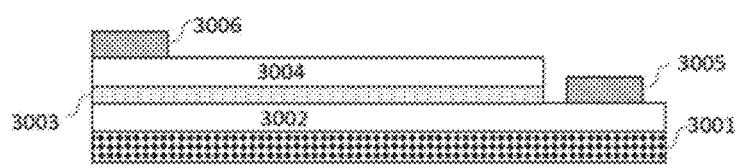
Figures 3, 57:
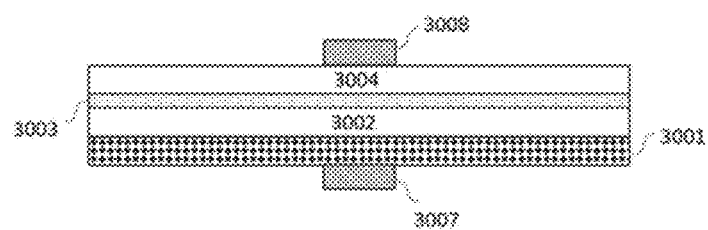
Figures 4, 57:
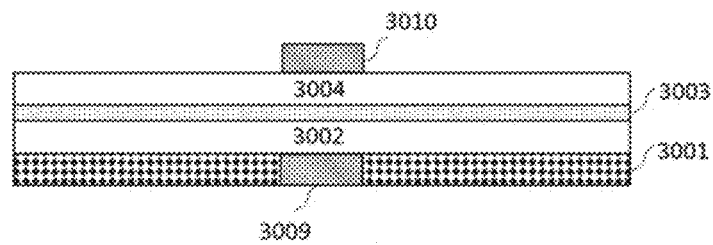
Figures 5, 57:
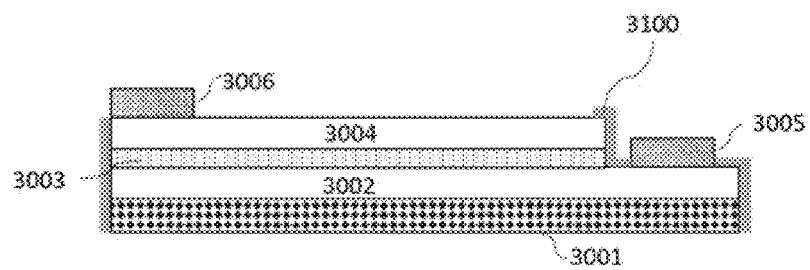
Figures 6, 57:
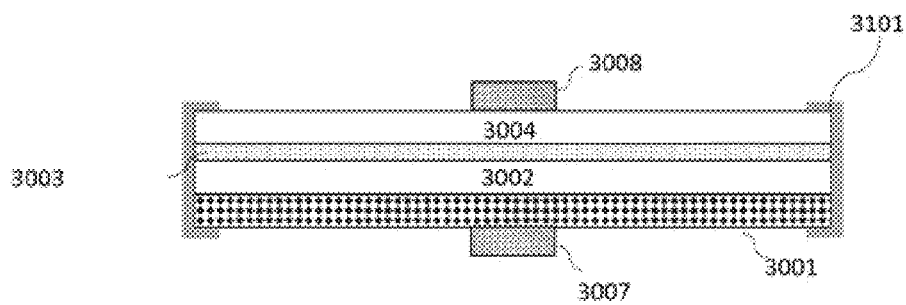
Figures 7, 57:
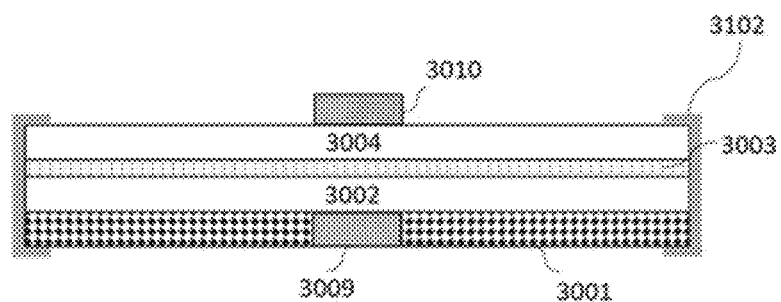
Figures 8, 57:
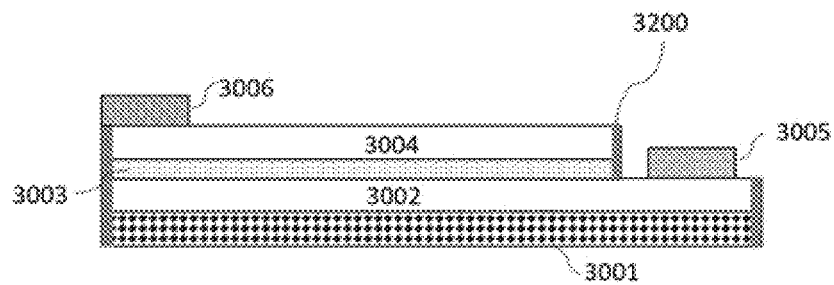
Figures 9, 57:
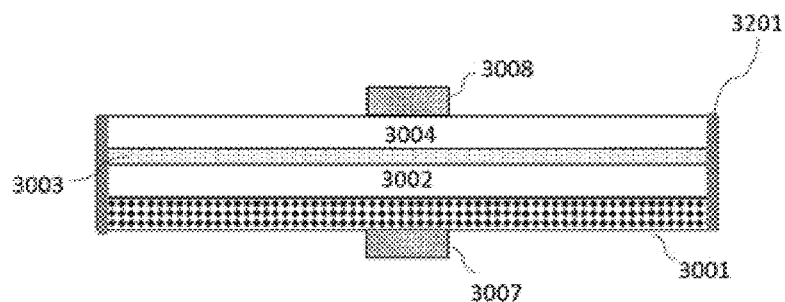
Figures 10, 57:
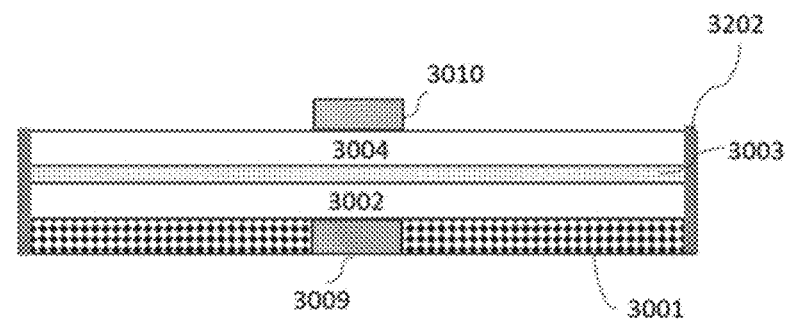
Figures 11, 57:
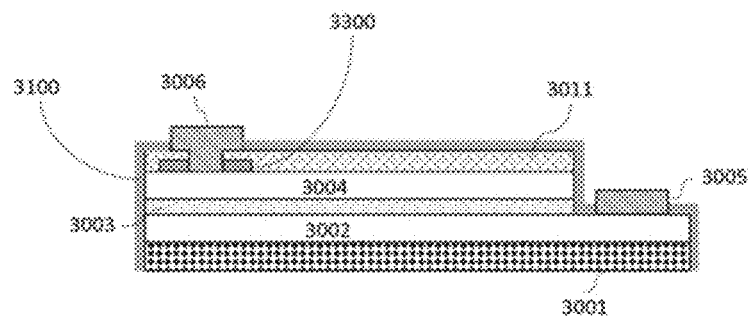
Figures 12, 57:
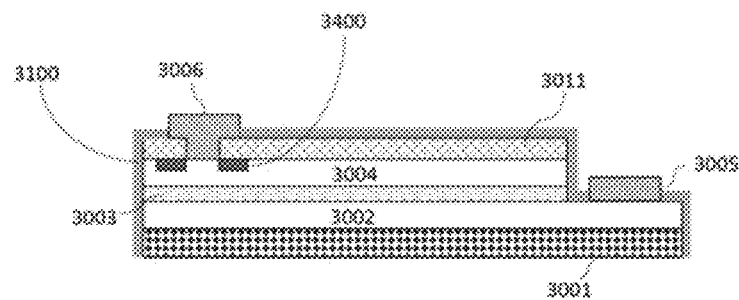
Figures 13, 57:
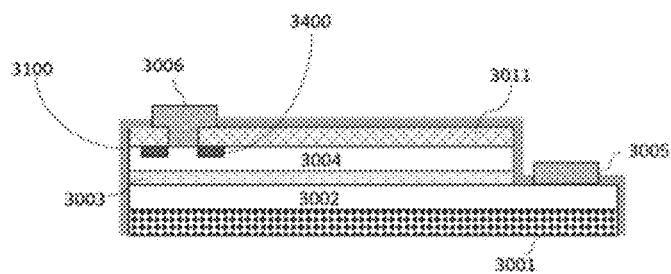
Figures 14, 57:
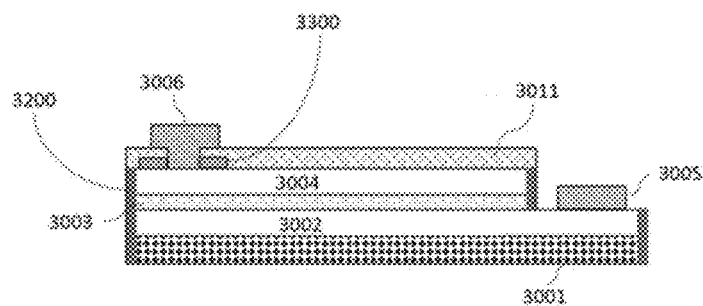
Figures 15, 57:
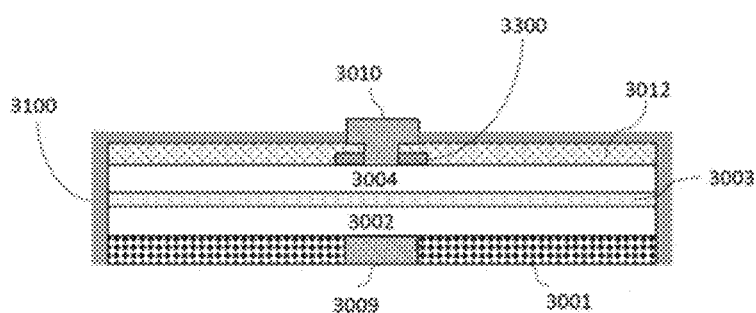
Figures 16, 57:
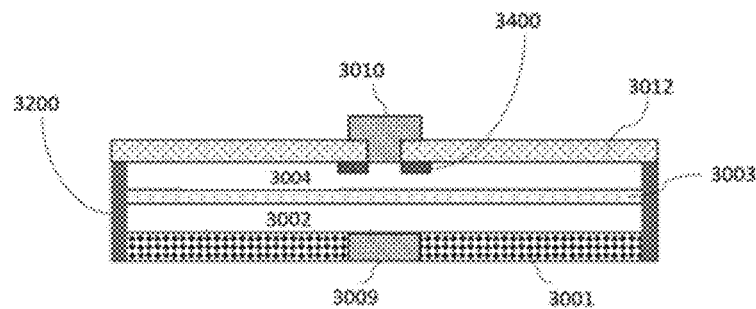
Figures 17, 57:
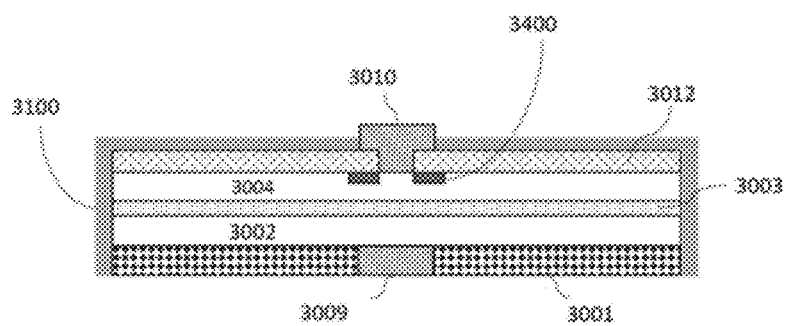
Figures 18, 57:
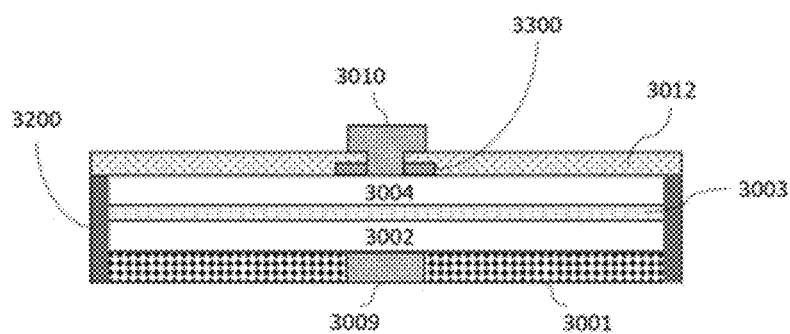

FIG. 57-1 schematically illustrates a micro light emitting diode structure including magnetic layer.

FIG. 57-2 schematically illustrates a lateral magnetic micro light emitting diode structure.

FIG. 57-3 schematically illustrates a vertical magnetic micro light emitting diode structure.

FIG. 57-4 schematically illustrates another vertical magnetic micro light emitting diode structure.

FIG. 57-5 schematically illustrates a lateral magnetic micro light emitting diode structure, further including a first current blocking layer.

Figures 6, 9:
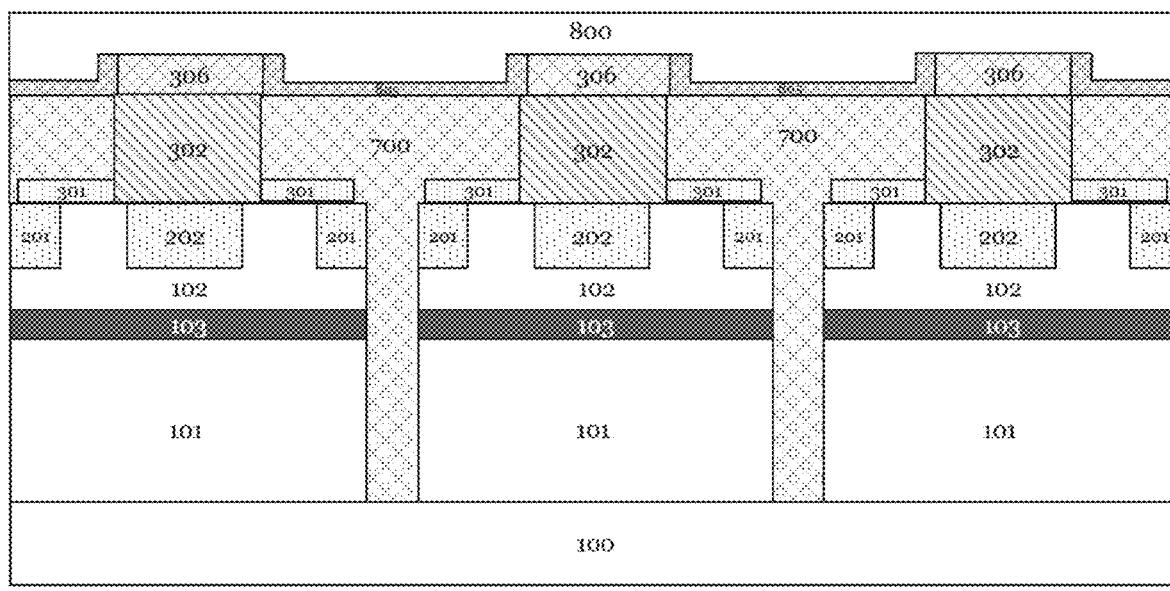

FIG. 57-6 schematically illustrates a vertical magnetic micro light emitting diode structure, further including a first current blocking layer.

Figures 7, 9:
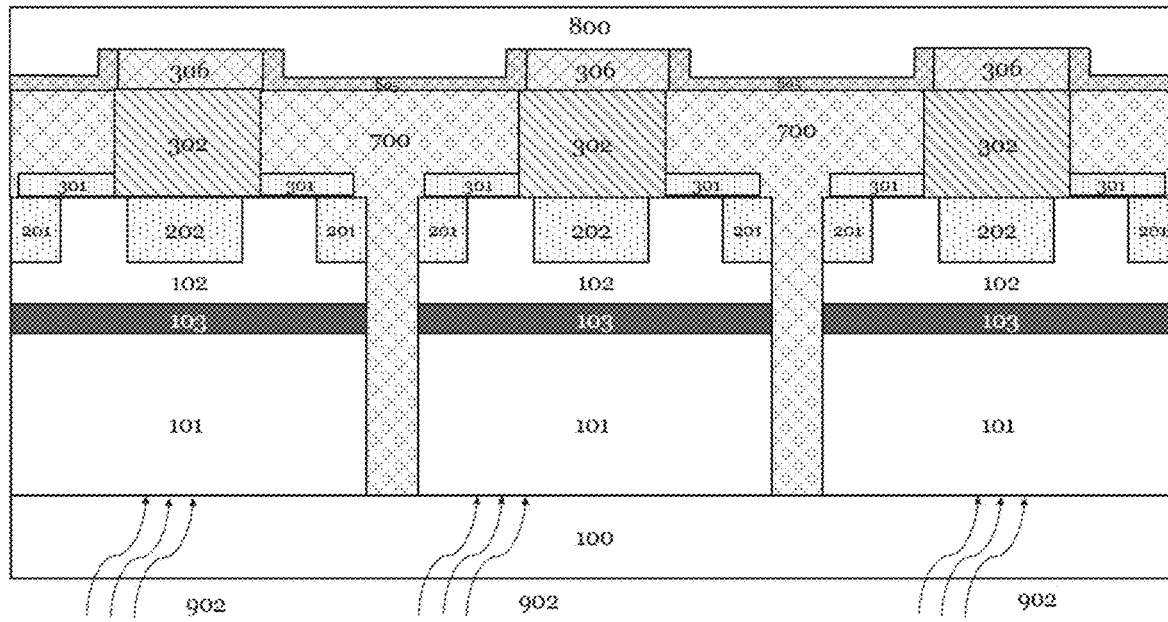

FIG. 57-7 schematically illustrates another vertical magnetic micro light emitting diode structure, further including a first current blocking layer.

Figures 8, 9:
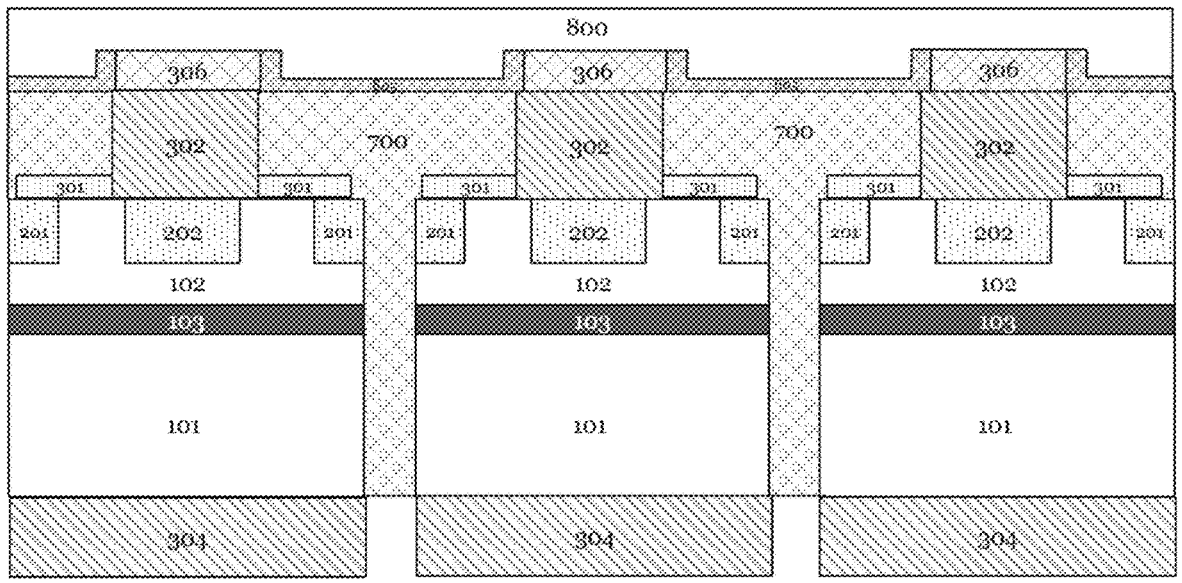
Figure 9:
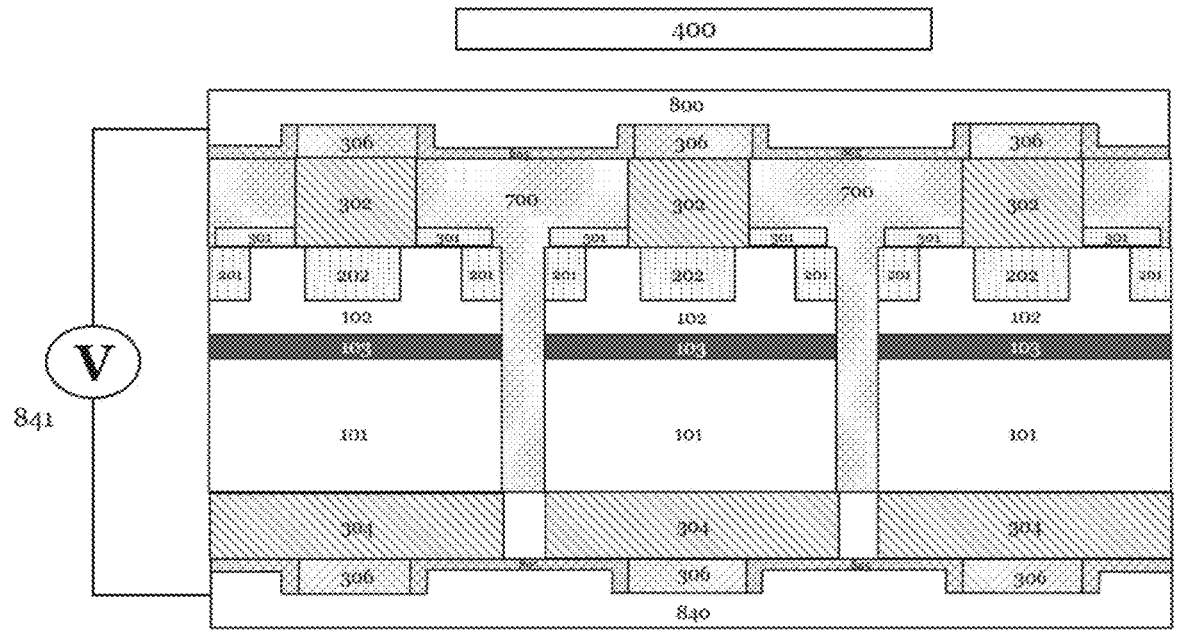

FIG. 57-8 schematically illustrates a lateral magnetic micro light emitting diode structure, further including a current limiting layer.

FIG. 57-9 schematically illustrates a vertical magnetic micro light emitting diode structure, further including a current limiting layer.

Figures 9, 10:
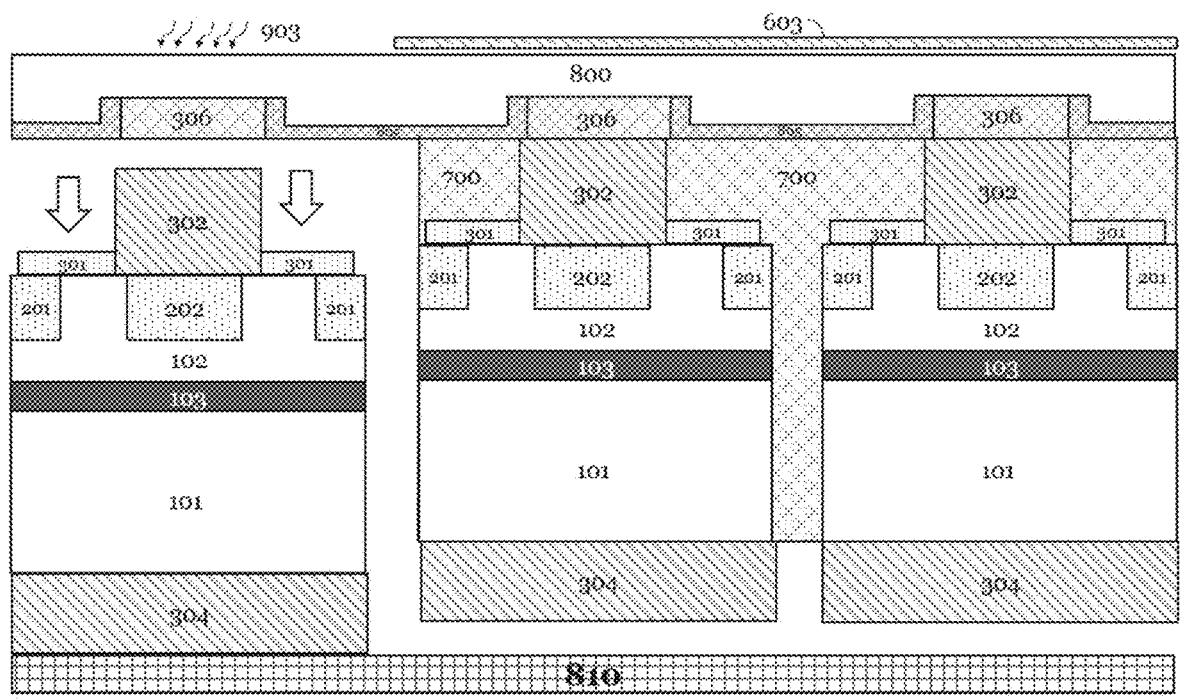

FIG. 57-10 schematically illustrates another vertical magnetic micro light emitting diode structure, further including a current limiting layer.

Figures 9, 10, 11:
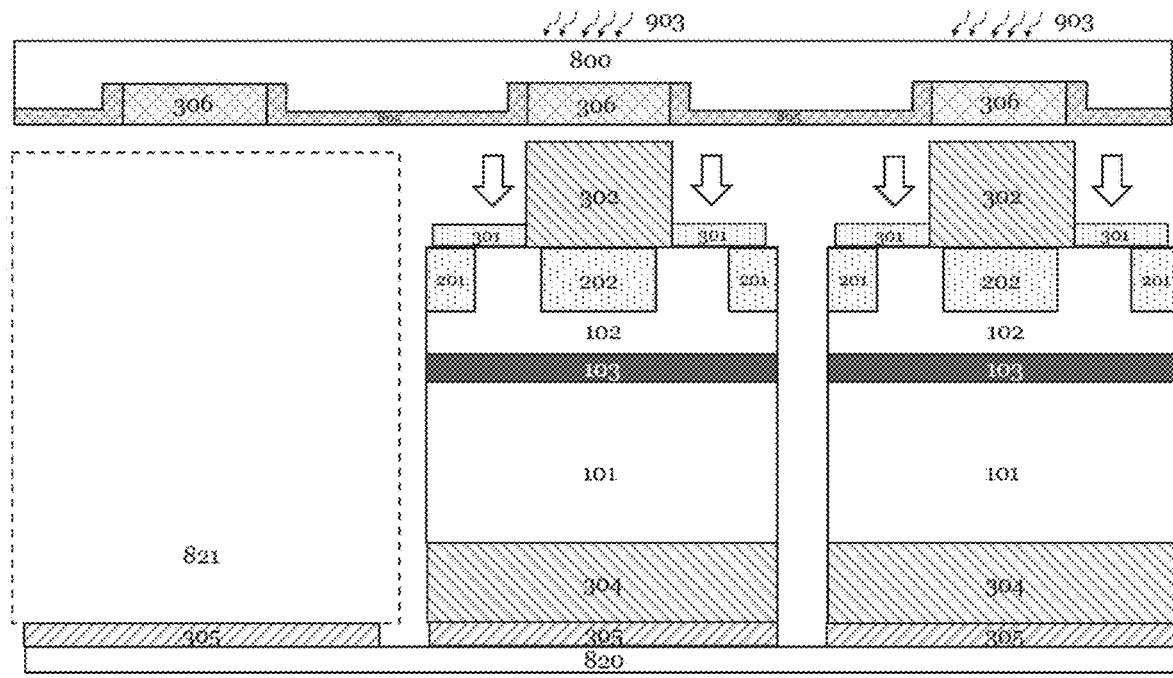

FIG. 57-11 schematically illustrates a lateral magnetic micro light emitting diode.

Figures 9, 10, 11, 12:
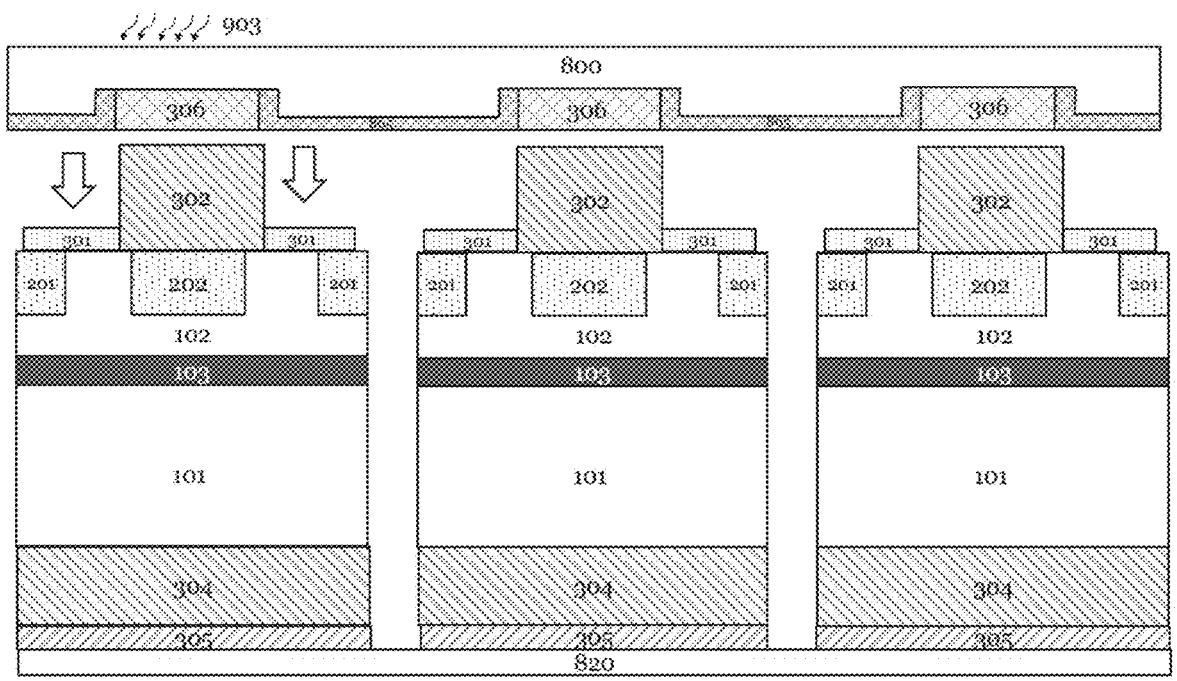

FIG. 57-12 schematically illustrates a lateral magnetic micro light emitting diode.

Figures 9, 10, 11, 12, 13:
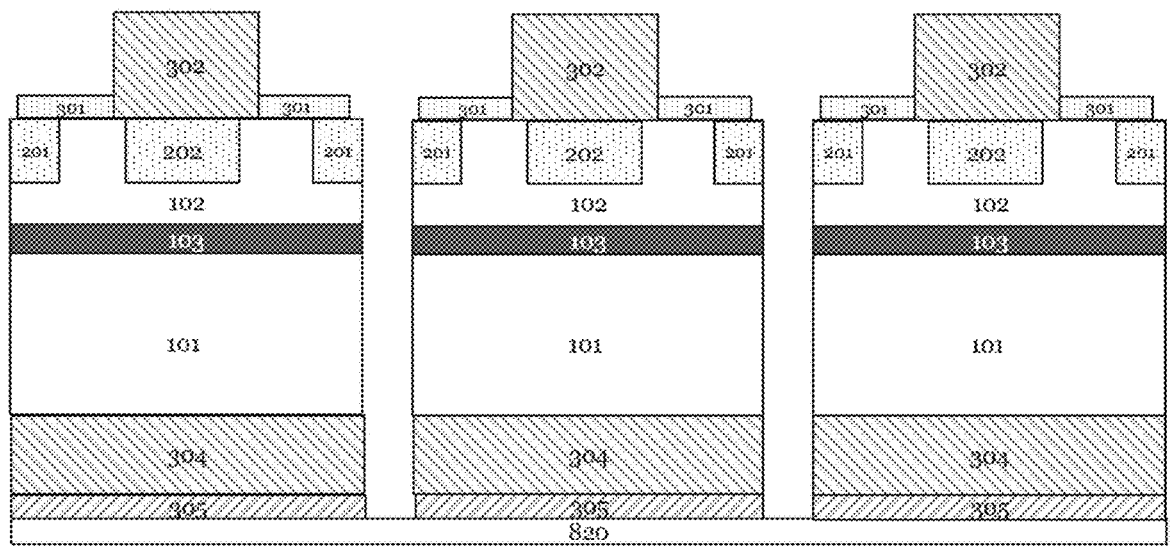

FIG. 57-13 schematically illustrates a lateral magnetic micro light emitting diode.

Figures 9, 10, 11, 12, 13, 14:
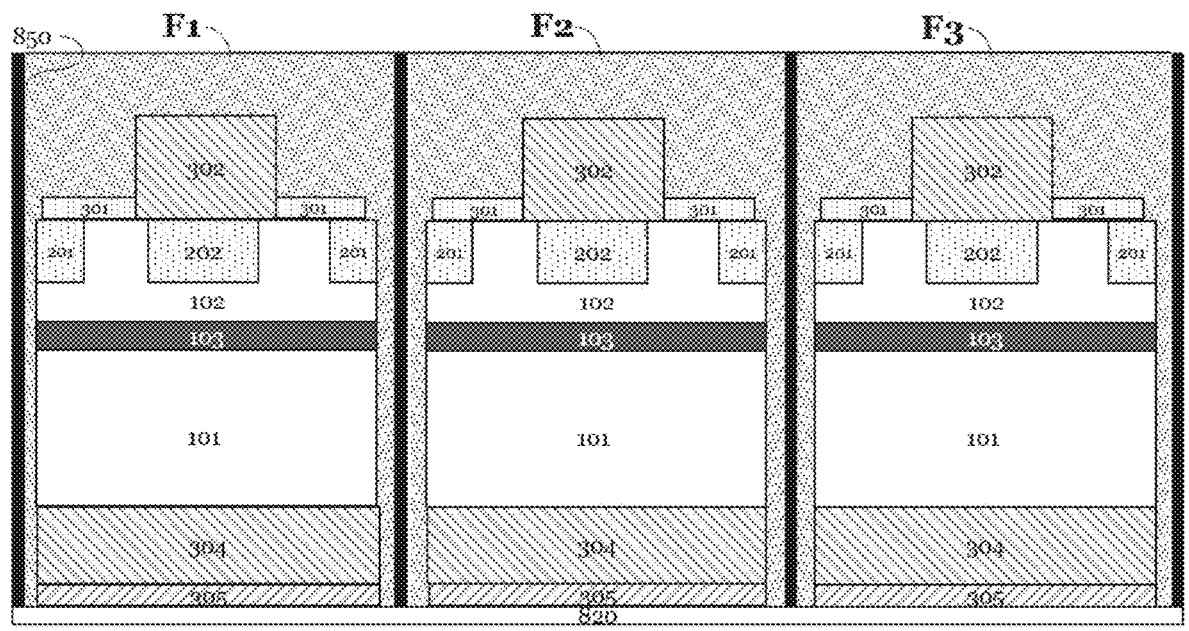

FIG. 57-14 schematically illustrates a lateral magnetic micro light emitting diode.

Figures 9, 10, 11, 12, 13, 14, 15:
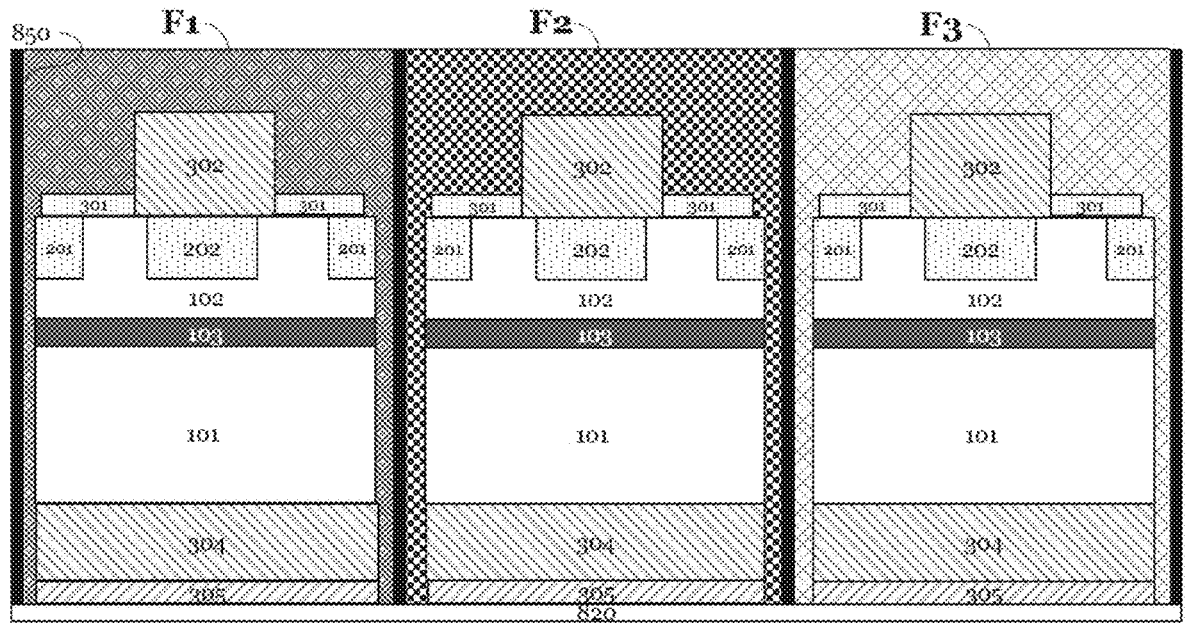

FIG. 57-15 schematically illustrates a vertical magnetic micro light emitting diode.

Figures 9, 10, 11, 12, 13, 14, 15, 16:
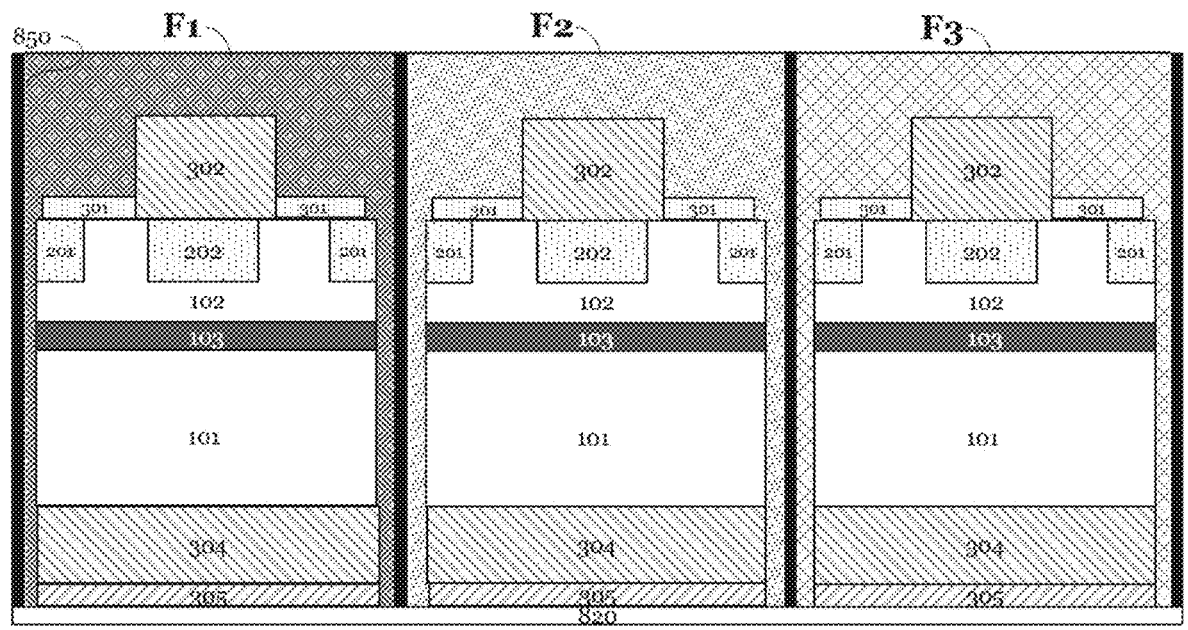
Figures 1, 10:
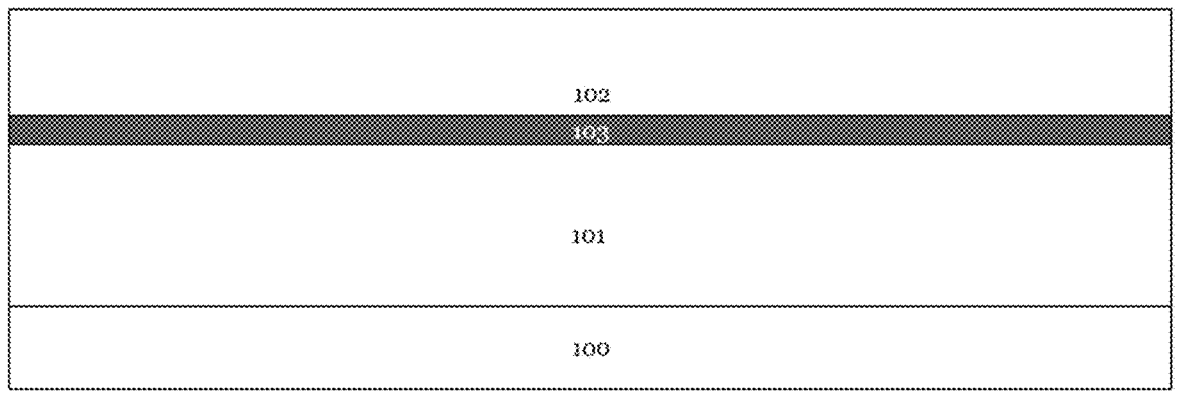
Figures 2, 10:
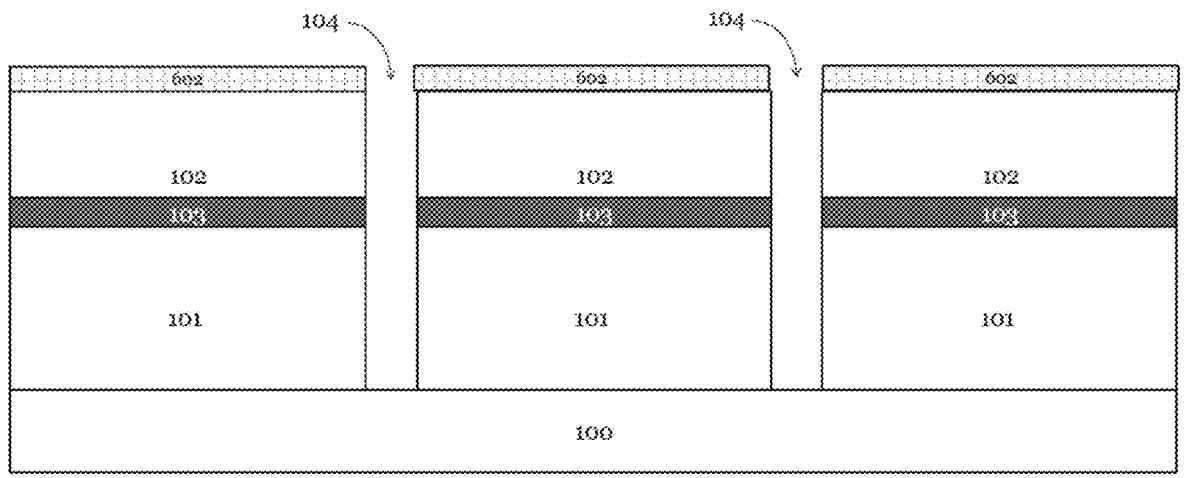
Figures 3, 10:
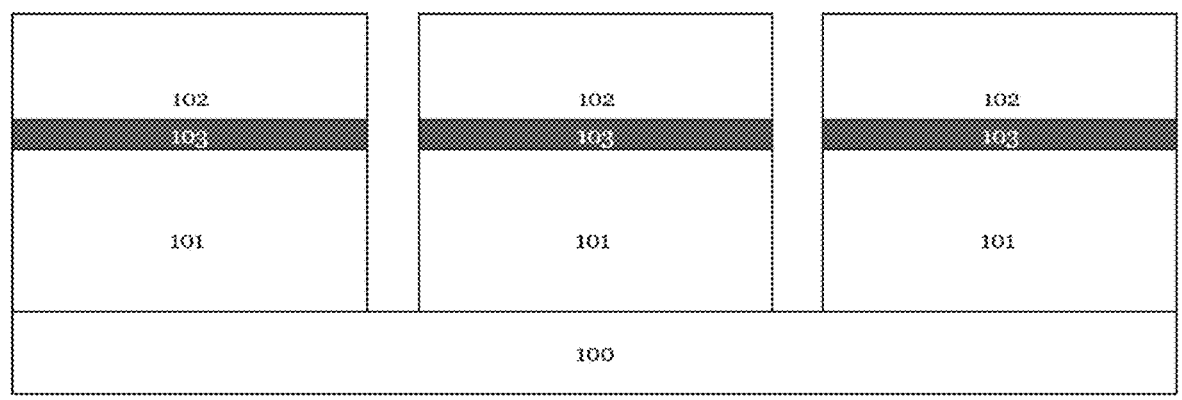
Figures 4, 10:
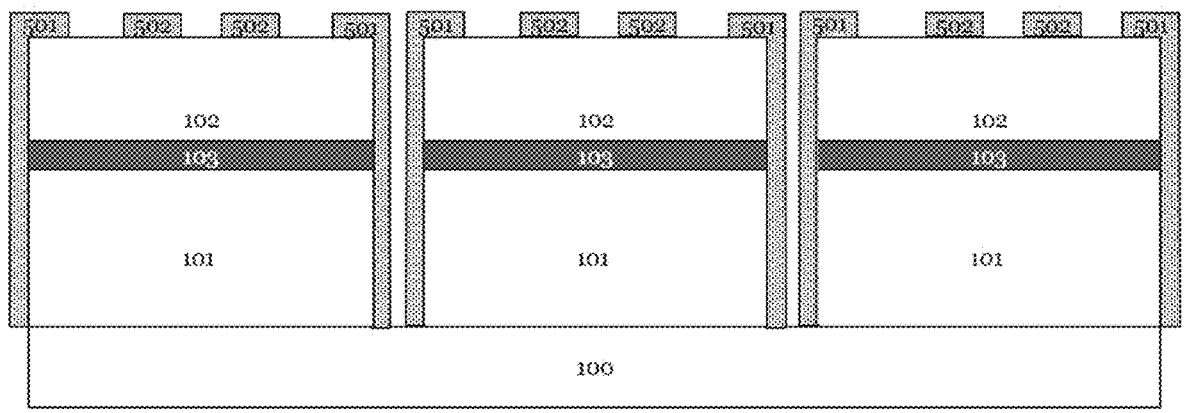
Figures 5, 10:
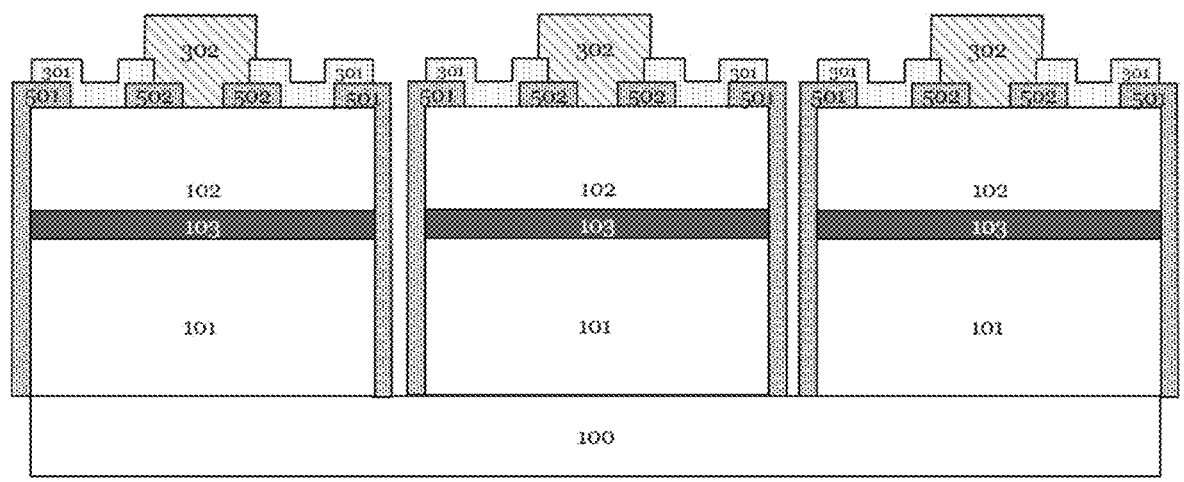
Figures 6, 10:
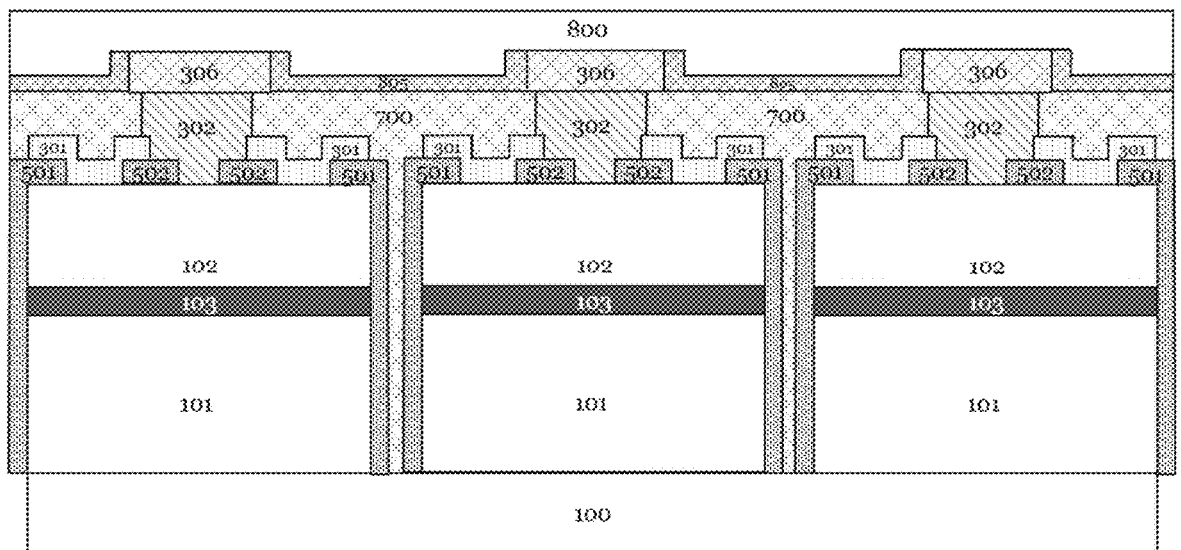
Figures 7, 10:
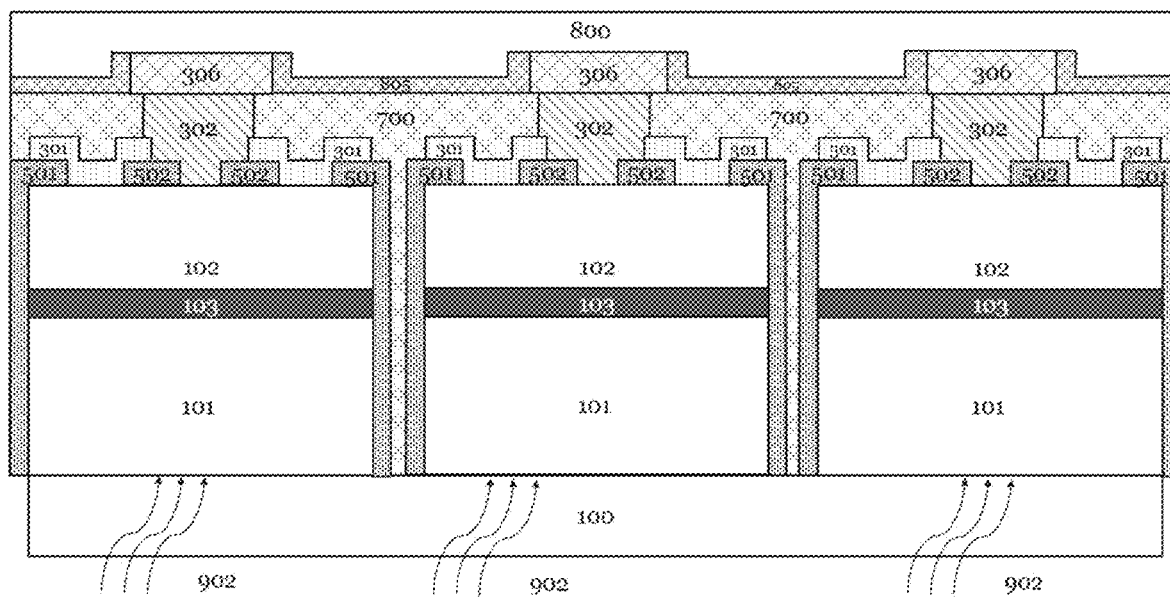
Figures 8, 10:
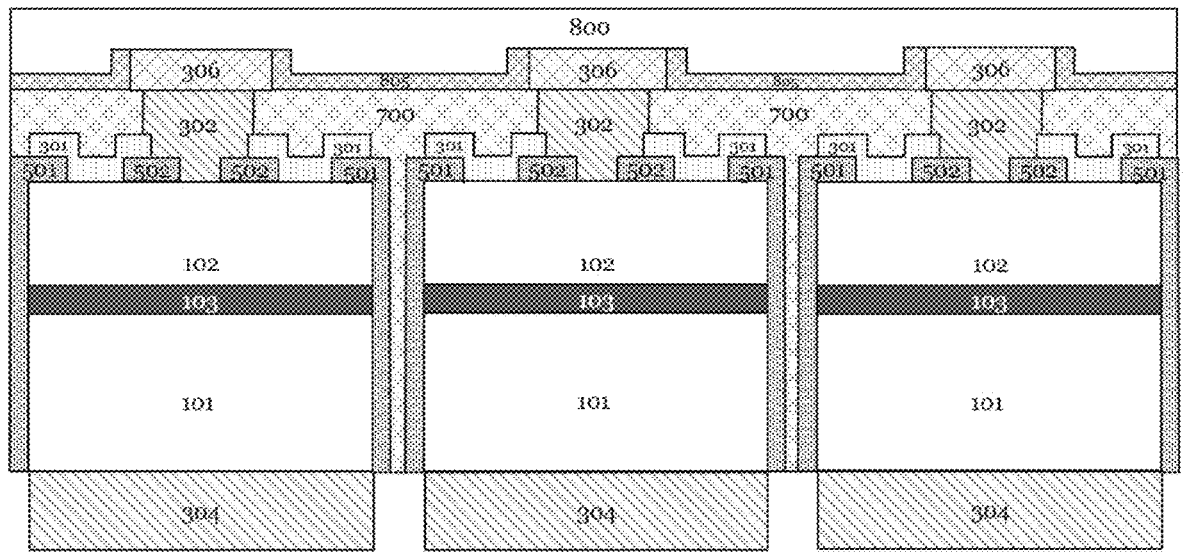
Figures 9, 10:
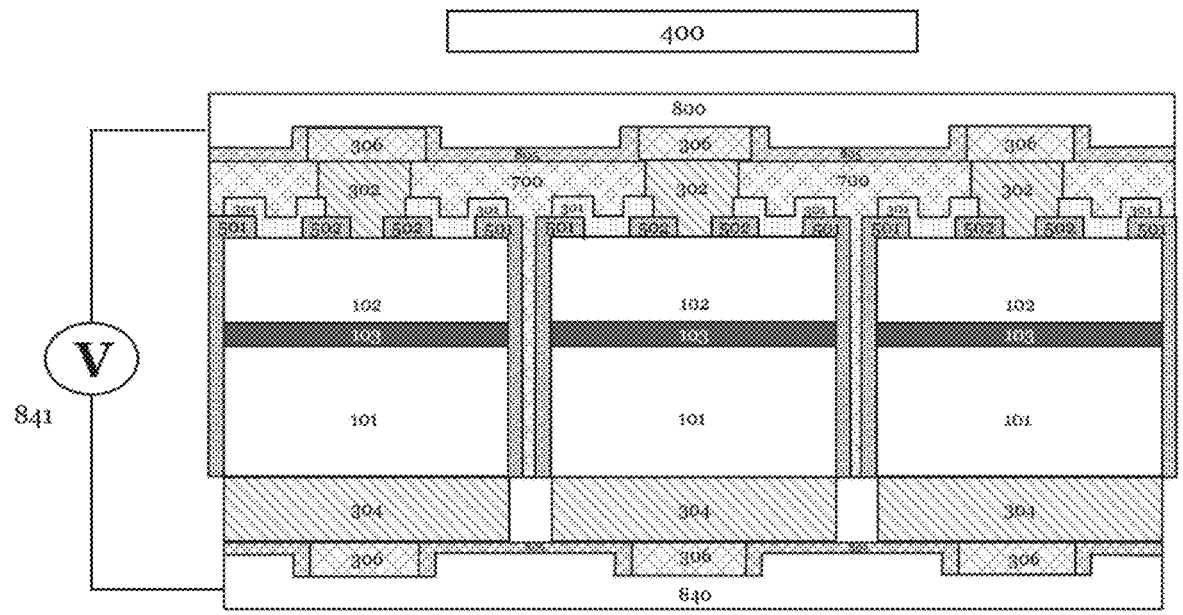
Figure 10:
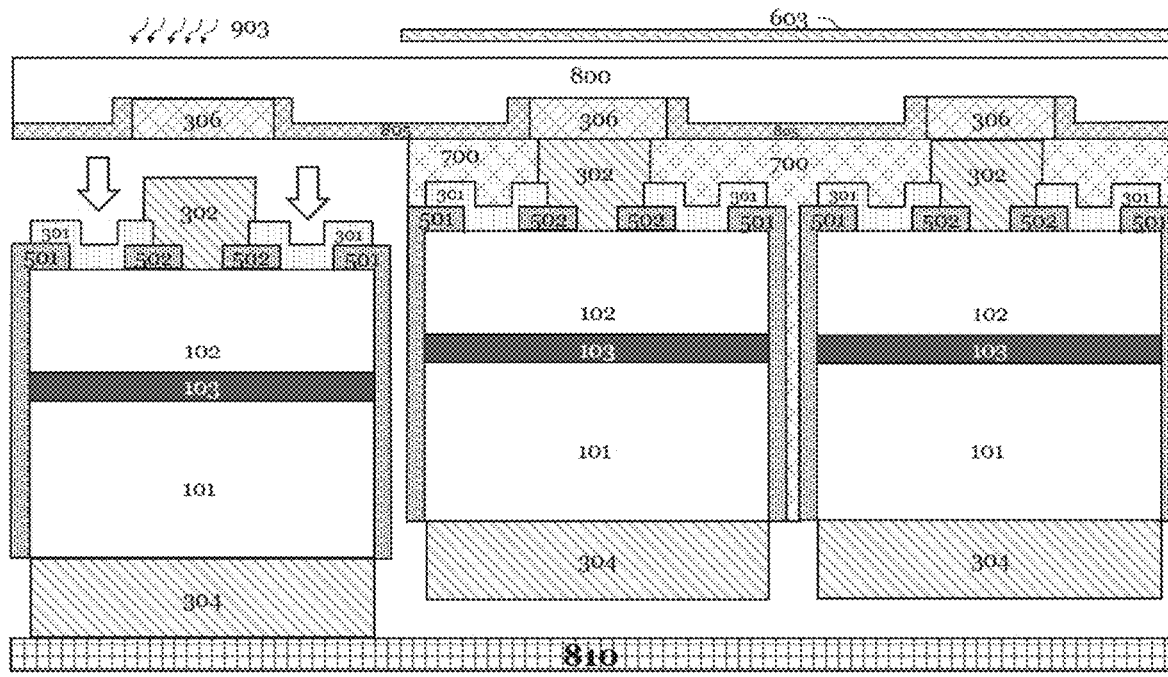
Figures 10, 11:
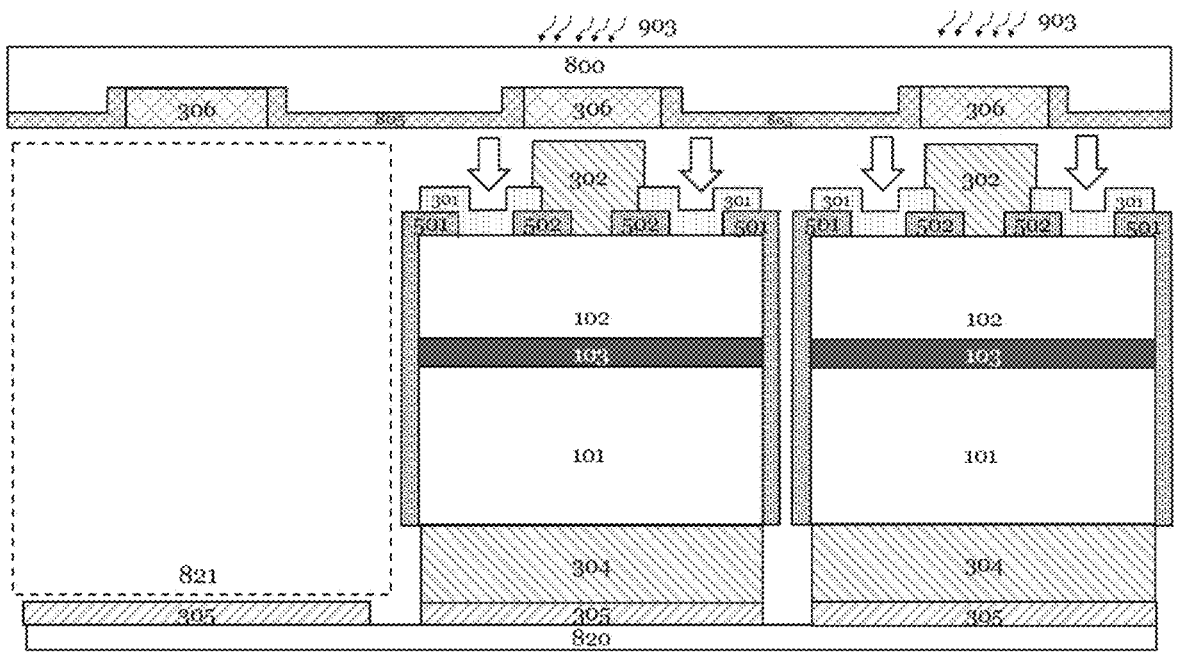
Figures 10, 11, 12:
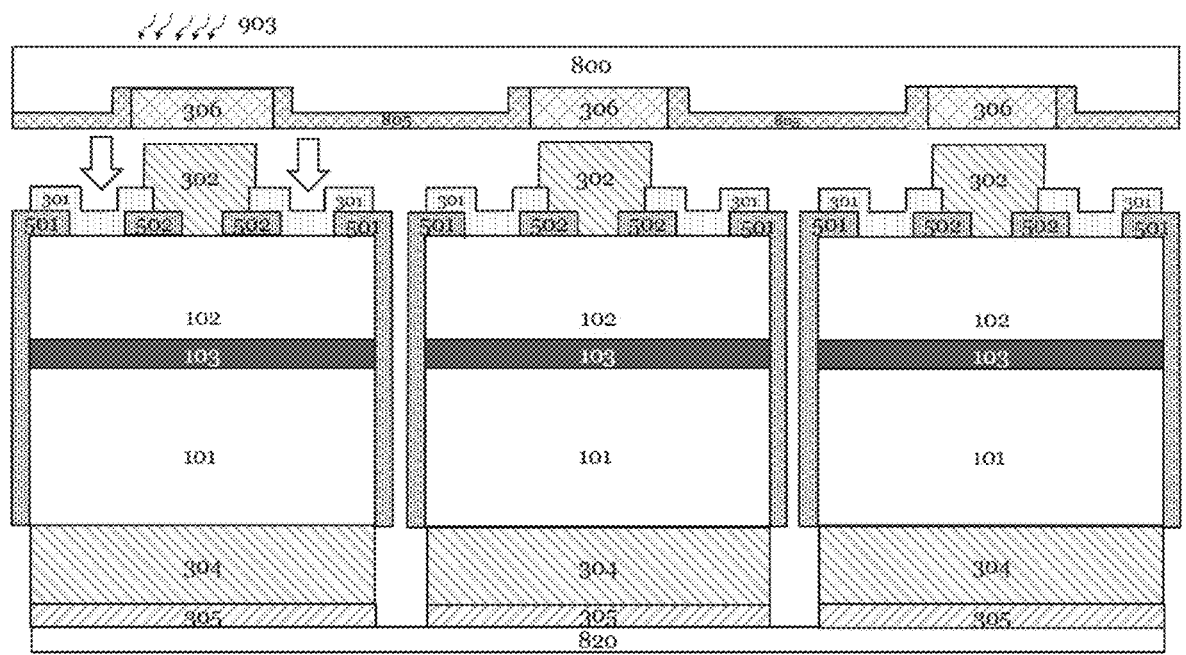
Figures 10, 11, 12, 13:
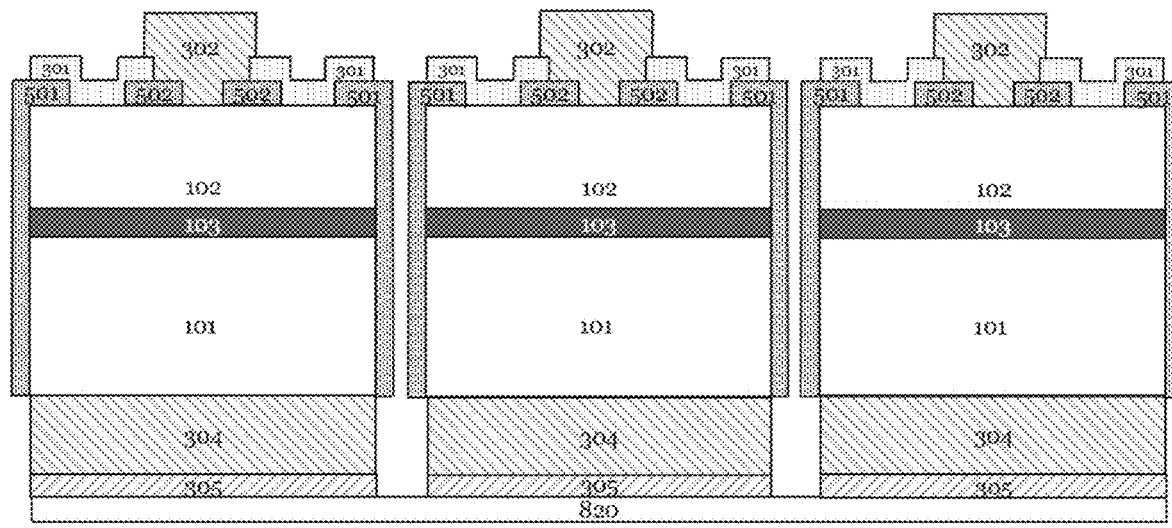
Figures 10, 11, 12, 13, 14:
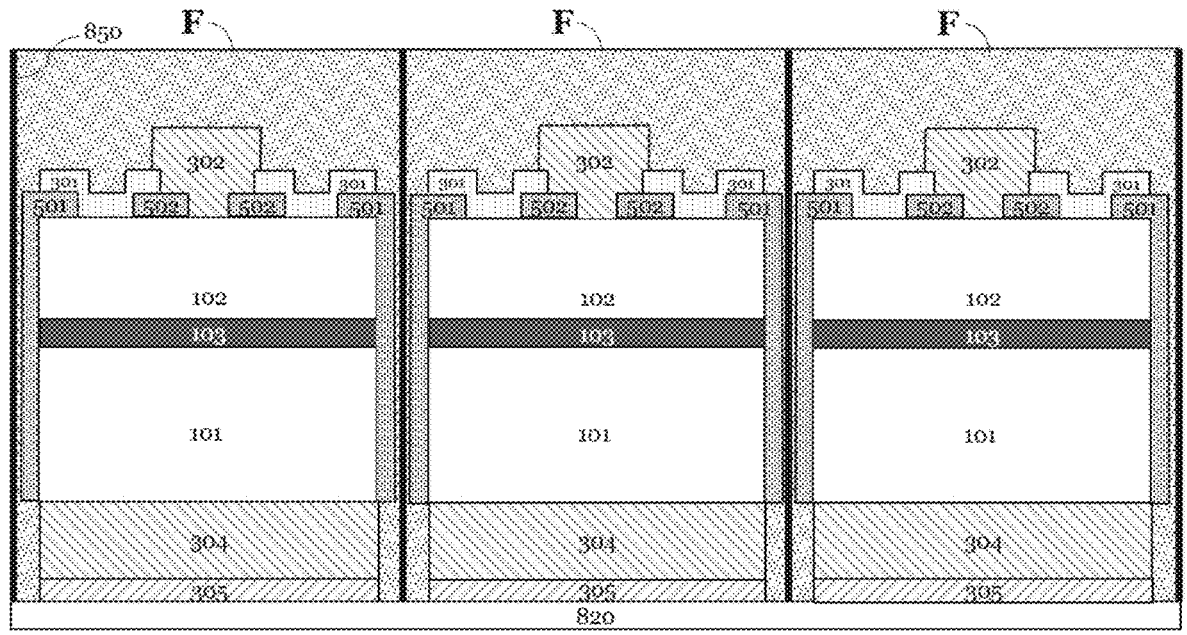
Figures 10, 11, 12, 13, 14, 15:
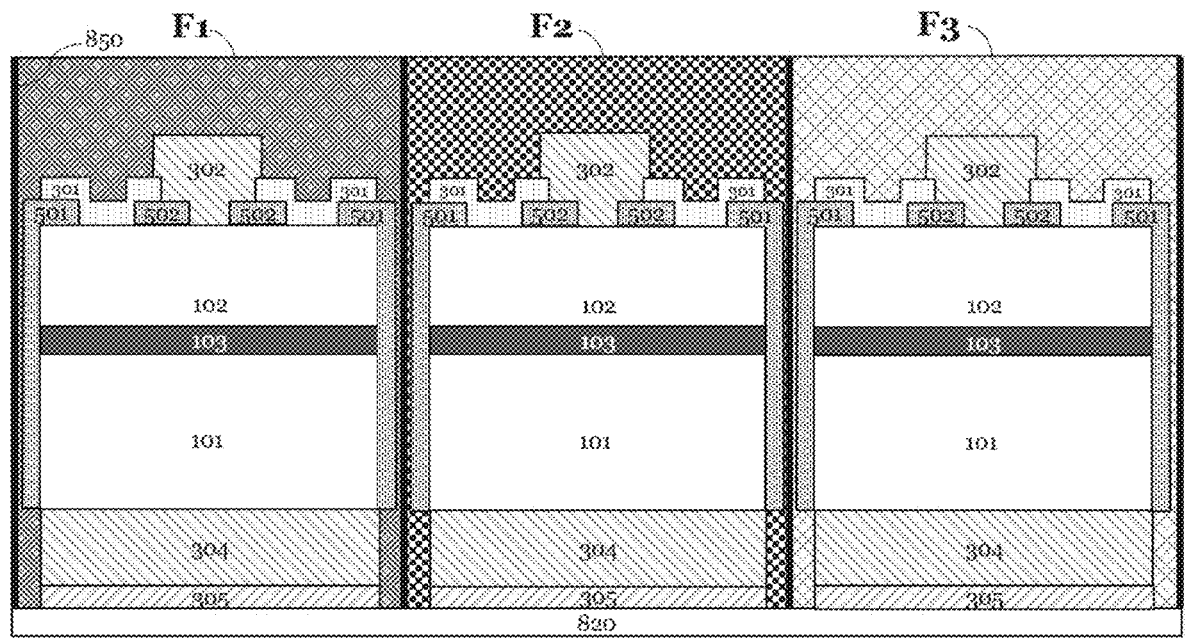
Figures 10, 11, 12, 13, 14, 15, 16:
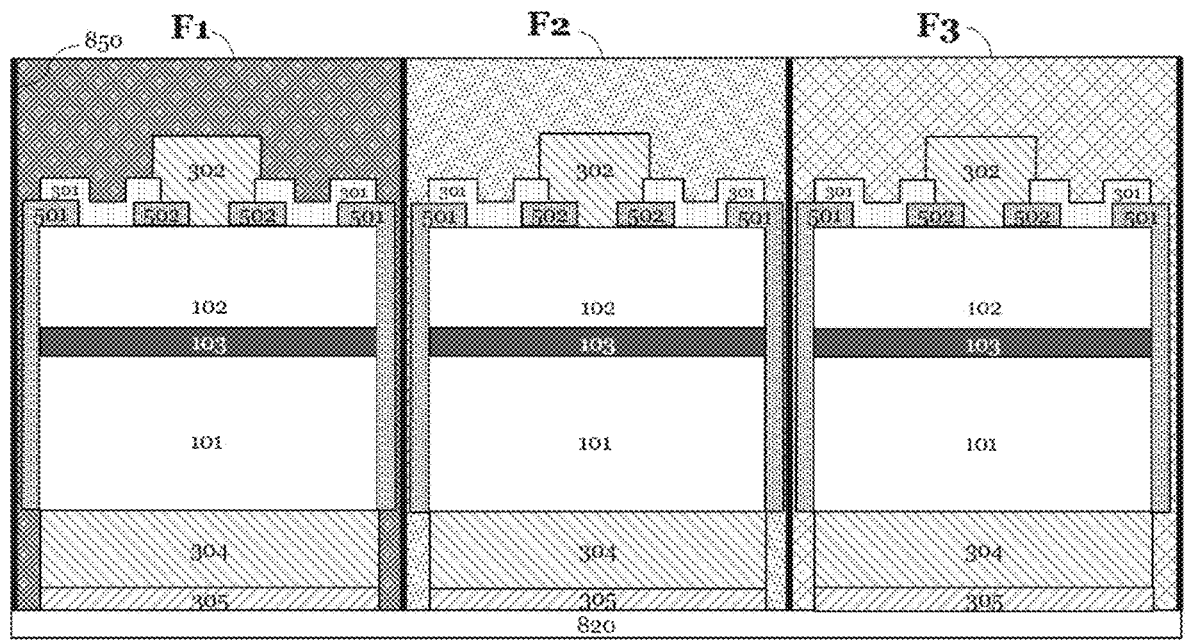
Figures 1, 11:
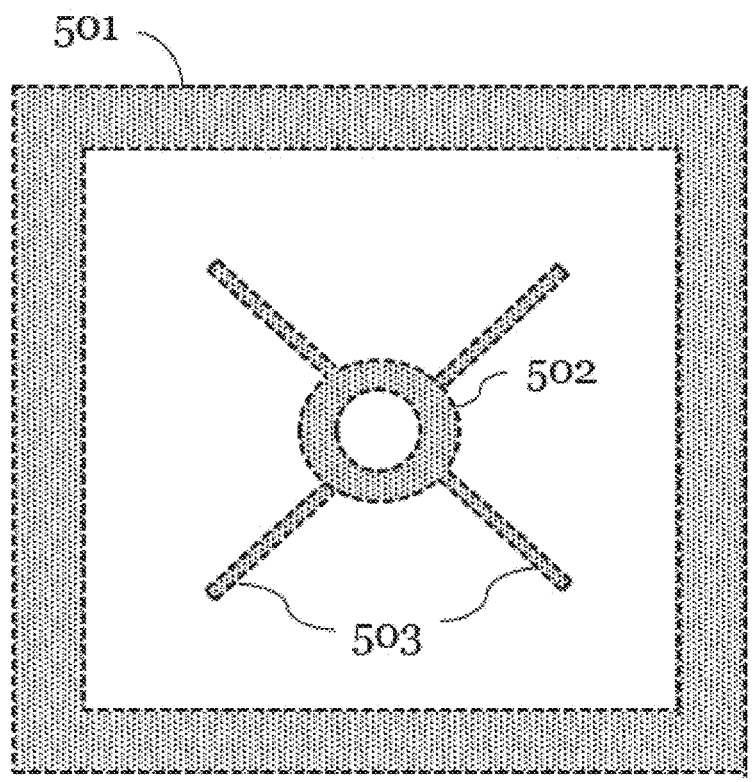
Figures 2, 11:
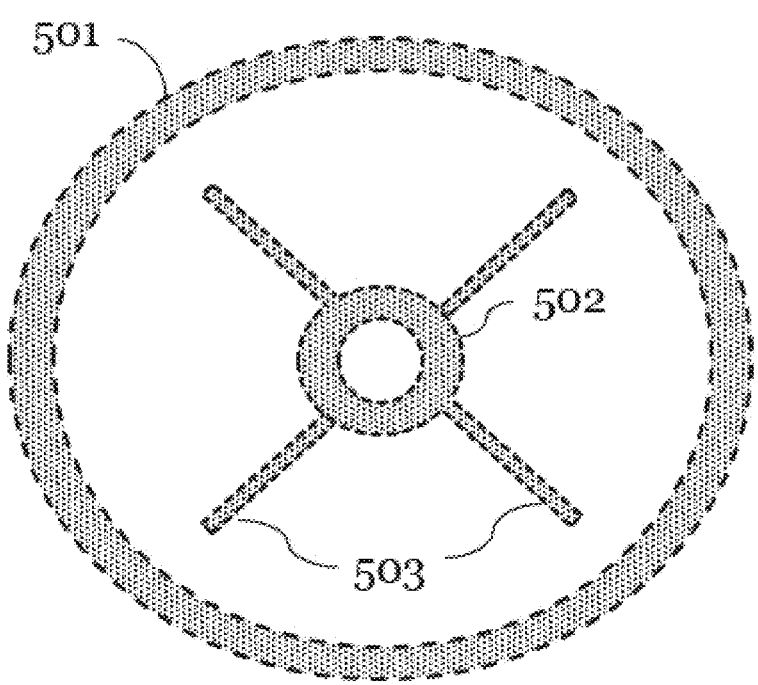
Figures 3, 11:
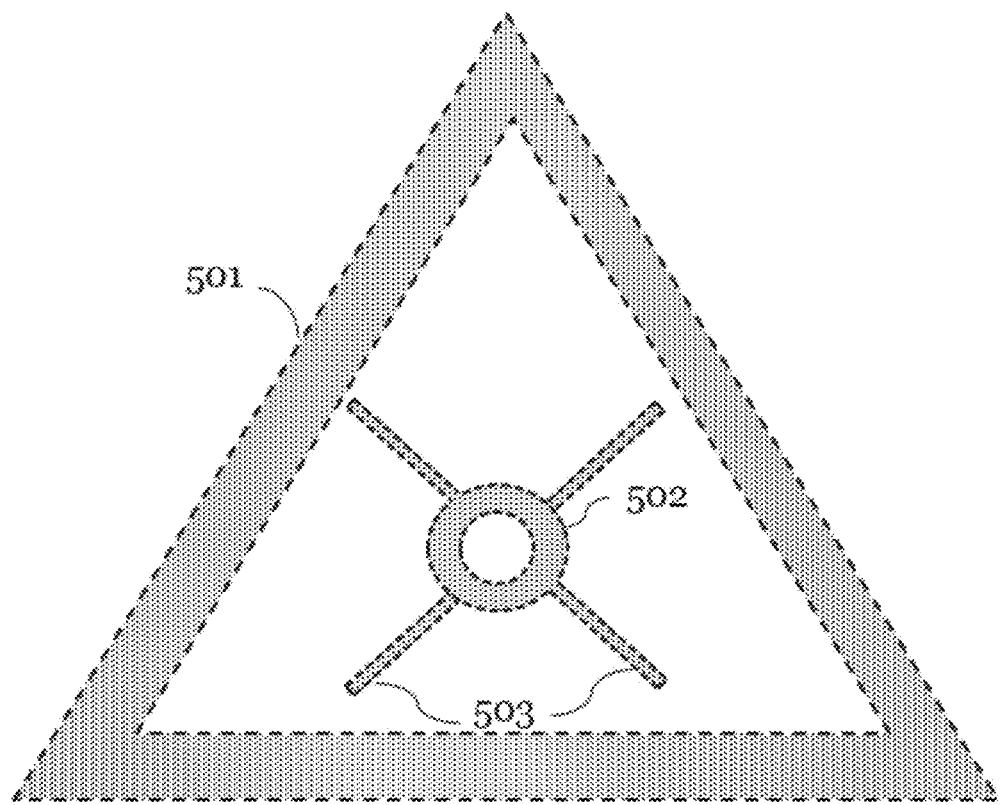
Figure 12:
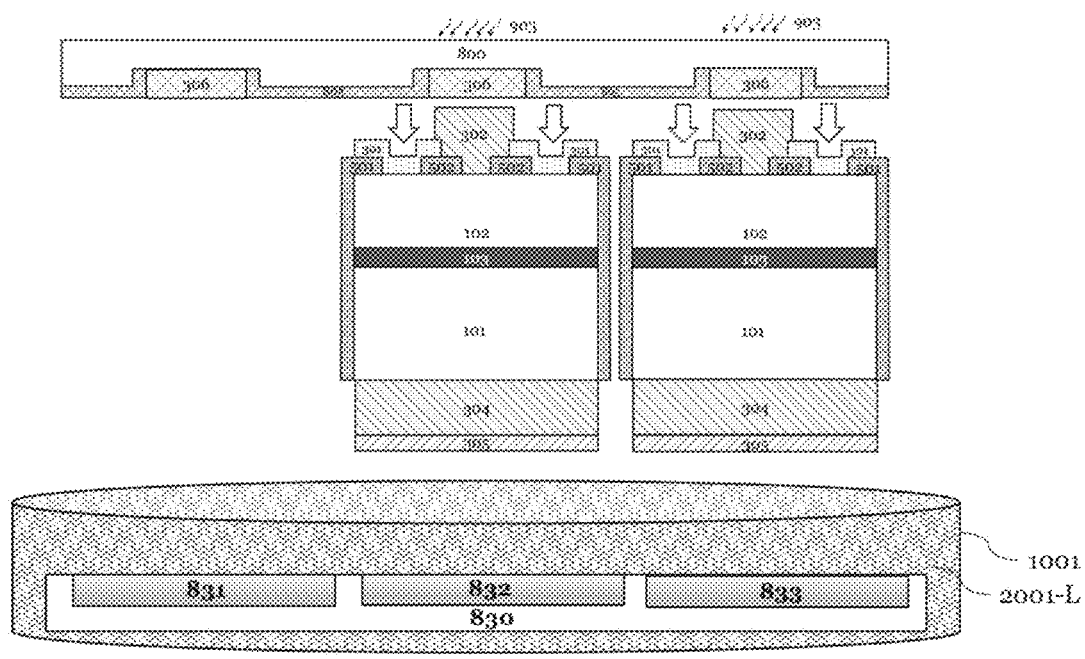
Figure 13:
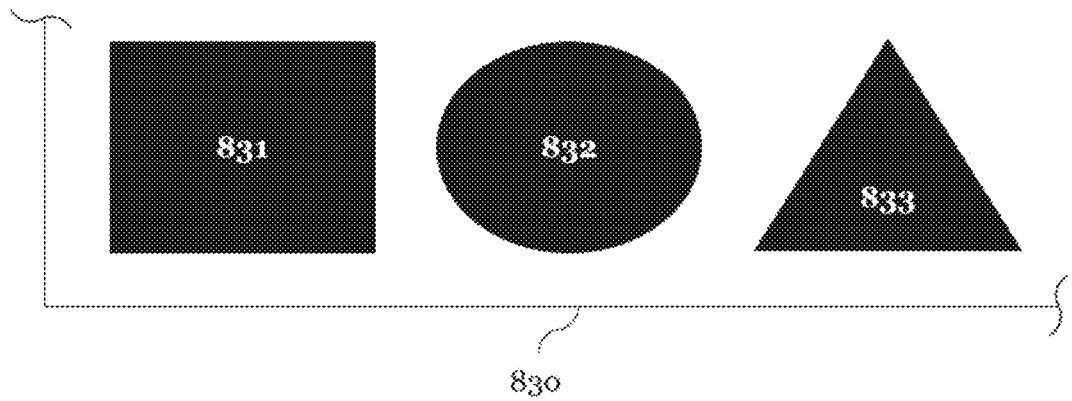
Figure 14:
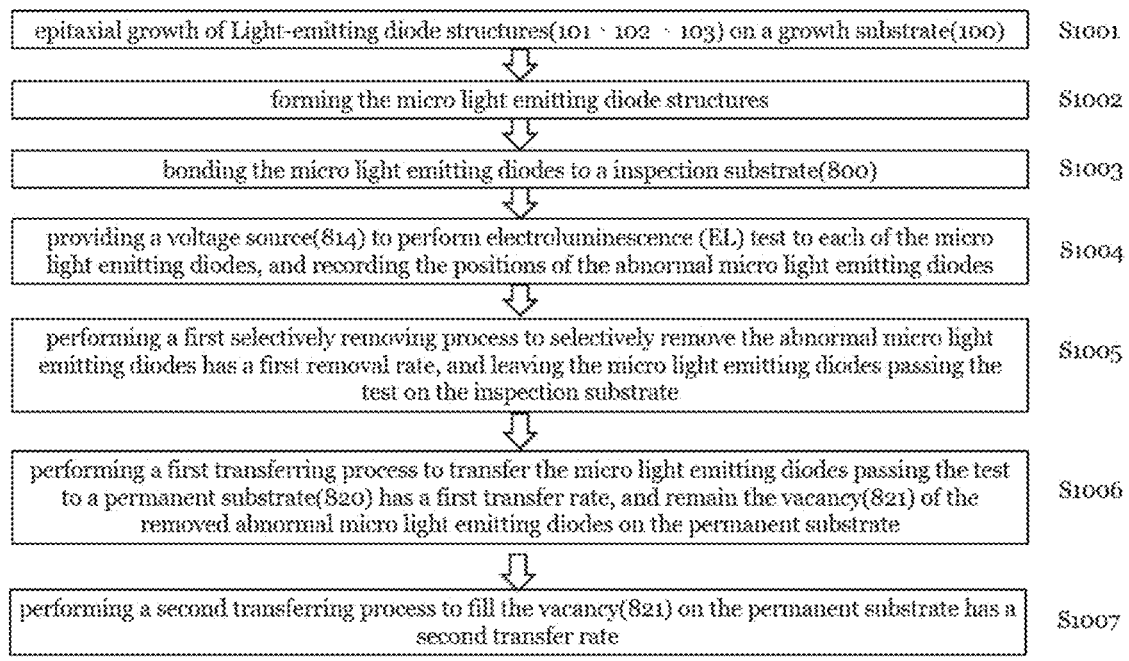
Figure 15:
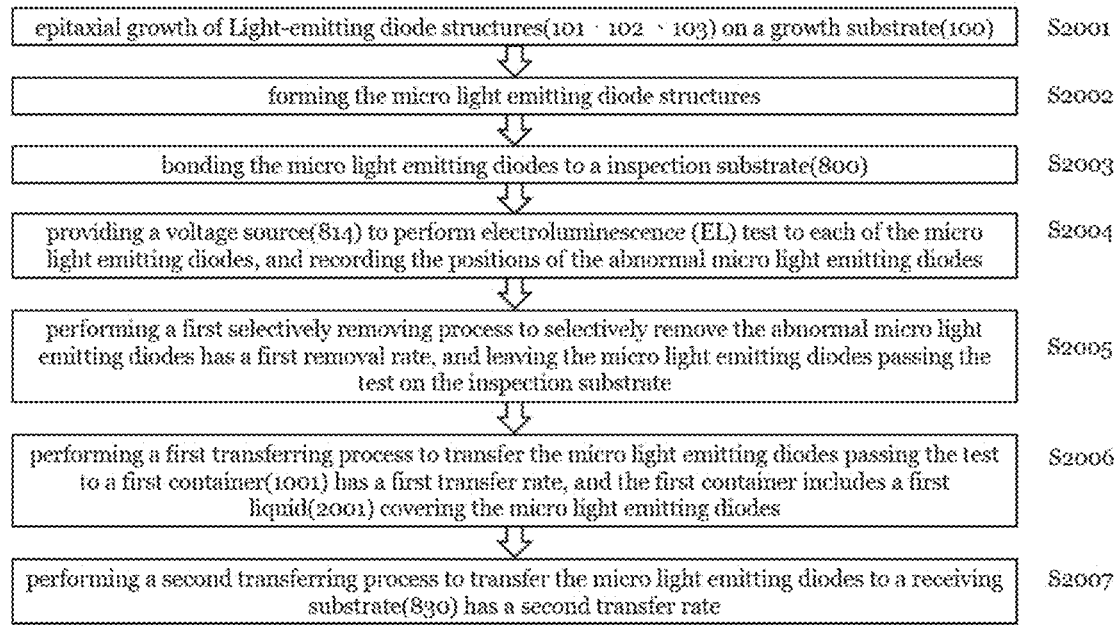
Figure 16A:
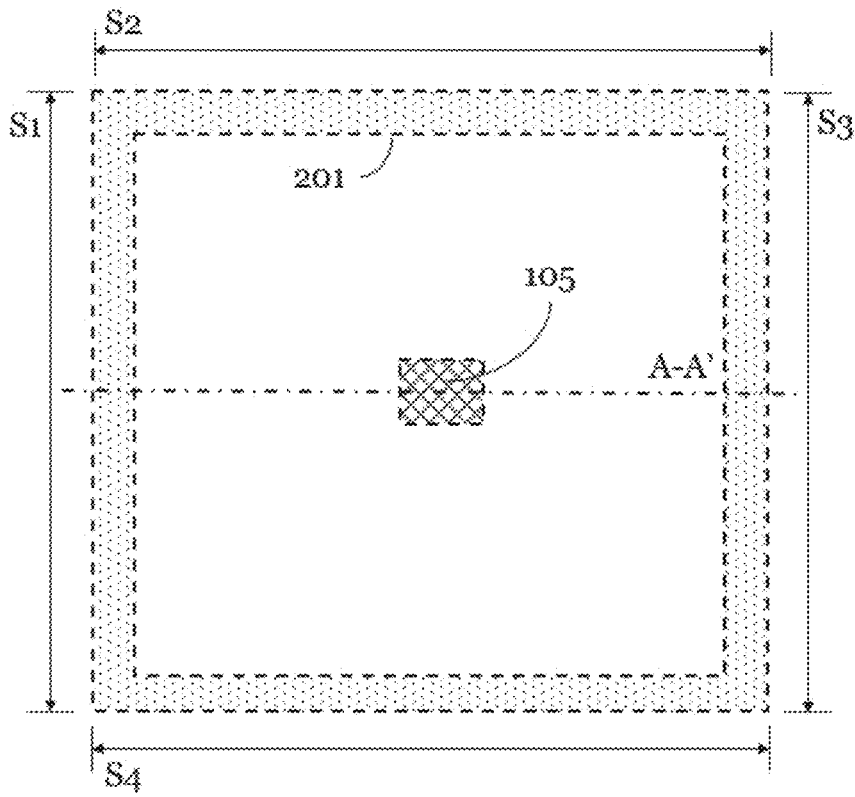
FIG. 16A schematically illustrates a top view according to an embodiment of the present invention.
Figure 16B:
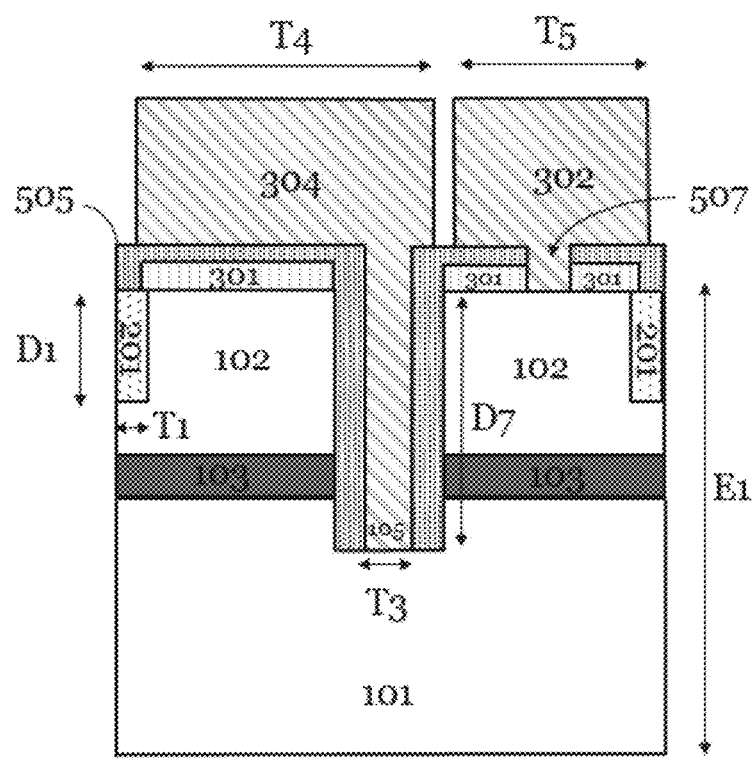
FIG. 16B schematically illustrates a cross-sectional view along line A-A' according to an embodiment of the present invention.
Figure 17A:
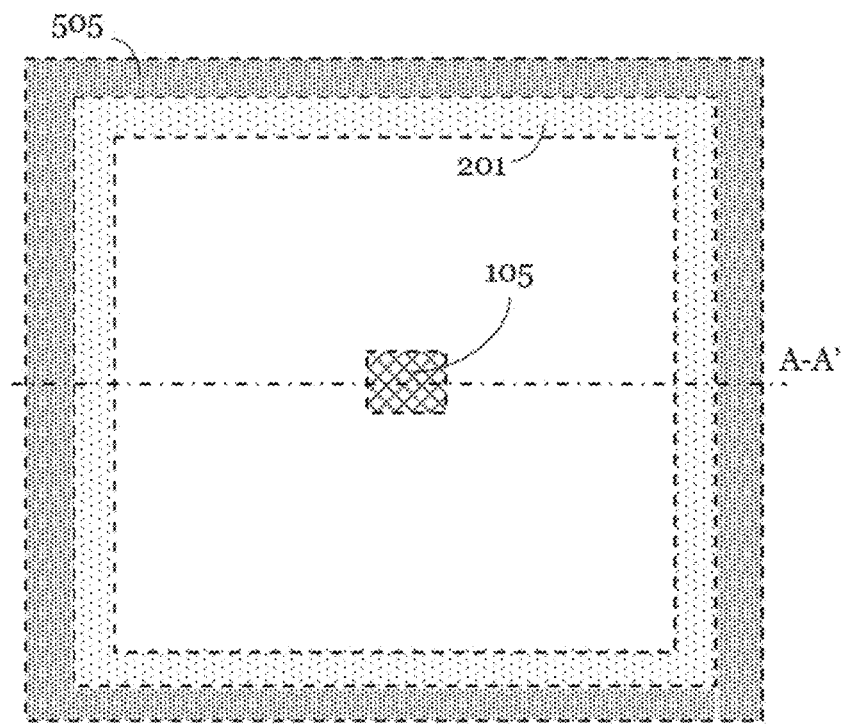
FIG. 17A schematically illustrates a top view according to an embodiment of the present invention.
Figure 17B:
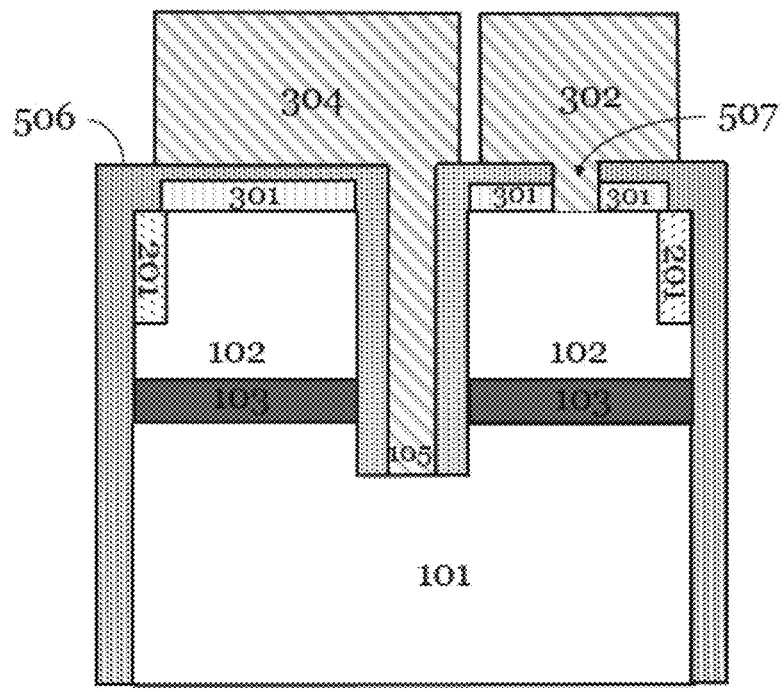
FIG. 17B schematically illustrates a cross-sectional view along line A-A' according to an embodiment of the present invention.
Figure 18A:
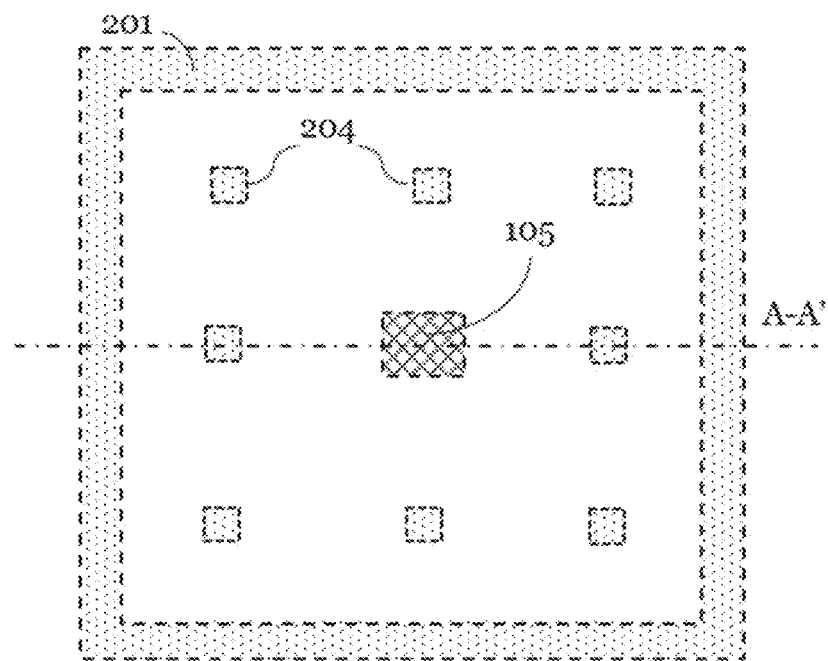
FIG. 18A schematically illustrates a top view according to an embodiment of the present invention.
Figure 18B:
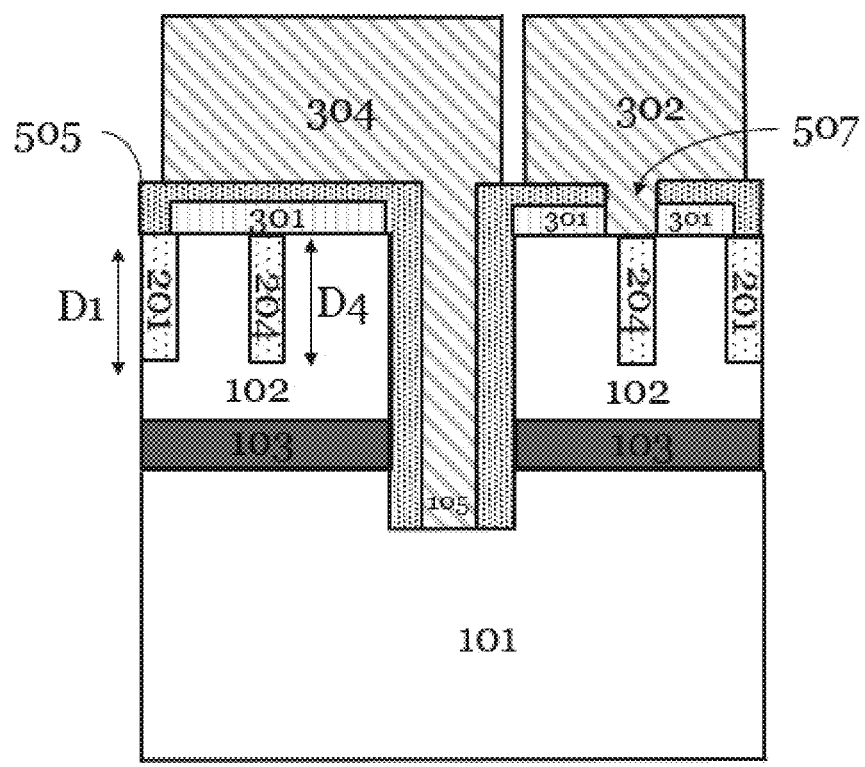
FIG. 18B schematically illustrates a cross-sectional view along line A-A' according to an embodiment of the present invention.
Figure 19A:
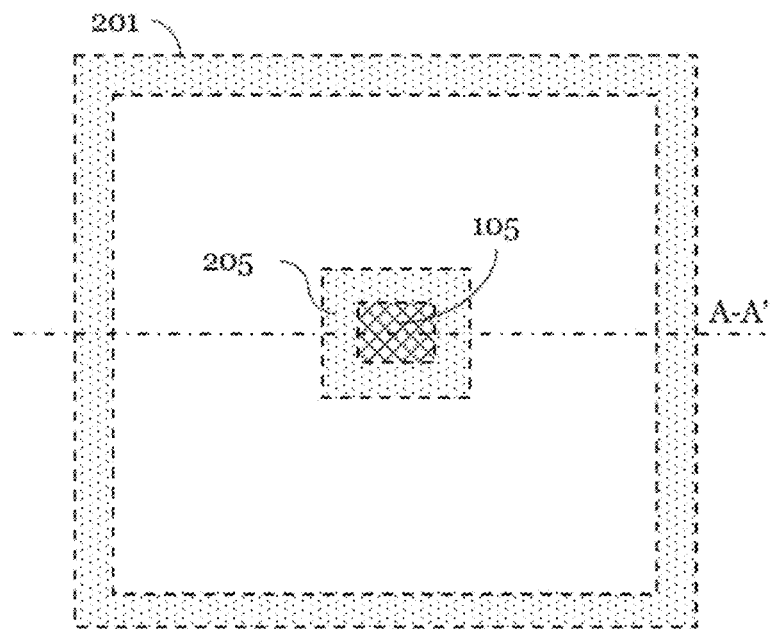
FIG. 19A schematically illustrates a top view according to an embodiment of the present invention.
Figure 19B:
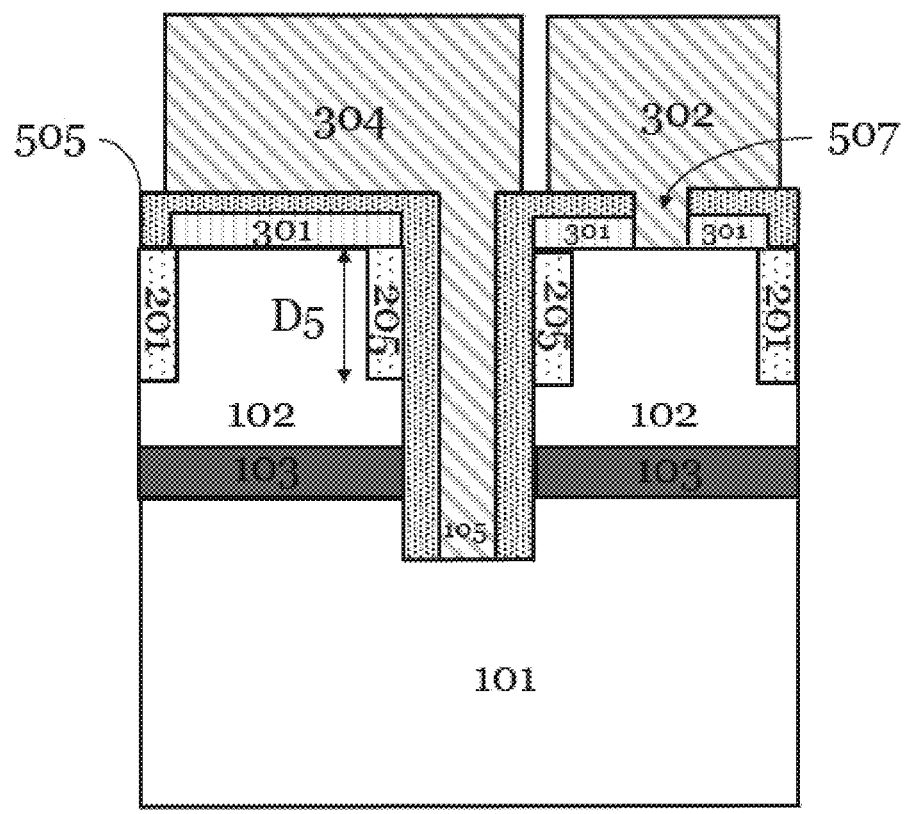
FIG. 19B schematically illustrates a cross-sectional view along line A-A' according to an embodiment of the present invention.
Figure 20A:
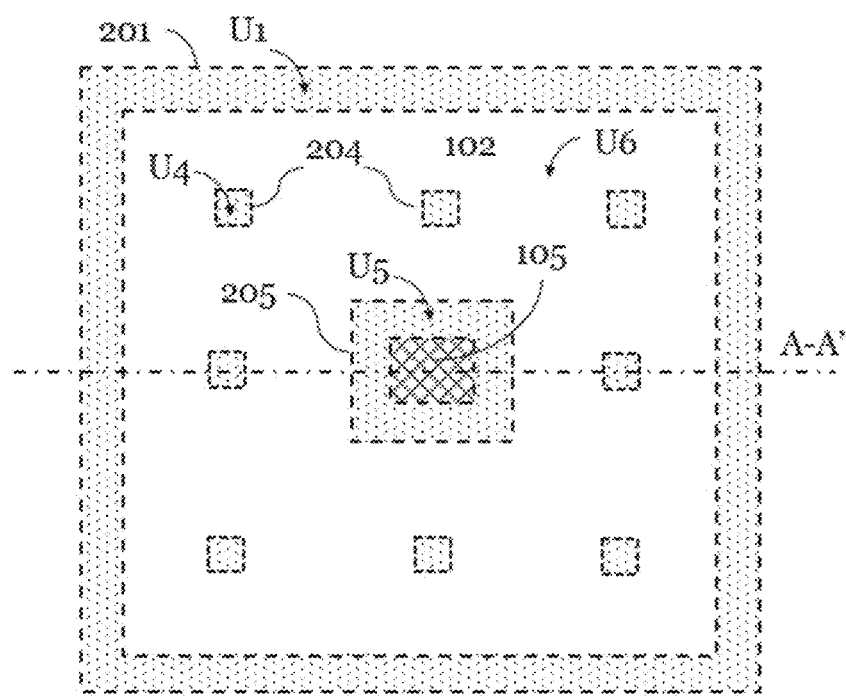
FIG. 20A schematically illustrates a top view according to an embodiment of the present invention.
Figure 20B:
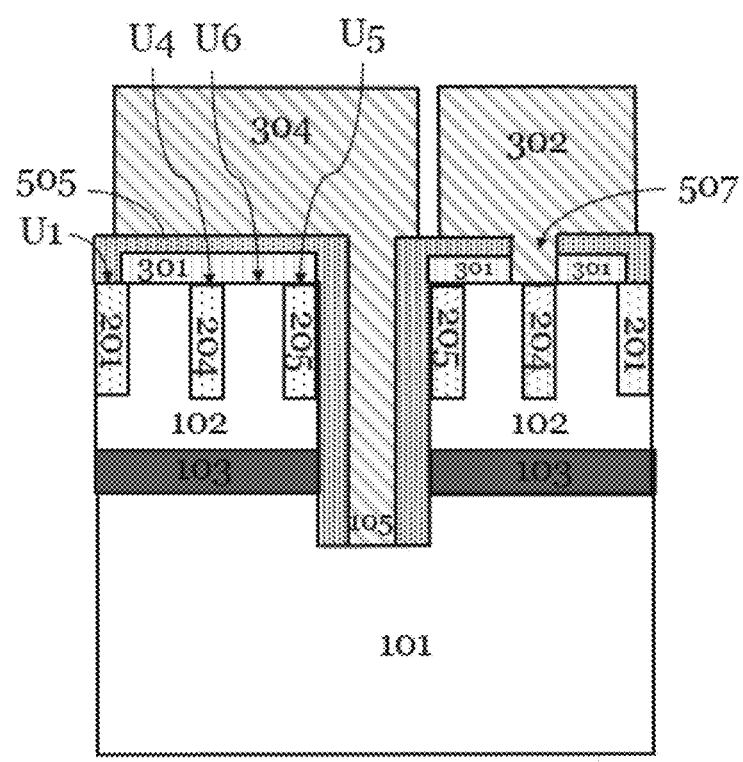
FIG. 20B schematically illustrates a cross-sectional view along line A-A' according to an embodiment of the present invention.
Figure 21A:
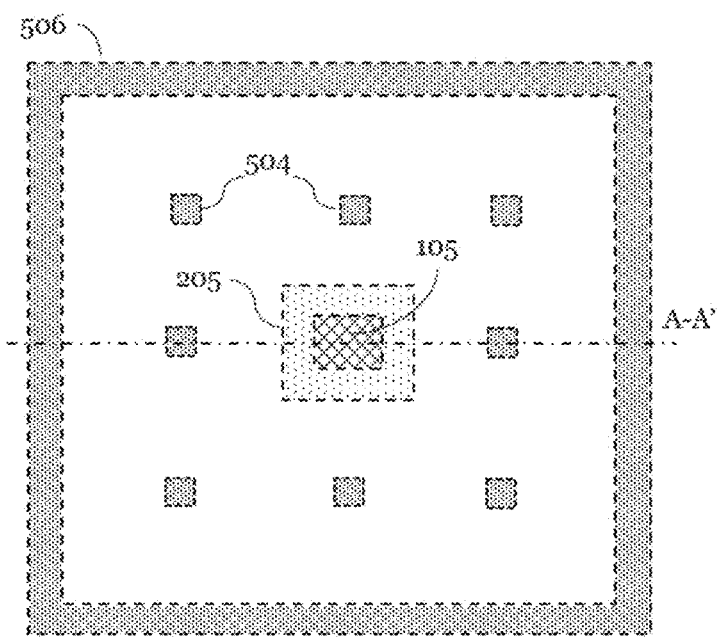
FIG. 21A schematically illustrates a top view according to an embodiment of the present invention.
Figure 21B:
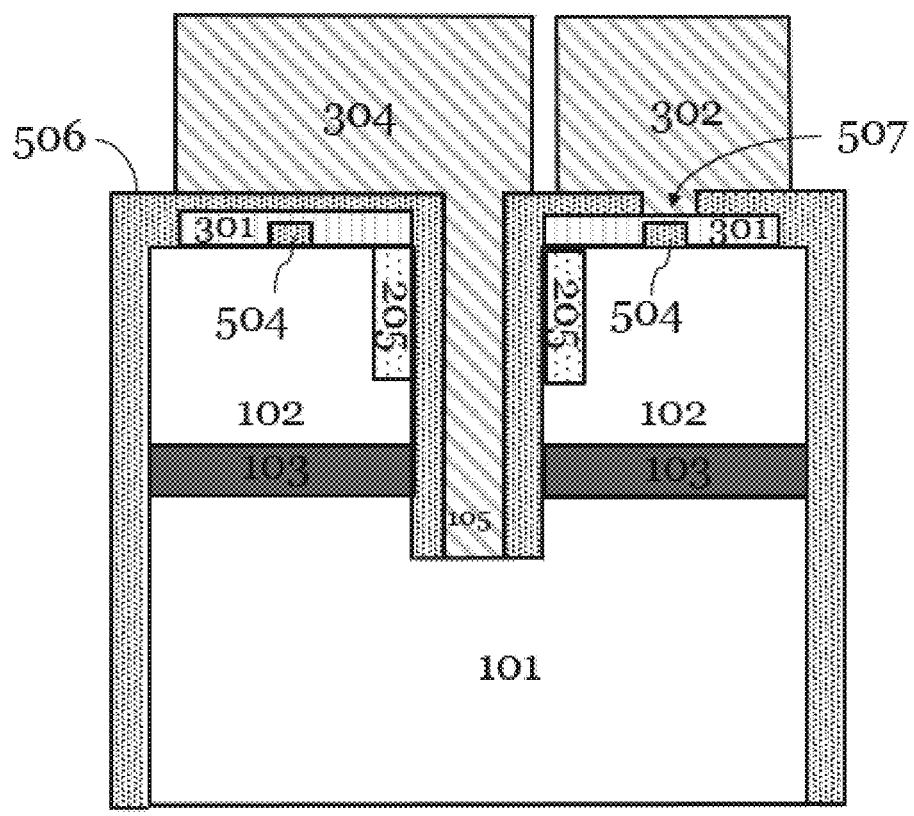
FIG. 21B schematically illustrates a cross-sectional view along line A-A' according to an embodiment of the present invention.
Figure 22A:
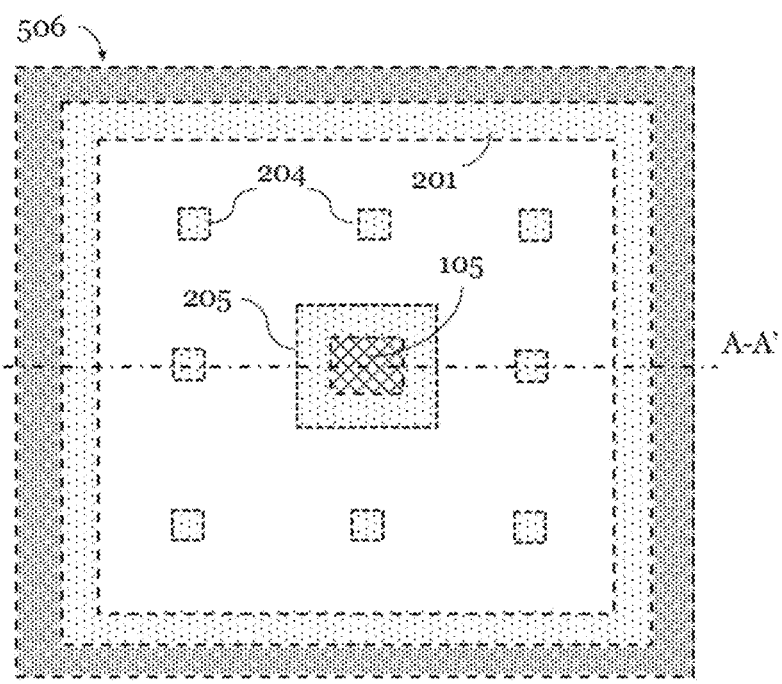
FIG. 22A schematically illustrates a top view according to an embodiment of the present invention.
Figure 22B:
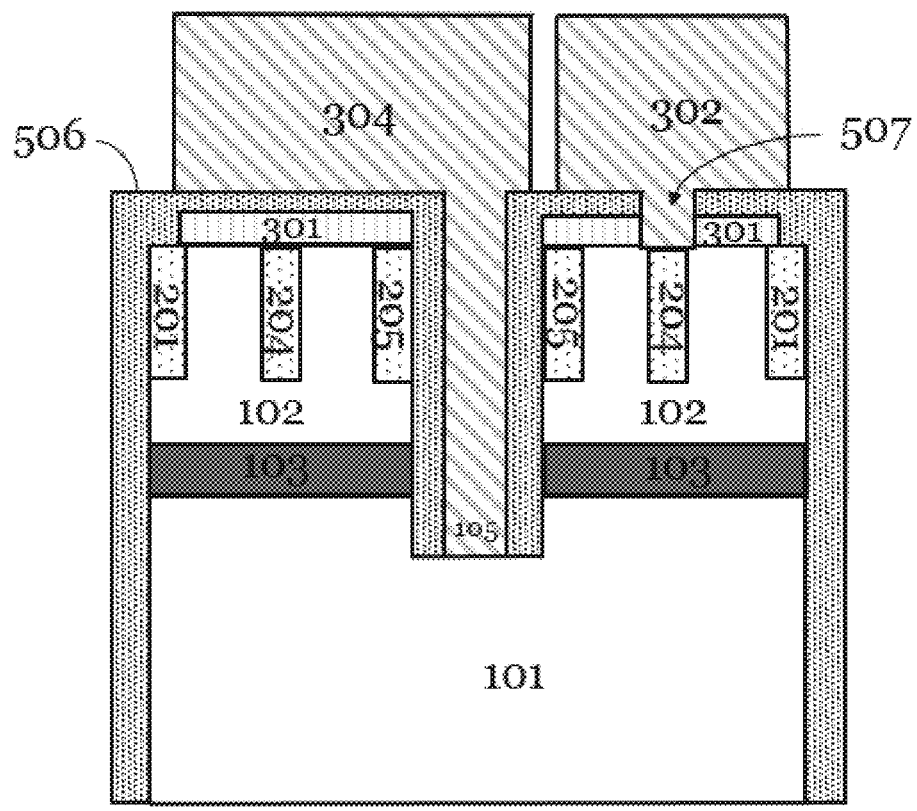
FIG. 22B schematically illustrates a cross-sectional view along line A-A' according to an embodiment of the present invention.
Figure 23A:
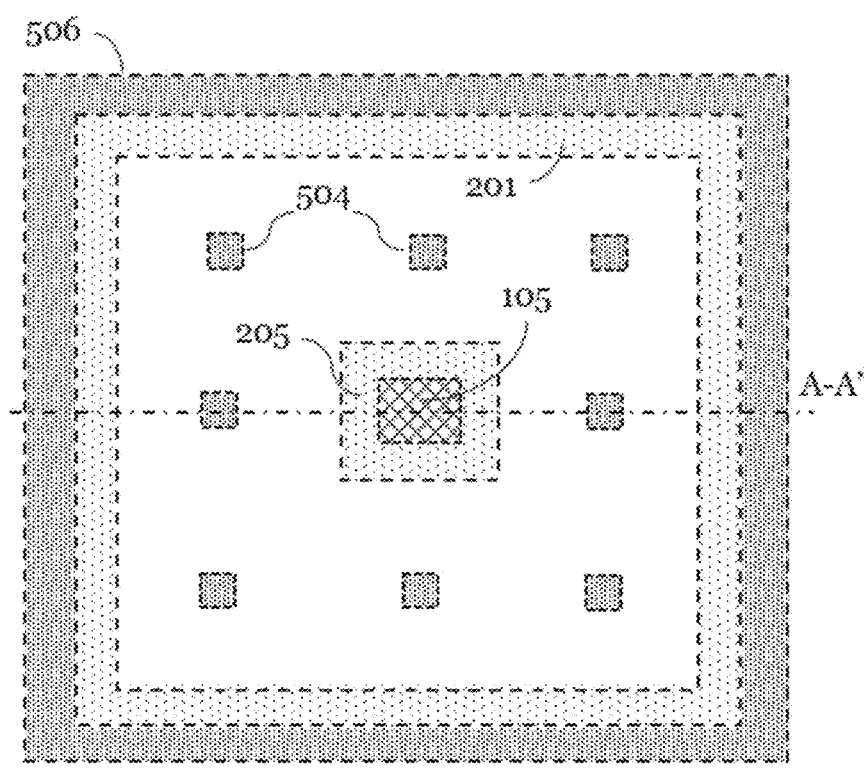
FIG. 23A schematically illustrates a top view according to an embodiment of the present invention.
Figure 23B:
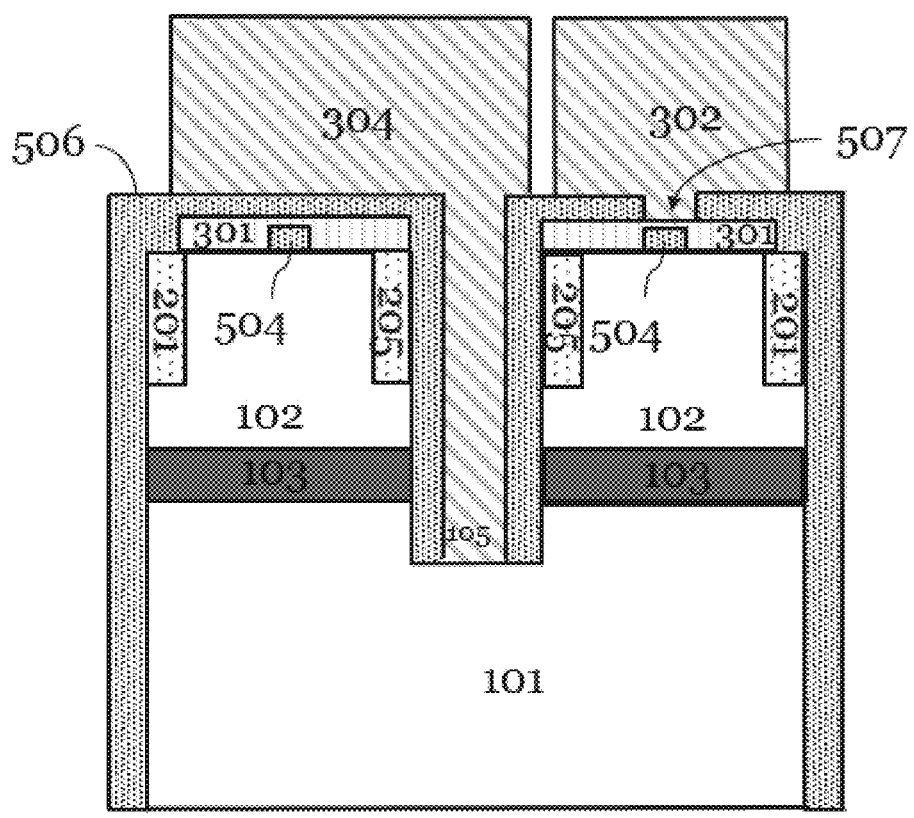
FIG. 23B schematically illustrates a cross-sectional view along line A-A' according to an embodiment of the present invention.
Figure 24A:
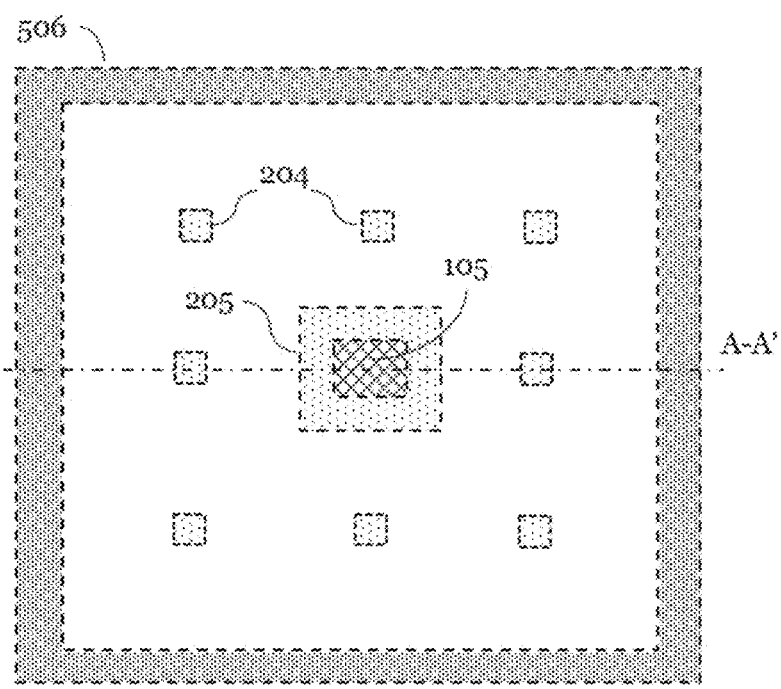
FIG. 24A schematically illustrates a top view according to an embodiment of the present invention.
Figure 24B:
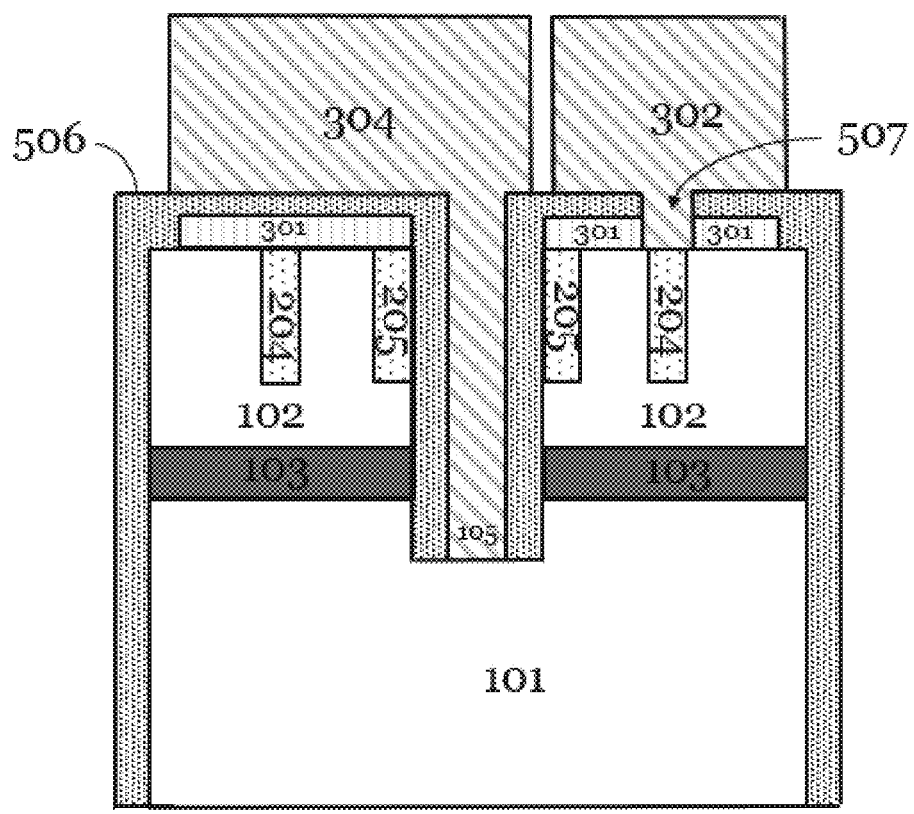
FIG. 24B schematically illustrates a cross-sectional view along line A-A' according to an embodiment of the present invention.
Figure 25A:
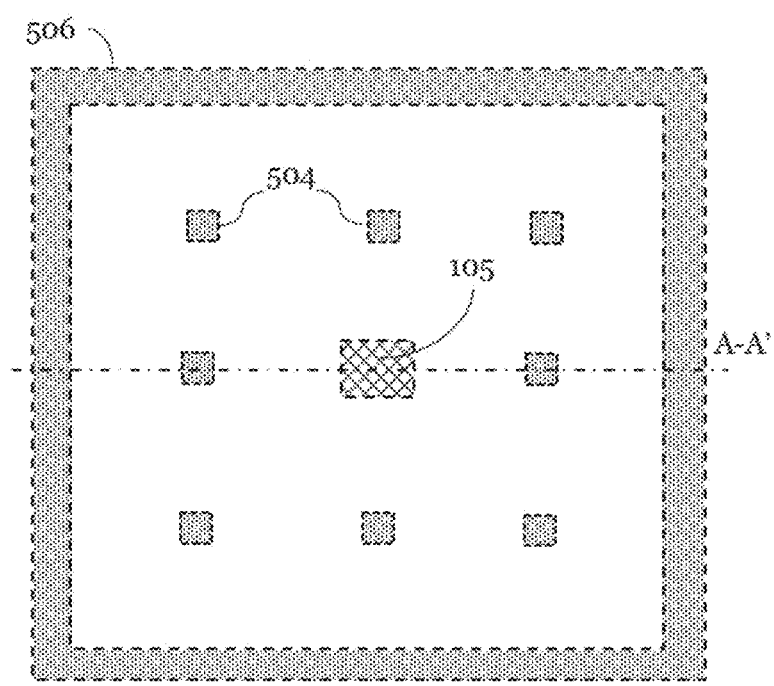
FIG. 25A schematically illustrates a top view according to an embodiment of the present invention.
Figure 25B:
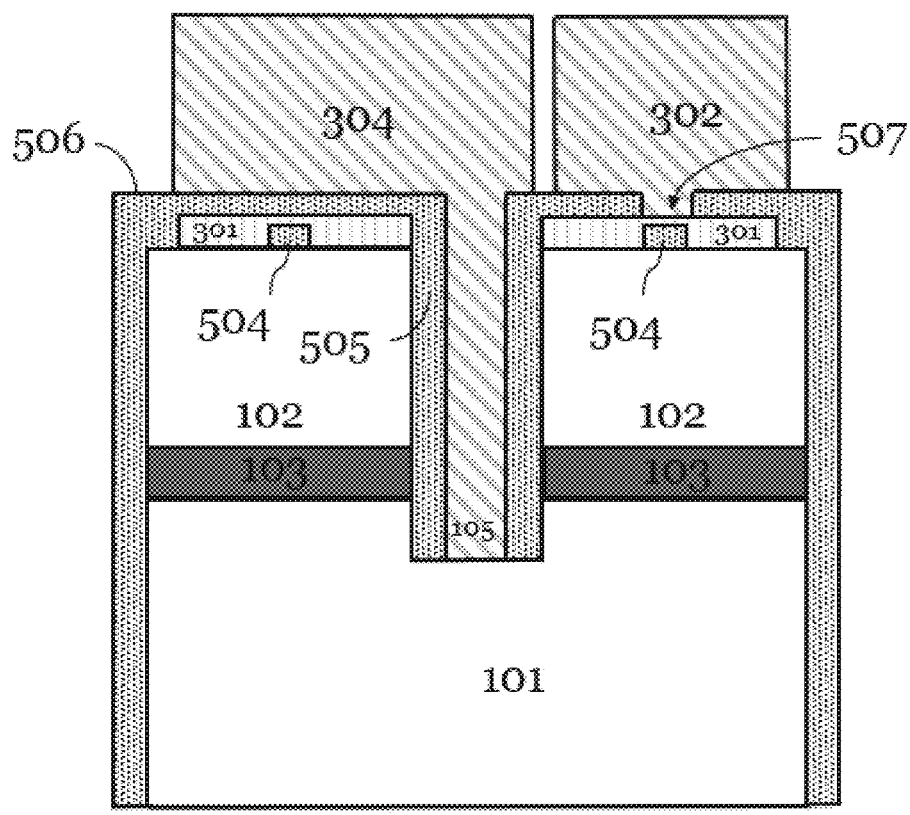
FIG. 25B schematically illustrates a cross-sectional view along line A-A' according to an embodiment of the present invention.
Figure 26A:
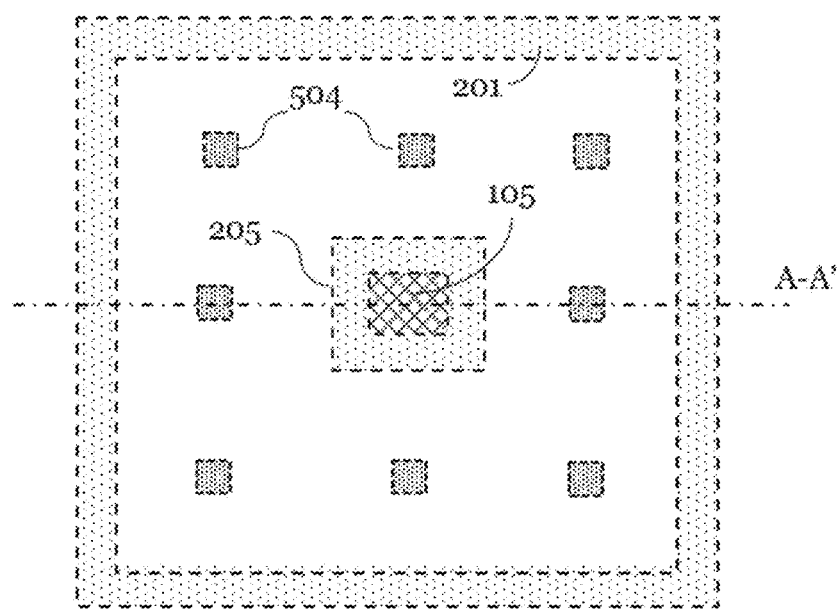
FIG. 26A schematically illustrates a top view according to an embodiment of the present invention.
Figure 26B:
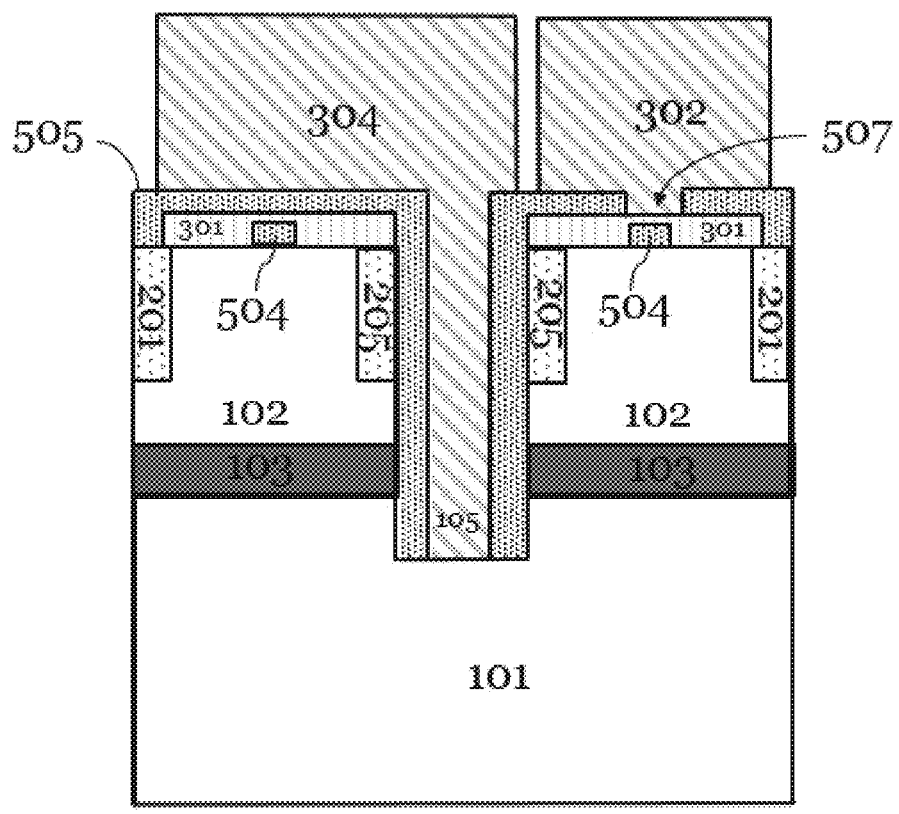
FIG. 26B schematically illustrates a cross-sectional view along line A-A' according to an embodiment of the present invention.
Figure 27A:
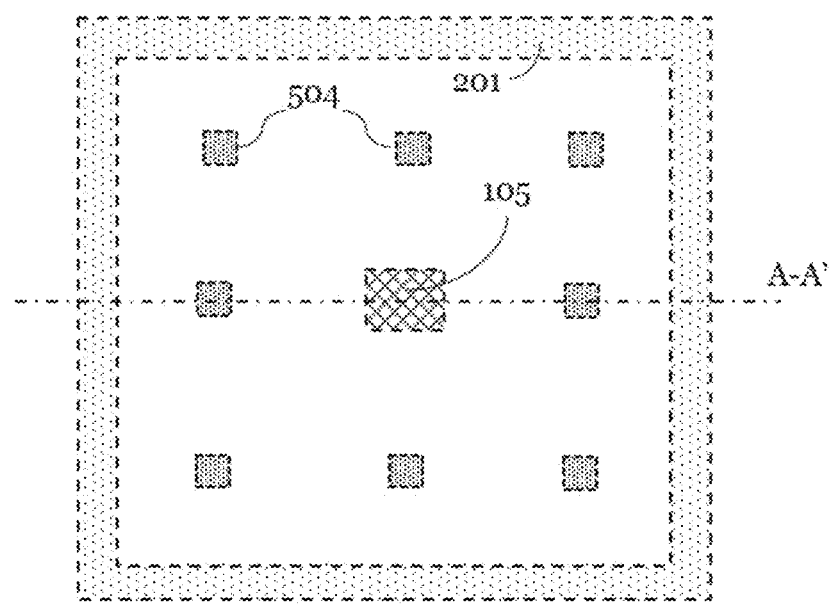
FIG. 27A schematically illustrates a top view according to an embodiment of the present invention.
Figure 27B:
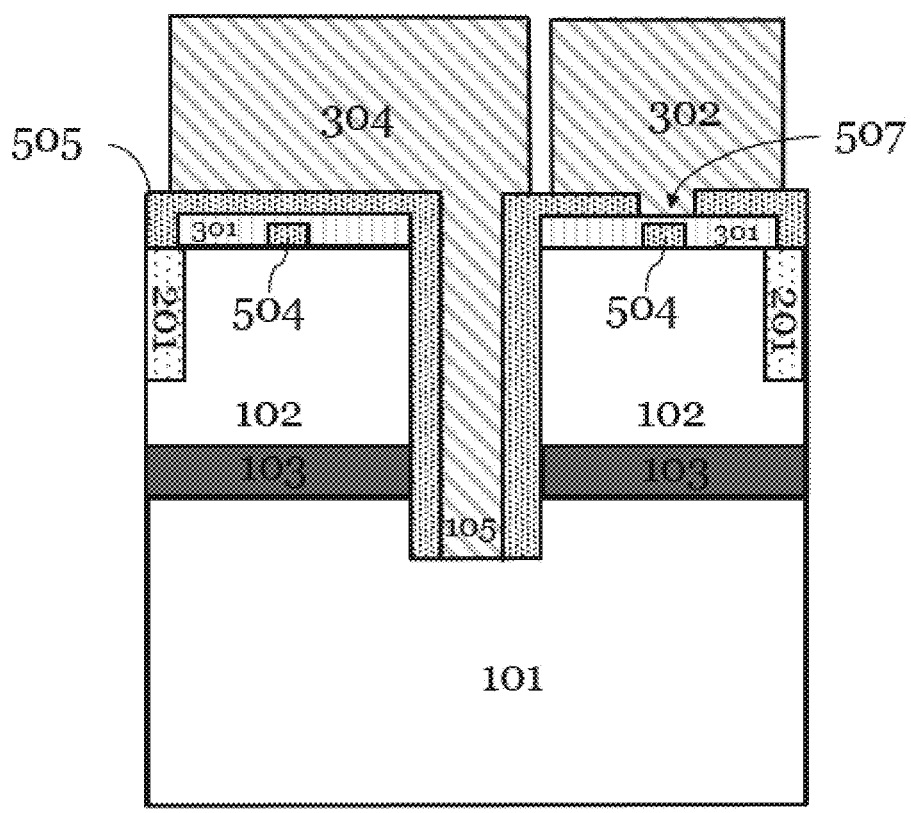
FIG. 27B schematically illustrates a cross-sectional view along line A-A' according to an embodiment of the present invention.

FIG. 57-16 schematically illustrates a vertical magnetic micro light emitting diode.

Figures 1, 28:
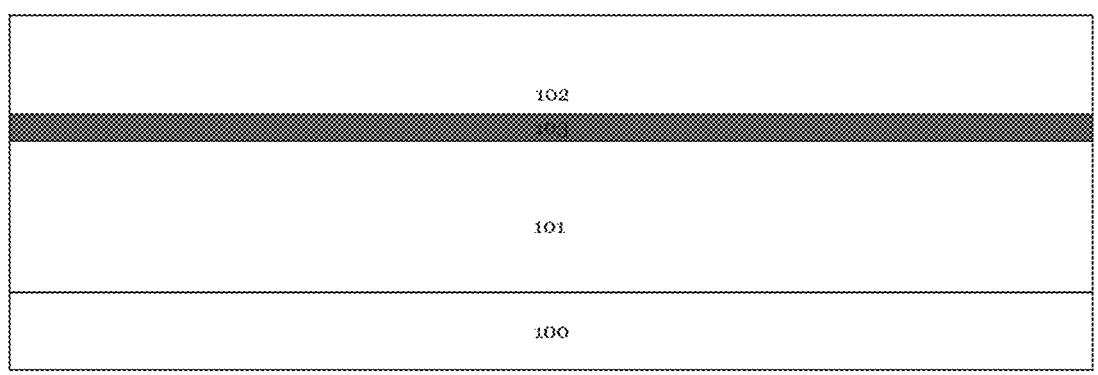
Figures 2, 28:
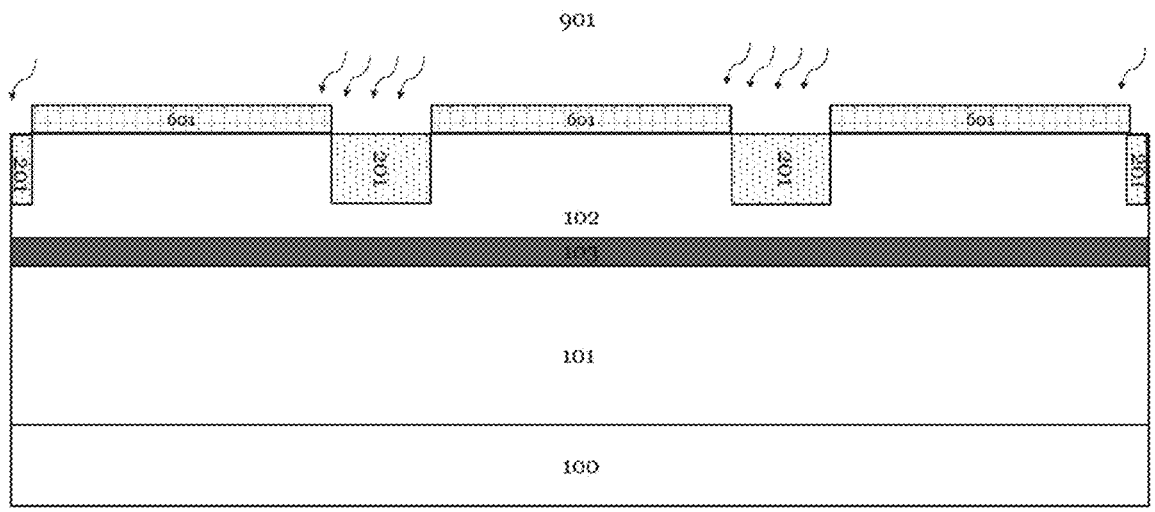
Figures 3, 28:
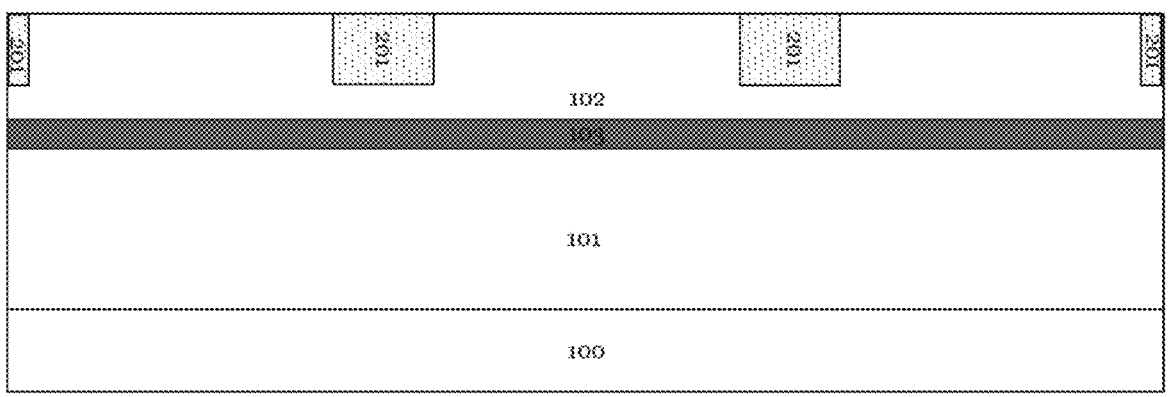
Figures 4, 28:
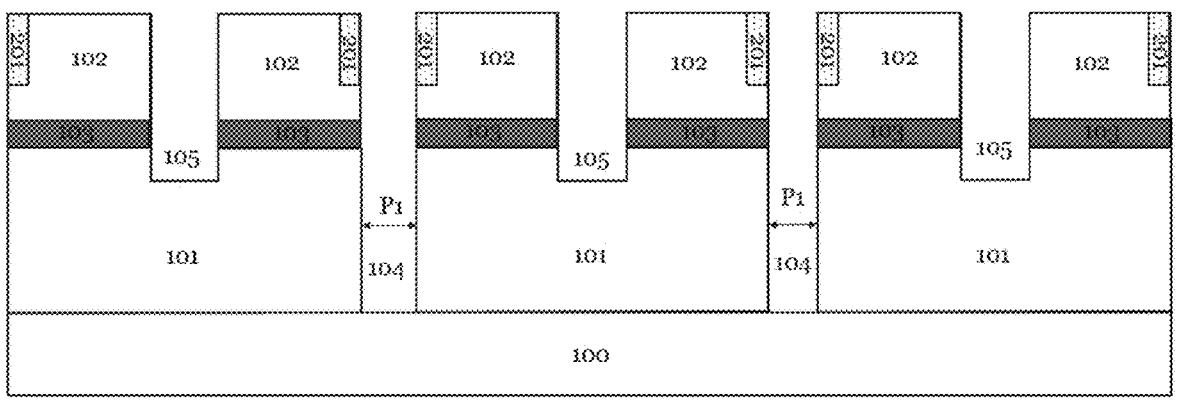
Figures 5, 28:
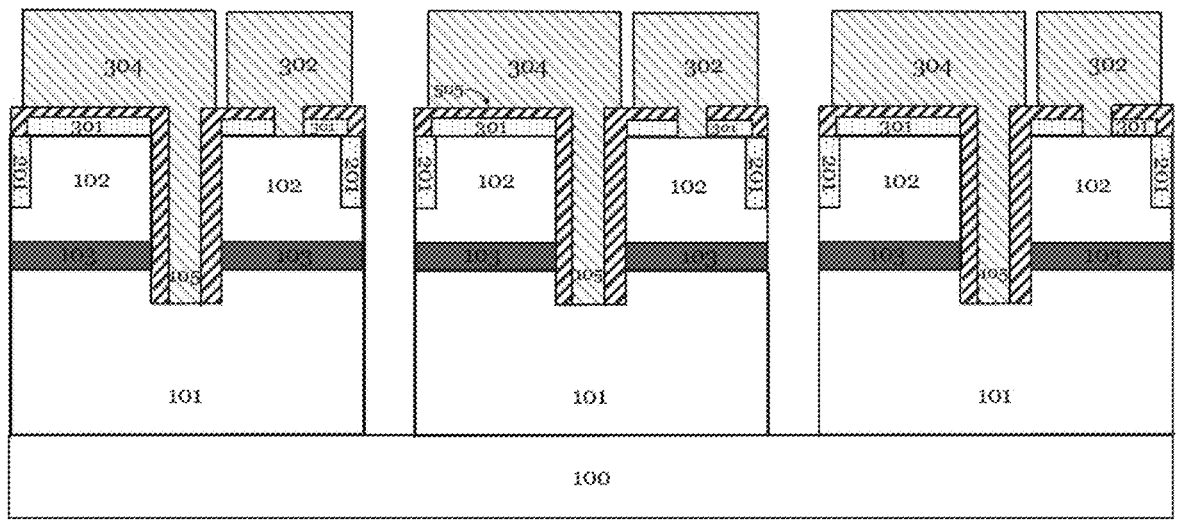
Figures 6, 28:
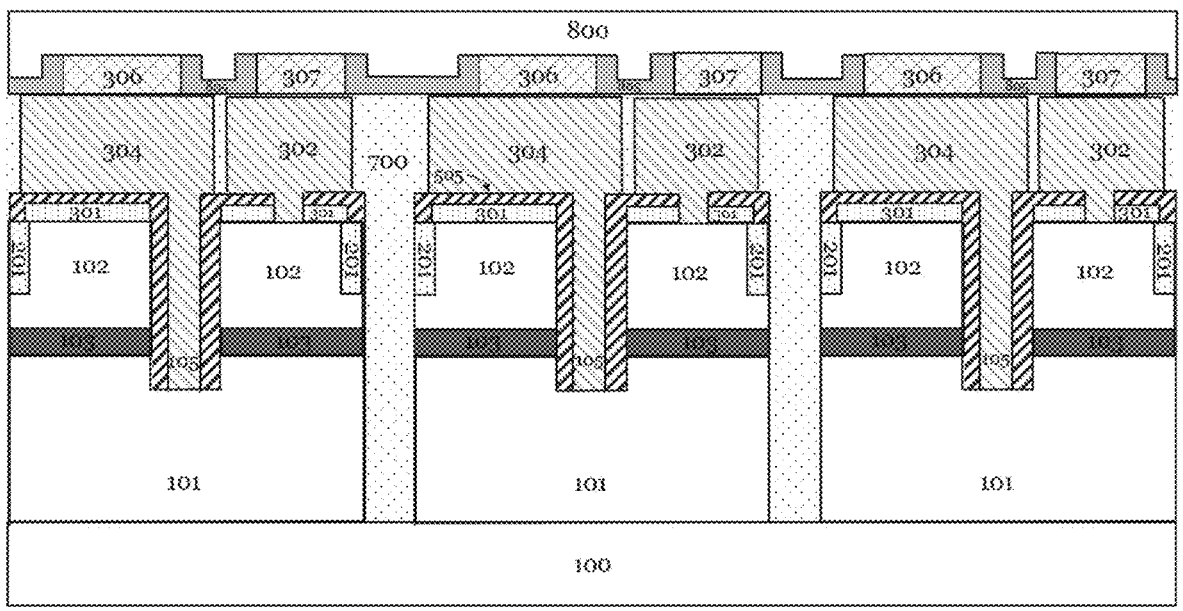
Figures 7, 28:
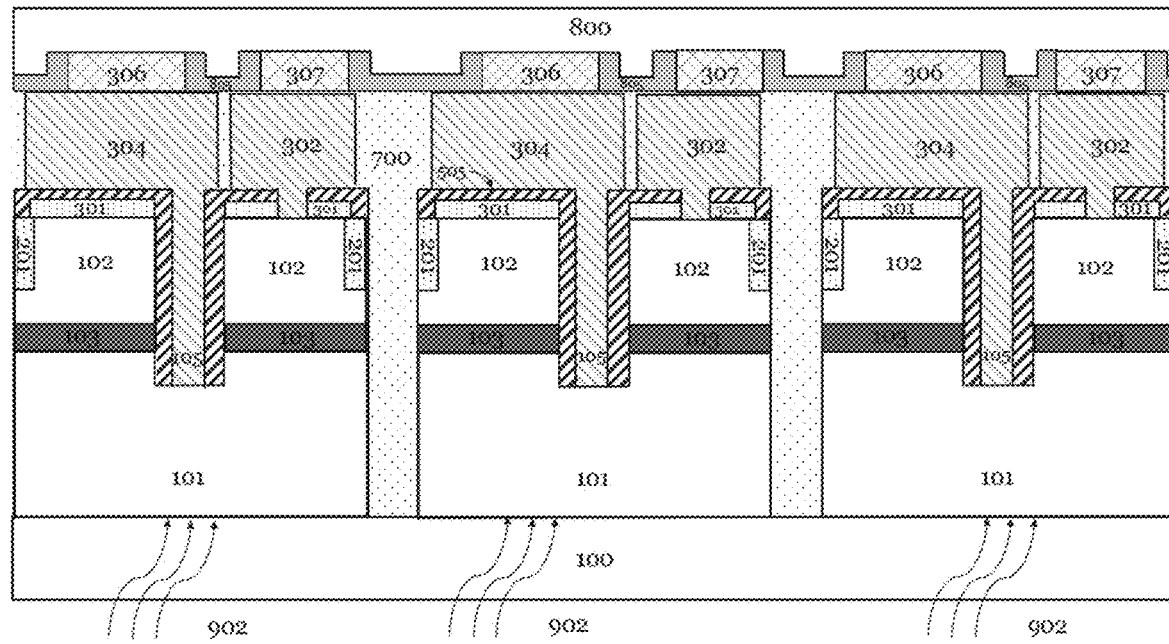
Figures 8, 28:
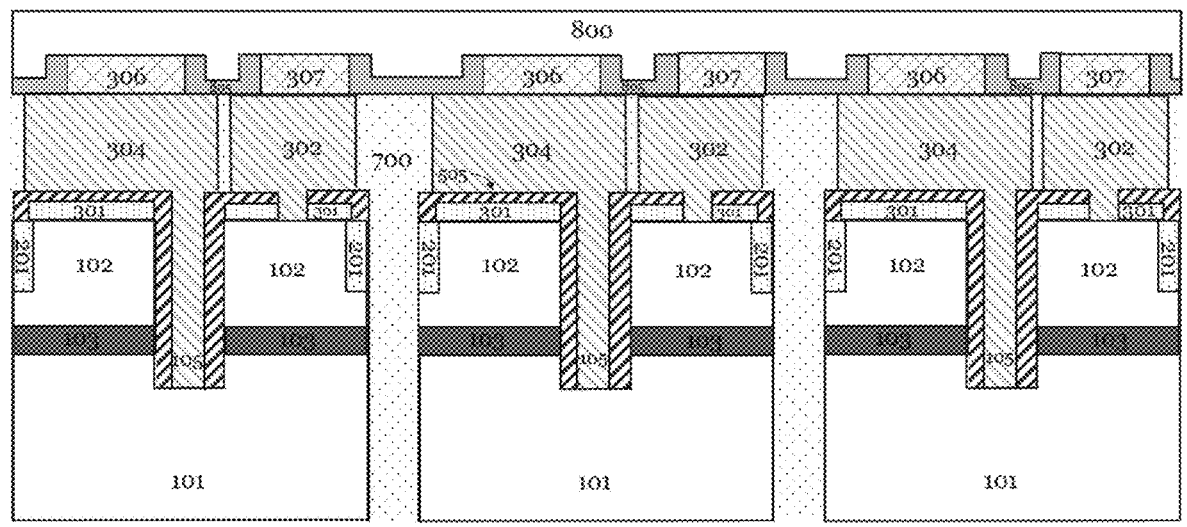
Figures 9, 28:
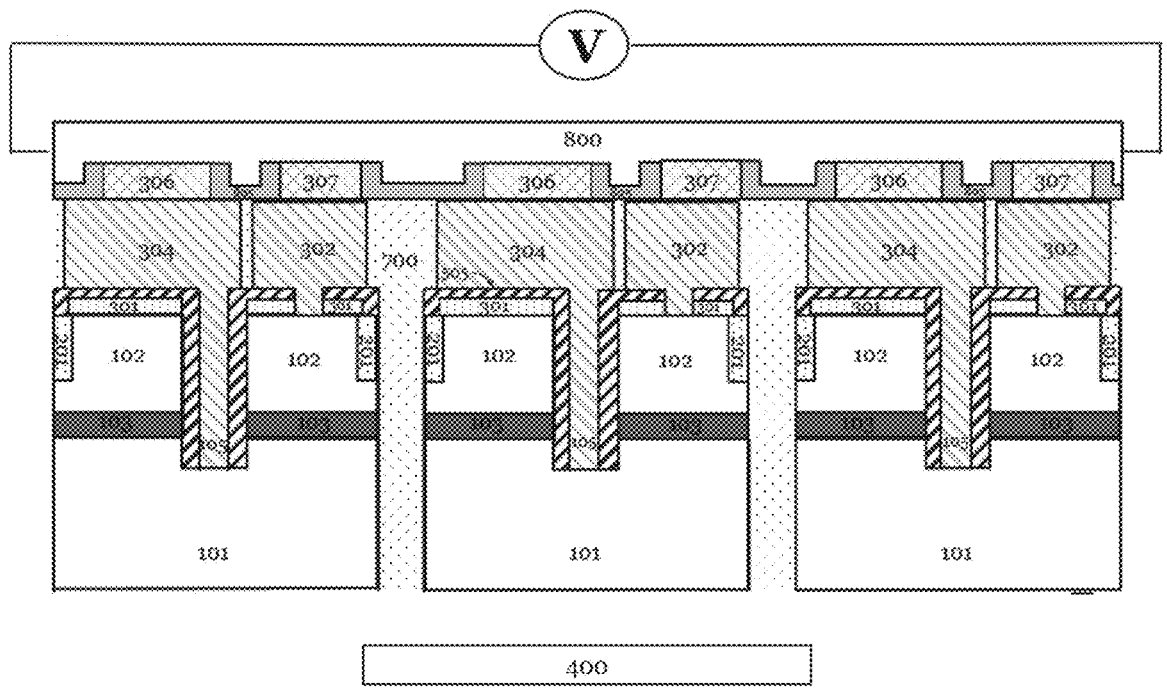
Figures 10, 28:
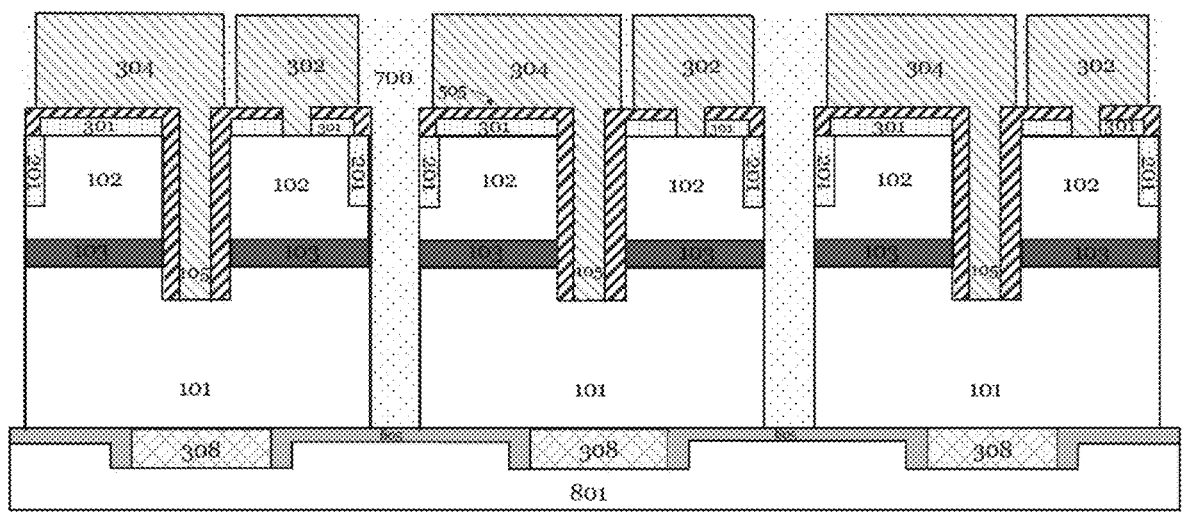
Figures 11, 28:
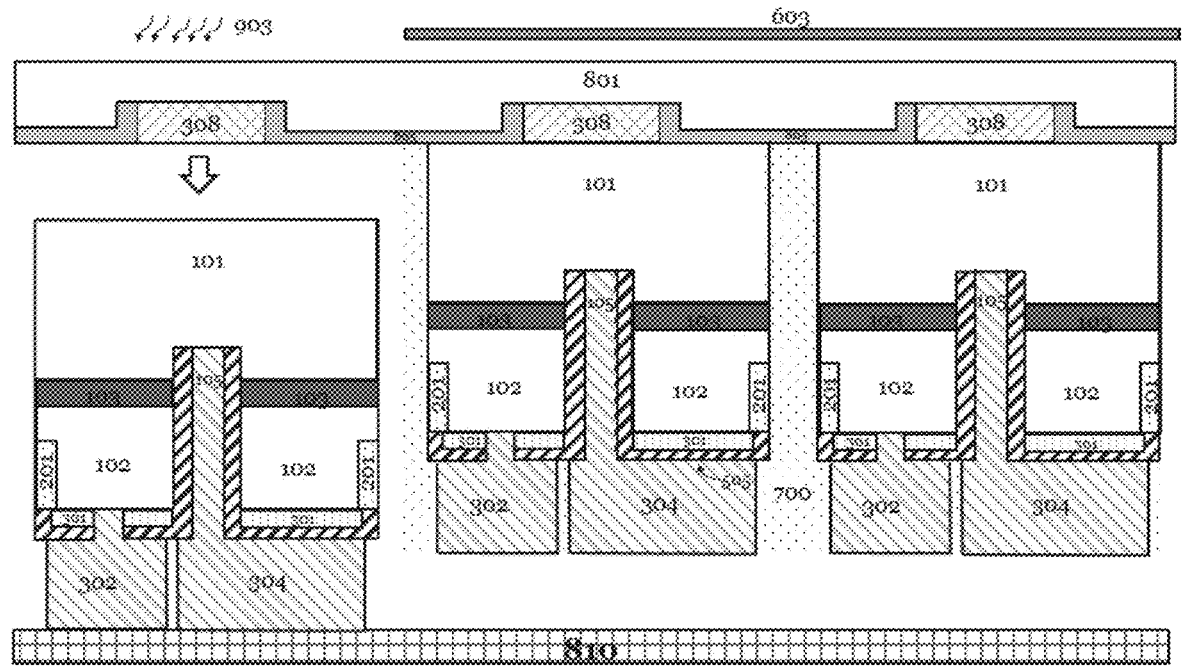
Figures 12, 28:
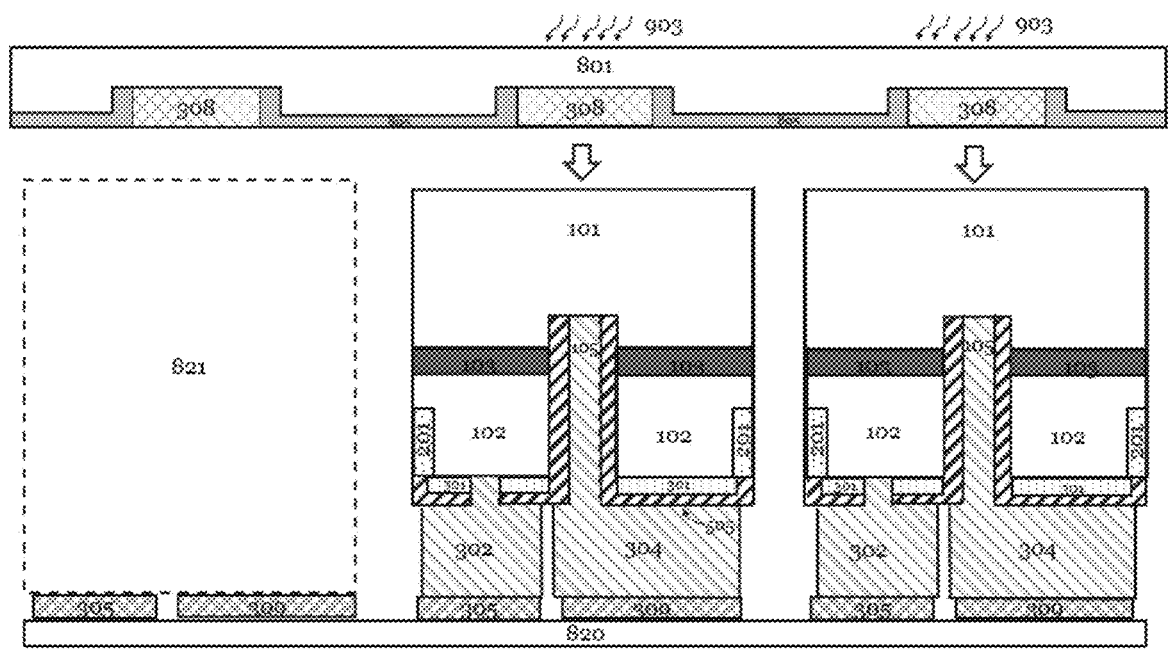
Figures 13, 28:
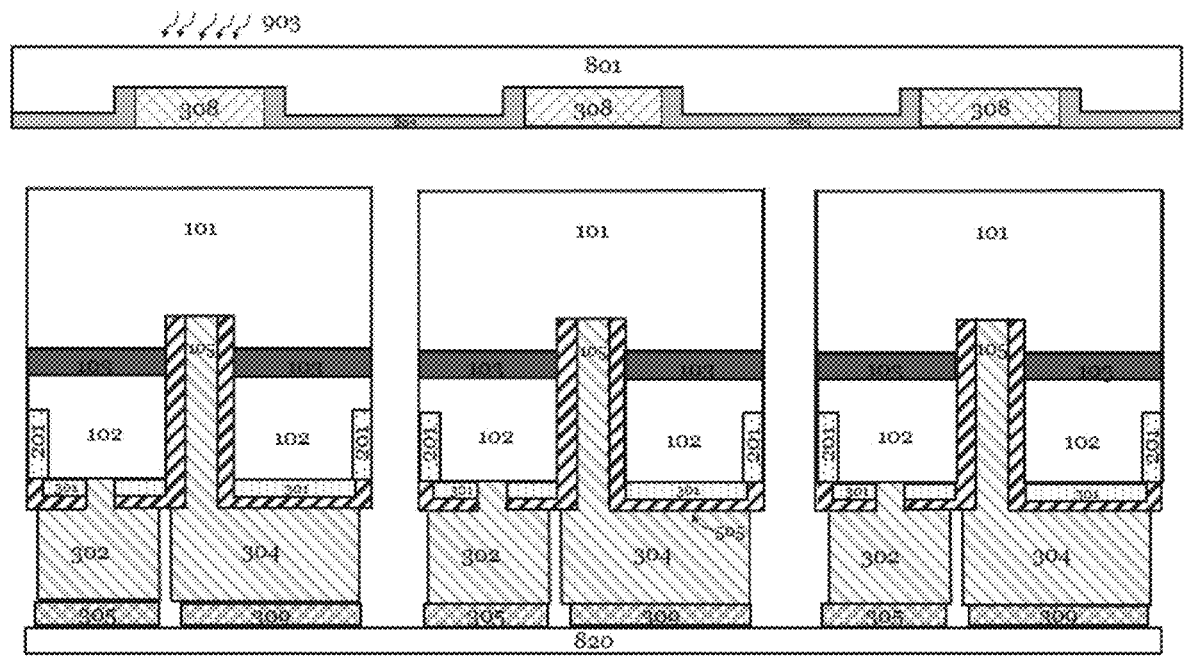
Figures 14, 28:
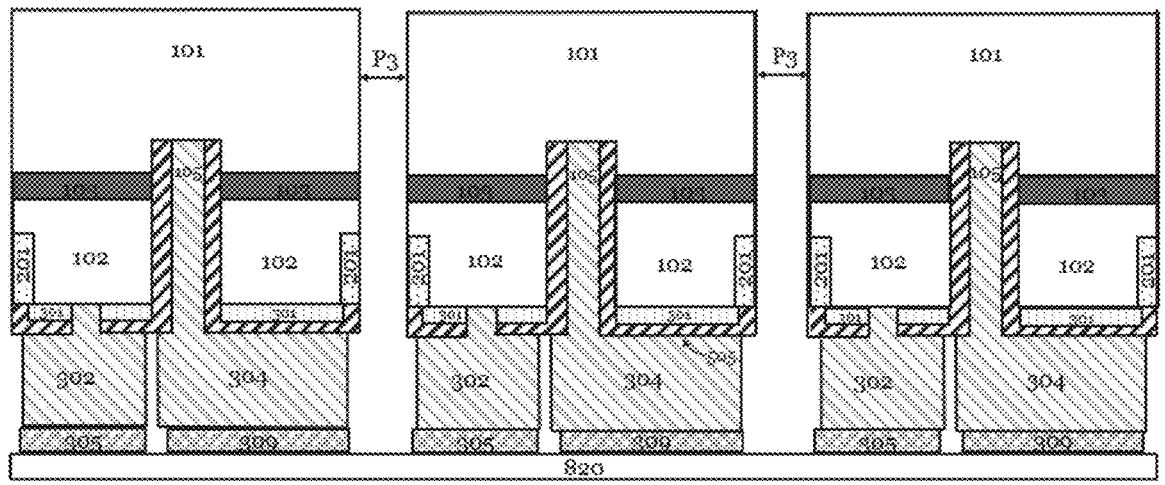
Figures 15, 28:
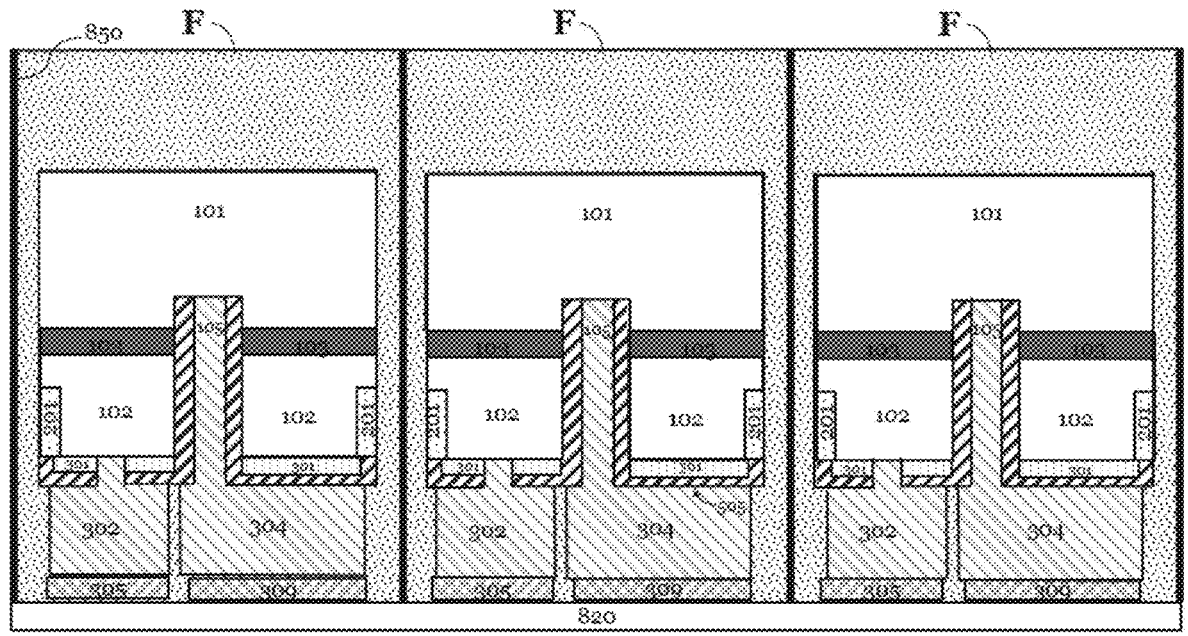
Figures 16, 28:
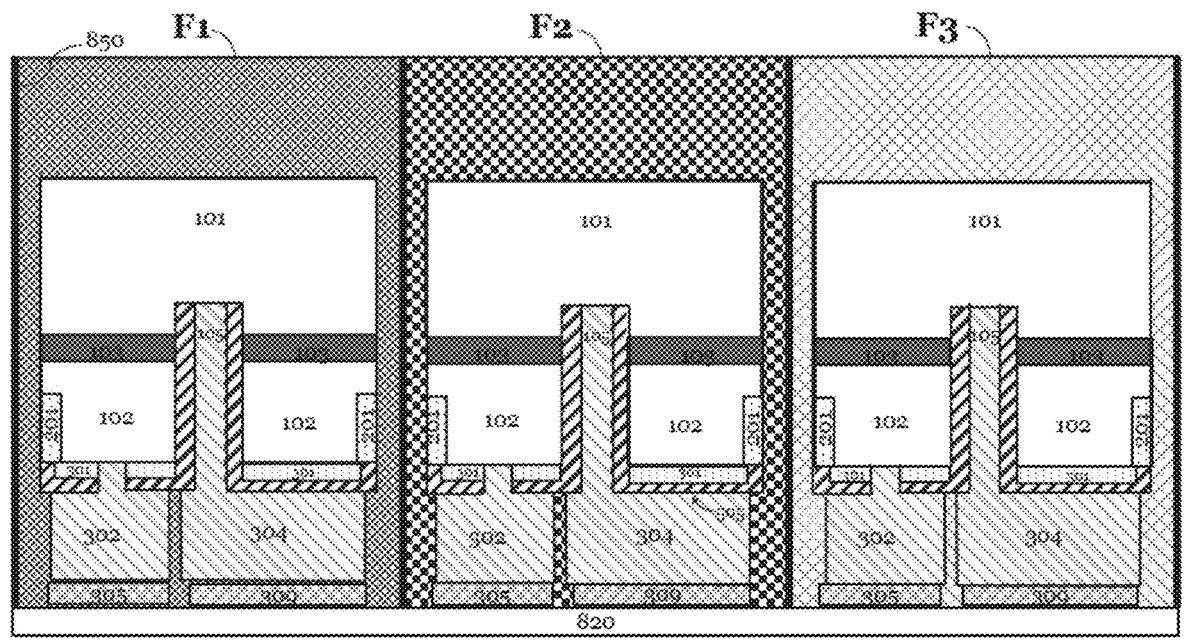
Figures 17, 28:
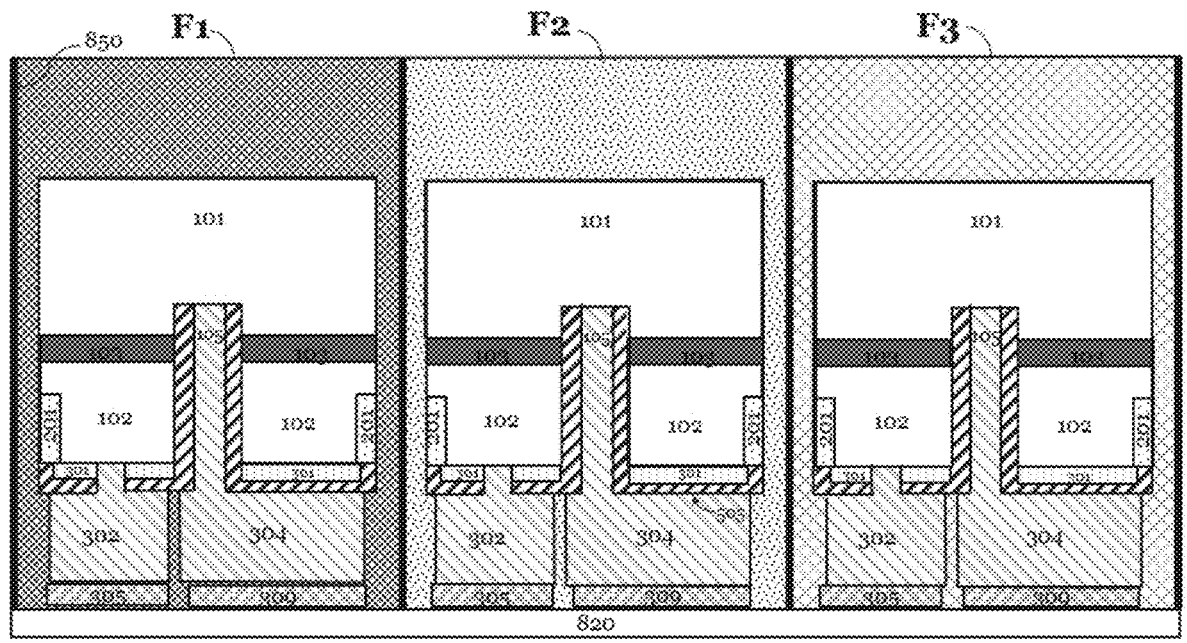

FIG. 57-17 schematically illustrates a vertical magnetic micro light emitting diode.

Figures 18, 28:
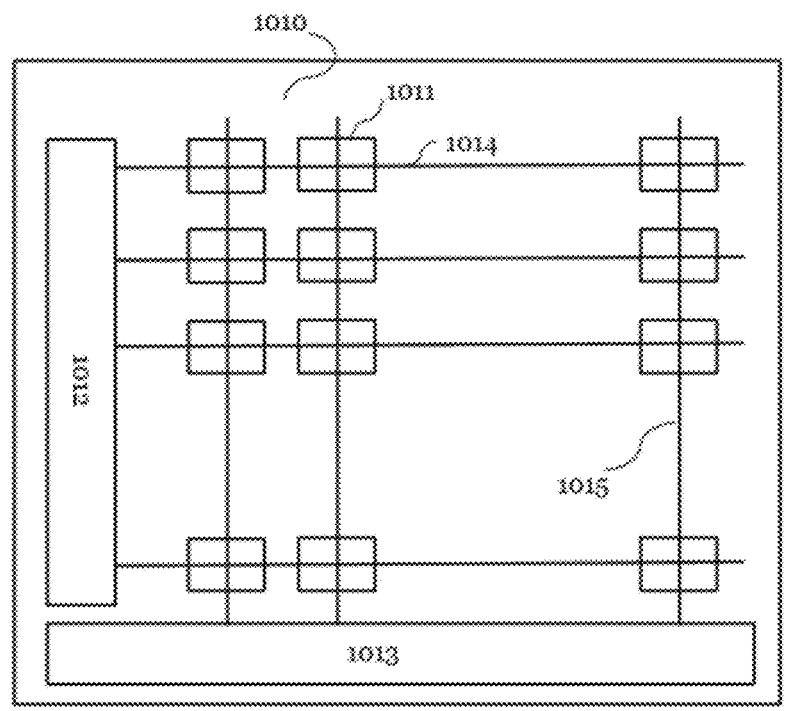

FIG. 57-18 schematically illustrates a vertical magnetic micro light emitting diode.

Figures 19, 57:
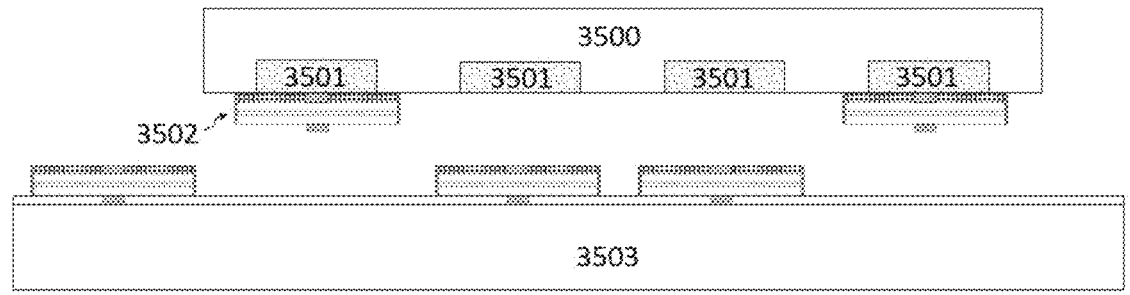

FIG. 57-19 schematically illustrates mass transfer of magnetic micro light emitting diodes to a target substrate by controlling a transferring head which is magnetically attractive and controllable.

Figures 20, 57:
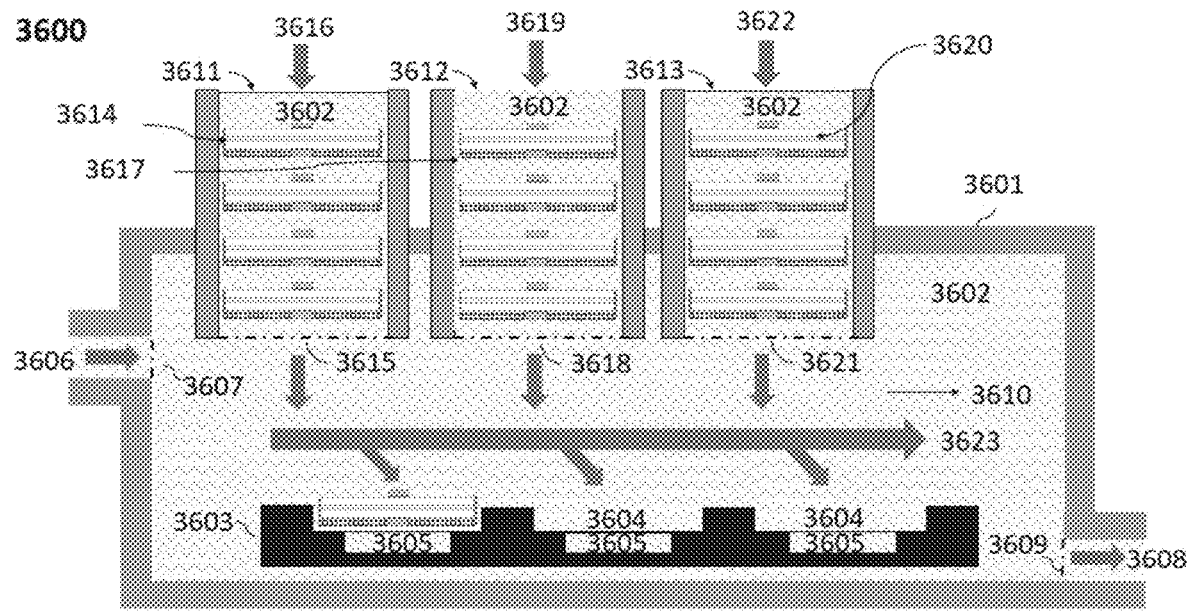

FIG. 57-20 schematically illustrates a fluid transfer system.

Figures 1, 21, 57:
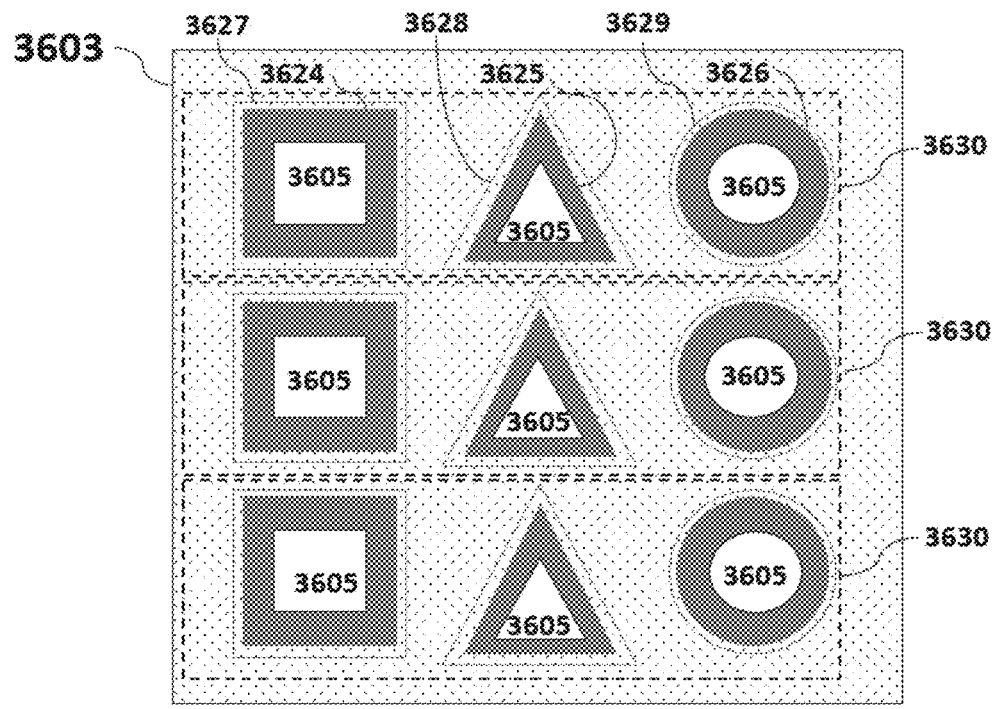
Figures 2, 21, 57:
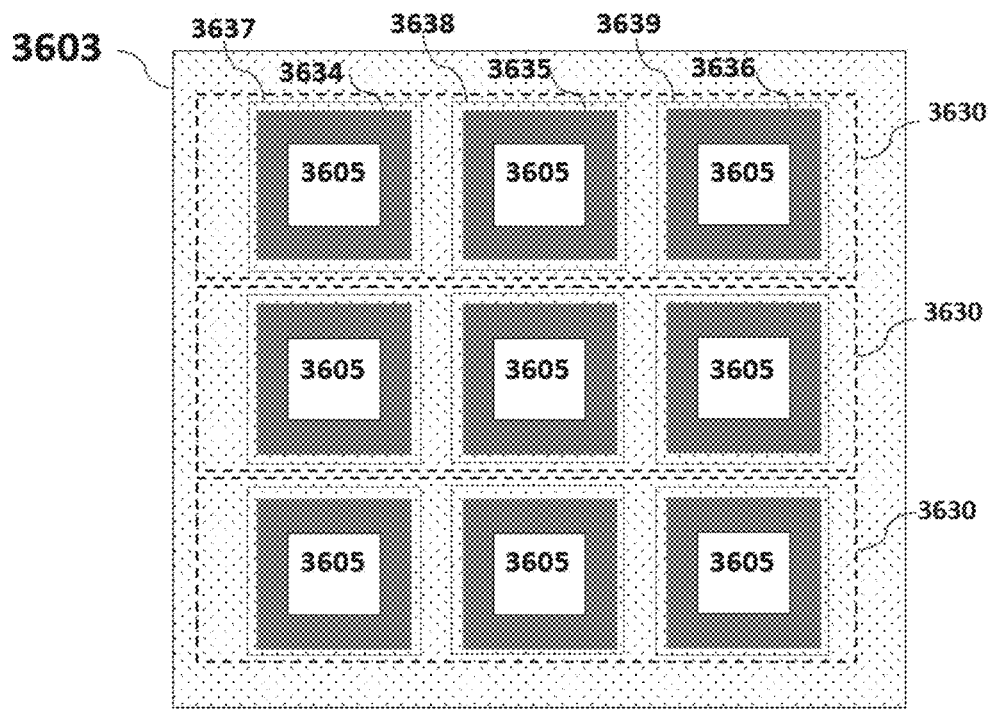

FIG. 57-21-1 schematically illustrates a top view of a substrate of the fluid transfer system.

FIG. 57-21-2 schematically illustrates a top view of a substrate of the fluid transfer system.

Figures 1, 22, 57:
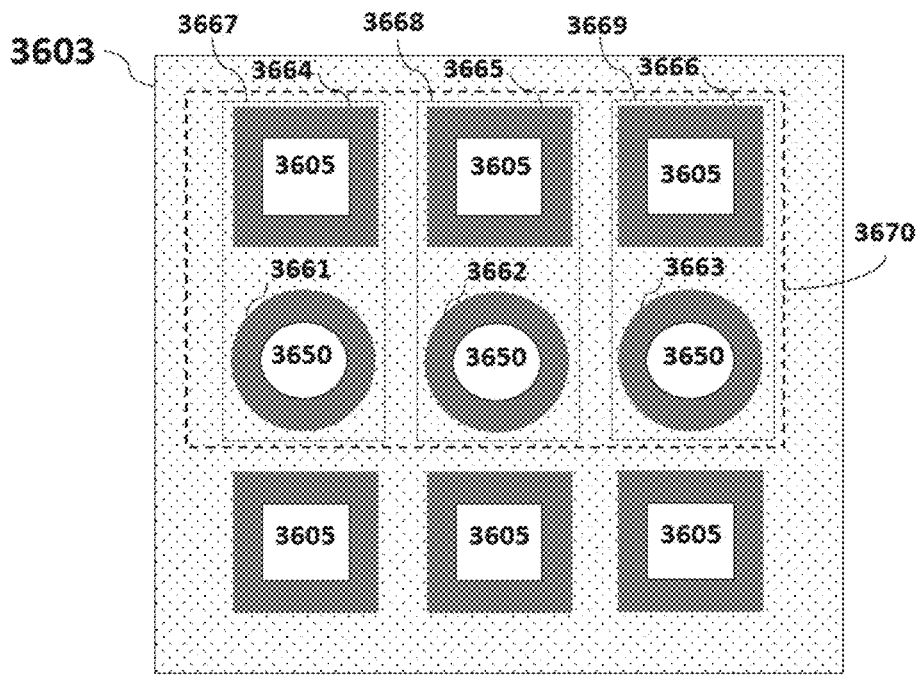
Figures 2, 22, 57:
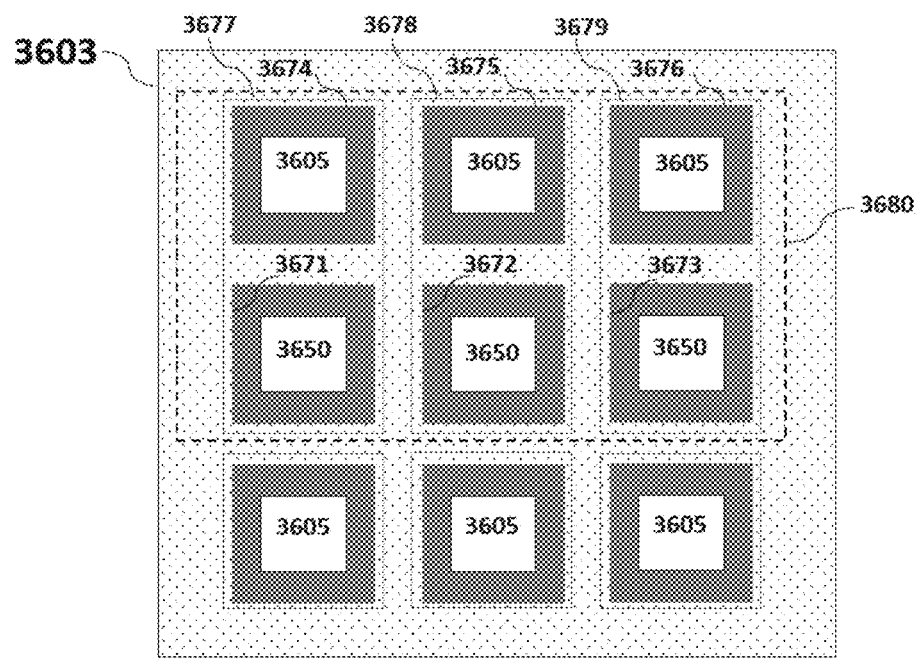

FIG. 57-22-1 schematically illustrates a top view of a substrate of the fluid transfer system.

FIG. 57-22-2 schematically illustrates a top view of a substrate of the fluid transfer system.

Figures 23, 57:
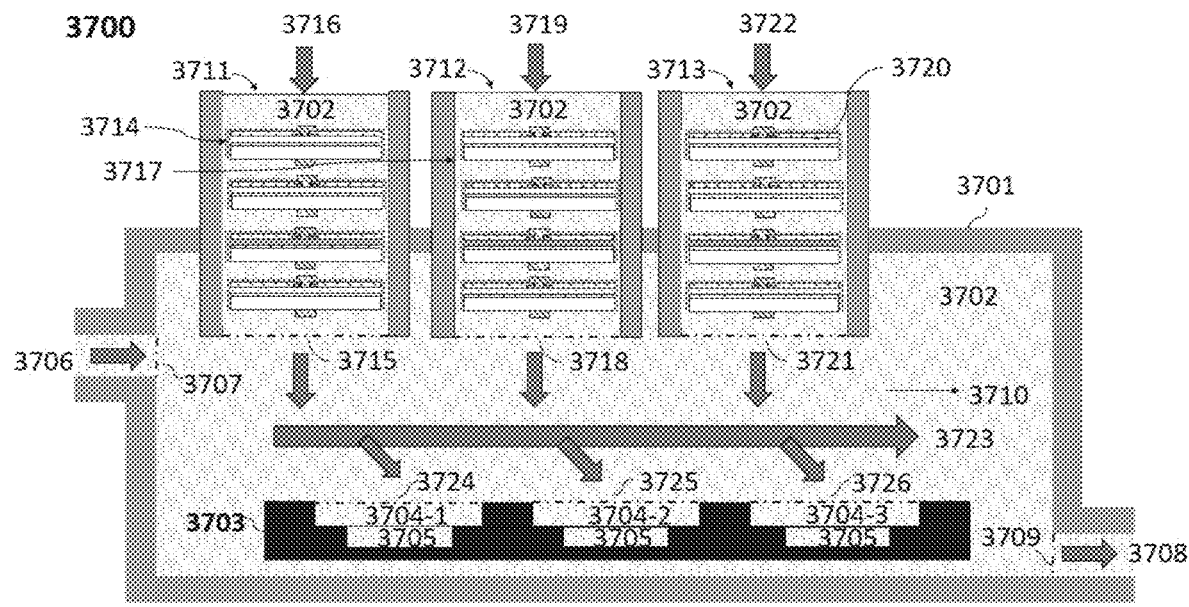

FIG. 57-23 schematically illustrates a fluid transfer system.

Figures 24, 57:
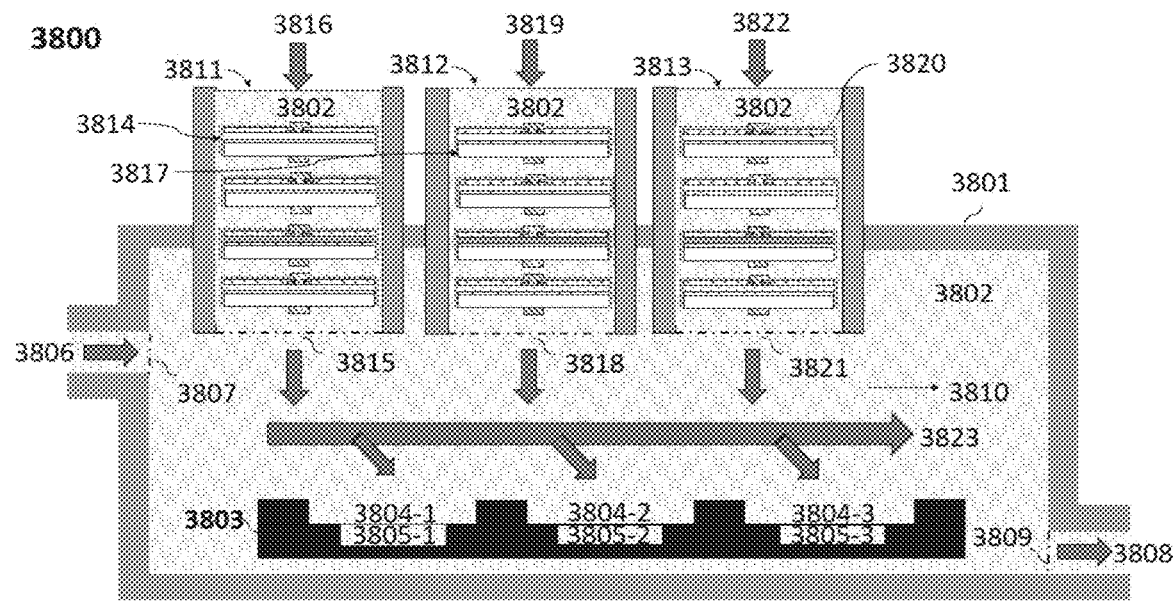

FIG. 57-24 schematically illustrates a fluid transfer system.

Figures 25, 57:
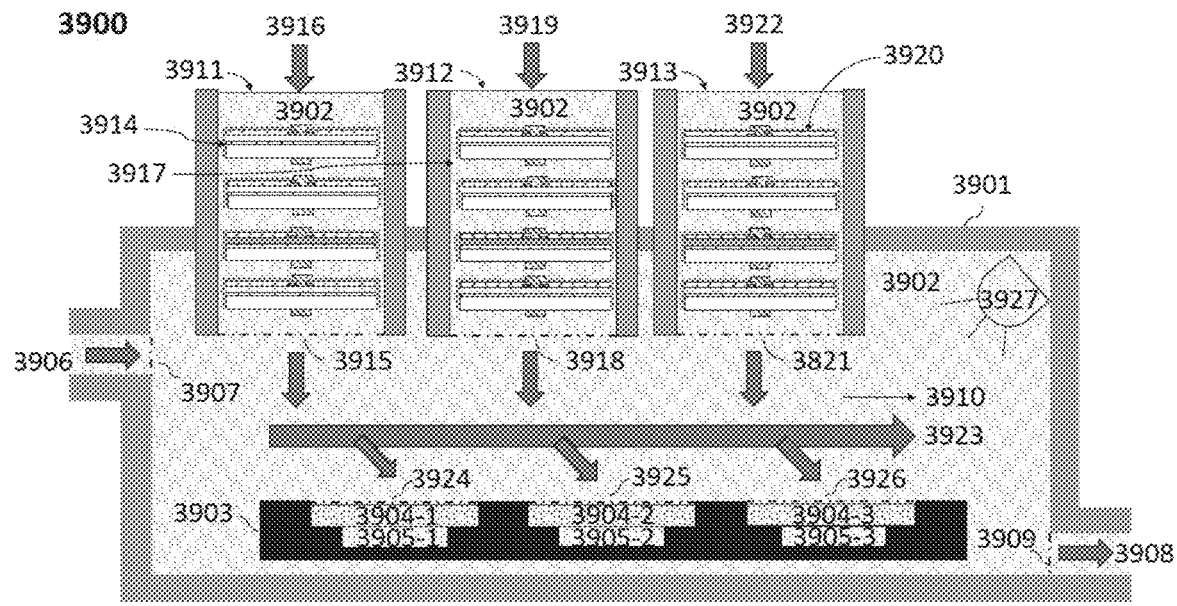

FIG. 57-25 schematically illustrates a fluid transfer system.

Figure 1A:
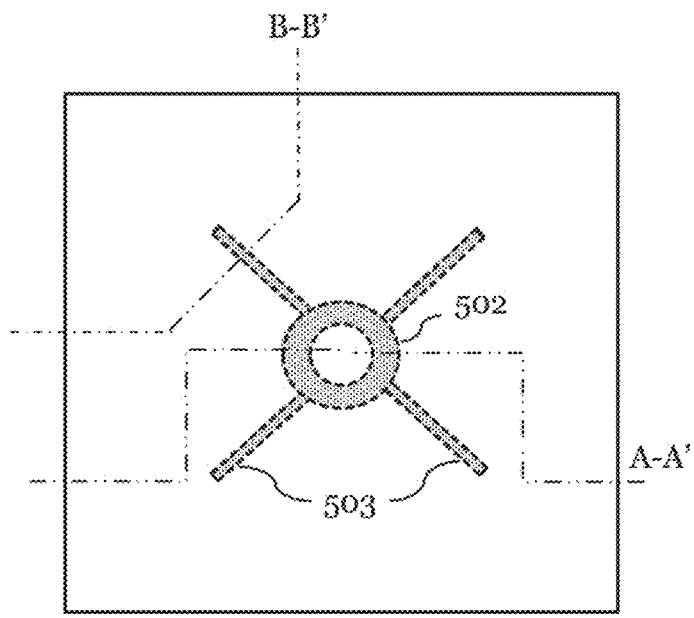
FIG. 1A schematically illustrates a top view of a traditional light emitting diode.
Figures 1A, 58:
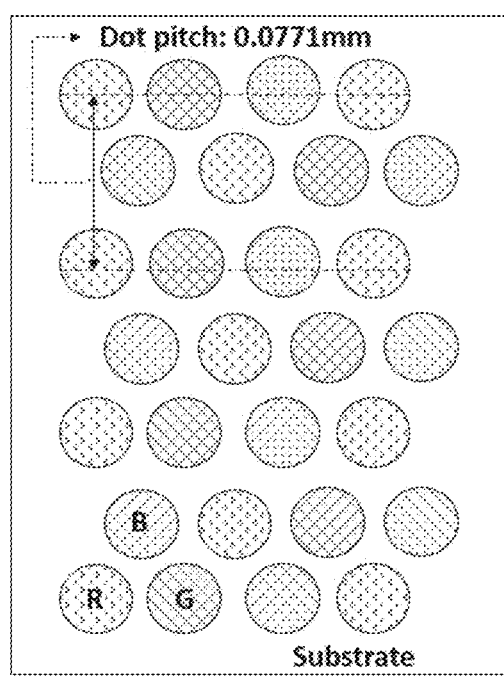
Figures 1B, 58:
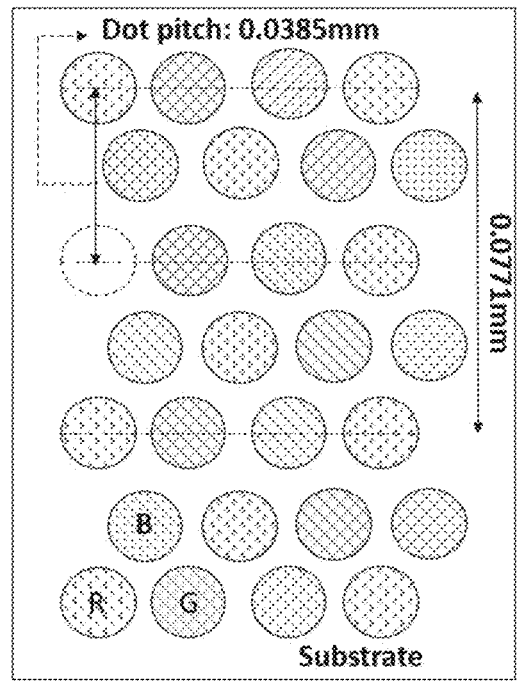
Figures 1C, 58:
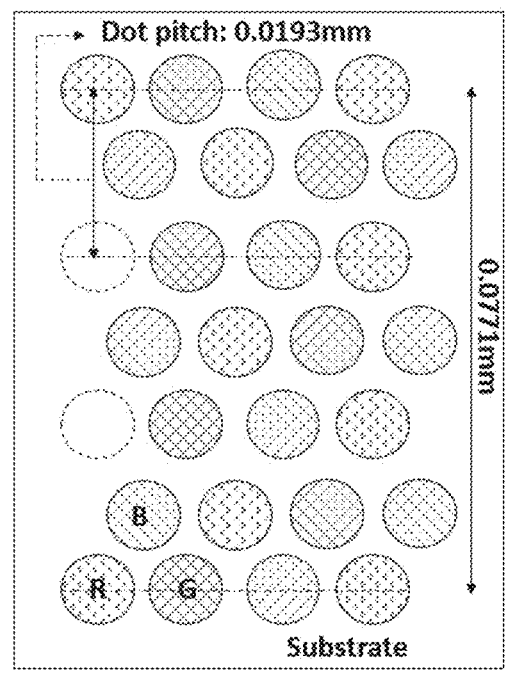
Figures 2A, 58:
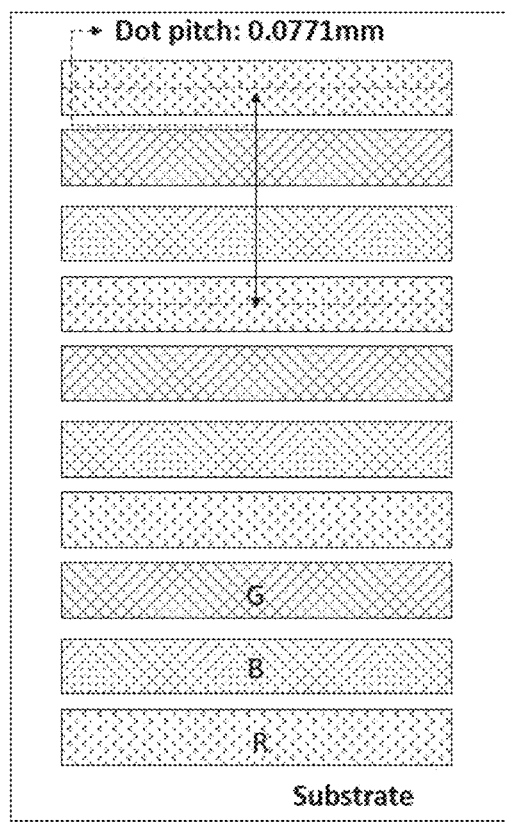
Figures 2B, 58:
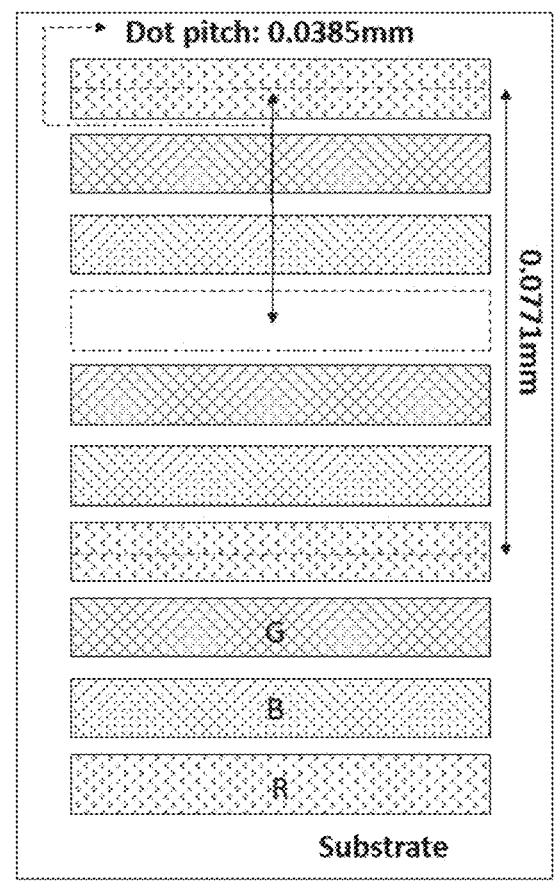
Figures 2C, 58:
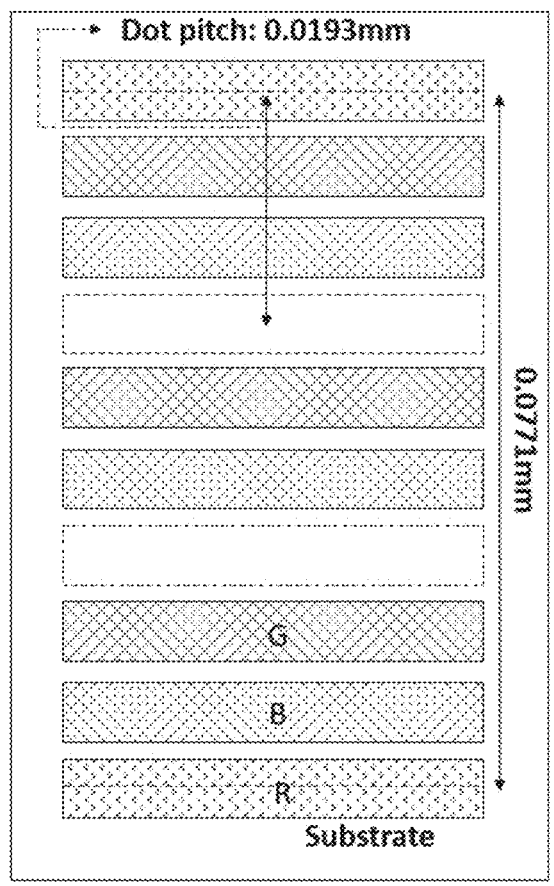
Figures 3A, 58:
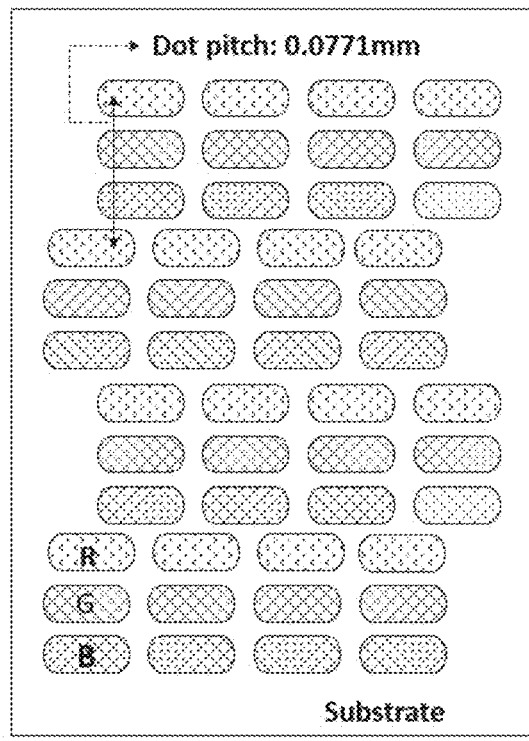
Figures 3B, 58:
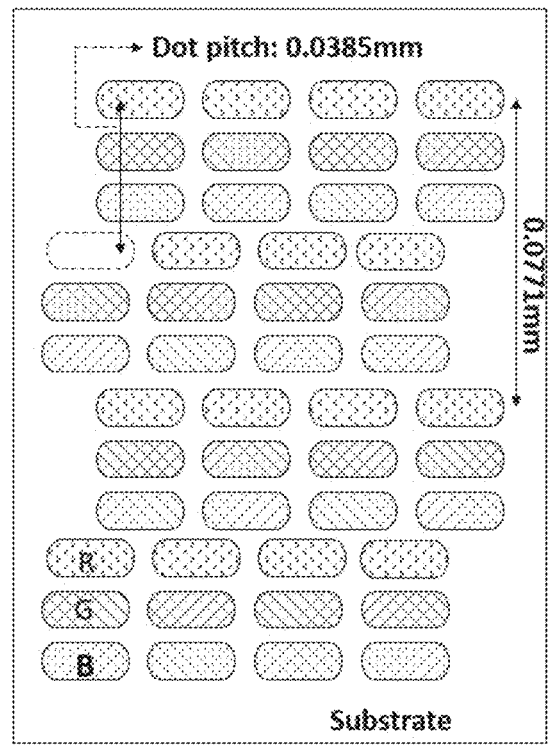
Figures 3C, 58:
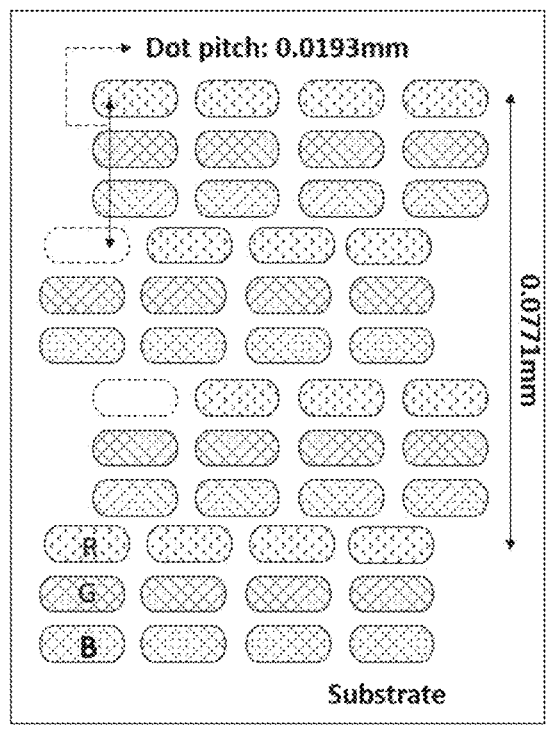

FIG. 58-1A schematically illustrates a traditional display device.

FIG. 58-2A schematically illustrates a traditional display device.

Figure 3A:
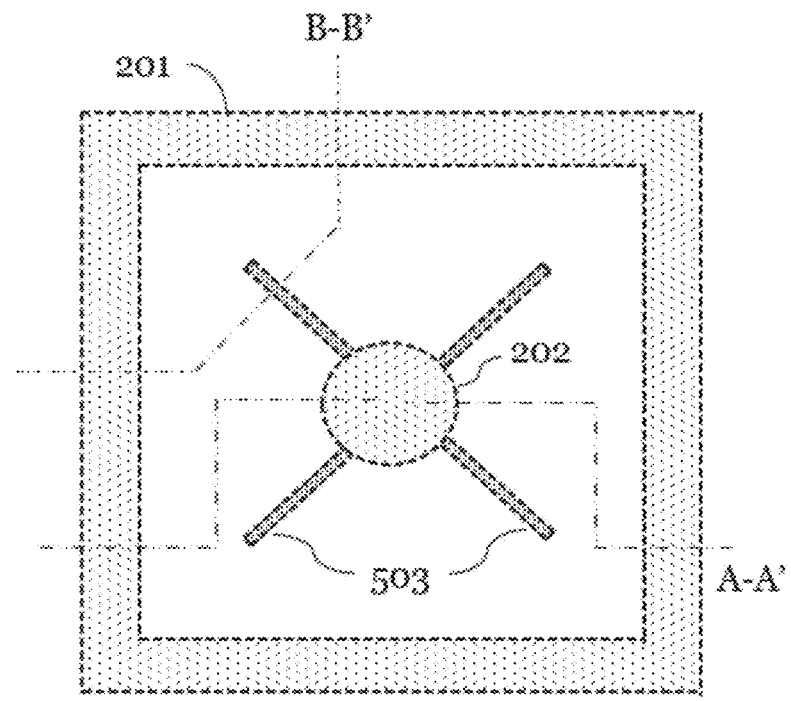
FIG. 3A schematically illustrates a top view according to an embodiment of the present invention.

FIG. 58-3A schematically illustrates a traditional display device.

Figure 1B:
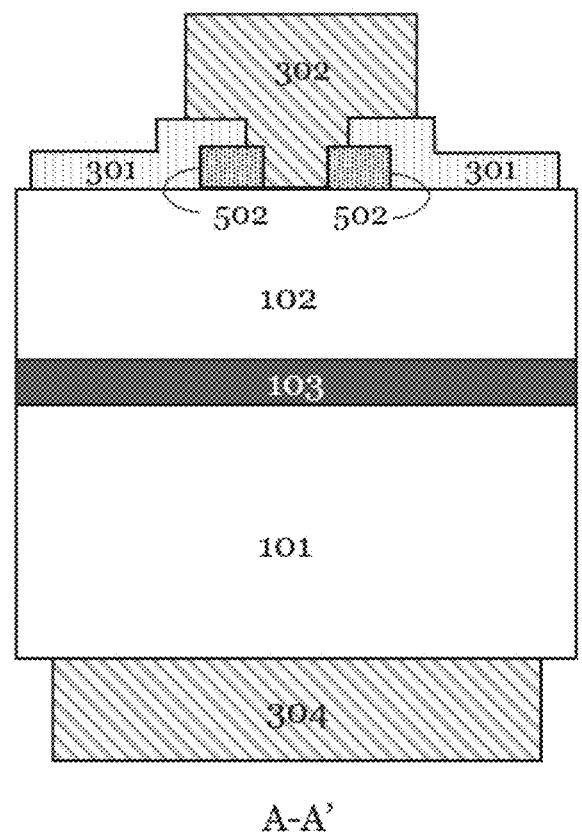
FIG. 1B schematically illustrates a cross-sectional view of a traditional light emitting diode along line A-A'.

FIG. 58-1B schematically illustrates a high resolution display device.

FIG. 58-2B schematically illustrates a high resolution display device.

Figure 3B:
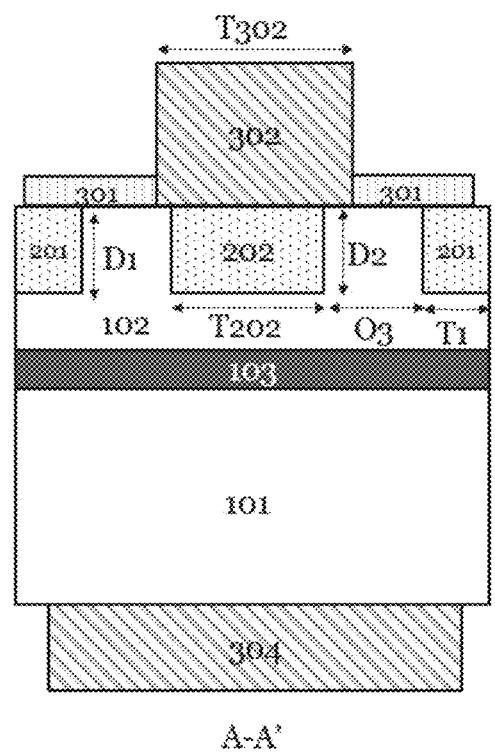
FIG. 3B and FIG. 3D schematically illustrate a cross-sectional view along line A-A according to an embodiment of the present invention.

FIG. 58-3B schematically illustrates a high resolution display device.

Figure 1C:
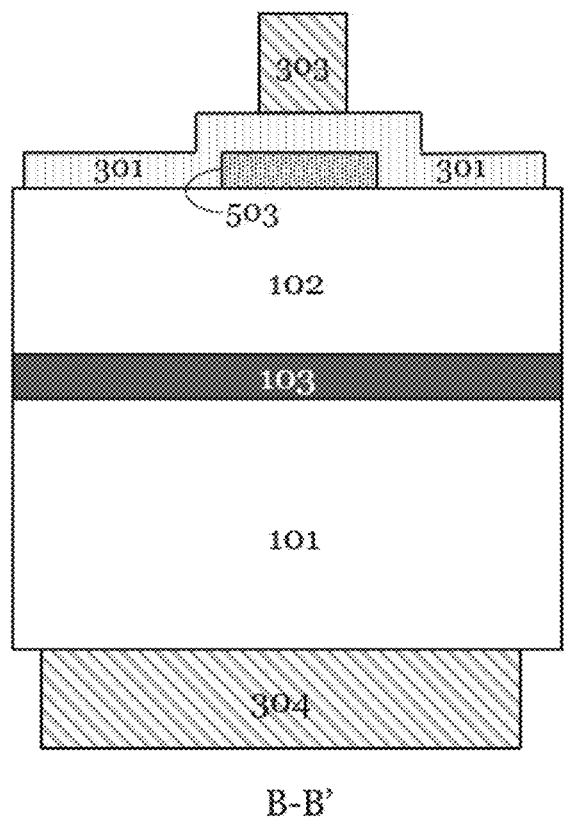
FIG. 1C schematically illustrates a cross-sectional view of a traditional light emitting diode along line B-B'.

FIG. 58-1C schematically illustrates a high resolution display device.

FIG. 58-2C schematically illustrates a high resolution display device.

Figure 3C:
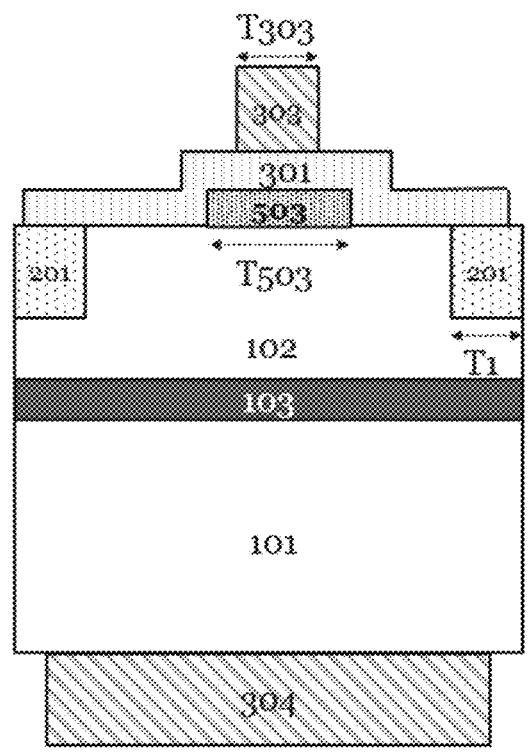
FIG. 3C and FIG. 3E schematically illustrate a cross-sectional view along line B-B' according to an embodiment of the present invention.
Figure 3D:
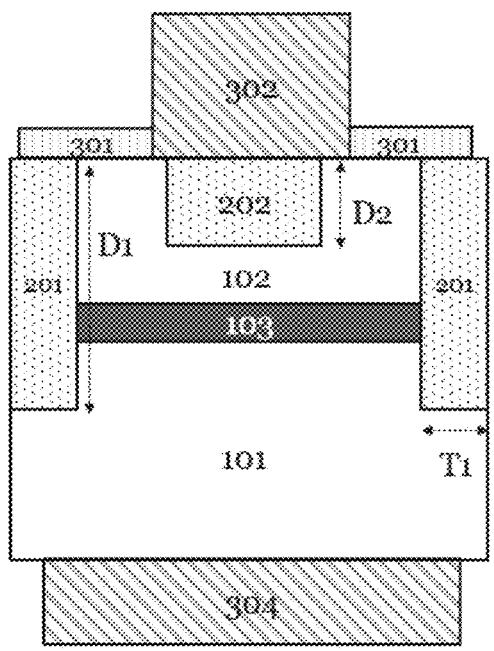
Figure 3E:
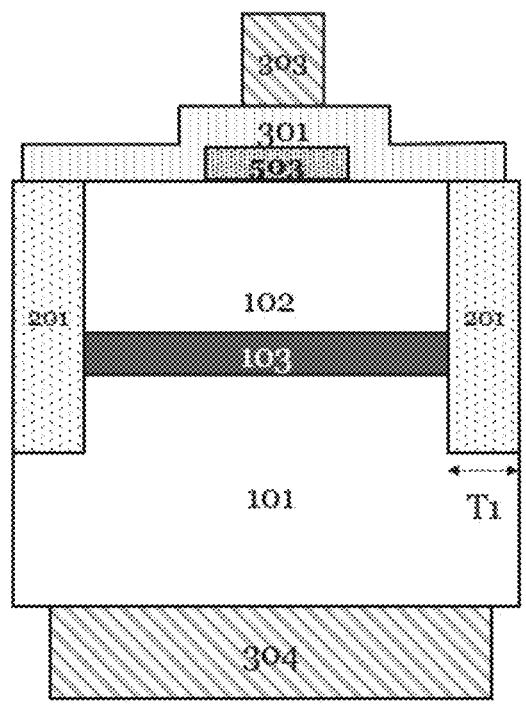
Figure 4A:
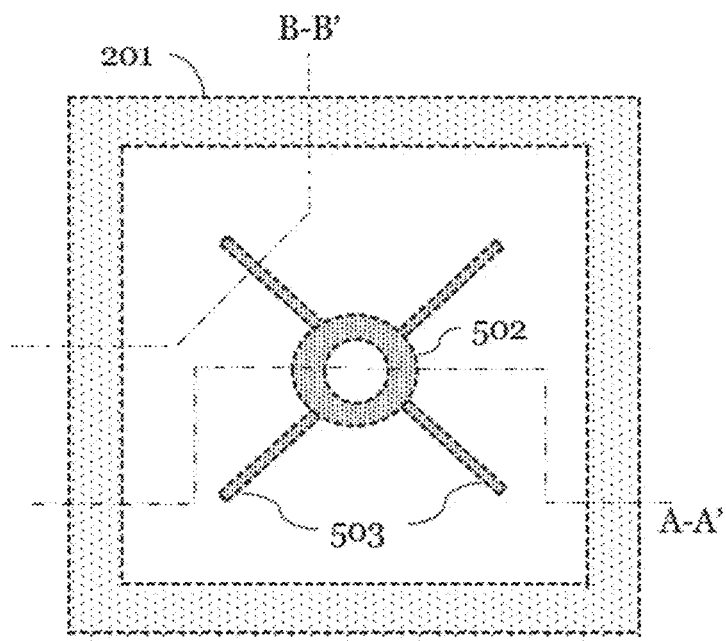
FIG. 4A schematically illustrates a top view according to an embodiment of the present invention.
Figure 4B:
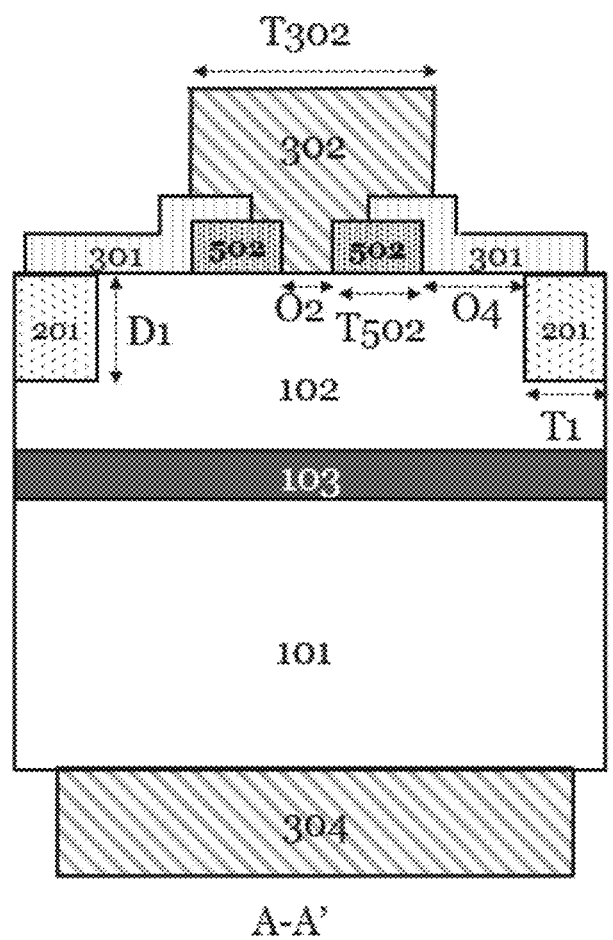
FIG. 4B and FIG. 4D schematically illustrate cross-sectional views along line A-A according to an embodiment of the present invention.
Figure 4C:
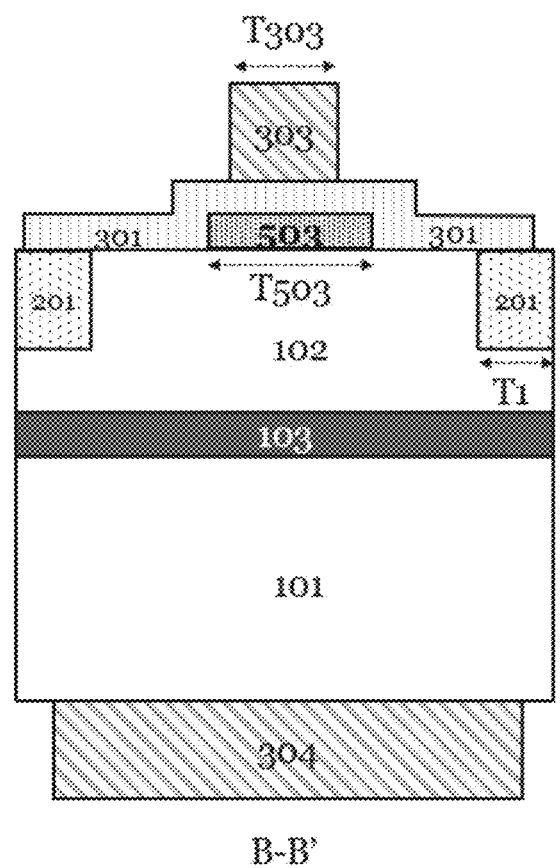
FIG. 4C and FIG. 4E schematically illustrate a cross-sectional view along line B-B' according to an embodiment of the present invention.
Figure 4D:
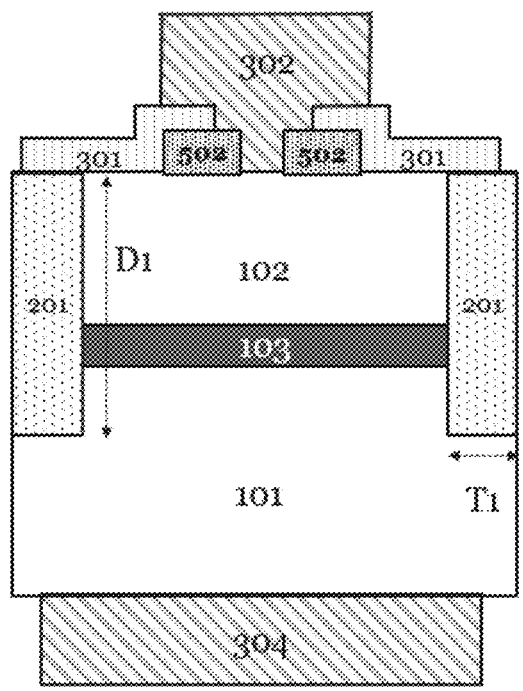
Figure 4E:
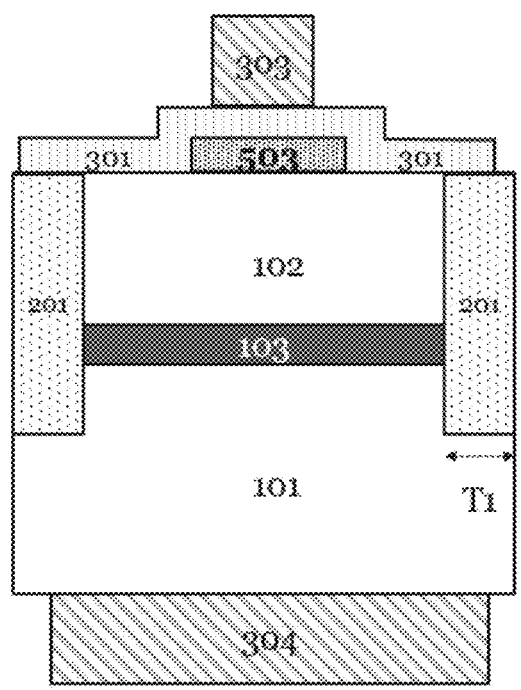
Figure 5A:
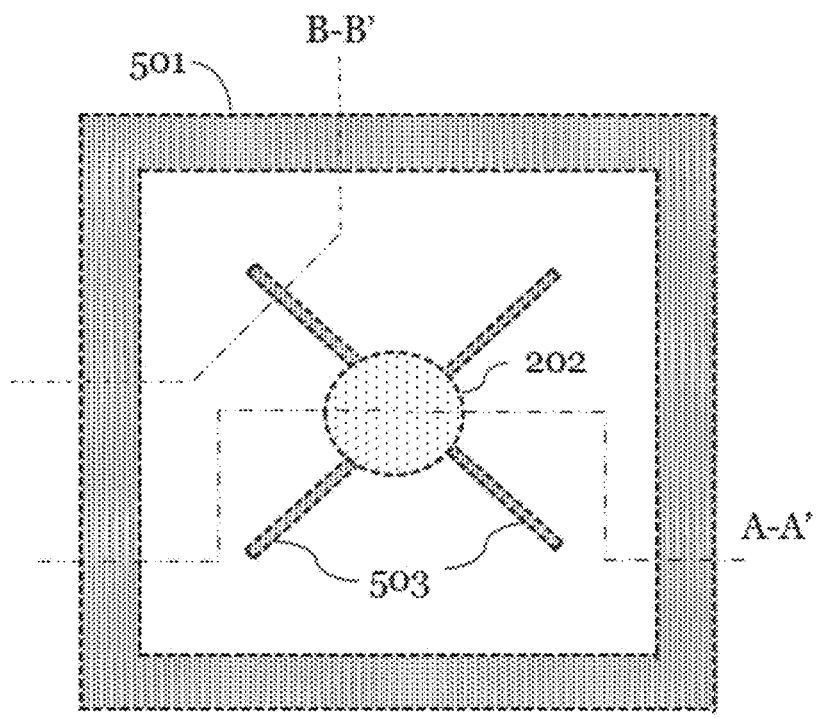
FIG. 5A schematically illustrates a top view according to an embodiment of the present invention.
Figure 5B:
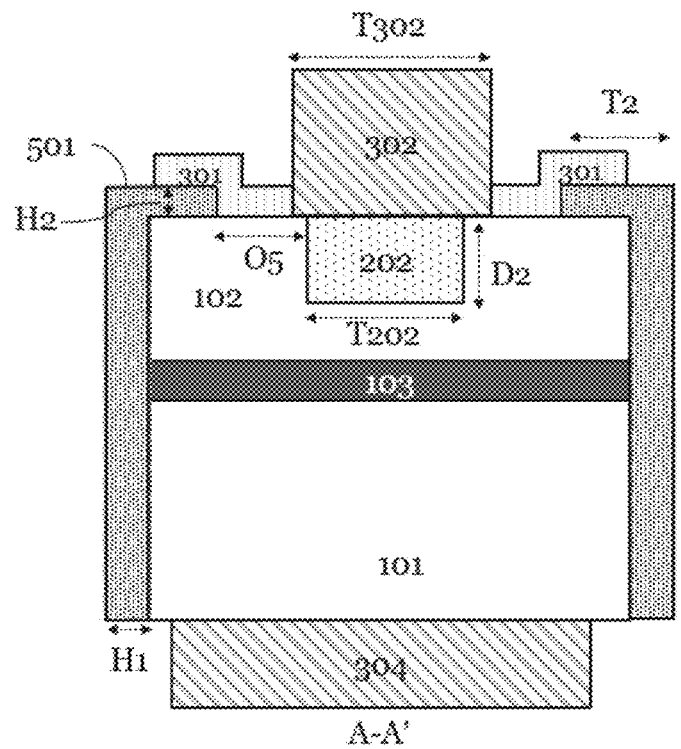
FIG. 5B schematically illustrates a cross-sectional view along line A-A' according to an embodiment of the present invention.
Figure 5C:
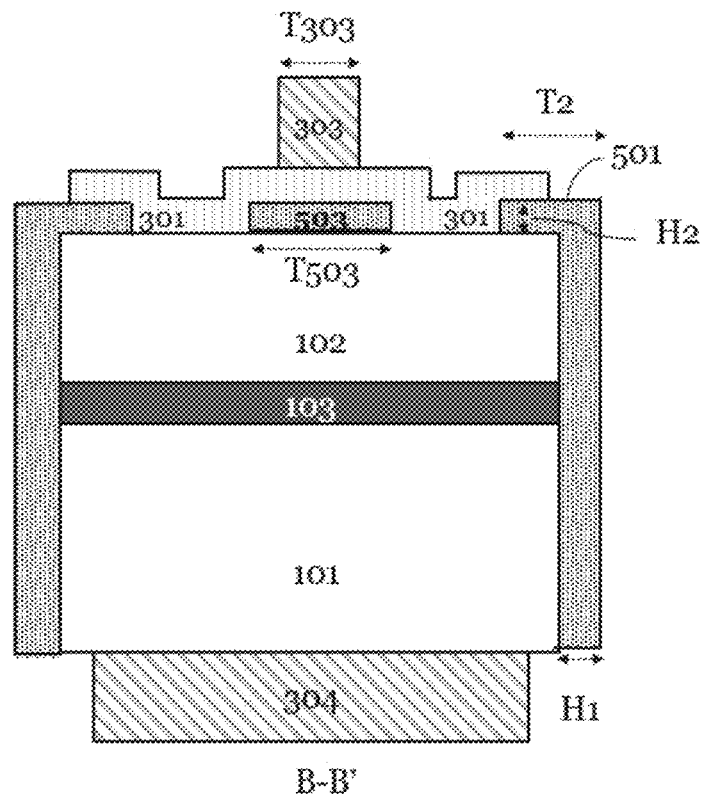
FIG. 5C schematically illustrates a cross-sectional view along line B-B' according to an embodiment of the present invention.
Figure 6A:
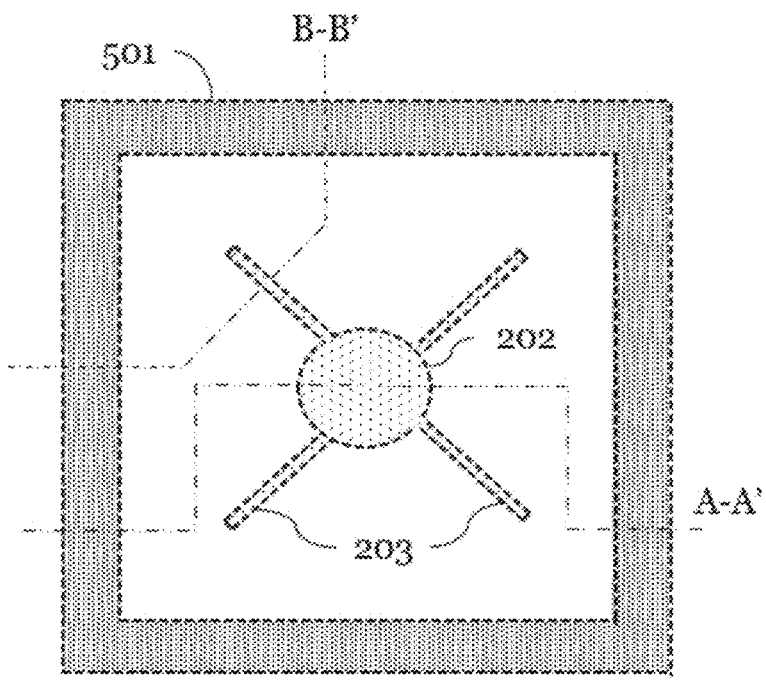
FIG. 6A schematically illustrates a top view according to an embodiment of the present invention.
Figure 6B:
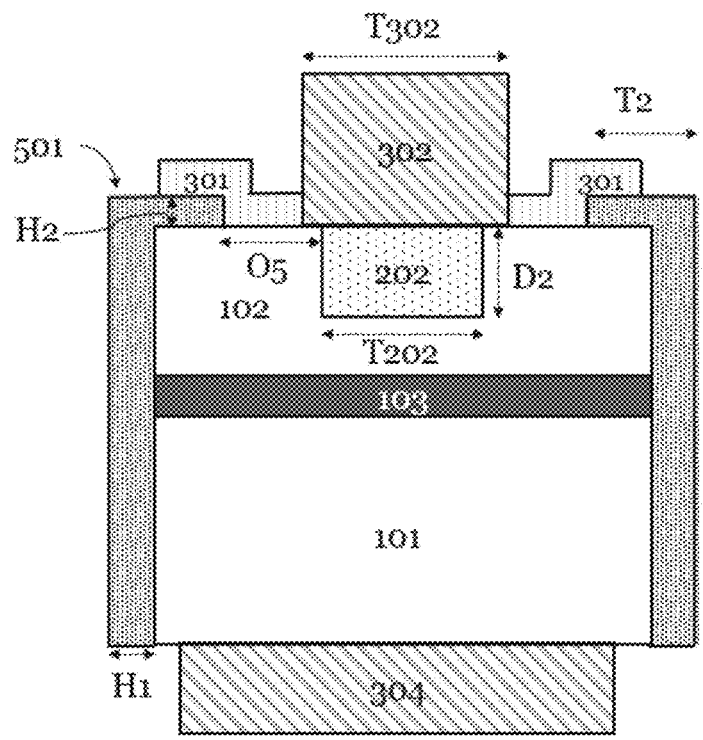
FIG. 6B schematically illustrates a cross-sectional view along line A-A' according to an embodiment of the present invention.
Figure 6C:
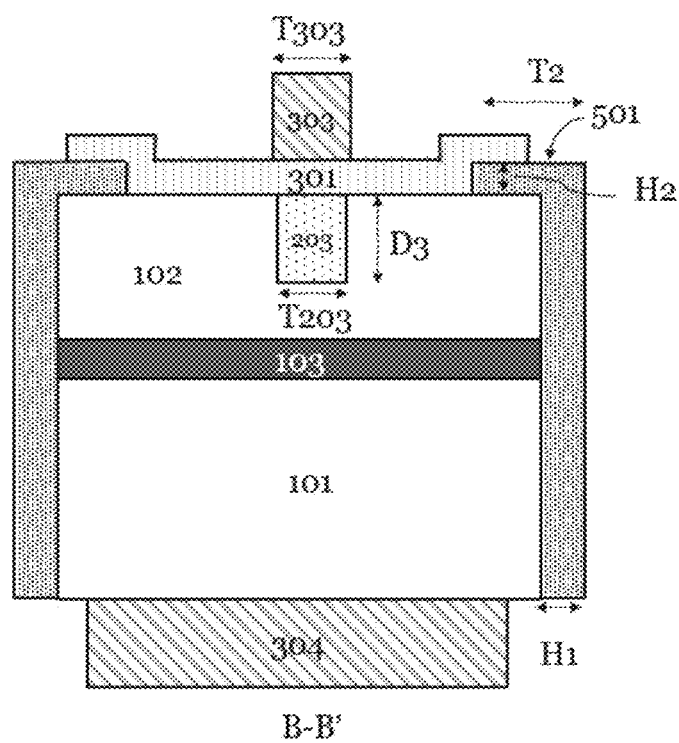
FIG. 6C schematically illustrates a cross-sectional view along line B-B' according to an embodiment of the present invention.
Figure 7A:
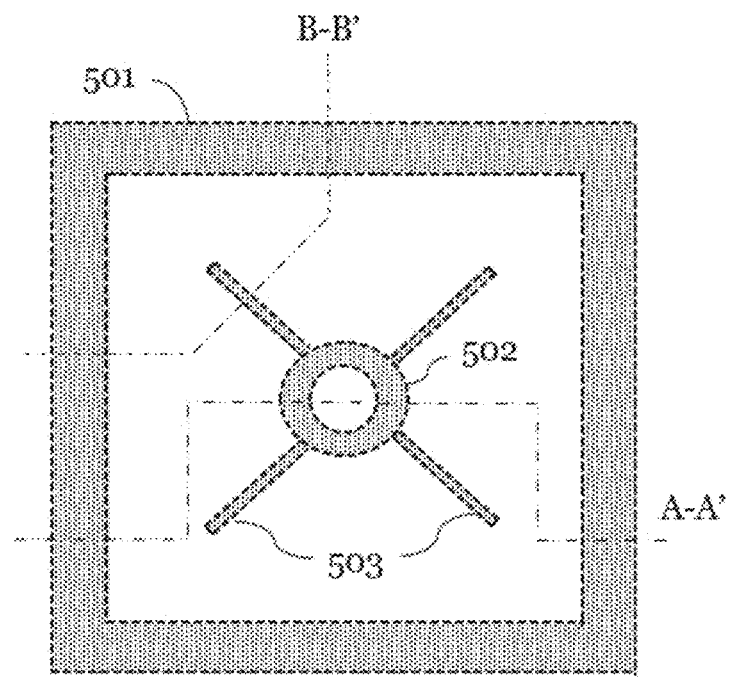
FIG. 7A and FIG. 7J schematically illustrate a top view according to an embodiment of the present invention.
Figure 7B:
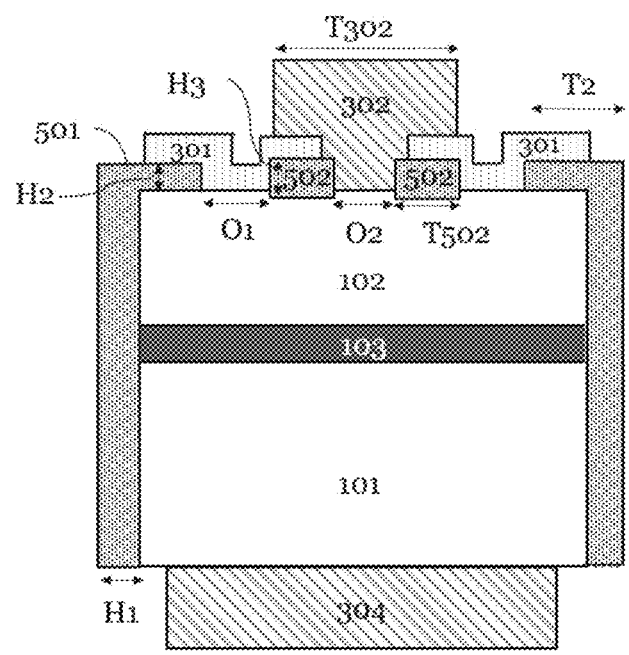
FIG. 7B, FIG. 7D, FIG. 7F, FIG. 7H and FIG. 7K schematically illustrate a cross-sectional view along line A-A' according to an embodiment of the present invention.
Figure 7C:
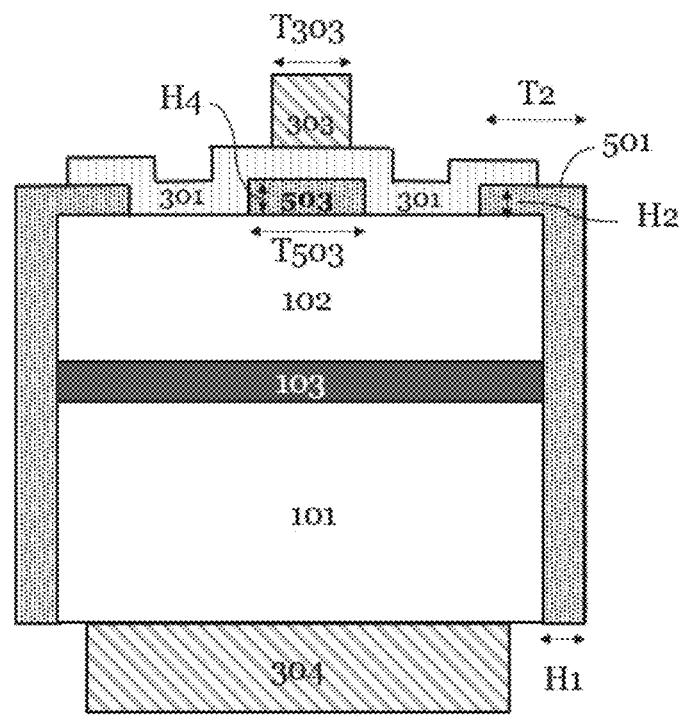
FIG. 7C, FIG. 7E, FIG. 7G and FIG. 7I schematically illustrate a cross-sectional view along line B-B' according to an embodiment of the present invention.
Figure 7D:
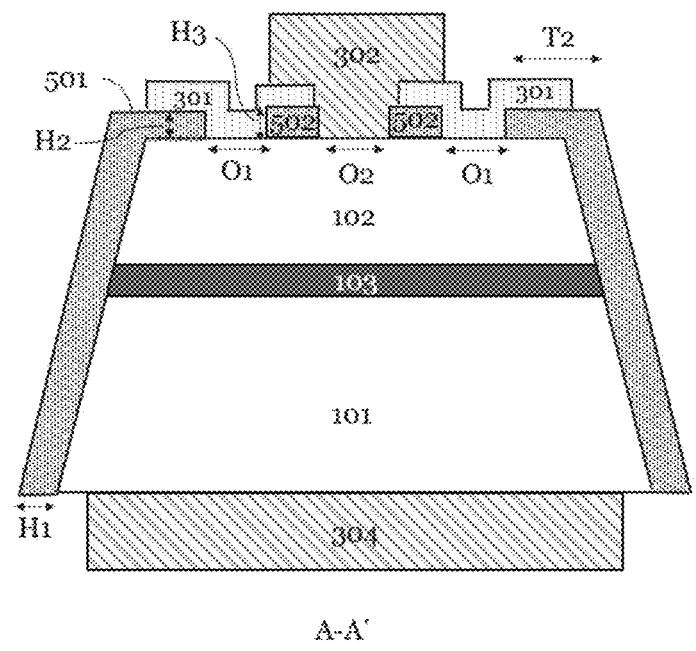
Figure 7E:
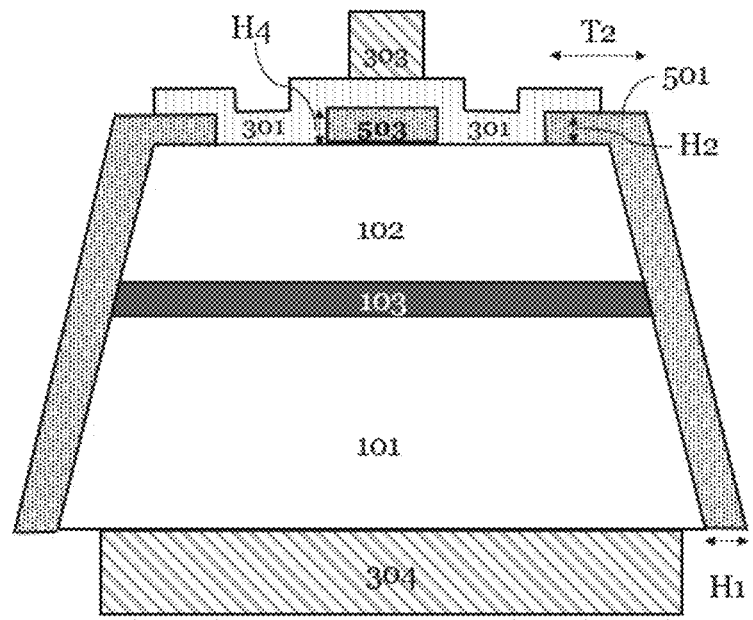
Figure 7F:
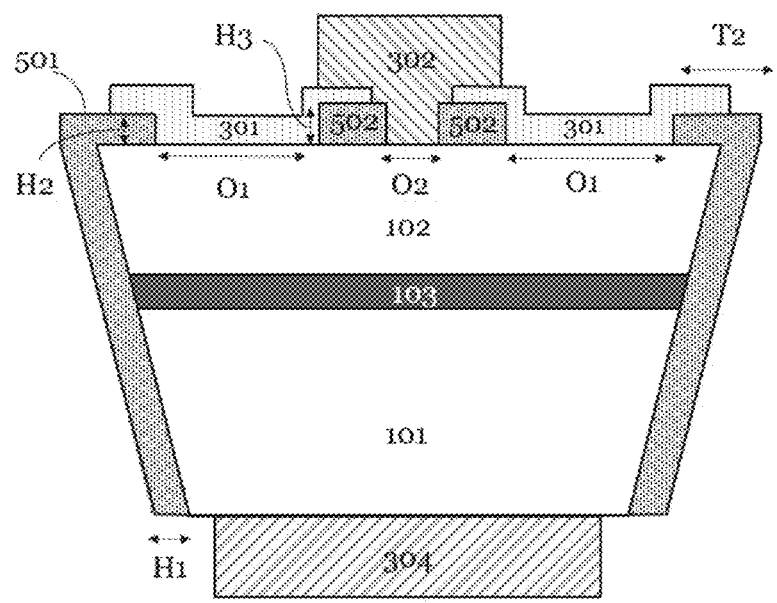
Figure 7G:
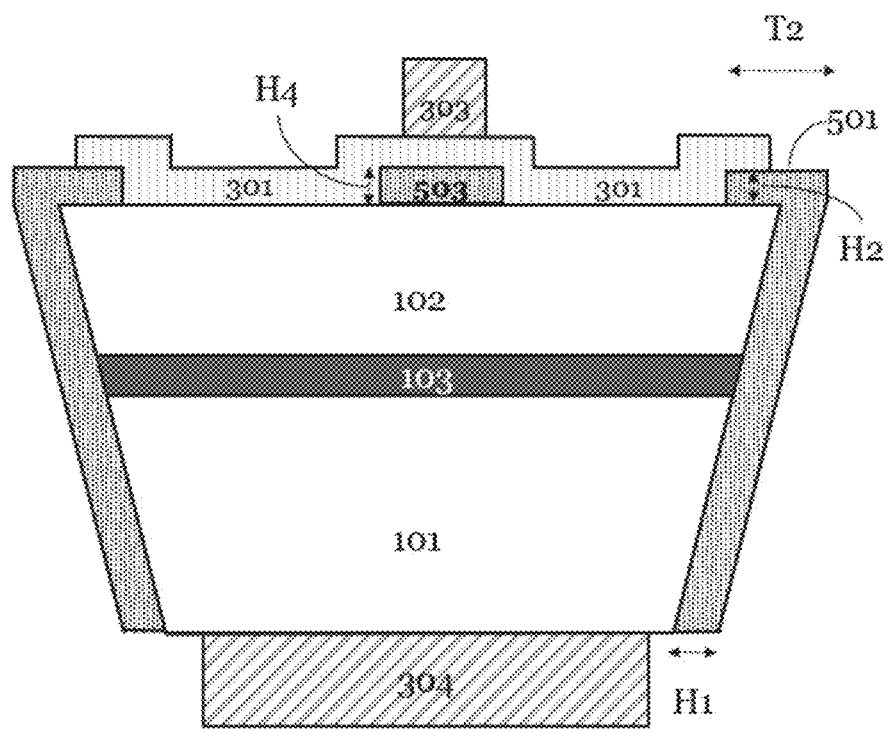
Figure 7H:
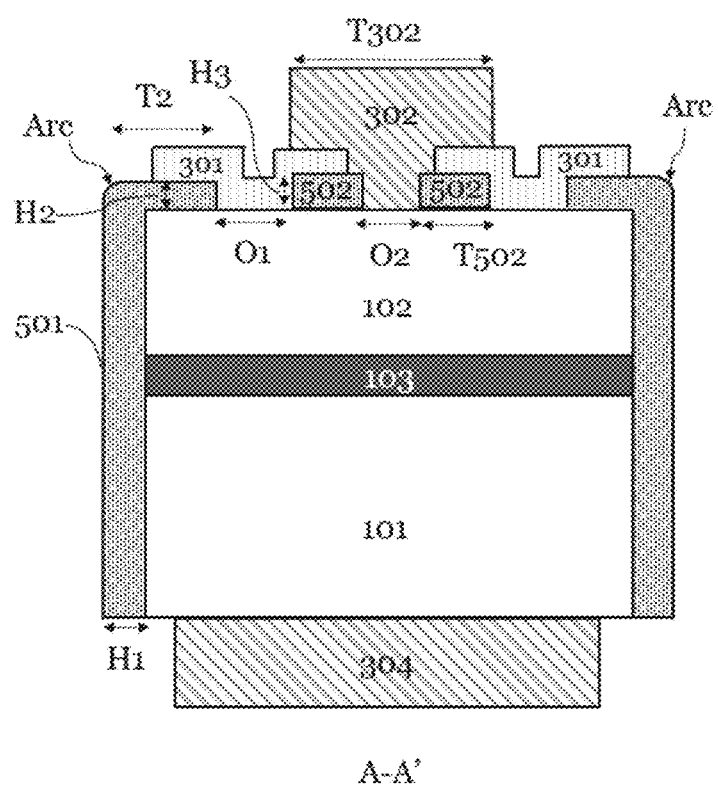
Figure 7I:
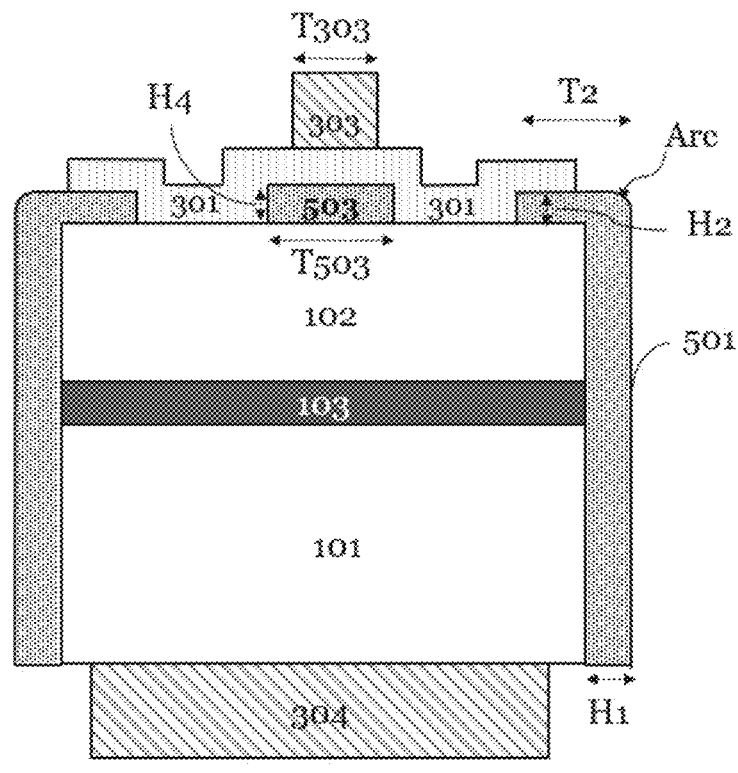
Figure 7J:
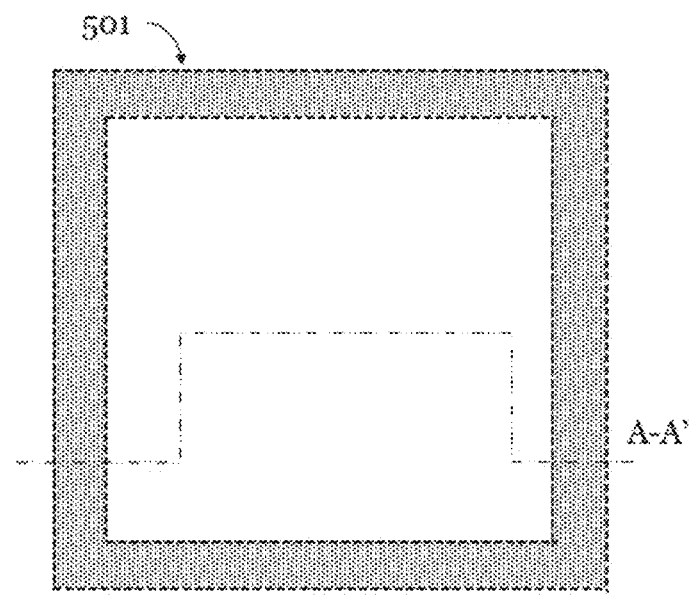
Figure 7K:
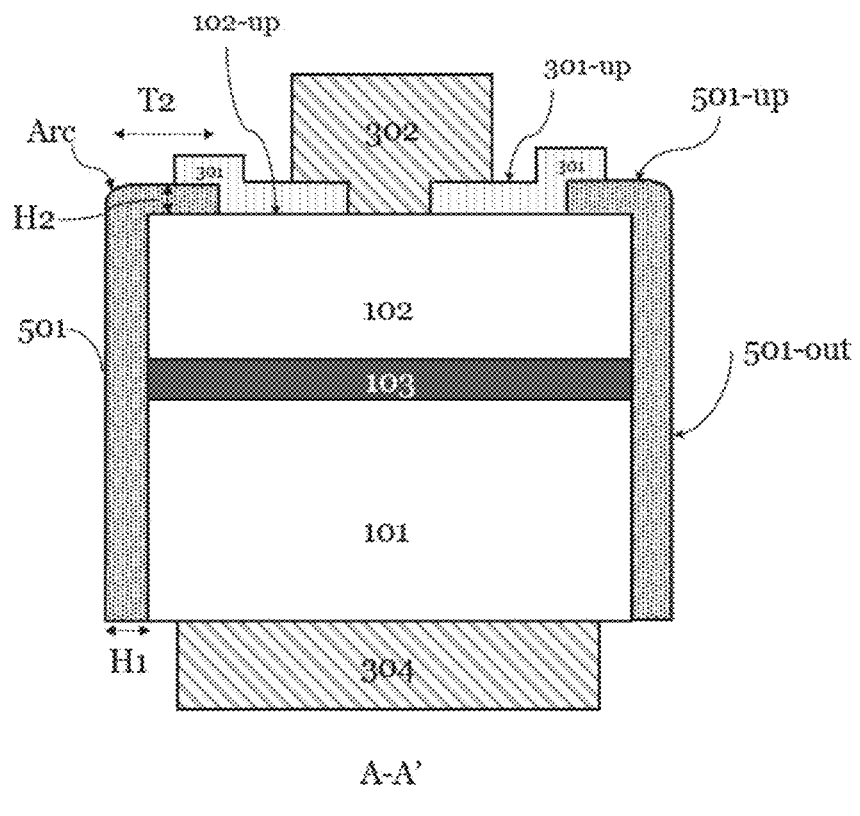
Figure 8A:
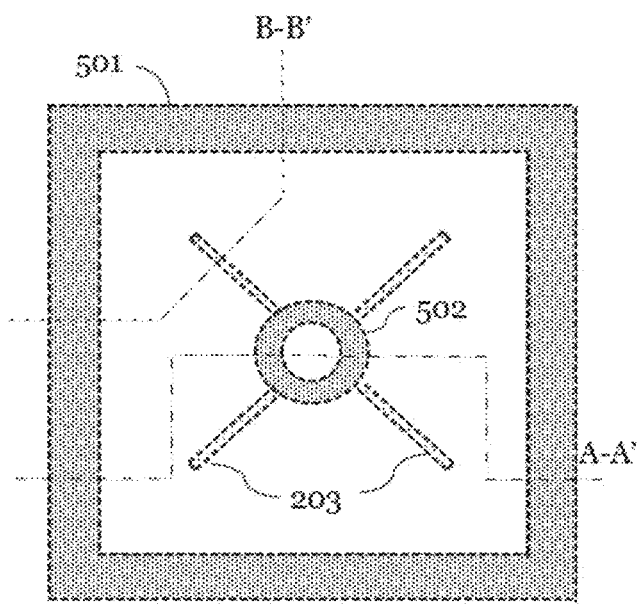
FIG. 8A schematically illustrates a top view according to an embodiment of the present invention.
Figure 8B:
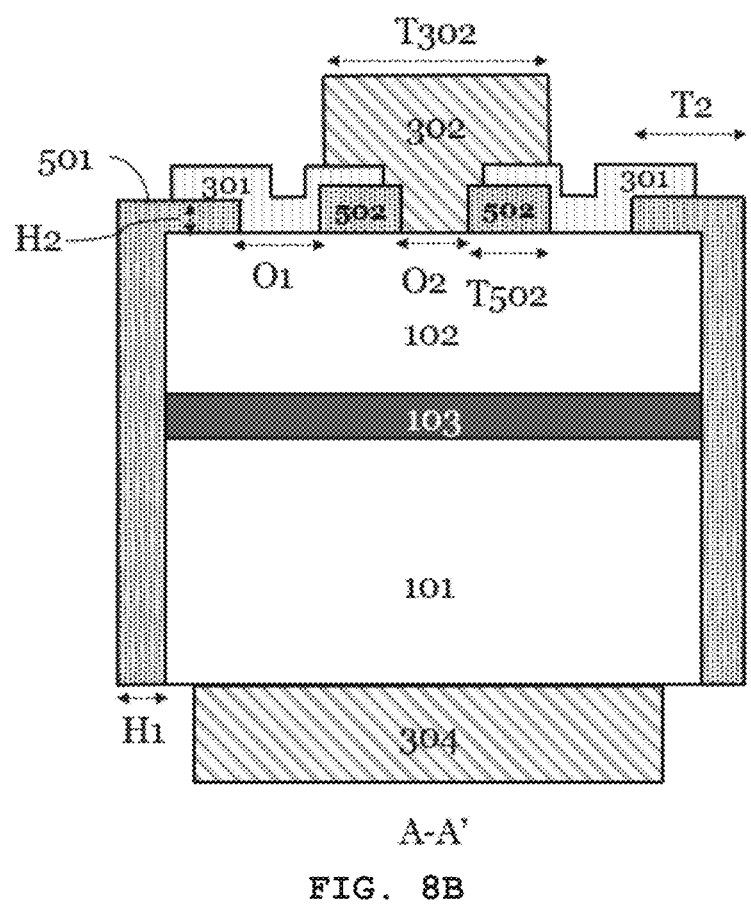
FIG. 8B schematically illustrates a cross-sectional view along line A-A' according to an embodiment of the present invention.
Figure 8C:
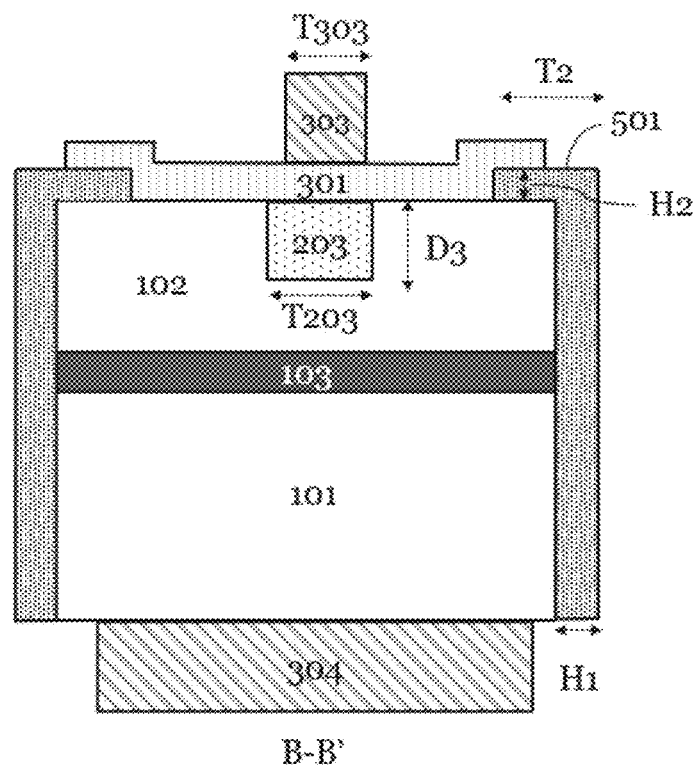
FIG. 8C schematically illustrates a cross-sectional view along line B-B' according to an embodiment of the present invention.

FIG. 58-3C schematically illustrates a high resolution display device.

Figure 59:
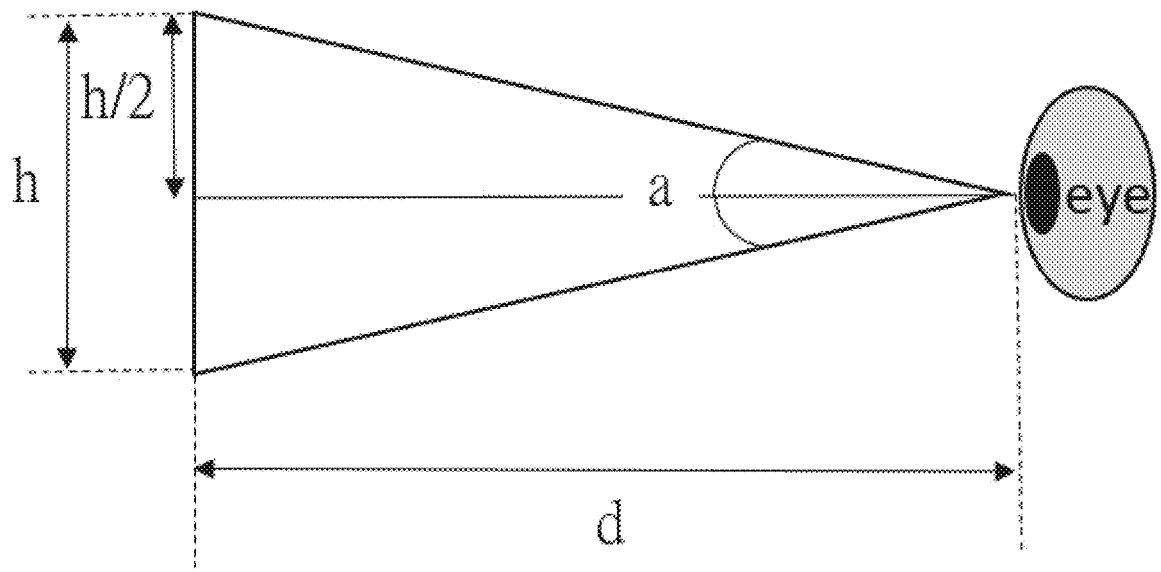

FIG. 59 schematically illustrates the identification requirements of human eye's visual acuity.

Figure 60A:
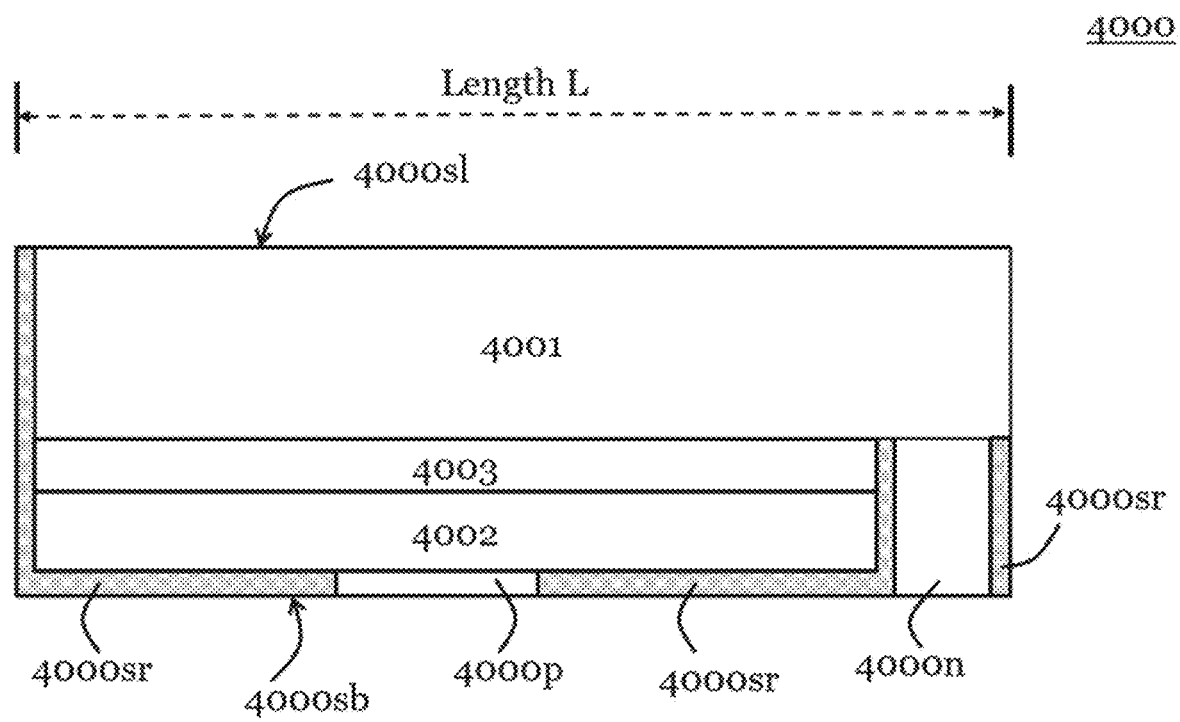

FIG. 60A schematically illustrates a cross-section view of a light emitting diode structure 4000 according to an embodiment.

Figure 60B:
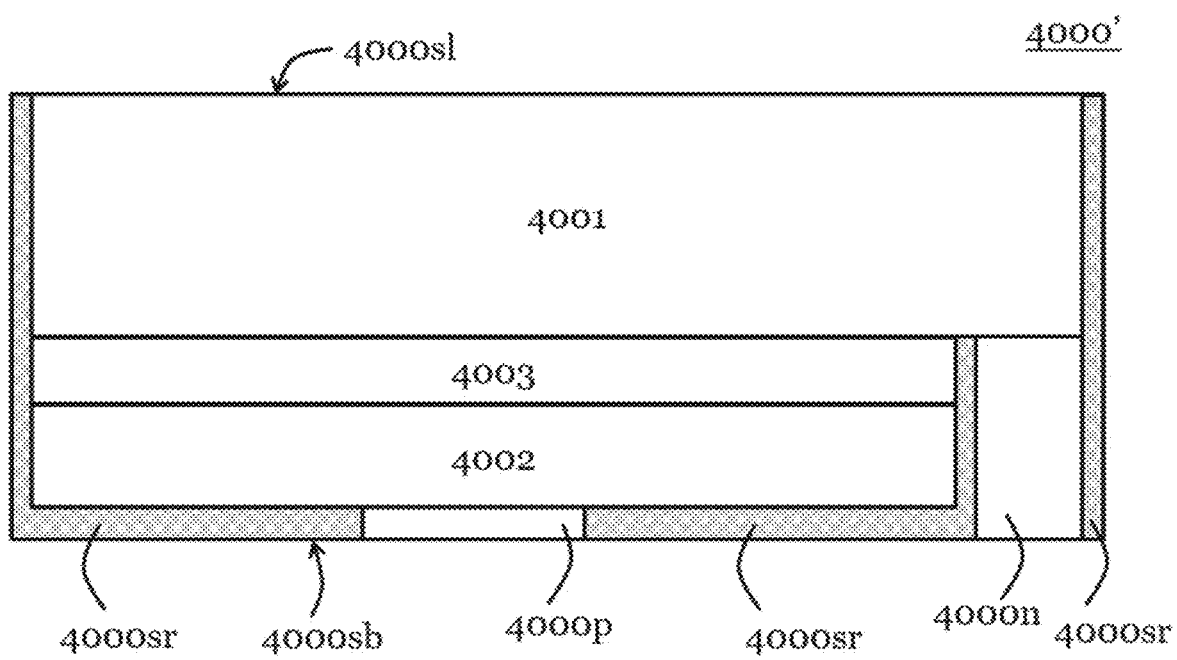

FIG. 60B schematically illustrates a cross-section view of a light emitting diode structure 4000' according to an embodiment.

Figure 60C:
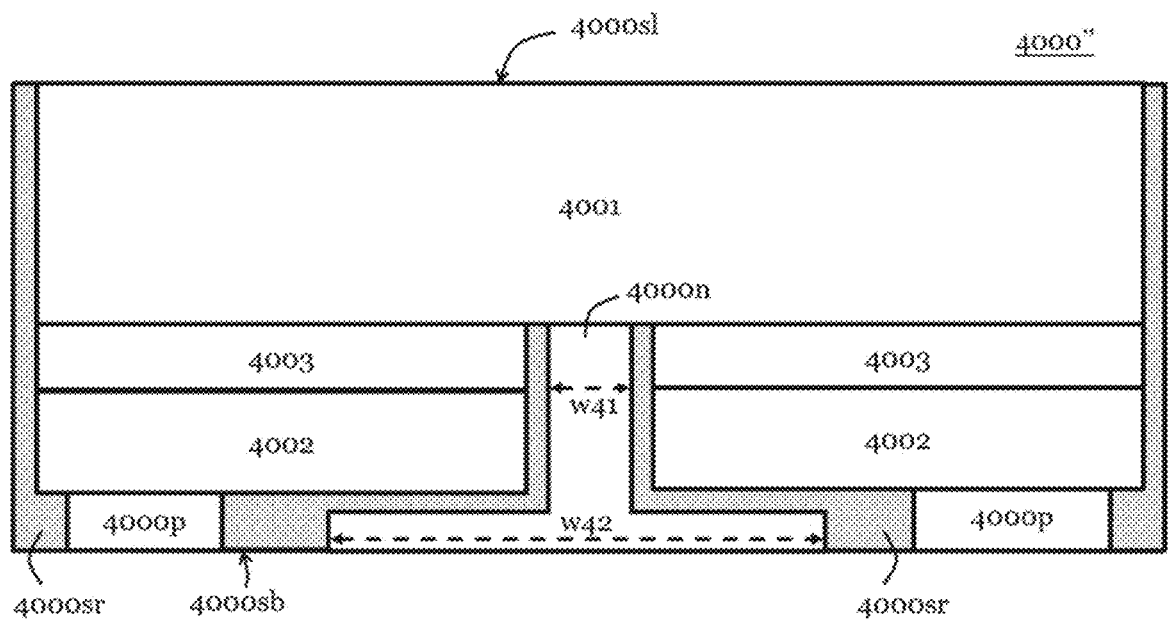

FIG. 60C schematically illustrates a cross-section view of a light emitting diode structure 4000" according to an embodiment.

Figure 60D:
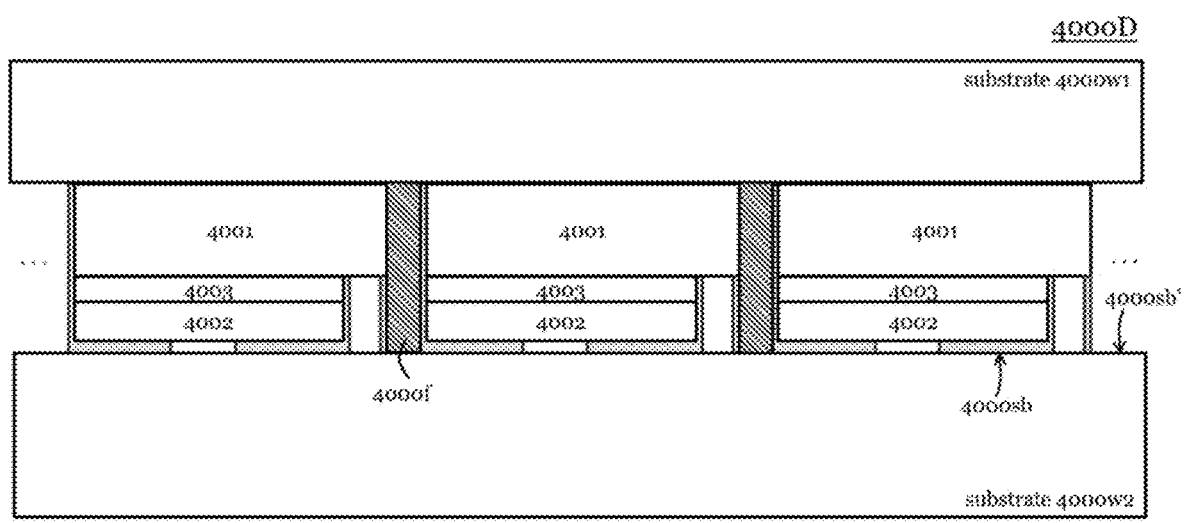

FIG. 60D schematically illustrates a cross-section view of a light emitting device according to an embodiment.

Figures 1, 60E:
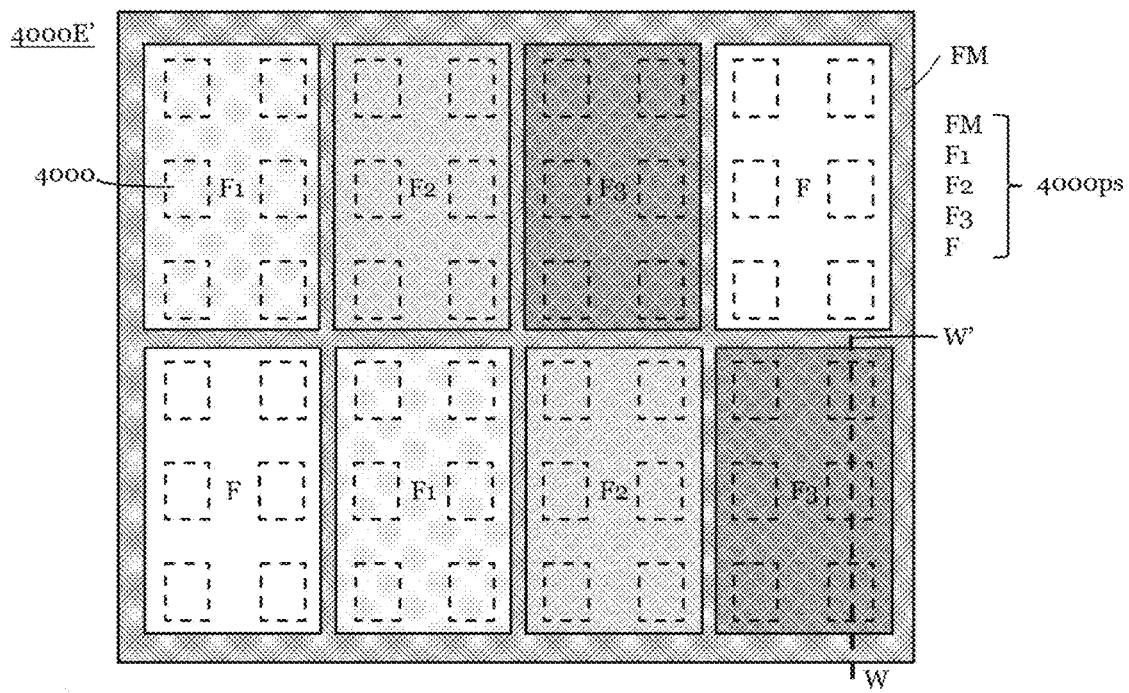
Figures 2, 60E:
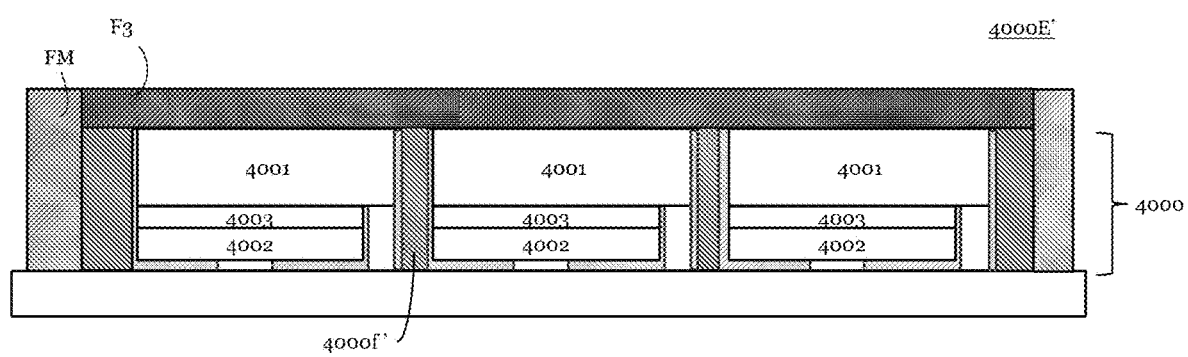
Figures 3, 60E:
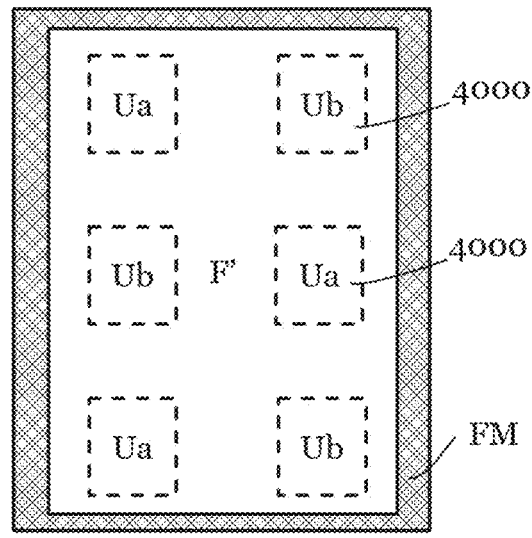

FIG. 60E-1 schematically illustrates a top view of a light emitting device according to an embodiment.

FIG. 60E-2 schematically illustrates a cross-section view along line W-W of a light emitting diode device according to the embodiment of FIG. 60E-1.

FIG. 60E-3 schematically illustrates an enlarged top view of a window region of a light emitting device according to the embodiment of FIG. 60E-1.

Figure 60F:
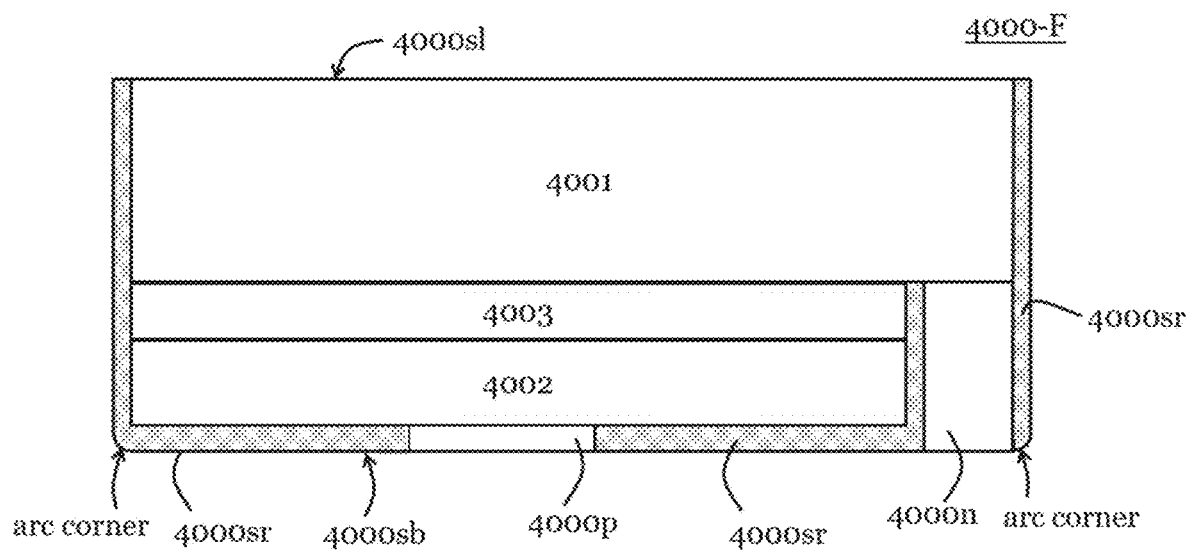

FIG. 60F schematically illustrates cross-section view of a light emitting diode structure 4000-F.

Figure 60G:
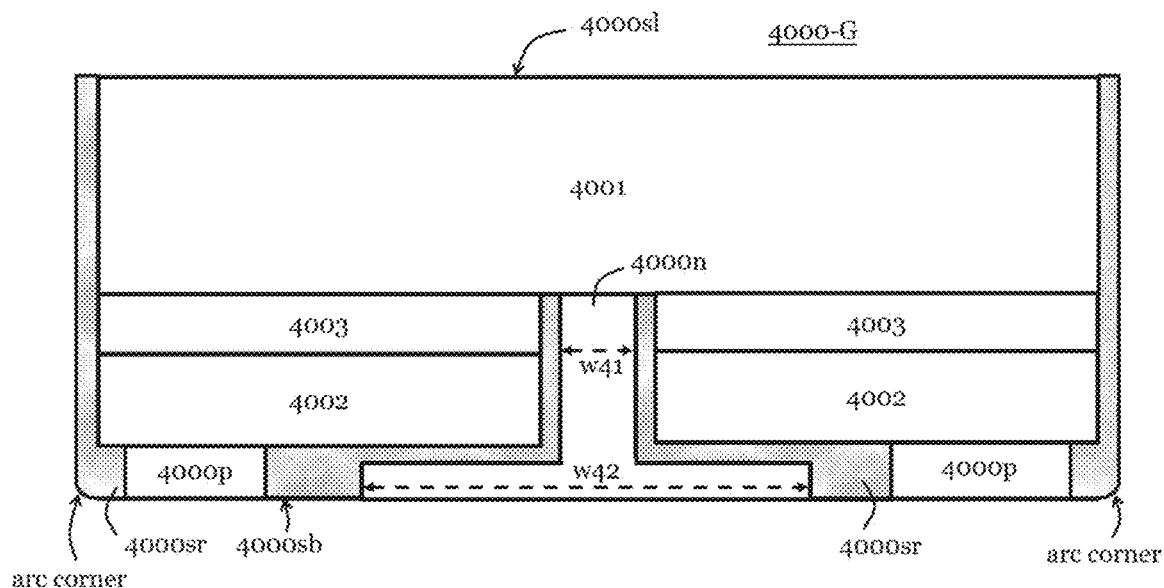

FIG. 60G schematically illustrates cross-section view of a light emitting diode structure 4000-G.

Figure 60H:
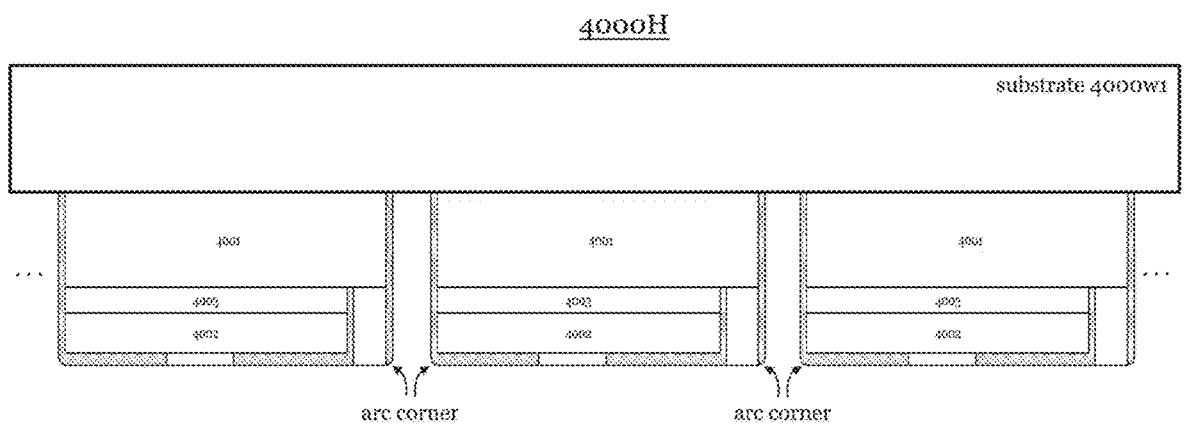

FIG. 60H schematically illustrates a cross-section view of a light emitting diode structure 4000H.

Figure 60I:
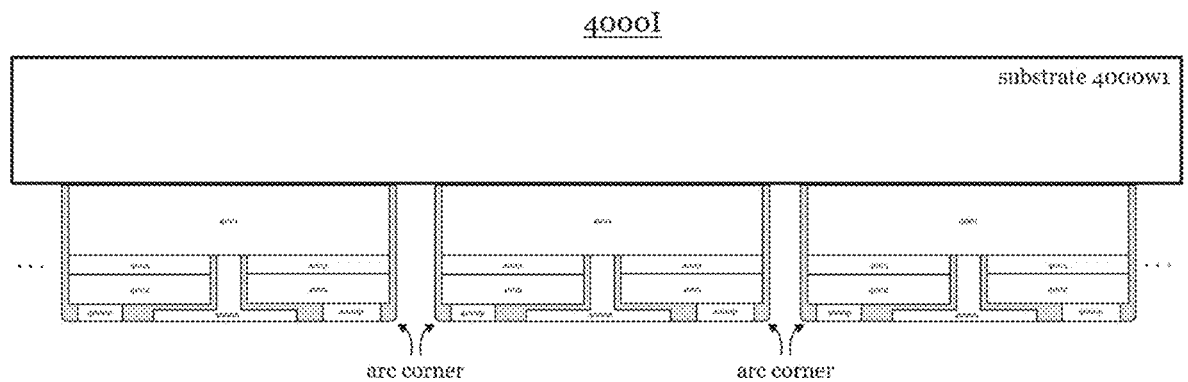

FIG. 60I schematically illustrates a cross-section view of a light emitting diode structure 4000I.

Figure 60J:
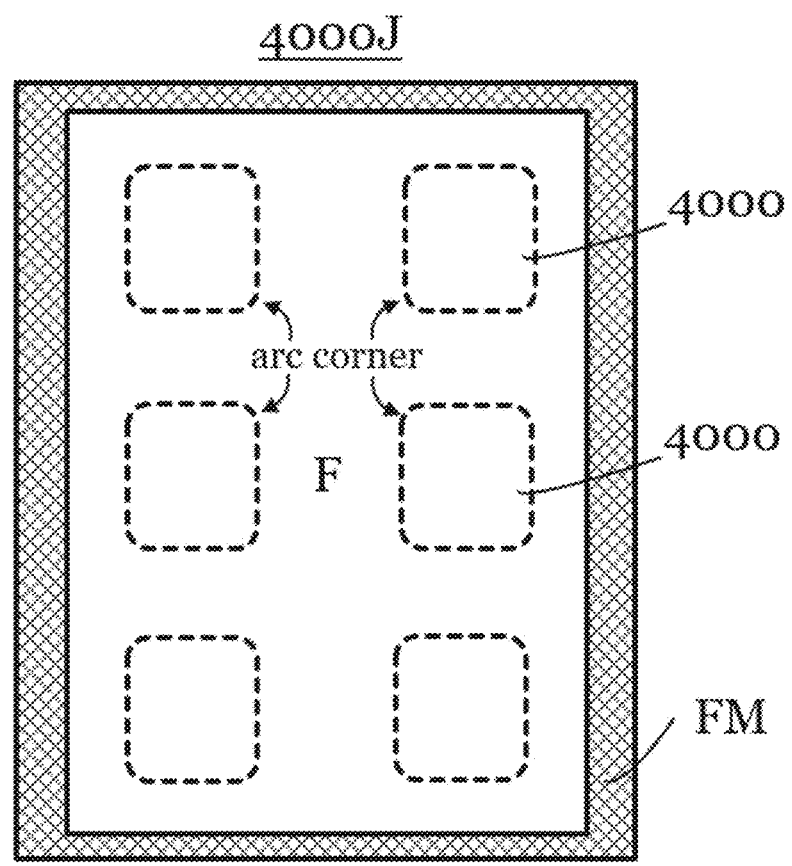

FIG. 60J schematically illustrates a top view of a light emitting device 4000J.

Figure 60K:
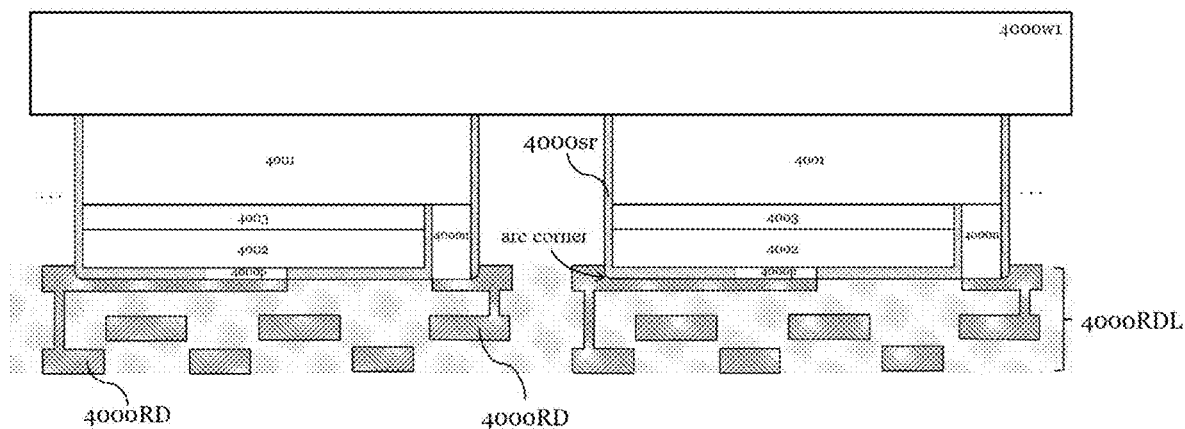

FIG. 60k schematically illustrates a side view of the light emitting device.

Wherein, the numerals and symbols used in the drawings are listed as following.

100: growth substrate
    101: first type semiconductor layer
    102: second type semiconductor layer
    103: light emitting layer
    104: groove
    105: etching groove
    101-down: bottom surface of the first type semiconductor layer; second bottom surface
    102-up: upper surface of the second type semiconductor layer; second upper surface
    201: first current limiting area, sidewall current limiting area
    202: second current limiting area
    203: third current limiting area
    204: fourth current limiting area
    205: fifth current limiting area 201-up: upper surface of the sidewall current limiting area, first upper surface
201-down: bottom surface of sidewall current limiting area, first bottom surface
201-out: outer sidewall surface of sidewall current limiting area, first outer surface
201-in: inner sidewall surface of sidewall current limiting area, first inner surface
202-up: upper surface of the second current limiting area
203-up: upper surface of the third current limiting area
301: transparent electrode
302: electrode
303: electrode extension part
304: electrode, back electrode
305: metal layer
306: metal layer, magnetic bonding layer, vacuum adsorption layer, electrostatic adsorption layer, adhesion layer
307: metal layer, magnetic bonding layer, vacuum adsorption layer, electrostatic adsorption layer, adhesion layer
308: metal layer, magnetic bonding layer, vacuum adsorption layer, electrostatic adsorption layer, adhesion layer
309: metal layer
Arc: arc angle
D1: first depth
D2: second depth
D3: third depth
D4: fourth depth
D5: fifth depth
D6: sixth depth
D7: seventh depth
DS: sidewall length
E1: epitaxial thickness
F: light-transmissive adhesive
F1: first phosphor with adhesive
F2: second phosphor with adhesive
F3: third phosphor with adhesive
H1: first thickness
H2: second thickness
H3: third thickness
H4: fourth thickness
$i_{L-1}$: first low conductivity region
$i_{L-2}$: second low conductivity region
$i_H$: high conductivity region
$i_{L-up}$: upper surface low conductivity region
$i_{H-up}$: upper surface high conductivity region
$i_{L-out}$: sidewall low conductivity region, outer surface low conductivity region
$i_{H-out}$: sidewall high conductivity region, outer surface high conductivity region
O1: width of first aperture
O2: width of second aperture
O3: third width
O4: fourth width
O5: fifth width
P1: first pitch
P2: second pitch
P3: third pitch
RS-102-top, RS-201-top, RS-501-top: roughness of upper surface
RS-102-out, RS-201-out, RS-501-out: roughness of outer surface and sidewall
S1: first length
S2: second length
S3: third length
S4: fourth length
T1: first width
T2: width
T3: third width
T4: fourth width
T-up: width of upper surface
T-down: width of bottom surface
T1A: first lateral width
T1B: second lateral width
T1C: third lateral width
U1: first surface
U2: second surface
U3: third surface
U4: fourth surface
U5: fifth surface
U6: sixth surface
400: photoelectric sensor
501: first current blocking area
502: second current blocking area
503: third current blocking area
504: fourth current blocking area
505: fifth current blocking area
506: sixth current blocking area
507: aperture
601: shielding
602: shielding
603: shielding
700: sacrificing layer
800: inspection substrate, test substrate
801: transfer substrate
805: insulating layer
810: collection substrate
820: permanent substrate
821: vacancy
830: receiving substrate
840: inspection substrate, test substrate
841: voltage source
831: first recess
832: second recess
833: third recess
850: wall structure
901: ion implantation
902: laser
903: laser
1001: first container
2001-L: first liquid
$\Theta 1$: first included angle
$\Theta 2$: second included angle
1010: flexible substrate
1011: micro light emitting diode
1012: gate driver
1013: source driver
1014: scan line
1015: data line
1100: bump
1101: ridge area
1102: N-pad
1103: P-pad
1104: P-contact layer
1105: multiple quantum well
1106: N-contact layer
1107: buffer layer
1108: ion implantation area
1109: redundancy micro light emitting diode
1110: first epitaxial substrate (S1)
1111: first epitaxial layer structure (Epi layer-1)
1112: first micro light emitting diode (M1)
111P1: pitch (P1)
111P2: pitch (P2)
1114: first ion implantation area (Ion-1)

1115: first sub-pixel area (R1)
1116: conductive layer (ML)
1117: first transparent substrate (T1)
1118: bonding pad (BL)
1119: conductive layer (ML)
111BR1: first light-transmissive intermediate layer (BR1)
1120: second epitaxial substrate (S2)
1121: second epitaxial layer structure (Epi layer-2)
1122: second micro light emitting diode (M2)
112P3: pitch (P3)
112P4: pitch (P4)
1124: second ion implantation area (ion-2)
1124-2a: first region of the second ion implantation area (ion-2a)
1124-2b: second region of the second ion implantation area (ion-2b)
1125: second sub-pixel area (G1)
1126: conductive layer (ML)
1127: second transparent substrate (T2)
1128: bonding pad (BL)
1129: conductive layer (ML)
1130: third epitaxial substrate (S3)
1131: third epitaxial layer structure (Epi layer-3)
1132: third micro light emitting diode (M3)
113P5: pitch (P5)
113P6: pitch (P6)
1134: third ion implantation area (Ion-3)
1135: third sub-pixel area (B1)
1136: conductive layer (ML)
1137: third transparent substrate (T3)
1138: bonding pad (BL)
1139: conductive layer (ML)
113BR3: third light-transmissive intermediate layer (BR3)
141, 1161, 1171, 1181, 1191, 1201, 1211, 1221, 1231, 1241, 1251: first sub-pixel structure (Pixel 1)
1142, 1162, 1172, 1182, 1192, 1202, 1212, 1222, 1232, 1242, 1252: second sub-pixel structure (Pixel 2)
1143, 1163, 1173, 1183, 1193, 1203, 1213, 1223, 1233, 1243, 1253: third sub-pixel structure (Pixel 3)
1151: first light-transmissive adhesion layer (T1)
1152: second light-transmissive adhesion layer (T2)
1153: thickness (D-1)
1161: first sub-pixel (R1-1, R1-1A, R1-2A, R1-3, R1-4, R1-5, R1-6)
1162: second sub-pixel (G1-1, G1-1A, G1-2A, G1-3A, G1-4A, G1-5A, G1-6A)
1163: third sub-pixel (B1-1, B1-1A, B1-2A, B1-3A, B1-4A, B1-5A, B1-6A)
1171: first redundancy sub-pixel (R1-2, R1-3, R1-4, R1-5, R1-6)
1172: second redundancy sub-pixel (G1-2, G1-3, G1-4, G1-5, G1-6)
1173: third redundancy sub-pixel (B1-2, B1-3, B1-4, B1-5, B1-6)
1300: black mattress layer
1301: magnetic layer (ML)
1302: current blocking area
1303: current limiting area
1400: integrated control system
1401: micro-LED display
1402: lens system
1403: optical component
1404: eye
1405: augmented reality (AR)
1500: integrated control system
1501: RGB micro-LED display
1502: lens system
1503: optical component
1504: eye
1505: augmented reality (AR)
1600: integrated control system
1601: micro-LED display
1602: lens system
1603: optical component
1604: eye
1605: augmented reality (AR)
1700: integrated control system
1701: RGB micro-LED display
1702: lens system
1703: optical component
1704: eye
1705: augmented reality (AR)
1800: integrated control system
1801: multi-function sensor
1802: microchip processors
1803: network interface
1900: integrated control system
1901: display
1902: frame
1903: optical component
1904: eye
1905: augmented reality (AR)
1906: rims
1907: bridge
2000, 2010, 2020, 2030: integrated control system
2001, 2011, 2021, 2031: micro-LED display
2002, 2012, 2022, 2032: frame
2003, 2013, 2023, 2033: optical component
2004, 2014, 2024, 2034: eye
2005, 2015, 2025, 2035: augmented reality (AR)
2006, 2016, 2026, 2036: rims
2007, 2017, 2027, 2037: bridge
3000: epitaxial substrate
3001: magnetic layer (ML)
3002: first type semiconductor layer
3003: light emitting layer
3004: second type semiconductor layer
3005, 3006, 3007, 3008, 3009, 3010: metal layer
3011, 3012: transparent conductive layer
3100, 3101, 3102: first current blocking layer
3200, 3201, 3202: first current limiting layer
3300: second current blocking layer
3400: second current limiting layer
3500: controllable transferring head
3501: electromagnetic layer
3502: magnetic micro light emitting diode
3503: substrate
3600: fluid transfer system
3601: main chamber
3602: solution
3603: substrate
3604: recess
3605: magnetic layer
3606: input end
3607: input valve
3608: output end
3609: output valve
3610: flow rate (F)
3611: first sub chamber
3612: second sub chamber
3613: third sub chamber
3614: magnetic micro light emitting diode with the first color

3615: first valve
3616: first input port
3617: magnetic micro light emitting diode with the second color
3618: second valve
3619: second input port
3620: magnetic micro light emitting diode with the third color
3621: third valve
3622: third input port
3623: fluid
3624: first recess with the first shape
3625: second recess with the second shape
3626: third recess with the third shape
3627: first sub-pixel area
3628: second sub-pixel area
3629: third sub-pixel area
3630: pixel area
3634: first recess
3635: second recess
3636: third recess
3637: first sub-pixel area
3638: second sub-pixel area
3639: third sub-pixel area
3640: pixel area
3650: redundancy magnetic layer
3651, 3661, 3671: first redundancy recess
3652, 3662, 3672: second redundancy recess
3653, 3663, 3673: third redundancy recess
3654, 3664, 3674: first recess
3655, 3665, 3675: second recess
3656, 3666, 3676: third recess
3657, 3667, 3677: first sub-pixel area
3658, 3668, 3678: second sub-pixel area
3659, 3669, 3679: third sub-pixel area
3660, 3670, 3680: pixel area
3700: fluid transfer system
3701: main chamber
3702: solution
3703: substrate
3704-1: first recess
3704-2: second recess
3704-3: third recess
3705: attraction layer
3706: input end
3707: input valve
3708: output end
3709: output valve
3710: flow rate (F)
3711: first sub chamber
3712: second sub chamber
3713: third sub chamber
3714: micro light emitting diode with the first color
3715: first valve
3716: first input port
3717: micro light emitting diode with the second color
3718: second valve
3719: second input port
3720: micro light emitting diode with the third color
3721: third valve
3722: third input port
3723: fluid
3724: first valve of substrate
3725: second valve of substrate
3726: third valve of substrate
3800: fluid transfer system
3801: main chamber
3802: solution
3803: substrate
3804-1: first recess
3804-2: second recess
3804-3: third recess
3805-1: first attraction layer
3805-2: second attraction layer
3805-3: third attraction layer
3806: input end
3807: input valve
3808: output end
3809: output valve
3810: flow rate (F)
3811: first sub chamber
3812: second sub chamber
3813: third sub chamber
3814: micro light emitting diode with the first color
3815: first valve
3816: first input port
3817: micro light emitting diode with the second color
3818: second valve
3819: second input port
3820: micro light emitting diode with the third color
3821: third valve
3822: third input port
3823: fluid
3900: fluid transfer system
3901: main chamber
3902: solution
3903: substrate
3904-1: first filling layer
3904-2: second filling layer
3904-3: third filling layer
3905-1: first attraction layer
3905-2: second attraction layer
3905-3: third attraction layer
3906: input end
3907: input valve
3908: output end
3909: output valve
3910: flow rate (F)
3911: first sub chamber
3912: second sub chamber
3913: third sub chamber
3914: micro light emitting diode with the first color
3915: first valve
3916: first input port
3917: micro light emitting diode with the second color
3918: second valve
3919: second input port
3920: micro light emitting diode with the third color
3921: third valve
3922: third input port
3923: fluid
3924: first valve of substrate
3925: second valve of substrate
3926: third valve of substrate
3927: light source

DETAILED DESCRIPTION OF DISCLOSED EMBODIMENTS

The exemplary embodiments of the present invention will be described in the following by taking in conjunction with drawings, wherein various details included in the embodiments for better understanding are merely exemplary. Therefore, a person having ordinary skills in the art should realize that various modifications and changes may be made to the embodiments described herein without departing from the scope and spirit of the invention. Also, for clarity and conciseness, descriptions of well-known functions and structures are omitted in the following description.

FIG. 2A schematically illustrates a top view according to an embodiment. FIG. 2B, FIG. 2D, FIG. 2F, FIG. 2H, FIG. 2J, FIG. 2L, FIG. 2N, FIG. 2R and FIG. 2U respectively illustrate a cross-sectional view along line A-A' in FIG. 2A according to several embodiments. In one embodiment, the diode device includes a first type semiconductor layer 101, a second type semiconductor layer 102, a light emitting layer 103 located between the first type semiconductor layer 101 and the second type semiconductor layer 102, and a sidewall current limiting area 201 in contact with a periphery sidewall region of the second type semiconductor layer 102, wherein a peripheral perimeter of the sidewall current limiting area 201 is equal to or less than 400 micrometers (μm).

Optionally, the diode device may further include a transparent electrode 301 located above the second type semiconductor layer 102 and electrically connected to the second type semiconductor layer 102, and the transparent electrode 301 is partially overlapped with the sidewall current limiting area 201.

A micro light emitting diode (Micro-LED) device according to an embodiment includes a first type semiconductor layer 101, a second type semiconductor layer 102, a light emitting layer 103 located between the first type semiconductor layer 101 and the second type semiconductor layer 102, a first current limiting area 201 located at a periphery of the second type semiconductor layer 102 and on the sidewall region of the second type semiconductor layer 102, and a second current limiting area 202 surrounded by the first current limiting area 201, wherein a shortest distance between the first current limiting area 201 and the second current limiting area 202 is equal to or less than 50 micrometers, and a periphery perimeter of the first current limiting area 201 is equal to or less than 400 micrometers.

An upper surface U6 of the second type semiconductor layer 102, an upper surface U1 of the first current limiting area 201, and an upper surface U2 of the second current limiting area 202 are coplanar, which gives the beneficial effects such as increasing surface flatness, improving stability of the products, and reducing non-radiative recombination, thereby improving the efficiency of micro light emitting diodes.

The first current limiting area 201 has a first depth D1, the second current limiting area 202 has a second depth D2, and the first depth D1 may be equal to, greater than or less than the second depth D2.

The Micro-LED device may further include a third current limiting area 203 located between the first current limiting area 201 and the second current limiting area 202, and the third current limiting area 203 is in contact with the second current limiting area 202. In such condition, an upper surface U3 of the third current limiting area 203 and the upper surface U1 of the first current limiting area 201 are coplanar, which helps increasing surface flatness, improving stability of products, and reducing non-radiative recombination, thereby improving the efficiency of micro light emitting diodes.

The first current limiting area 201 has a first depth D1, the second current limiting area 202 has a second depth D2, the third current limiting area 203 has a third depth D3, and the first depth D1 is equal to the second depth D2 and equal to the third depth D3. Since these depths are the same, they may be formed in the same ion implantation process, thereby simplifying the process.

Alternatively, the first current limiting area 201 has a first depth D1, the second current limiting area 202 has a second depth D2, the third current limiting area 203 has a third depth D3, and the first depth D1 is greater than the second depth D2 and greater than the third depth D3. By increasing the first depth D1 according to different epitaxial structures, a preferable effect of reducing sidewall leakage current can be achieved, and the light emitting efficiency (also called light emitting efficiency) of the micro light emitting diode can be improved.

The Micro-LED device may further include a transparent electrode 301 located above the second type semiconductor layer 102 and electrically connected to the second type semiconductor layer 102, and the transparent electrode 301 covers the first current limiting area 201 and the third current limiting area 203, wherein the third current limiting area 203 is formed through ion implantation technique. Ion implantation can increase surface flatness and stability of the products. The first current limiting area 201 has a first width T1, the second current limiting area 202 has a second width T202, and the third current limiting area 203 has a third width T203. The second width T202 is greater than or equal to the first width T1, and the first width T1 is greater than or equal to the third width T203.

The Micro-LED device may further include a transparent electrode 301 located above the second type semiconductor layer 102 and electrically connected to the second type semiconductor layer 102, and the transparent electrode 301 covers the first current limiting area 201. The transparent electrode has high light transmittance ratio, and therefore the light emitting efficiency of the micro light emitting diode can be improved.

The Micro-LED device may further include an electrode 302 located above the second type semiconductor layer 102 and electrically connected to the transparent electrode 301, and the electrode 302 is directly in contact with the second current limiting area 202. Direct contact between the electrode and the semiconductor can prevent electrode from peeling, and therefore stability of products can be improved. In such condition, an electrode extension part 303 located above the transparent electrode 301 can be further included, wherein the electrode extension part 303 is electrically connected to the electrode 302, which helps improving the uniformity of current distribution and improving light emitting efficiency of the micro light emitting diode. The Micro-LED may further include a back electrode 304 located below the first type semiconductor layer. The back electrode 304 is electrically connected to the first type semiconductor layer. The back electrode 304 may include a multi-layer structure, which includes an ohm contact layer, a diffusion blocking layer, a connecting layer and a reflective mirror layer.

The first current limiting area 201 and the second current limiting area 202 can be formed through ion implantation technique. Ion implantation can increase sidewall flatness and stability of products; meanwhile, ion implantation can further increase surface flatness, which can also improve stability of products.

The first current limiting area 201 has a first width T1 greater than or equal to 1 micrometer.

The second current limiting area 202 may be located in the middle of the second type semiconductor layer 102.

Regarding the depth of the first current limiting area 201, the following are some optional embodiments:

The first current limiting area 201 has a first depth D1, and the first depth D1 may be not greater than the depth of the second type semiconductor layer.

Optionally, the first current limiting area 201 has a first depth D1, the first depth D1 further includes the periphery of the light emitting layer and the first type semiconductor layer, and the first depth D1 is greater than the summation of the depth of the second type semiconductor and the depth of the light emitting layer.

Optionally, the first current limiting area 201 has a first depth D1, the first depth D1 further includes the sidewall regions of the light emitting layer and the first type semiconductor layer, and the first depth D1 is greater than the summation of the depth of the second type semiconductor and the depth of the light emitting layer.

Optionally, the first current limiting area 201 has a first depth D1, the first depth D1 further includes the sidewall regions of the light emitting layer and the first type semiconductor layer, and the first depth D1 is equal to the summation of the depth of the second type semiconductor, the depth of the light emitting layer and the depth of the first type semiconductor.

Optionally, the first current limiting area 201 has a first depth D1, the first depth D1 further includes the sidewall regions of the light emitting layer and the first type semiconductor layer, the first current limiting area 201 located at the sidewall region of the first type semiconductor layer has a first lateral width T1A, the first current limiting area 201 located at the sidewall region of the light emitting layer has a second lateral width T1B, and the first current limiting area 201 located at the sidewall region of the second type semiconductor layer has a third lateral width T1C. Wherein the first lateral width T1A is greater than the second lateral width T1B and greater than the third lateral width T1C, or the third lateral width T1C is greater than the second lateral width T1B and greater than the first lateral width T1A.

Besides, the surface of the first current limiting area may have a first low conductivity region $i_{L-1}$, and the following are some optional embodiments:

The surface of the first current limiting area has a first low conductivity region $i_{L-1}$, and the surface of the second type semiconductor layer has a high conductivity region $i_H$, wherein a conductivity distribution is gradually increased from the first low conductivity region $i_{L-1}$ toward the high conductivity region $i_H$.

Optionally, the surface of the first current limiting area has a first low conductivity region $i_{L-1}$, the surface of the second current limiting area has a second low conductivity region $i_{L-2}$, and the surface of the second type semiconductor layer has a high conductivity region $i_H$, wherein a conductivity distribution is gradually increased from both the first low conductivity region $i_{L-1}$ and the second low conductivity region $i_{L-2}$ toward the high conductivity region $i_H$.

Adopting the above-mentioned embodiments may facilitate reducing surface leakage current and sidewall leakage current and improving light emitting efficiency of the micro light emitting diode.

Regarding the width of the first current limiting area 201, the following are some optional embodiments:

The first current limiting area 201 has a first width T1, the second current limiting area 202 has a second width T202, and the second width T202 is greater than or equal to the first width T1.

Optionally, the first current limiting area 201 has a first width T1, the second current limiting area 202 has a second width T202, and the first current limiting area 201 and the second current limiting area 202 have a distance O3, wherein the second width T202 is greater than or equal to the first width T1, and the distance O3 is greater than the second width T202.

By adopting the above-mentioned embodiments, the first current limiting area 201 can reduce the sidewall leakage current and improve the light emitting efficiency of the micro light emitting diode; the second current limiting area 202 can improve the uniformity of current distribution and improve the light emitting efficiency of the micro light emitting diode; and the third current limiting area 203 can improve the uniformity of current distribution and improve the light emitting efficiency of the micro light emitting diode, wherein the peripheral perimeter of the first current limiting area 201 is equal to or less than 400 micrometers, thereby providing various advantages of the micro light emitting diode.

Another Micro-LED device according to an embodiment of the present invention includes a first type semiconductor layer 101, a second type semiconductor layer 102, a light emitting layer 103 located between the first type semiconductor layer 101 and the second type semiconductor layer 102, a first current limiting area 201 located at a periphery of the second type semiconductor layer 102 and on the sidewall region of the second type semiconductor 102, a second current limiting area 202 surrounded by the first current limiting area 201, and a third current limiting area 203 surrounded by the first current limiting area 201 and in contact with the second current limiting area 202, wherein a shortest distance between the first current limiting area 201 and the second current limiting area 202 is equal to or less than 50 micrometers, and a periphery perimeter of the first current limiting area 201 is equal to or less than 400 micrometers.

According to the above-mentioned structure, the Micro-LED has the followings advantages:

(1) The first current limiting area 201 can reduce sidewall leakage current and improve the light emitting efficiency of the micro light emitting diode.

(2) The second current limiting area 202 can improve the uniformity of current distribution and improve the light emitting efficiency of the micro light emitting diode.

(3) The third current limiting area 203 can improve the uniformity of current distribution and improve the light emitting efficiency of the micro light emitting diode.

(4) The peripheral perimeter is small enough to have various advantages of the micro light emitting diode.

An upper surface U6 of the second type semiconductor layer 102, the upper surface U6 of the first current limiting area 201, an upper surface U2 of the second current limiting area 202 and an upper surface U3 of the third current limiting area 203 are coplanar, which helps increasing surface flatness, improving stability of products and reducing non-radiative recombination, thereby improving the efficiency of the micro light emitting diode.

The first current limiting area 201 has a first depth D1, the second current limiting area 202 has a second depth D2, and the third current limiting area 203 has a third depth D3, wherein the first depth D1 is equal to the second depth D2 and equal to the third depth D3. Since these depths are equal to each other in this embodiment, they can be formed by the same fabrication process, thereby simplifying the process.

Alternatively, the structure may be designed as that the first current limiting area 201 has a first depth D1, the second current limiting area 202 has a second depth D2, and the third current limiting area 203 has a third depth D3, wherein the first depth D1 is greater than the second depth D2 and greater than the third depth D3. By increasing the first depth D1 according to different epitaxial structures, a preferable effect of reducing sidewall leakage current can be achieved, and the light emitting efficiency of the micro light emitting diode can be improved.

The Micro-LED device may further include a transparent electrode 301 located above the second type semiconductor layer 102 and electrically connected to the second type semiconductor layer 102, and the transparent electrode 301 covers the first current limiting area 201 and the third current limiting area 203. The transparent electrode has high light transmittance ratio, thereby improving the light emitting efficiency of the micro light emitting diode. In such condition, the Micro-LED device may further include an electrode 302 located above the second type semiconductor layer 102 and electrically connected to the transparent electrode 301, and the electrode 302 is directly in contact with the second current limiting area 202, thereby preventing the electrode from peeling and improving stability of the products. The Micro-LED device may further include an electrode extension part 303 located above the transparent electrode 301 and electrically connected to the electrode 302.

The first current limiting area 201, the second current limiting area 202 and the third current limiting area 203 may be formed through ion implantation technique. Ion implantation can increase sidewall flatness and improve stability of the products; meanwhile, ion implantation can further increase surface flatness, which can also improve stability of the products.

The width of the first current limiting area 201 is greater than or equal to 1 micrometer.

Besides, the second current limiting area 202 can be located in the middle of the second type semiconductor layer 102.

Another Micro-LED device according to an embodiment of the present invention includes a first type semiconductor layer 101, a second type semiconductor layer 102, a light emitting layer 103 located between the first type semiconductor layer 101 and the second type semiconductor layer 102, a first current limiting area 201 located at a periphery of the second type semiconductor layer 102 and on the sidewall region of the second type semiconductor layer 102, a second current limiting area 202 surrounded by the first current limiting area 201, and a third current blocking area 503 surrounded by the first current limiting area 201 and in contact with the second current limiting area 202, wherein a shortest distance between the first current limiting area 201 and the second current limiting area 202 is equal to or less than 50 micrometers, and a periphery perimeter of the first current limiting area 201 is equal to or less than 400 micrometers.

According to the above-mentioned structure, the Micro-LED has the followings advantages:
(1) The first current limiting area 201 can reduce sidewall leakage current and improve the light emitting efficiency of the micro light emitting diode.
(2) The second current limiting area 202 can improve the uniformity of current distribution and improve the light emitting efficiency of the micro light emitting diode.
(3) The third current blocking area 503 can improve the uniformity of current distribution and improve the light emitting efficiency of the micro light emitting diode.
(4) The peripheral perimeter is less than 400 micrometers, thereby having various advantages of the micro light emitting diode.

The upper surface U6 of the second type semiconductor layer 102, the upper surface U1 of the first current limiting area 201 and the upper surface U2 of the second current limiting area 202 are coplanar, which can increase surface flatness, improve stability of the products and reduce non-radiative recombination, thereby improving the efficiency of the micro light emitting diode.

The first current limiting area 201 has a first depth D1, the second current limiting area 201 has a second depth D2, and the first depth D1 is equal to the second depth D2. Since these depths are equal to each other, they can be formed through the same fabrication process, thereby simplifying the process.

Optionally, the first current limiting area 201 has a first depth D1, the second current limiting area 201 has a second depth D2, and the first depth D1 is greater than the second depth D2.

Optionally, the first current limiting area 201 has a first depth D1, the second current limiting area 201 has a second depth D2, and the first depth D1 is less than the second depth D2.

By increasing or decreasing the first depth D1 according to different epitaxial structures, a preferable effect of reducing sidewall leakage current can be achieved, and the light emitting efficiency of the micro light emitting diode can be improved.

The Micro-LED device may further include a transparent electrode 301 located above the second type semiconductor layer 102 and electrically connected to the second type semiconductor layer 102, and the transparent electrode 301 covers the first current limiting area 201 and the third current blocking area 503. The transparent electrode has high light transmittance ratio, thereby improving the light emitting efficiency of the micro light emitting diode. In such condition, the Micro-LED device may further include an electrode 302 located above the second type semiconductor layer 102 and electrically connected to the transparent electrode 301, and the electrode 302 is directly in contact with the second current limiting area 202, thereby preventing the electrode from peeling and improving stability of the products. The Micro-LED device may further include an electrode extension part 303 located above the transparent electrode 301 and electrically connected to the electrode 302.

The first current limiting area 201 and the second current limiting area 202 are formed through ion implantation technique. Ion implantation can increase sidewall flatness and stability of products; meanwhile, ion implantation can further increase surface flatness, which can also improve stability of products.

The third current blocking area 203 may be composed of dielectric material.

The width of the first current limiting area 201 may be greater than or equal to 1 micrometer.

The second current limiting area 202 may be located in the middle of the second type semiconductor layer 102.

Yet another Micro-LED device according to an embodiment of the present invention includes a first type semiconductor layer 101, a second type semiconductor layer 102, a light emitting layer 103 disposed between the first type semiconductor layer 101 and the second type semiconductor layer 102, a first current limiting area 201 located at a periphery of the second type semiconductor layer 102 and on the sidewall region of the second type semiconductor layer 102, a second current blocking area 502 surrounded by the first current limiting area 201, and a third current blocking area 503 surrounded by the first current limiting area 201 and in contact with the second current blocking area 502, wherein a shortest distance between the first current limiting area 201 and the second current blocking area 202 is equal to or less than 50 micrometers, and a periphery perimeter of the first current limiting area 201 is equal to or less than 400 micrometers.

The structure of the Micro-LED device has the following beneficial effects:
(1) The first current limiting area 201 can reduce sidewall leakage current and improve the light emitting efficiency of the micro light emitting diode.
(2) The second current blocking area 502 can improve the uniformity of current distribution and improve the light emitting efficiency of the micro light emitting diode.
(3) The third current blocking area 503 can improve the uniformity of current distribution and improve the light emitting efficiency of the micro light emitting diode.
(4) The peripheral perimeter is less than 400 micrometers and therefore the size scale of the micro light emitting diode can be met, thereby having various advantages of the micro light emitting diode.

The upper surface U6 of the second type semiconductor layer 102 and the upper surface U1 of the first current limiting area 201 are coplanar, which helps to increase surface flatness, improve stability of the products and reduce non-radiative recombination, thereby improving the efficiency of the micro light emitting diode.

The Micro-LED device may further include a transparent electrode 301 located above the second type semiconductor layer 102 and electrically connected to the second type semiconductor layer 102, and the transparent electrode 301 covers the first current limiting area 201, the second current blocking area 502 and the third current blocking area 503. In such condition, the Micro-LED device further includes an electrode 302 located above the second type semiconductor layer 102 and electrically connected to the transparent electrode 301, and the electrode 302 is directly in contact with the second type semiconductor layer 102, thereby preventing the electrode from peeling and improving stability of the products. The transparent electrode has high light transmittance ratio, which can improve the light emitting efficiency of the micro light emitting diode. The Micro-LED device further includes an electrode extension part 303 located above the transparent electrode 301 and electrically connected to the electrode 302.

The first current limiting area 201 is formed through ion implantation technique. Ion implantation can increase sidewall flatness and improve stability of the products.

The second current blocking area 502 and the third current blocking area 503 may be composed of dielectric material.

The width of the electrode extension part 303 may be less than the width of the third current blocking area 503.

The width of the first current limiting area 201 may be greater than or equal to 1 micrometer.

The second current blocking area 502 may have a hollow ring shape and a hollow width O2, wherein the hollow width O2 is greater than or equal to 1 micrometer.

The second current blocking area 502 may be located in the middle of the second type semiconductor layer 102.

Yet another Micro-LED device according to an embodiment of the present invention includes a first type semiconductor layer 101, a second type semiconductor layer 102, a light emitting layer 103 located between the first type semiconductor layer 101 and the second type semiconductor layer 102, a first current blocking area 501 located at a periphery of the second type semiconductor layer 102 and on the sidewall region of the second type semiconductor layer 102, a second current limiting area 202 surrounded by the first current blocking area 501, and a third current blocking area 503 surrounded by the first current blocking area 501 and in contact with the second current limiting area 202, wherein a shortest distance between the first current blocking area 501 and the second current limiting area 202 is equal to or less than 50 micrometers, and a periphery perimeter of the first current blocking area 501 is equal to or less than 400 micrometers.

According to the structure of the Micro-LED device, the beneficial effects can be as following:
(1) The first current blocking area 501 can reduce sidewall leakage current and improve the light emitting efficiency of the micro light emitting diode.
(2) The second current limiting area 202 can improve the uniformity of current distribution and improve the light emitting efficiency of the micro light emitting diode.
(3) The third current blocking area 503 can improve the uniformity of current distribution and improve the light emitting efficiency of the micro light emitting diode.
(4) The peripheral perimeter is less than 400 micrometers and therefore the size scale of the micro light emitting diode can be met, thereby having various advantages of the micro light emitting diode.

The first current blocking area 501 may at least cover the sidewall of the first type semiconductor layer 101, the sidewall of the second type semiconductor layer 102, and the sidewall of the light emitting layer 103.

The Micro-LED device may further include a transparent electrode 301 located above the second type semiconductor layer 102 and electrically connected to the second type semiconductor layer 102, and the transparent electrode 301 covers the first current blocking area 501, the second current limiting area 202 and the third current blocking area 503. The transparent electrode has high light transmittance ratio, thereby improving the light emitting efficiency of the micro light emitting diode. In such condition, the Micro-LED device further includes an electrode 302 located above the second type semiconductor layer 102 and electrically connected to the transparent electrode 301, and the electrode 302 is directly in contact with the second current limiting area 202, thereby preventing the electrode from peeling and improving stability of the products. The Micro-LED device further includes an electrode extension part 303 located above the transparent electrode 301 and electrically connected to the electrode 302.

The second current limiting area 202 may be formed through ion implantation technique. Ion implantation can increase surface flatness, thereby improving stability of the products.

The first current blocking area 501 and the third current blocking area 503 may be composed of dielectric material.

The width of the electrode extension part 303 may be less than the width of the third current blocking area 503.

The width of the first current blocking area 501 may be greater than or equal to 1 micrometer.

The second current limiting area 202 may be located in the middle of the second type semiconductor layer 102.

Yet another Micro-LED device according to an embodiment of the present invention includes a first type semiconductor layer 101, a second type semiconductor layer 102, a light emitting layer 103 located between the first type semiconductor layer 101 and the second type semiconductor layer 102, a first current blocking area 501 located at a periphery of the second type semiconductor layer 102 and on the sidewall region of the second type semiconductor layer 102, a second current limiting area 202 surrounded by the first current blocking area 501, and a third current limiting area 203 surrounded by the first current blocking area 501 and in contact with the second current limiting area 202, wherein a shortest distance between the first current blocking area 501 and the second current limiting area 202 is equal to or less than 50 micrometers, and a peripheral perimeter of the first current blocking area 501 is equal to or less than 400 micrometers.

According to the structure of the Micro-LED device, the beneficial effects can be as following:

(1) The first current blocking area 501 can reduce sidewall leakage current and improve the light emitting efficiency of the micro light emitting diode.

(2) The second current limiting area 202 can improve the uniformity of current distribution and improve the light emitting efficiency of the micro light emitting diode.

(3) The third current limiting area 203 can improve the uniformity of current distribution and improve the light emitting efficiency of the micro light emitting diode.

(4) The peripheral perimeter is less than 400 micrometers and therefore the size scale of the micro light emitting diode can be met, thereby having various advantages of the micro light emitting diode.

The first current blocking area 501 at least covers the sidewall of the first type semiconductor layer 101, the sidewall of the second type semiconductor layer 102 and the sidewall of the light emitting layer 103.

The Micro-LED device may further include a transparent electrode 301 located above the second type semiconductor layer 102 and electrically connected to the second type semiconductor layer 102, and the transparent electrode 301 covers the first current blocking area 501 and the third current limiting area 203. In such condition, the Micro-LED device may further include an electrode 302 located above the second type semiconductor layer 102 and electrically connected to the transparent electrode 301, and the electrode 302 is directly in contact with the second current limiting area 202, thereby preventing the electrode from peeling and improving stability of the products. The transparent electrode has high light transmittance ratio, and therefore the light emitting efficiency of the micro light emitting diode can be improved. The Micro-LED device may further include an electrode extension part 303 located above the transparent electrode 301 and electrically connected to the electrode 302.

The second current limiting area 202 and the third current limiting area 203 are formed through ion implantation technique. Ion implantation can increase sidewall flatness and stability of products. Ion implantation can further increase surface flatness, which can also improve stability of products.

The first current blocking area 501 may be composed of dielectric material.

The width of the first current blocking area 501 is greater than or equal to 1 micrometer.

The second current limiting area 202 may be located in the middle of the second type semiconductor layer 102.

The second current limiting area 202 has a second depth D2, the third current limiting area 203 has a third depth D3, and the second depth D2 may be equal to the third depth D3.

The second current limiting area 202 may be located in the middle of the second type semiconductor layer 102.

The first current blocking area 501 covering the sidewall region has a thickness H1, and the first current blocking area 501 covering the upper surface region has a thickness H2, wherein the thickness H1 may be greater than, less than or equal to the thickness H2. The first current blocking area 501 may expose a transparent electrode that is positioned above the second type semiconductor layer 102 and electrically connected to the second type semiconductor layer 102.

Yet another Micro-LED device according to an embodiment of the present invention includes a first type semiconductor layer 101, a second type semiconductor layer 102, a light emitting layer 103 located between the first type semiconductor layer 101 and the second type semiconductor layer 102, a first current blocking area 501 located at a periphery of the second type semiconductor layer 102 and on the sidewall region of the second type semiconductor layer 102, a second current blocking area 502 surrounded by the first current blocking area 501, and a third current blocking area 503 surrounded by the first current blocking area 501 and in contact with the second current blocking area 502, wherein a shortest distance between the first current blocking area 501 and the second current blocking area 502 is equal to or less than 50 micrometers, and a peripheral perimeter of the first current blocking area 501 is equal to or less than 400 micrometers.

According to the above-mentioned structure of the Micro-LED device, the beneficial effects can be as following:

(1) The first current blocking area 501 can reduce sidewall leakage current and improve the light emitting efficiency of the micro light emitting diode.

(2) The second current blocking area 502 can improve the uniformity of current distribution and improve the light emitting efficiency of the micro light emitting diode.

(3) The third current blocking area 503 can improve the uniformity of current distribution and improve the light emitting efficiency of the micro light emitting diode.

(4) The peripheral perimeter is less than 400 micrometers and therefore the size scale of the micro light emitting diode cab be met, thereby having various advantages of the micro light emitting diode.

The first current blocking area 501 may at least cover the sidewall of the first type semiconductor layer 101, the sidewall of the second type semiconductor layer 102 and the sidewall of the light emitting layer 103.

The Micro-LED device may further include a transparent electrode 301 located above the second type semiconductor layer 102 and electrically connected to the second type semiconductor layer 102, and the transparent electrode 301 covers the first current blocking area 501, the second current blocking area 502 and the third current blocking area 503. In such condition, an electrode 302 may be further included. The electrode 302 is located above the second type semiconductor layer 102 and electrically connected to the transparent electrode 301, and the electrode 302 is directly in contact with the second type semiconductor layer 102, thereby preventing the electrode from peeling and improving stability of the products. The transparent electrode has high light transmittance ratio, thereby improving the light emitting efficiency of the micro light emitting diode. An electrode extension part 303 may be further included. The electrode extension part 303 is located above the transparent electrode 301 and electrically connected to the electrode 302, wherein the width of the electrode extension part 303 is less than the width of the third current blocking area 503.

The first current blocking area 501, the second current blocking area 502 and the third current blocking area 503 may be composed of dielectric material.

The width of the first current blocking area 501 is greater than or equal to 1 micrometer.

The second current blocking area 502 may have a hollow ring shape and a hollow width O2, wherein the hollow width O2 is greater than or equal to 1 micrometer.

The second current blocking area 502 may be located in the middle of the second type semiconductor layer 102.

Yet another Micro-LED device according to an embodiment of the present invention includes a first type semiconductor layer 101, a second type semiconductor layer 102, a light emitting layer 103 located between the first type semiconductor layer 101 and the second type semiconductor layer 102, a first current blocking area 501 located at a periphery of the second type semiconductor layer 102 and on the sidewall region of the second type semiconductor layer 102, a second current blocking area 502 surrounded by the first current blocking area 501, and a third current limiting area 203 surrounded by the first current blocking area 501 and in contact with the second current blocking area 502, wherein a shortest distance between the first current blocking area 501 and the second current blocking area 502 is equal to or less than 50 micrometers, and a peripheral perimeter of the first current blocking area 501 is equal to or less than 400 micrometers.

The structure of the Micro-LED device has the following beneficial effects:
(1) The first current blocking area 501 can reduce sidewall leakage current and improve the light emitting efficiency of the micro light emitting diode.
(2) The second current blocking area 502 can improve the uniformity of current distribution and improve the light emitting efficiency of the micro light emitting diode.
(3) The third current limiting area 203 can improve the uniformity of current distribution and improve the light emitting efficiency of the micro light emitting diode.
(4) The peripheral perimeter is less than 400 micrometers, thereby having various advantages of the micro light emitting diode.

The first current blocking area 501 at least covers the sidewall of the first type semiconductor layer 101, the sidewall of the second type semiconductor layer 102 and the sidewall of the light emitting layer 103.

The Micro-LED device further includes a transparent electrode 301 located above the second type semiconductor layer 102 and electrically connected to the second type semiconductor layer 102, and the transparent electrode 301 covers the first current blocking area 501, the second current blocking area 502 and the third current limiting area 203. In such condition, an electrode 302 is further included, which is located above the second type semiconductor layer 102 and electrically connected to the transparent electrode 301, and the electrode 302 is directly in contact with the second type semiconductor layer 102, thereby preventing the electrode from peeling and improving stability of the products. The transparent electrode has high light transmittance ratio, thereby improving the light emitting efficiency of the micro light emitting diode. An electrode extension part 303 is further included, which is located above the transparent electrode 301 and electrically connected to the electrode 302. The first current blocking area 501, the second current blocking area 502 and the third current blocking area 503 are composed of dielectric material such as silicon oxide (SiO$_2$), silicon nitride (Si$_3$N$_4$), aluminum oxide (Al$_2$O$_3$), yttrium oxide (Y$_2$O$_3$), titanium oxide (TiO$_2$), hafnium oxide (HfO$_2$), zirconium oxide (ZrO$_2$), barium zirconate (BaZrO$_3$), barium titanate (BaTiO$_3$), tantalum pentoxide (Ta$_2$O$_5$) and Silica.

The first current blocking area 501 and the third current blocking area 503 are composed of dielectric material.

The third current limiting area 203 is formed through ion implantation technique. Ion implantation can increase surface flatness and improve stability of the products.

The width of the first current blocking area 501 is greater than or equal to 1 micrometer.

The second current blocking area 502 may have a hollow ring shape and a hollow width O2, wherein the hollow width O2 is greater than or equal to 1 micrometer.

The second current blocking area 502 is located in the middle of the second type semiconductor layer 102.

A Micro-LED device includes a first type semiconductor layer 101, a second type semiconductor layer 102, a light emitting layer 103 located between the first type semiconductor layer 101 and the second type semiconductor layer 102, a first current blocking area 501 located at a periphery of the second type semiconductor layer 102 and on the sidewall region of the second type semiconductor layer 102, and a second current blocking area 502 surrounded by the first current blocking area 501, wherein a shortest distance between the first current blocking area 501 and the second current blocking area 502 is equal to or less than 50 micrometers, and a peripheral perimeter of the first current blocking area 501 is equal to or less than 400 micrometers.

The beneficial effects are:
(1) The first current blocking area 501 can reduce sidewall leakage current and improve the light emitting efficiency of the micro light emitting diode.
(2) The second current blocking area 502 can improve the uniformity of current distribution and improve the light emitting efficiency of the micro light emitting diode.
(3) The peripheral perimeter is less than 400 micrometers and therefore the size scale of the micro light emitting diode can be met, thereby having various advantages of the micro light emitting diode.

The first current blocking area 501 at least covers the sidewall of the first type semiconductor layer 101, the sidewall of the second type semiconductor layer 102 and the sidewall of the light emitting layer 103.

The Micro-LED device may further include a transparent electrode 301 located above the second type semiconductor layer 102 and electrically connected to the second type semiconductor layer 102, and the transparent electrode 301 covers the first current blocking area 501 and the second current blocking area 502. In such condition, an electrode 302 may be further included, which is located above the second type semiconductor layer 102 and electrically connected to the transparent electrode 301, and the electrode 302 is directly in contact with the second type semiconductor layer 102, thereby preventing the electrode from peeling and improving the stability of the products. The transparent electrode has high light transmittance ratio, thereby improving the light emitting efficiency of the micro light emitting diode. An electrode extension part 303 may be further included, which is located above the transparent electrode 301 and electrically connected to the electrode 302. The first current blocking area 501 covering the sidewall region has a first thickness H1, the first current blocking area 501 covering the upper surface region has a second thickness H2, the second current blocking area 502 has a third thickness H3, and the third current blocking area 503 has a fourth thickness H4, wherein the first thickness H1 is greater than or equal to the second thickness H2, greater than or equal to the third thickness H3, and greater than or equal to the fourth thickness H4. Alternatively, the first current blocking area 501 covering the sidewall region has a first thickness H1, the first current blocking area 501 covering the upper surface region has a second thickness H2, the second current blocking area 502 has a third thickness H3, and the third current blocking area 503 has a fourth thickness H4, wherein the first thickness H1 is less than or equal to the second thickness H2, less than or equal to the third thickness H3, and less than or equal to the fourth thickness H4.

The Micro-LED device may further include a third current blocking area 503 surrounded by the first current blocking area 501 and in contact with the second current blocking area 502. The third current blocking area 503 can improve the uniformity of current distribution, thereby improving the light emitting efficiency of the micro light emitting diode. In such condition, the micro light emitting diode may further include a transparent electrode 301 located above the second type semiconductor layer 102 and electrically connected to the second type semiconductor layer 102, and the transparent electrode 301 covers the first current blocking area 501, the second current blocking area 502 and the third current blocking area 503. An electrode 302 may further be included, which is located above the second type semiconductor layer 102 and electrically connected to the transparent electrode 301, and the electrode 302 is directly in contact with the second type semiconductor layer 102. An electrode extension part 303 may be further included, which is located above the transparent electrode 301 and electrically connected to the electrode 302, wherein the width of the electrode extension part 303 is less than the width of the third current blocking area 503.

The first current blocking area 501, the second current blocking area 502 and the third current blocking area 503 may be composed of dielectric material.

The width of the first current blocking area 501 may be greater than or equal to 1 micrometer.

The second current blocking area 502 may have a hollow ring shape and a hollow width O2, wherein the hollow width O2 is greater than or equal to 1 micrometer.

The second current blocking area 502 may be located in the middle of the second type semiconductor layer 102.

The first current blocking area 501 covering the sidewall region has a first thickness H1, and the first current blocking area 501 covering the upper surface region has a second thickness H2, wherein the first thickness H1 is greater than or equal to the second thickness H2. Optionally, the first current blocking area 501 covering the sidewall region has a first thickness H1, and the first current blocking area 501 covering the upper surface region has a second thickness H2, wherein the first thickness H1 is less than the second thickness H2.

The first current blocking area 501 covering the sidewall region has a first thickness H1, the first current blocking area 501 covering the upper surface region has a second thickness H2, and the second current blocking area 502 has a third thickness H3, wherein the first thickness H1 is greater than or equal to the second thickness H2 and greater than or equal to the third thickness H3. Alternatively, the first current blocking area 501 covering the sidewall region has a first thickness H1, the first current blocking area 501 covering the upper surface region has a second thickness H2, and the second current blocking area 502 has a third thickness H3, wherein the first thickness H1 is less than the second thickness H2 and less than the third thickness H3.

The first current blocking area 501 exposes a transparent electrode 301 which is located above the second type semiconductor layer 102 and electrically connected to the second type semiconductor layer 102. The second current blocking area 502 exposes an electrode 302 which is located above the second type semiconductor layer 102 and electrically connected to the transparent electrode 301, and the electrode 302 is directly in contact with the second current limiting area 202. Alternatively, the second current blocking area 502 exposes an electrode 302 which is located above the second type semiconductor layer 102 and electrically connected to the second type semiconductor layer 102.

The light emitting efficiency of the above-mentioned micro light emitting diode is greater than 250 lumens per watt (lm/W).

The reveal ability to red, R9, of the color rendering index (CRI) of the above-mentioned micro light emitting diode is greater than 90.

The CRI of the above-mentioned micro light emitting diode is greater than 90.

The general CRI Ra of the above-mentioned micro light emitting diode is greater than 90.

A further Micro-LED device according to an embodiment of the present invention includes a first type semiconductor layer 101, a second type semiconductor layer 102, a light emitting layer 103 located between the first type semiconductor layer 101 and the second type semiconductor layer 102, and a sidewall current limiting area 201 directly in contact with the periphery sidewall regions of the second type semiconductor layer 102, the light emitting layer 103 and the first type semiconductor layer 102, wherein the sidewall current limiting area 201 further includes an upper surface 201-up, a bottom surface 101-down, an outer surface 201-out, and an inner surface 201-in. The upper surface 201-up of the sidewall current limiting area 201 and the upper surface 102-up of the second type semiconductor layer 102 are coplanar, and the outmost periphery perimeter of the vertical projection of the first current limiting area 201 is equal to or less than 400 micrometers.

The beneficial effects of the Micro-LED device is as following:

(1) The sidewall current limiting area 201 can reduce sidewall leakage current and improve the light emitting efficiency of the micro light emitting diode.

(2) The peripheral perimeter is less than 400 micrometers, which meets the size scale of the micro light emitting diode, thereby having various advantages of the micro light emitting diode.

The bottom surface 201-down of the sidewall current limiting area 201 and the bottom surface 101-down of the first type semiconductor layer 101 are coplanar.

The vertical projection of the upper surface 201-up of the sidewall current limiting area 201 has an upper surface width T-up, the vertical projection of the bottom surface 201-down of the sidewall current limiting area 201 has a bottom surface width T-down, and the upper surface width T-up is greater than the bottom surface width T-down. Alternatively, the vertical projection of the upper surface 201-up of the sidewall current limiting area 201 has an upper surface width T-up, the vertical projection of the bottom surface 201-down of the sidewall current limiting area 201 has a bottom surface width T-down, and the upper surface width T-up is less than the bottom surface width T-down.

The vertical projection of the upper surface 201-up of the sidewall current limiting area 201 may be partially overlapped with the vertical projection of the bottom surface 201-down of the sidewall current limiting area 201.

The outer surface 201-out of the sidewall current limiting area 201 has a sidewall length DS, the inner surface 201-in of the sidewall current limiting area 201 has a first depth D1, wherein the sidewall length DS is equal to the first depth D1. Alternatively, the outer surface 201-out of the sidewall current limiting area 201 has a sidewall length DS, the inner surface 201-in of the sidewall current limiting area 201 has a first depth D1, wherein the sidewall length DS is greater than the first depth D1.

The upper surface 201-up of the sidewall current limiting area 201 and the outer surface 201-out of the sidewall current limiting area 201 have a first included angle Θ1, the upper surface 201-up of the sidewall current limiting area 201 and the inner surface 201-in of the sidewall current limiting area 201 have a second included angle Θ2, wherein the first included angle Θ1 and the second included angle Θ2 are right angle (90°) or close to right angle, obtuse angle (greater than 90°), or acute angle (less than 90°) respectively.

The sidewall current limiting area 201 located at the sidewall region of the first type semiconductor layer has a first lateral width T1A, the sidewall current limiting area 201 located at the sidewall region of the light emitting layer has a second lateral width T1B, and the sidewall current limiting area 201 located at the sidewall region of the second type semiconductor layer has a third lateral width T1C. In this case, the vertical projection of the first lateral width T1A is partially overlapped with the vertical projections of the second lateral width T1B and the third lateral width T1C, wherein the width of the vertical projection of the first lateral width T1A is greater than the width of the vertical projection of the third lateral width T1C. Alternatively, the width of the vertical projection of the first lateral width T1A is less than the width of the vertical projection of the third lateral width T1C. Alternatively, the width of the vertical projection of the first lateral width T1A is equal to the width of the vertical projection of the third lateral width T1C.

In the above-mentioned displays, a preferable effect of reducing sidewall leakage current can be achieved by controlling the depth of the sidewall current limiting area, and therefore the light emitting efficiency of the micro light emitting diode can be improved.

The Micro-LED device may further include a second current limiting area 202 which is surrounded by the sidewall current limiting area, wherein the shortest distance between the sidewall current limiting area 201 and the second current limiting area 202 is equal to or less than 50 micrometers. The second current limiting area 202 can improve the uniformity of current distribution, and the light emitting efficiency of the micro light emitting diode can be improved. The upper surface 102-up of the second type semiconductor layer 102, the upper surface 201-up of the sidewall current limiting area 201 and the upper surface 202-up of the second current limiting area 202 are coplanar. In this case, the Micro-LED device may further include a third current limiting area 203 which is located between the sidewall current limiting area 201 and the second current limiting area 202 and in contact with the second current limiting area 202. The upper surface 203-up of the third current limiting area 203 and the upper surface 201-up of the sidewall current limiting area 201 are coplanar. The second current limiting area 202 has a second depth D2, the third current limiting area 203 has a third depth D3, and the second depth D2 is equal to the third depth D3. The Micro-LED device may further include a transparent electrode 301 which is located above the second type semiconductor layer 102 and electrically connected to the second type semiconductor layer 102, and the transparent electrode 301 covers the upper surface 201-up of the sidewall current limiting area 201 and the upper surface 203-up of the third current limiting area 203. In such case, the Micro-LED device may further include an electrode 302 which is located above the second type semiconductor layer 102 and electrically connected to the transparent electrode 301, and the electrode 302 is directly in contact with the second current limiting area 202. The Micro-LED device may further include an electrode extension part 303 located above the transparent electrode 301 and electrically connected to the electrode 302. The second current limiting area 202 may be located in the middle of the second type semiconductor layer 102.

The Micro-LED device may further include a transparent electrode 301 which is located above the second type semiconductor layer 102 and electrically connected to the second type semiconductor layer 102, and the transparent electrode 301 covers the upper surface 201-up of the sidewall current limiting area 201. In such case, the Micro-LED device may further include an electrode 302 located above the second type semiconductor layer 102 and electrically connected to the transparent electrode 301, and the electrode 302 is directly in contact with the second current limiting area 202, so as to prevent the electrode from peeling and improve stability of the products. Transparent electrode has high light transmittance ratio, thus the light emitting efficiency of the micro light emitting diode can be improved. The Micro-LED device may further include an electrode extension part 303 located above the transparent electrode 301 and electrically connected to the electrode 302.

The sidewall current limiting area 201, the second current limiting area 202 and the third current limiting area 203 may be formed through ion implantation technique. Ion implantation technique can increase surface flatness and improve stability of the products.

Besides, the sidewall current limiting area 201, the second current limiting area 202 and the third current limiting area 203 may be formed through diffusion technique or thin film deposition technique.

The upper surface of the sidewall current limiting area has a first width T-up greater than or equal to 1 micrometer.

The light emitting layer includes single-layer quantum well structure or multi-layer quantum well structure.

Optionally, the light emitting layer includes single-layer quantum wire structure or multi-layer quantum wire structure.

Optionally, the light emitting layer includes single layer quantum dot structure or multi-layer quantum dot structure.

The Micro-LED device may further include a back electrode 304 located below the first type semiconductor layer and electrically connected to the first type semiconductor layer.

The sidewall current limiting area 201, the second current limiting area 202 and/or the third current limiting area 203 may be formed through metal organic chemical vapor phase deposition (MOCVD) epitaxy regrowth technique.

Optionally, the sidewall current limiting area 201, the second current limiting area 202 and/or the third current limiting area 203 may be formed through molecular beam epitaxy (MBE) of epitaxy regrowth technique.

Optionally, the sidewall current limiting area 201, the second current limiting area 202 and/or the third current limiting area 203 may be formed through atomic layer chemical vapor deposition system (ALD) technique.

Optionally, the sidewall current limiting area 201, the second current limiting area 202 and/or the third current limiting area 203 may be formed through laser surface modification technique.

The upper surface 201-up of the sidewall current limiting area 201 and the outer surface 201-out of the sidewall current limiting area 201 have a first included angle Θ1, the upper surface 201-up of the sidewall current limiting area 201 and the inner surface 201-in of the sidewall current limiting area 201 have a second included angle Θ2, the first included angle Θ1 is an acute angle which is less than 90 degrees, and the second included angle Θ2 is an obtuse angle which is greater than 90 degrees.

Alternatively, the upper surface 201-up of the sidewall current limiting area 201 and the outer surface 201-out of the sidewall current limiting area 201 have a first included angle Θ1, the upper surface 201-up of the sidewall current limiting area 201 and the inner surface 201-in of the sidewall current limiting area 201 have a second included angle Θ2, the first included angle Θ1 is an obtuse angle which is greater than 90 degrees, and the second included angle Θ2 is an acute angle which is less than 90 degrees.

The sidewall current limiting area 201, the second current limiting area 202 and/or the third current limiting area 203 may be formed through selective oxidation technique.

Optionally, the sidewall current limiting area 201, the second current limiting area 202 and/or the third current limiting area 203 may be formed through thermal oxidation technique.

Optionally, the sidewall current limiting area 201, the second current limiting area 202 and/or the third current limiting area 203 may be formed through wet thermal oxidation technique.

The fabrication method of a Micro-LED device according to an embodiment of the present invention includes forming the above-mentioned micro light emitting diodes on a growth substrate 100, wherein the steps of forming the micro light emitting diodes includes: forming an electrode electrically connected to the second type semiconductor layers; bonding the micro light emitting diodes to a test substrate; removing the growth substrate;

forming another electrode electrically connected to the first type semiconductor layers; providing a voltage source to perform electroluminescence (EL) test to each of the micro light emitting diodes, and recording the positions of the abnormal micro light emitting diodes; performing a first selectively removing process to selectively remove the abnormal micro light emitting diodes and leaving the micro light emitting diodes passing the test on the test substrate; performing a first transferring process to transfer the micro light emitting diodes passing the test to a permanent substrate and remain the vacancy of the removed abnormal micro light emitting diodes on the permanent substrate; and performing a second transferring process to transfer micro light emitting diodes to fill the vacancy on the permanent substrate.

The abnormal micro light emitting diodes can be removed by performing a massive test in advance before massive transfer, thereby improving the yields of massive transfer, such that extra cost of repairing after massive transfer can be saved.

A sacrificing layer (700) shown in FIG. 9-6, FIG. 10-6 or FIG. 28-6 may be further included. The micro light emitting diodes can be bonded to the test substrate through the sacrificing layer. The first selectively removing process to remove the abnormal micro light emitting diodes can be carried out by introducing a laser to adjust the adhesiveness of the sacrificing layer, so as to remove the abnormal micro light emitting diodes from the test substrate. The first transferring process may be carried out by introducing a laser to adjust the adhesiveness of the sacrificing layer, so as to transfer the micro light emitting diodes from the test substrate to the permanent substrate. The second transferring process can be carried out by introducing a laser to adjust the adhesiveness of the sacrificing layer, so as to transfer the micro light emitting diodes from the test substrate to the permanent substrate. By adopting the laser to adjust the adhesiveness of the sacrificing layer, the rate of massive transfer can be improved, production cost can be reduced, and the yields can be improved.

The micro light emitting diodes transferred in the first transferring process and the micro light emitting diodes transferred in the second transferring process may come from the same growth substrate or from different growth substrates.

The advantages of the above-mentioned fabrication method include:
(1) The chips from the same epitaxial wafer has similar wavelengths, which can increase the rate of massive transfer.
(2) Waste of the chip materials can be reduced, utility rate of the source chips can be increased, and production cost can be reduced.

The fabrication method of the above-mentioned Micro-LED device may include adopting a magnetic bonding layer to temporarily bond the micro light emitting diodes to the test substrate. In such condition, the first selectively removing process to the abnormal micro light emitting diodes may be carried out by adjusting the magnetic force of the magnetic bonding layer, so as to remove the abnormal micro light emitting diodes from the test substrate. The first transferring process may be carried out by adjusting the magnetic force of the magnetic bonding layer, so as to transfer the micro light emitting diodes from the test substrate to the permanent substrate. The second transferring process may be carried out by adjusting the magnetic force of the magnetic bonding layer, so as to transfer the micro light emitting diodes from the test substrate to the permanent substrate. By adopting the magnetic bonding layer, the rate and yields of testing and transferring can be improved, and production cost can be reduced.

Optionally, the fabrication method of the Micro-LED device may include adopting a vacuum adsorption layer to bond the micro light emitting diodes to the test substrate. In such case, the first selectively removing process for selectively removing the abnormal micro light emitting diodes can be carried out by adjusting the suction of the vacuum adsorption layer, such that the abnormal micro light emitting diodes can be removed from the test substrate. The first transferring process can be carried out by adjusting the suction of the vacuum adsorption layer, such that the micro light emitting diodes can be transferred from the test substrate to the permanent substrate. The second transferring process can be carried out by adjusting the suction of the vacuum adsorption layer, such that the micro light emitting diodes can be transferred from the test substrate to the permanent substrate. By adopting the vacuum adsorption layer, the rate and yields of testing and transferring can be improved, and production cost can be reduced.

Optionally, the fabrication method of the Micro-LED device may include adopting an electrostatic adsorption layer to bond the micro light emitting diodes to the test substrate. In such case, the first selectively removing process for selectively removing the abnormal micro light emitting diodes can be carried out by adjusting the electrostatic force of the electrostatic adsorption layer, such that the abnormal micro light emitting diodes can be removed from the test substrate. The first transferring process can be carried out by adjusting the electrostatic force of the electrostatic adsorption layer, such that the micro light emitting diodes can be transferred from the test substrate to the permanent substrate. The second transferring process can be carried out by adjusting the electrostatic force of the electrostatic adsorption layer, such that the micro light emitting diodes can be transferred from the test substrate to the permanent substrate. By adopting the electrostatic adsorption layer, the rate and yields of testing and transferring can be improved, and production cost can be reduced.

Optionally, the fabrication method of the Micro-LED device may include adopting an adhesion layer to bond the micro light emitting diodes to the test substrate. In such case, the first selectively removing process for removing the abnormal micro light emitting diodes can be carried out by adjusting the adhesion of the adhesion layer, such that the abnormal micro light emitting diodes can be removed from the test substrate. The first transferring process can be achieved by adjusting the adhesion of the adhesion layer, such that the micro light emitting diodes can be transferred from the test substrate to the permanent substrate. The second transferring process of can be carried out by adjusting the adhesion of the adhesion layer, such that the micro light emitting diodes can be transferred from the test substrate to the permanent substrate. By adopting the adhesion layer, the rate and yields of testing and transferring can be improved, and production cost can be reduced.

The above-mentioned fabrication method of the Micro-LED device includes the following features: the first selectively removing process to the abnormal micro light emitting diodes has a first removal rate; the first transferring process for transferring the micro light emitting diodes passing the test to the permanent substrate has a first transfer rate; and the second transferring process for filling the vacancy on the permanent substrate has a second transfer rate; wherein the first transfer rate is greater than the second transfer rate, and the first removal rate is greater than or equal to the second transfer rate.

The above-mentioned fabrication method of the Micro-LED device may further adopt the following methods: the first transferring process for transferring the micro light emitting diodes passing the test to the permanent substrate has a first transfer rate; and the second transferring process for filling the vacancy on the permanent substrate has a second transfer rate; wherein the first transfer rate is greater than the second transfer rate. By controlling the transfer rate and the removal rate, the yields of massive transfer can be improved, and production cost can be reduced.

According to the fabrication method of Micro-LED device, the micro light emitting diodes on the growth substrate 100 have a first pitch P1; the micro light emitting diodes on the permanent substrate 820 have a second pitch P2; and the second pitch P2 is greater than or equal to the first pitch P1.

Subsequent production cost can be reduced by controlling the transfer pitch.

In the above-mentioned fabrication method of Micro-LED device, the micro light emitting diodes at least include an array structure composed of red LEDs, green LEDs and blue LEDs. In such case, the fabrication method further includes: forming a wall structure 850 located between adjacent micro light emitting diodes; and forming a light-transmissive adhesive F covering the micro light emitting diodes. The wall structure 850 can improve the display contrast of the micro-LED display.

The micro light emitting diodes at least include an array structure composed of ultraviolet LEDs.

The above-mentioned fabrication method of the Micro-LED device further includes:

forming a wall structure 850 located between the adjacent micro light emitting diodes; forming a first phosphor with adhesive F1 covering one or more of the micro light emitting diodes, wherein the first phosphor with adhesive F1 is excited by the micro light emitting diodes to emit red light; forming a second phosphor with adhesive F2 covering one or more of the micro light emitting diodes, wherein the second phosphor with adhesive F2 is excited by the micro light emitting diodes to emit blue light; and forming a third phosphor with adhesive F3 covering one or more of the micro light emitting diodes, wherein the third phosphor with adhesive F3 is excited by the micro light emitting diodes to emit green light.

The micro light emitting diodes at least include an array structure composed of blue LEDs.

Optionally, the above-mentioned fabrication method of the Micro-LED device further includes: forming a wall structure 850 located between the adjacent micro light emitting diodes; forming a first light-transmissive adhesive F covering one or more of the micro light emitting diodes, wherein blue light is emitted from the micro light emitting diodes which penetrates the first light-transmissive adhesive F; forming a first phosphor with adhesive F1 covering one or more of the micro light emitting diodes, wherein the first phosphor with adhesive F1 is excited by the micro light emitting diodes to emit red light; and forming a third phosphor with adhesive F3 covering one or more of the micro light emitting diodes, wherein the third phosphor with adhesive F3 is excited by the micro light emitting diodes to emit green light.

The light emitting efficiency of the micro light emitting diodes is greater than 250 lm/W.

The reveal ability to red, R9, of the color rendering index (CRI) of the micro light emitting diode is greater than 90.

The CRI of the micro light emitting diodes is greater than 90.

The general CRI Ra of the micro light emitting diodes is greater than 90.

The permanent substrate 820 is a flexible substrate, wherein the material of the flexible substrate may include ultra-thin glass, metal foil, fiber-reinforced composite material, plastic film, ceramic substrate or a combination of any two or more of the above-mentioned materials. The flexible substrate can be applied in flexible display. Preferably, the coefficient of thermal expansion (CTE) of the metal foil is similar to CTE of the thin glass. The light transmittance of the plastic film is greater than 90% under a wavelength of 550 nanometers. The material of the plastic film may for example include polyethylene terephthalate (PET), polyethylene naphthalate (PEN) or polyethersulfone (PES). The fiber-reinforced composite material may for example include carbon fibers, silicon carbide fibers or boron filament.

The preferred thickness of the flexible substrate is less than 200 micrometers, the more preferred thickness of the flexible substrate is less than 50 micrometers, and the best thickness of the flexible substrate is in a range from 25 micrometers to 50 micrometers.

The metal foil may for example include stainless steel, aluminum, nickel, titanium, zirconium, copper, iron, cobalt, palladium or a combination of any two or more of the above-mentioned materials.

The surface roughness Ra of the metal foil is less than 10 nanometers.

The permanent substrate 820 may be a transparent substrate, and the transparent substrate may for example be formed of normal glass, hard glass, quartz, ceramic or plastic.

The fabrication method of another Micro-LED device according to an embodiment of the present invention includes forming the above-mentioned micro light emitting diodes on a growth substrate, wherein the steps of forming the micro light emitting diodes includes: forming an electrode electrically connected to the second type semiconductor layer; bonding the micro light emitting diodes to a test substrate; removing the growth substrate; forming another electrode electrically connected to the first type semiconductor layer; providing a voltage source to perform electroluminescence (EL) test to each of the micro light emitting diodes, and recording the positions of the abnormal micro light emitting diodes; performing a first selectively removing process to remove the abnormal micro light emitting diodes and leave the micro light emitting diodes passing the test on the test substrate; performing a first transferring process to transfer the micro light emitting diodes passing the test to a first container; the first container includes a first liquid covering the micro light emitting diodes; and performing a second transferring process to transfer the micro light emitting diodes to a receiving substrate.

The beneficial effects of the fabrication method are as following:
  (1) Repairing cost after transferring process can be saved by performing electroluminescence test to each of the micro light emitting diodes before transferring.
  (2) Fluid transfer has advantages such as low cost and high transfer rate.

The second transferring process can be carried out by adjusting the flow rate of the first liquid so as to transfer the micro light emitting diodes to the receiving substrate.

The second transferring process can also be carried out by adjusting the viscosity of the first liquid so as to transfer the micro light emitting diodes to the receiving substrate.

The second transferring process can also be carried out by adjusting substrate capturing rate so as to transfer the micro light emitting diodes to the receiving substrate. Massive transfer can be achieved by controlling the flow rate and viscosity of the liquid and adjusting the substrate capturing rate.

The fabrication method of the Micro-LED device further includes providing a sacrificing layer 700 as shown in FIG. 9-6, FIG. 10-6 or FIG. 28-6 for bonding the micro light emitting diodes to the test substrate through the sacrificing layer. In such case, the first selectively removing process to remove the abnormal micro light emitting diodes can be carried out by introducing a laser to adjust the adhesiveness of the sacrificing layer, so as to remove the abnormal micro light emitting diodes from the test substrate. The first transferring process can be carried out by introducing a laser to adjust the adhesiveness of the sacrificing layer, so as to transfer the micro light emitting diodes from the test substrate to the first container. By adopting the sacrificing layer and laser, the rate and yields of testing and transferring can be improved, and production cost can be reduced.

The micro light emitting diodes transferred in the first transferring process and the micro light emitting diodes transferred in the second transferring process come from the same growth substrate. Alternatively, the micro light emitting diodes transferred in the first transferring process and the micro light emitting diodes transferred in the second transferring process come from different growth substrates.

The advantages of the above-mentioned method are as following:
  (1) The chips from the same epitaxial wafer has a similar wavelength, which can increase the rate of massive transfer.
  (2) Waste of the chip materials can be reduced, utility rate of the source chip can be increased, and production cost can be reduced.

The fabrication method of the Micro-LED device may further include adopting a magnetic bonding layer to bond the micro light emitting diodes to a test substrate. In such case, the first selectively removing process for removing the abnormal micro light emitting diodes can be carried out by adjusting the magnetic force of the magnetic bonding layer, so as to remove the abnormal micro light emitting diodes from the test substrate. The first transferring process can be carried out by adjusting the magnetic force of the magnetic bonding layer, so as to transfer the micro light emitting diodes from the test substrate to the first container. By adopting the magnetic bonding layer, the rate and yields of testing and transferring can be improved, and production cost can be reduced.

Optionally, the fabrication method of the Micro-LED device may include adopting a vacuum adsorption layer to bond the micro light emitting diodes to the test substrate. In such case, the first selectively removing process for removing the abnormal micro light emitting diodes can be carried out by adjusting the suction of the vacuum adsorption layer, so as to remove the abnormal micro light emitting diodes from the test substrate. The first transferring process can be carried out by adjusting the suction of the vacuum adsorption layer, so as to transfer the micro light emitting diodes from the test substrate to the first container. By adopting the vacuum adsorption layer, the rate and yields of testing and transferring can be improved, and production cost can be reduced.

Optionally, the fabrication method of the Micro-LED device may include adopting an electrostatic adsorption layer to bond the micro light emitting diodes to the test substrate. In such case, the first selectively removing process for removing the abnormal micro light emitting diodes can be carried out by adjusting the electrostatic force of the electrostatic adsorption layer, so as to remove the abnormal micro light emitting diodes from the test substrate. The first transferring process can be carried out by adjusting the electrostatic force of the electrostatic adsorption layer, so as to transfer the micro light emitting diodes from the test substrate to the first container. By adopting the electrostatic adsorption layer, the rate and yields of testing and transferring can be improved, and production cost can be reduced.

Optionally, the fabrication method of the Micro-LED device may include adopting an adhesion layer to bond the micro light emitting diodes to the test substrate. In such case, the first selectively removing process for removing the abnormal micro light emitting diodes can be carried out by adjusting the adhesion of the adhesion layer, so as to remove the abnormal micro light emitting diodes from the test substrate. The first transferring process can be carried out by adjusting the adhesion of the adhesion layer, so as to transfer the micro light emitting diodes from the test substrate to the first container. By adopting the adhesion layer, the rate and yields of testing and transferring can be improved, and production cost can be reduced.

According to the fabrication method of the Micro-LED device, the first selectively removing process for the abnormal micro light emitting diodes has a first removal rate;
  the first transferring process for transferring the micro light emitting diodes passing the test to the first container has a first transfer rate; and
  the second transferring process for transferring the micro light emitting diodes to a receiving substrate has a second transfer rate; wherein the first transfer rate is greater than the second transfer rate, and the first removal rate is greater than or equal to the second transfer rate.

By controlling the transfer rate and removal rate, the yields of massive transfer can be improved, and production cost can be reduced.

Optionally, according to the fabrication method of the Micro-LED device, the first transferring process for transferring the micro light emitting diodes passing the test to the first container has a first transfer rate; and the second transferring process for transferring the micro light emitting diodes to a receiving substrate has a second transfer rate; wherein the first transfer rate is greater than the second transfer rate.

According to the fabrication method of the Micro-LED device, the micro light emitting diodes on the growth substrate 100 have a first pitch P1; and the micro light emitting diodes on the receiving substrate 830 have a second pitch P2; wherein the second pitch P2 is greater than or equal to the first pitch P1.

Optionally, in the fabrication method of the Micro-LED device, the micro light emitting diodes on the growth substrate 100 have a first pitch P1; and the micro light emitting diodes on the receiving substrate 830 have a second pitch P2; wherein the second pitch P2 is greater than the first pitch P1. Subsequent production cost can be reduced by controlling the transfer pitch.

In the fabrication method of the Micro-LED device, the micro light emitting diodes at least include an array structure composed of red LEDs, green LEDs and blue LEDs. In such case, the fabrication method further includes: forming a wall structure 850 located between adjacent micro light emitting diodes; and forming a light-transmissive adhesive F covering the micro light emitting diodes. The wall structure 850 can improve display contrast of the micro-LED display.

The micro light emitting diodes at least include an array structure composed of ultraviolet LEDs. In such case, the fabrication method further includes: forming a wall structure 850 located between adjacent micro light emitting diodes; forming a first phosphor with adhesive F1 covering one or more of the micro light emitting diodes, wherein the first phosphor with adhesive F1 emits red light when it is excited by the micro light emitting diodes; forming a second phosphor with adhesive F2 covering one or more of the micro light emitting diodes, wherein the second phosphor with adhesive F2 emits blue light when it is excited by the micro light emitting diodes; and forming a third phosphor with adhesive F3 covering one or more of the micro light emitting diodes, wherein the third phosphor with adhesive F3 emits green light when it is excited by the micro light emitting diodes.

The micro light emitting diodes at least includes an array structure composed of blue LEDs. In such case, the fabrication method further includes: forming a wall structure 850 located between adjacent micro light emitting diodes; forming a first light-transmissive adhesive F covering one or more of the micro light emitting diodes, wherein blue light is emitted from the micro light emitting diodes which penetrates the first light-transmissive adhesive F; forming a first phosphor with adhesive F1 covering one or more of the micro light emitting diodes, wherein the first phosphor with adhesive F1 emits red light when it is excited by the micro light emitting diodes; and forming a third phosphor with adhesive F3 covering one or more of the micro light emitting diodes, wherein the third phosphor with adhesive F3 emits green light when it is excited by the micro light emitting diodes.

Light emitting efficiency of the micro light emitting diodes is greater than 250 lm/W.

The reveal ability to red, R9, of the color rendering index (CRI) of the micro light emitting diodes is greater than 90.

The CRI of the micro light emitting diodes is greater than 90.

The general CRI Ra of the micro light emitting diodes is greater than 90.

The fabrication method of another Micro-LED device includes forming the above-mentioned micro light emitting diodes on a growth substrate, wherein the steps of forming the micro light emitting diodes includes: forming an electrode electrically connected to the second type semiconductor layer; bonding the micro light emitting diodes to a test substrate; removing the growth substrate;

forming another electrode electrically connected to the first type semiconductor layer; providing a voltage source to perform electroluminescence (EL) test to each of the micro light emitting diodes, and record the positions of the abnormal micro light emitting diodes; selectively removing the abnormal micro light emitting diodes, and leaving the micro light emitting diodes passing the test; the micro light emitting diodes include the micro light emitting diodes with a first color, the micro light emitting diodes with a second color, and the micro light emitting diodes with a third color; transferring the micro light emitting diodes with the first color passing the test to a first container, and putting the first container in a first sub-chamber, wherein the first sub-chamber includes a liquid covering the micro light emitting diodes with the first color; transferring the micro light emitting diodes with the second color passing the test to a second container, and putting the second container in a second sub-chamber, wherein the second sub-chamber includes a liquid covering the micro light emitting diodes with the second color; transferring the micro light emitting diodes with the third color passing the test to a third container, and putting the third container in a third sub-chamber, wherein the third sub-chamber includes a liquid covering the micro light emitting diodes with the third color; and transferring the micro light emitting diodes with the first color, the micro light emitting diodes with the second color and the micro light emitting diodes with the third color to a receiving substrate through a fluid transfer system respectively.

The beneficial effects of the method are as following:

(1) Repairing cost after the transferring process can be saved by performing electroluminescence test to each of the micro light emitting diodes before the transferring process.

(2) Fluid transfer has advantages such as low cost and high transfer rate.

(3) By the design of the first sub-chamber, the second sub-chamber and the third sub-chamber, the micro light emitting diodes with different colors can be respectively transferred in batches, and production rate can be improved.

The receiving substrate has a plurality of recesses thereon, and a plurality of controllable attraction layers are disposed in the receiving substrate. The attraction layer may provide an electrical attraction force, a magnetic attraction force, an electrostatic attraction force, a fluid attraction force, an air attraction force, a van der waals attraction force, a thermal attraction force and an attachment attraction force. The attraction force produced by the attraction layer can capture the micro light emitting diodes in the fluid. In such case, the fluid transfer system includes a first sub-chamber, a second sub-chamber and a third sub-chamber. The first sub-chamber includes a plurality of micro light emitting diodes with the first color, a solution, a first valve and a first input port. When the first valve is opened, the plurality of micro light emitting diodes with the first color are moved downward through the first valve to a main chamber by the solution injected from the first input port, and respectively moved to the corresponding recess above the substrate by the fluid. The micro light emitting diodes with the first color may be attracted by the suction of the attraction layer on the substrate to move to the recesses in a self-alignment way, wherein the shape of the recesses and the shape of the micro light emitting diodes with the first color are the same. Accordingly, transfer of the micro light emitting diodes with the first color to the top of the substrate can be accomplished.

The second sub-chamber includes a plurality of micro light emitting diodes with the second color, a solution, a second valve and a second input port. When the second valve is opened, the plurality of micro light emitting diodes with the second color are moved downward through the second valve to a main chamber by the solution injected from the second input port, and respectively moved to the corresponding recess above the substrate by the fluid. The micro light emitting diodes with the second color may be attracted by the suction of the attraction layer on the substrate to move to the recesses in a self-alignment way, wherein the shape of the recesses and the shape of the micro light emitting diodes with the second color are the same. Accordingly, transfer of the micro light emitting diodes with the second color to the top of the substrate can be accomplished.

The beneficial effects of the above-mentioned method are as following:
(1) Repairing cost after the transferring process can be saved by performing electroluminescence test to each of the micro light emitting diodes before the transferring process.
(2) Fluid transfer has advantages such as low cost and high transfer rate.
(3) By the design of the first sub-chamber, the second sub-chamber and the third sub-chamber, the micro light emitting diodes with different colors can be respectively transferred in batches, and production rate can be improved.
(4) The design of self-alignment to the recesses can reduce production cost.

The third sub-chamber includes a plurality of micro light emitting diodes with the third color, a solution, a third valve and a third input port. When the third valve is opened, the plurality of micro light emitting diodes with the third color are moved downward through the third valve to a main chamber by the solution injected from the third input port, and respectively moved to the corresponding recess above the substrate by the fluid. The micro light emitting diodes with the third color may be attracted by the suction of the attraction layer on the substrate to move to the recess in a self-alignment way, wherein the shape of the recess and the shape of the micro light emitting diodes with the third color are the same. Accordingly, transfer of the micro light emitting diodes with the third color to the top of the substrate can be accomplished.

A further Micro-LED device according to an embodiment of the present invention includes a first type semiconductor layer 101, a second type semiconductor layer 102, a light emitting layer 103 located between the first type semiconductor layer 101 and the second type semiconductor layer 102 and a first current limiting area 201 located at a periphery of the second type semiconductor layer 102 and the sidewall region of the second type semiconductor layer 102. The first current limiting area 201 can reduce sidewall leakage current, and the light emitting efficiency of the micro light emitting diode can be improved.

The upper surface U6 of the second type semiconductor layer 102 and the upper surface U1 of the first current limiting area 201 are coplanar.

The above-mentioned Micro-LED device may further include a transparent electrode 301 located above the second type semiconductor layer 102 and electrically connected to the second type semiconductor layer 102, and the transparent electrode 301 covers the first current limiting area 201. In such case, the Micro-LED device may further include an electrode 302 located above the second type semiconductor layer 102 and electrically connected to the transparent electrode 301, and the electrode 302 is directly in contact with the second type semiconductor layer 102, thereby preventing the electrode from peeling, and stability of the products can be improved. The Micro-LED device may further include another electrode 304 located above the first type semiconductor layer 101 and the second type semiconductor layer 102 and electrically connected to the first type semiconductor layer 101, and the another electrode 304 is directly in contact with the first type semiconductor layer 102. The transparent electrode 301 has high light transmittance ratio, thereby improving the light emitting efficiency of the micro light emitting diode. The Micro-LED device may further include a fifth current blocking area 505 covering the transparent electrode 301 and isolating the electrode 302 and the electrode 304. The electrode 304 has a fourth width T4, the electrode has a fifth width T5, and the fourth width T4 is greater than or equal to the fifth width T5. The contact surface between the electrode 304 and the first type semiconductor layer 101 has a third width T3, and the third width T3 is less than the fourth width T4.

The first current limiting area 201 can be formed through ion implantation technique. Ion implantation technique can increase sidewall flatness and improve stability of the products.

The first current limiting area 201 has a first width T1 greater than or equal to 1 micrometer.

The Micro-LED device may include an etching groove 105 formed by removing a portion of the second type semiconductor layer 102 and the light emitting layer 103, and the groove 105 exposes the first type semiconductor layer 101. The groove 105 has a seventh depth D7, the first current limiting area has a first depth D1, and the first depth D1 is less than or equal to the seventh depth D7. The Micro-LED device has a feature of flip chip structure. In such case, the Micro-LED device further includes a fifth current blocking area 505 located at the sidewall of the etching groove 105.

The first type semiconductor layer 101, the second type semiconductor layer 102 and the light emitting layer 103 have an epitaxial thickness E1 less than 10 micrometers.

The Micro-LED device may include a sixth current blocking area 506 covering the sidewall of the second type semiconductor layer 102, the sidewall of the light emitting layer 103 and the sidewall of the first type semiconductor layer 101, and the sixth current blocking area 506 surrounds the first current limiting area 201.

The Micro-LED device may include a fourth current limiting area 204 surrounded by the first current limiting area 201, wherein the first current limiting area 201 has a first depth D1, the fourth current limiting area 204 has a fourth depth D4, and the first depth D1 is equal to the fourth depth D4. In such case, the fourth current limiting area 204 can be formed through ion implantation technique. The upper surface U4 of the fourth current limiting area 204 and the upper surface U6 of the second type semiconductor layer 102 are coplanar. The fifth current limiting area 205 can be formed through ion implantation technique. The upper surface U5 of the fifth current limiting area 205 and the upper surface U6 of the second type semiconductor layer 102 are coplanar.

The Micro-LED device may include a fifth current limiting area 205 surrounded by the first current limiting area 201, wherein the first current limiting area 201 has a first depth D1, the fifth current limiting area 205 has a fifth depth D5, the first depth D1 is equal to the fifth depth D5, and the fifth current limiting area 205 surrounds the etching groove 105.

The Micro-LED device may include a fourth current blocking area 504 surrounded by the first current limiting area 201 and directly in contact with the second type semiconductor layer 102.

The periphery of the first current limiting area 201 has a first length S1, a second length S2, a third length S3 and a fourth length S4, wherein the first length S1, the second length S2, the third length S3 and the fourth length S4 are less than or equal to 100 micrometers respectively.

The periphery of the first current limiting area 201 has a first length S1, a second length S2, a third length S3 and a fourth length S4, wherein the summation of the first length S1, the second length S2, the third length S3 and the fourth length S4 is less than or equal to 400 micrometers.

The light emitting efficiency of the micro light emitting diodes is greater than 250 lm/W The reveal ability to red, R9, of the color rendering index (CRI) of the micro light emitting diodes is greater than 90.

The CRI of the micro light emitting diodes is greater than 90.

The general CRI Ra of the micro light emitting diodes is greater than 90.

The periphery perimeter of the first current limiting area 201 is less than or equal to 400 micrometers. Optionally, the periphery perimeter of the first current limiting area 201 is less than or equal to 200 micrometers. Optionally, the periphery perimeter of the first current limiting area 201 is less than or equal to 100 micrometers. Optionally, the periphery perimeter of the first current limiting area 201 is less than or equal to 50 micrometers. Optionally, the periphery perimeter of the first current limiting area 201 is less than or equal to 20 micrometers.

For example, the materials used in the above-mentioned ion implantation technique may include ions $H^+$, $He^+$, $N^+$, $F^+$, $Mg^+$, $Ar^+$, $Zn^+$, $O^+$, $Si^+$, $P^+$, $Be^+$, $C^+$, $B^+$, $P^+$, $As^+$, $Sb^+$, $Te^+$, $Fe^+$, $Co^+$, $Sn^+$, $Zr^+$, $Ag^+$, $Au^+$, $Ti^+$, $Al^+$ or the combination thereof, but not limited thereto. In the ion implantation technique, the ions are passed through the mass analyzer to remove unwanted ions by using a magnetic field at first, and then, after the selected doping ions enter the accelerator, the ions are accelerated to have high energy by the electric field. Sequentially, after the high-energy ion-beam passes through the longitudinal and lateral scanners, the ion-beam is driven into the semiconductor to perform the pre-set of the doping ions. When performing the pre-set of the doping ions, the doping concentration of the pre-set can be controlled by the current intensity of the ion beam and implantation time. The distribution of the dopants in the semiconductor can be adjusted by the energy obtained by the ions through acceleration. Accordingly, the concentration and distribution of the doping ions in the semiconductor can be precisely controlled. After the ion implantation process, annealing activation may be performed by adopting rapid thermal annealing (RTA) or high-temperature furnace to repair the destruction and disorder of the lattice caused by collision, and the implanted ions and the atoms of the semiconductor can be recrystallized, such that the implanted ions can be located at the positions of the main atoms in new lattice.

The first type semiconductor layer 101, the second type semiconductor layer 102 and the light emitting layer 103 of the above-mentioned micro light emitting diodes may include any materials, for example including gallium nitride (GaN), aluminum nitride (AlN), indium nitride (InN), indium gallium nitride (InGaN), aluminum gallium nitride (AlGaN), aluminumgallium indium nitride (AlGaInN), gallium phosphide (GaP), aluminum phosphide (AlP), aluminum gallium phosphide (AlGaP), aluminum arsenide (AlAs), aluminum gallium arsenide (AlGaAs), aluminumindium gallium phosphide (AlInGaP), aluminumindium gallium arsenide (AlInGaAs), zinc selenide (ZnSe), zinc oxide (ZnO) or the alloy thereof, but not limit thereto.

Each of the micro light emitting diodes in the above-mentioned micro light emitting diodes can be controlled independently.

The fabrication method of a Micro-LED device includes forming the above-mentioned micro light emitting diodes on a growth substrate, wherein the steps of forming the micro light emitting diodes includes: forming an electrode electrically connected to the second type semiconductor layer; forming another electrode electrically connected to the first type semiconductor layer; bonding the micro light emitting diodes to a test substrate; removing the growth substrate; providing a voltage source to perform electroluminescence (EL) test to each of the micro light emitting diodes, and record the positions of the abnormal micro light emitting diodes;

transferring the micro light emitting diodes to a transfer substrate; performing a first selectively removing process to selectively remove the abnormal micro light emitting diodes, and remain the micro light emitting diodes passing the test; performing a first transferring process to transfer the micro light emitting diodes passing the test to a permanent substrate, and remain the vacancy of the removed abnormal micro light emitting diodes on the permanent substrate; and performing a second transferring process to fill the vacancy on the permanent substrate.

The fabrication method of the Micro-LED device further includes adopting a sacrificing layer 700 as shown in FIG. 9-6, FIG. 10-6 or FIG. 28-6. The micro light emitting diodes can be bonded to the test substrate through the sacrificing layer. The first selectively removing process for removing the abnormal micro light emitting diodes can be carried out by introducing a laser to adjust the adhesiveness of the sacrificing layer, so as to remove the abnormal micro light emitting diodes from the test substrate. The first transferring process can be carried out by introducing a laser to adjust the adhesiveness of the sacrificing layer, so as to transfer the micro light emitting diodes from the test substrate to the permanent substrate. The second transferring process can be carried out by introducing a laser to adjust the adhesiveness of the sacrificing layer, so as to transfer the micro light emitting diodes from the test substrate to the permanent substrate. The micro light emitting diodes transferred in the first transferring process and the micro light emitting diodes transferred in the second transferring process come from different growth substrate. The fabrication method of the Micro-LED device further includes adopting a magnetic bonding layer to temporarily bond the micro light emitting diodes to the test substrate. In such case, the first selectively removing process for removing the abnormal micro light emitting diodes can be carried out by adjusting the magnetic force of the magnetic bonding layer, so as to remove the abnormal micro light emitting diodes from the test substrate. The first transferring process can be carried out by adjusting the magnetic force of the magnetic bonding layer, so as to transfer the micro light emitting diodes from the test substrate to the permanent substrate. The second transferring process can be carried out by adjusting the magnetic force of the magnetic bonding layer, so as to transfer the micro light emitting diodes from the test substrate to the permanent substrate.

The fabrication method of the Micro-LED device may further include adopting a vacuum adsorption layer to bond the micro light emitting diodes to the substrate.

The first selectively removing process for removing the abnormal micro light emitting diodes can be carried out by adjusting the suction of the vacuum adsorption layer, so as to remove the abnormal micro light emitting diodes from the test substrate. The first transferring process can be carried out by adjusting the suction of the vacuum adsorption layer, so as to transfer the micro light emitting diodes from the test substrate to the permanent substrate. The second transferring process can be carried out by adjusting the suction of the vacuum adsorption layer, so as to transfer the micro light emitting diodes from the test substrate to the permanent substrate.

The micro light emitting diodes transferred in the first transferring process and the micro light emitting diodes transferred in the second transferring process come from the same growth substrate.

Optionally, the fabrication method of the Micro-LED device may include adopting an electrostatic adsorption layer to bond the micro light emitting diodes to a test substrate. In such case, the first selectively removing process for removing the abnormal micro light emitting diodes can be carried out by adjusting the electrostatic force of the electrostatic adsorption layer, so as to remove the abnormal micro light emitting diodes from the test substrate. The first transferring process can be carried out by adjusting the electrostatic force of the electrostatic adsorption layer, so as to transfer the micro light emitting diodes from the test substrate to the permanent substrate. The second transferring process can be carried out by adjusting the electrostatic force of the electrostatic adsorption layer, so as to transfer the micro light emitting diodes from the test substrate to the permanent substrate.

Optionally, the fabrication method of the Micro-LED device may include adopting an adhesion layer to bond the micro light emitting diodes to a test substrate. In such case, the first selectively removing process for removing the abnormal micro light emitting diodes can be carried out by adjusting the adhesion of the adhesion layer, so as to remove the abnormal micro light emitting diodes from the test substrate. The first transferring process can be carried out by adjusting the adhesion of the adhesion layer, so as to transfer the micro light emitting diodes from the test substrate to the permanent substrate. The second transferring process can be carried out by adjusting the adhesion of the adhesion layer, so as to transfer the micro light emitting diodes from the test substrate to the permanent substrate.

In the fabrication method of the Micro-LED device, the first selectively removing process for removing the abnormal micro light emitting diodes has a first removal rate; the first transferring process for transferring the micro light emitting diodes passing the test to the permanent substrate has a first transfer rate; and the second transferring process for filling the vacancy on the permanent substrate has a second transfer rate; wherein the first transfer rate is greater than the second transfer rate, and the first removal rate is greater than or equal to the second transfer rate.

In the fabrication method of the Micro-LED device, the first transferring process for transferring the micro light emitting diodes passing the test to the permanent substrate has a first transfer rate; and the second transferring process for filling the vacancy on the permanent substrate has a second transfer rate; wherein the first transfer rate is greater than the second transfer rate.

In the fabrication method of the Micro-LED device, the micro light emitting diodes on the growth substrate 100 have a first pitch P1; the micro light emitting diodes on the transfer substrate 801 have a second pitch P2; and the micro light emitting diodes on the permanent substrate 820 have a third pitch P3; wherein the second pitch P2 is greater than or equal to the first pitch P1, and the third pitch P3 is greater than or equal to the second pitch P2.

Optionally, in the fabrication method of the Micro-LED device, the micro light emitting diodes on the growth substrate 100 have a first pitch P1; the micro light emitting diodes on the transfer substrate 801 have a second pitch P2; and the micro light emitting diodes on the permanent substrate 820 have a third pitch P3; wherein the second pitch P2 is greater than the first pitch P1, and the third pitch P3 is greater than the second pitch P2.

The micro light emitting diodes at least include an array composed of red LEDs, green LEDs and blue LEDs. The fabrication method of the Micro-LED device further includes: forming a wall structure 850 located between adjacent micro light emitting diodes; and forming a light-transmissive adhesive F covering the micro light emitting diodes.

Selectively, the micro light emitting diodes at least include an array structure composed of ultraviolet LEDs.

The above-mentioned fabrication method further includes: forming a wall structure 850 located between adjacent micro light emitting diodes; forming a first phosphor with adhesive F1 covering one or more of the micro light emitting diodes, wherein the first phosphor with adhesive F1 emits red light when it is excited by the micro light emitting diodes; forming a second phosphor with adhesive F2 covering one or more of the micro light emitting diodes, wherein the second phosphor with adhesive F2 emits blue light when it is excited by the micro light emitting diodes; and forming a third phosphor with adhesive F3 covering one or more of the micro light emitting diodes, wherein the third phosphor with adhesive F3 emits green light when it is excited by the micro light emitting diodes.

Selectively, the micro light emitting diodes at least include an array composed of blue LEDs. The above-mentioned fabrication method further includes: forming a wall structure 850 located between adjacent micro light emitting diodes; forming a first light-transmissive adhesive F covering one or more of the micro light emitting diodes, wherein blue light emitted by the micro light emitting diodes penetrates the first light-transmissive adhesive; forming a first phosphor with adhesive F1 covering one or more of the micro light emitting diodes, wherein the first phosphor with adhesive F1 emits red light when it is excited by the micro light emitting diodes; and forming a third phosphor with adhesive F3 covering one or more of the micro light emitting diodes, wherein the third phosphor with adhesive F3 emits green light when it is excited by the micro light emitting diodes.

The light emitting efficiency of the micro light emitting diodes is greater than 250 lm/W The reveal ability to red, R9, of the color rendering index (CRI) of the micro light emitting diodes is greater than 90.

The CRI of the micro light emitting diode is greater than 90.

The general CRI Ra of the micro light emitting diodes is greater than 90.

The first transferring process for transferring the micro light emitting diodes passing the test to the permanent substrate has a first transfer rate, and the first transfer rate is greater than 1 million micro light emitting diodes per hour (million micro-LEDs/hour).

Optionally, the first transferring process for transferring the micro light emitting diodes passing the test to the permanent substrate has a first transfer rate, and the first transfer rate is greater than 10 million micro-LEDs/hour.

Optionally, the first transferring process for transferring the micro light emitting diodes passing the test to the permanent substrate has a first transfer rate, and the first transfer rate is greater than 20 million micro-LEDs/hour.

Optionally, the first transferring process for transferring the micro light emitting diodes passing the test to the permanent substrate has a first transfer rate, and the first transfer rate is greater than 100 million micro-LEDs/hour.

Optionally, the first transferring process for transferring the micro light emitting diodes passing the test to the permanent substrate has a first transfer rate, and the first transfer rate is greater than 200 million micro-LEDs/hour.

Optionally, the first transferring process for transferring the micro light emitting diodes passing the test to the permanent substrate has a first transfer rate, and the first transfer rate is greater than 500 million micro-LEDs/hour.

The first selectively removing process for removing the abnormal micro light emitting diodes has a first removal rate, and the first removal rate is greater than 1 million micro-LEDs/hour.

Optionally, the first selectively removing process for removing the abnormal micro light emitting diodes has a first removal rate, and the first removal rate is greater than 10 million micro-LEDs/hour.

Optionally, the first selectively removing process for removing the abnormal micro light emitting diodes has a first removal rate, and the first removal rate is greater than 20 million micro-LEDs/hour.

Optionally, the first selectively removing process for removing the abnormal micro light emitting diodes has a first removal rate, and the first removal rate is greater than 100 million micro-LEDs/hour.

Optionally, the first selectively removing process for removing the abnormal micro light emitting diodes has a first removal rate, and the first removal rate is greater than 200 million micro-LEDs/hour.

Optionally, the first selectively removing process for removing the abnormal micro light emitting diodes has a first removal rate, and the first removal rate is greater than 500 million micro-LEDs/hour.

The second transferring process for filling the vacancy on the permanent substrate has a second transfer rate, and the second transfer rate is greater than 1 million micro-LEDs/hour.

Optionally, the second transferring process for filling the vacancy on the permanent substrate has a second transfer rate, and the second transfer rate is greater than 10 million micro-LEDs/hour.

Optionally, the second transferring process for filling the vacancy on the permanent substrate has a second transfer rate, and the second transfer rate is greater than 20 million micro-LEDs/hour.

Optionally, the second transferring process for filling the vacancy on the permanent substrate has a second transfer rate, and the second transfer rate is greater than 100 million micro-LEDs/hour.

Optionally, the second transferring process for filling the vacancy on the permanent substrate has a second transfer rate, and the second transfer rate is greater than 200 million micro-LEDs/hour.

Optionally, the second transferring process for filling the vacancy on the permanent substrate has a second transfer rate, and the second transfer rate is greater than 500 million micro-LEDs/hour.

In the above-mentioned fabrication method of the Micro-LED device, the growth substrate 100 may for example include materials of silicon, aluminum oxide ($Al_2O_3$), gallium nitride (GaN), silicon carbide (SiC) and gallium arsenide (GaAs), but not limited thereto.

In the above-mentioned fabrication method of the Micro-LED device, each of the micro light emitting diodes can be controlled independently.

A further Micro-LED device according to an embodiment of the present invention includes a first type semiconductor layer 101, a second type semiconductor layer 102, a light emitting layer 103 located between the first type semiconductor layer 101 and the second type semiconductor layer 102, a magnetic layer located below the first type semiconductor layer 101, and a sidewall current limiting area located at the periphery sidewall regions of the second type semiconductor layer 102 and the light emitting layer 103, wherein the upper surface of the sidewall current limiting area and the upper surface of the second type semiconductor layer are coplanar, and the periphery perimeter of the first current limiting area is less than or equal to 400 micrometers.

The beneficial effects of the above-mentioned Micro-LED device are that the micro light emitting diodes have magnetic feature, the sidewall current limiting area can reduce sidewall leakage current, and the light emitting efficiency of the micro light emitting diode can be improved.

The Micro-LED device may further include a second current limiting area 202 surrounded by the sidewall current limiting area, wherein the shortest distance between the sidewall current limiting area and the second current limiting area 202 is less than or equal to 50 micrometers. The second current limiting area 202 is located in the middle of the second type semiconductor layer 102. The magnetic layer may include a semiconductor, a conductor layer and an oxide layer, and may be formed by epitaxial doping, ion implantation, diffusion or thin film deposition, wherein the magnetic material in epitaxial doping, ion implantation, diffusion or thin film deposition may include Fe, Co, Ni, Tb, Al, Pt, Sm, Cu, Cr or the combinations thereof. The light emitting layer includes single-layer quantum well structure or multi-layer quantum well structure. Optionally, the light emitting layer includes single-layer quantum wire structure or multi-layer quantum wire structure. Optionally, the light emitting layer includes single-layer quantum dot structure or multi-layer quantum dot structure. In such case, the upper surface of the second type semiconductor layer 102, the upper surface of the sidewall current limiting area and the upper surface of the second current limiting area 202 are coplanar. The second current limiting area 202 can be formed by ion implantation technique.

The Micro-LED device may further include a third current limiting area 203 located between the sidewall current limiting area and the second current limiting area 202 and in contact with the second current limiting area 202. The Micro-LED device may further include a transparent electrode 301 located above the second type semiconductor layer 102 and electrically connected to the second type semiconductor layer 102, and the transparent electrode 301 covers the sidewall current limiting area and the third current limiting area 203. The Micro-LED device may further include an electrode 302 located above the second type semiconductor layer 102 and electrically connected to the transparent electrode 301, and the electrode 302 is directly in contact with the second current limiting area 202. The Micro-LED device may further include an electrode extension part 303 located above the transparent electrode 301 and electrically connected to the electrode 302. The upper surface of the third current limiting area 203 and the upper surface of the sidewall current limiting area are coplanar. The third current limiting area 203 is formed by ion implantation technique. The second current limiting area 202 has a second depth D2, the third current limiting area 203 has a third depth D3, and the second depth D2 is equal to the third depth D3. The Micro-LED device may further include a transparent electrode 301 located above the second type semiconductor layer 102 and electrically connected to the second type semiconductor layer 102, and the transparent electrode 301 covers the sidewall current limiting area. The transparent electrode has high light transmittance ratio, thereby improving the light emitting efficiency of the micro light emitting diode. The Micro-LED device may further include an electrode 302 located above the second type semiconductor layer 102 and electrically connected to the transparent electrode 301, and the electrode 302 is directly in contact with the second current limiting area 202, thereby preventing the electrode from peeling and improving stability of the products. The Micro-LED device may further include an electrode extension part 303 located above the transparent electrode 301 and electrically connected to the electrode 302.

The sidewall current limiting area can be formed through ion implantation technique, wherein:
(1) The sidewall current limiting area can reduce sidewall leakage current, and the light emitting efficiency of the micro light emitting diode can be improved.
(2) The second current limiting area 202 can improve the uniformity of current distribution, and the light emitting efficiency of the micro light emitting diode can be improved.
(3) The third current limiting area 203 can improve the uniformity of current distribution, and the light emitting efficiency of the micro light emitting diode can be improved.
(4) Ion implantation technique can increase sidewall flatness, and the stability of the products can be improved.
(5) Ion implantation technique can increase surface flatness, and the stability of the products can be improved.

The sidewall current limiting area has a first width T1 greater than or equal to 1 micrometer.

A further Micro-LED device according to an embodiment of the present invention includes a first type semiconductor layer 101, a second type semiconductor layer 102, a light emitting layer 103 located between the first type semiconductor layer 101 and the second type semiconductor layer 102, a magnetic layer located below the first type semiconductor layer 101 and a first current blocking area 501 located at periphery sidewall regions of the second type semiconductor layer 102 and the light emitting layer 103, wherein the periphery perimeter of the first current blocking area 501 is less than or equal to 400 micrometers.

By adopting the above-mentioned structure, the beneficial effects are as following. The micro light emitting diodes have magnetic feature, and the first current blocking area 501 can reduce sidewall leakage current, thereby improving the light emitting efficiency of the micro light emitting diode. The periphery perimeter of the first current blocking area 501 is less than or equal to 400 micrometers, which meets the size scale of the micro light emitting diode, thereby having various advantages of the micro light emitting diode.

The Micro-LED device may further include a second current blocking area 502 surrounded by the first current blocking area 501, wherein the shortest distance between the first current blocking area 501 and the second current blocking area 502 is less than or equal to 50 micrometers. In such case, the Micro-LED device may further include a third current blocking area 503 surrounded by the first current blocking area 501 and in contact with the second current blocking area 502. The Micro-LED device may further include a transparent electrode 301 located above the second type semiconductor layer 102 and electrically connected to the second type semiconductor layer 102, and the transparent electrode 301 covers the first current blocking area 501, the second current blocking area 502 and the third current blocking area 503. The second current blocking area 502 has a hollow ring shape and a hollow width O2, wherein the hollow width O2 is greater than or equal to 1 micrometer. The second current blocking area 502 is located in the middle of the second type semiconductor 102. The Micro-LED device may further include an electrode 302 located above the second type semiconductor layer 102 and electrically connected to the transparent electrode 301, and the electrode 302 is directly in contact with the second type semiconductor layer 102. The Micro-LED device may further include an electrode extension part 303 located above the transparent electrode 301 and electrically connected to the electrode 302. The width of the electrode extension part 303 is less than the width of the third current blocking area 503. The Micro-LED device further includes a transparent electrode 301 located above the second type semiconductor layer 102 and electrically connected to the second type semiconductor layer 102, and the transparent electrode 301 covers the first current blocking area 501 and the second current blocking area 502. The Micro-LED device may further include an electrode 302 located above the second type semiconductor layer 102 and electrically connected to the transparent electrode 301, and the electrode 302 is directly in contact with the second type semiconductor layer 102, thereby preventing the electrode from peeling and improving the stability of the products. The transparent electrode has high light transmittance ratio, thereby improving the light emitting efficiency of the micro light emitting diode. The Micro-LED device may further include an electrode extension part 303 located above the transparent electrode 301 and electrically connected to the electrode 302.

The width T2 of the first current blocking area 501 is greater than or equal to 1 micrometer.

A further Micro-LED device according to an embodiment of the present invention includes a first type semiconductor layer 101, a second type semiconductor layer 102, a light emitting layer 103 located between the first type semiconductor layer 101 and the second type semiconductor layer 102, and a sidewall current limiting area 201 directly in contact with the periphery sidewall region of the second type semiconductor layer 102, wherein the sidewall current limiting area 201 further includes an upper surface 201-up, a bottom surface 101-down, an outer surface 201-out and an inner surface 201-in. The second type semiconductor layer 102 further includes an upper surface 102-up and an outer surface 102-out, and the periphery perimeter of the sidewall current limiting area 201 is less than or equal to 400 micrometers.

By adopting the above-mentioned structure, the beneficial effects are as following:
 (1) The sidewall current limiting area 201 can reduce sidewall leakage current, and the light emitting efficiency of the micro light emitting diode can be improved.
 (2) The peripheral perimeter is equal to or less than 400 micrometers and reach the size of micro light emitting diodes, thereby having various advantages of micro light emitting diodes.

The upper surface 102-up of the second type semiconductor layer 102 and the upper surface 201-up of the sidewall current limiting area 201 are coplanar.

The Micro-LED device may further include a transparent electrode 301 located above the second type semiconductor layer 102 and electrically connected to the second type semiconductor layer 102, and the transparent electrode 301 covers the sidewall current limiting area 201. The Micro-LED device may further include an electrode 302 located above the second type semiconductor layer 102 and electrically connected to the transparent electrode 301, and the electrode 302 is directly in contact with the second type semiconductor layer 102, thereby preventing the electrode from peeling and improving the stability of the products. The transparent electrode has high light transmittance ratio, thereby improving the light emitting efficiency of the micro light emitting diode.

The sidewall current limiting area 201 can be formed through ion implantation technique. Ion implantation technique can increase sidewall flatness, thereby improving the stability of the products.

The sidewall current limiting area 201 has a first width T1 greater than or equal to 1 micrometer.

The Micro-LED device may further include a back electrode 304 located below the first type semiconductor layer and electrically connected to the first type semiconductor layer.

The upper surface 201-up of the sidewall current limiting area has a surface low conductivity region $i_{L\text{-}up}$, the upper surface 102-up of the second type semiconductor layer has a surface high conductivity region $i_{H\text{-}up}$, and a conductivity distribution is gradually increased from the surface low conductivity region $i_{L\text{-}up}$ toward the surface high conductivity region $i_{H\text{-}up}$, which helps reduce surface leakage current and sidewall leakage current, and the light emitting efficiency of the micro light emitting diode can be improved.

The outer surface 201-out of the sidewall current limiting area has a sidewall low conductivity region $i_{L\text{-}out}$, the outer surface 102-out of the second type semiconductor layer has a sidewall high conductivity region $i_{H\text{-}out}$, and a conductivity distribution is gradually increased from the sidewall low conductivity region $i_{L\text{-}out}$ toward the high conductive region $i_{H\text{-}out}$.

The upper surface 201-up of the sidewall current limiting area has a first surface roughness RS-201-up not greater than 10 nanometers.

The upper surface 102-up of the second type semiconductor layer has a second surface roughness RS-102-up not greater than 10 nanometers.

Alternatively, the upper surface 201-up of the sidewall current limiting area has a first surface roughness RS-201-up, the upper surface 102-up of the second type semiconductor layer has a second surface roughness RS-102-up, and the first surface roughness RS-201-up is greater than or equal to the second surface roughness RS-102-up.

The outer surface 201-out of the sidewall current limiting area has a third surface roughness RS-201-out greater than 10 nanometers.

The outer surface 102-out of the second type semiconductor layer has a fourth surface roughness RS-102-out greater than 10 nanometers.

Optionally, the outer surface 201-out of the sidewall current limiting area has a third surface roughness RS-201-out, the outer surface 102-out of the second type semiconductor layer has a fourth surface roughness RS-102-out, and the third surface roughness RS-201-out is greater than or equal to the fourth surface roughness RS-102-out.

Optionally, the upper surface 201-up of the sidewall current limiting area has a first surface roughness RS-201-up, the outer surface 201-out of the sidewall current limiting area has a third surface roughness RS-201-out, and the first surface roughness RS-201-up is greater than or equal to the third surface roughness RS-201-out.

Optionally, the upper surface 102-up of the second type semiconductor layer has a second surface roughness RS-102-up, the outer surface 102-out of the second type semiconductor layer has a fourth surface roughness RS-102-out, and the second surface roughness RS-102-up is greater than or equal to the fourth surface roughness RS-102-out.

The advantage of the above-mentioned optional embodiments includes that the leakage current can be reduced by controlling surface roughness and sidewall roughness, thereby improving the light emitting efficiency of the micro light emitting diode.

The sidewall current limiting area 201 has a first depth D1 less than 1 micrometer. Alternatively, the sidewall current limiting area 201 has a first depth D1 greater than or equal to 1 micrometer.

The sidewall current limiting area 201 further includes the sidewall region 103-out of the light emitting layer 103.

The sidewall current limiting area 201 further includes the sidewall region outside the light emitting layer 103.

The sidewall current limiting area 201 further includes the sidewall region 103-out of the light emitting layer 103 and the sidewall region 101-out of the first type semiconductor layer 101.

The advantage of the above-mentioned optional embodiments includes that a preferable effect of reducing sidewall leakage current can be achieved by controlling the depth of the sidewall current limiting area, thereby improving the light emitting efficiency of the micro light emitting diode.

Optionally, the upper surface 201-up of the sidewall current limiting area and the outer surface 201-out of the sidewall current limiting area have a first included angle Θ1, and the upper surface 201-up of the sidewall current limiting area and the inner surface 201-in of the sidewall current limiting area have a second included angle Θ2. The first included angle Θ1 is an acute angle which is less than 90 degrees, and the second included angle Θ2 is an obtuse angle which is greater than 90 degrees.

Optionally, the upper surface 201-up of the sidewall current limiting area and the outer surface 201-out of the sidewall current limiting area have a first included angle Θ1, and the upper surface 201-up of the sidewall current limiting area and the inner surface 201-in of the sidewall current limiting area have a second included angle Θ2. The first included angle Θ1 is an obtuse angle which is greater than 90 degrees, and the second included angle Θ2 is an acute angle which is less than 90 degrees.

Optionally, the upper surface 201-up of the sidewall current limiting area and the outer surface 201-out of the sidewall current limiting area have a first included angle Θ1, the upper surface 201-up of the sidewall current limiting area and the inner surface 201-in of the sidewall current limiting area have a second included angle Θ2, and the first included angle Θ1 and the second included angle Θ2 are close to right angle (90°).

Optionally, the upper surface 201-up of the sidewall current limiting area and the outer surface 201-out of the sidewall current limiting area have a first included angle Θ1, the upper surface 201-up of the sidewall current limiting area and the inner surface 201-in of the sidewall current limiting area have a second included angle Θ2, and the first included angle Θ1 and the second included angle Θ2 are right angles (90°).

Optionally, the upper surface 201-up of the sidewall current limiting area and the outer surface 201-out of the sidewall current limiting area have a first included angle Θ1, the upper surface 201-up of the sidewall current limiting area and the inner surface 201-in of the sidewall current limiting area have a second included angle Θ2, and the first included angle Θ1 and the second included angle Θ2 are obtuse angles which are greater than 90 degrees.

Optionally, the upper surface 201-up of the sidewall current limiting area and the outer surface 201-out of the sidewall current limiting area have a first included angle Θ1, the upper surface 201-up of the sidewall current limiting area and the inner surface 201-in of the sidewall current limiting area have a second included angle Θ2, and the first included angle Θ1 and the second included angle Θ2 are acute angles which are less than 90 degrees.

A further Micro-LED device according to an embodiment of the present invention includes a first type semiconductor layer 101, a second type semiconductor layer 102, a light emitting layer 103 located between the first type semiconductor layer 101 and the second type semiconductor layer 102 and a first current blocking area 501 located at a periphery of the second type semiconductor layer 102 and on the sidewall region of the second type semiconductor layer 102, wherein a peripheral perimeter of the first current blocking area 501 is less than or equal to 400 micrometers.

By adopting the above-mentioned structure, the beneficial effects can be as following:

(1) The first current blocking region 501 can reduce sidewall leakage current and improve the light emitting efficiency of the micro light emitting diode.

(2) The distance of the peripheral perimeter is less than or equal to 400 μm, which reaches the size scale of micro light emitting diode, thus having various advantages thereof.

The first current blocking region 501 at least covers the sidewall of the first type semiconductor layer 101, the sidewall of the second type semiconductor layer 102, and the sidewall of the light emitting layer 103. Other options are as following:

The first current blocking region 501 only covers the sidewall of the second type semiconductor layer 102 and the sidewall of the light emitting layer 103.

The first current blocking region 501 only completely covers the sidewall of the second type semiconductor layer 102.

The first current blocking region 501 partially covers the sidewall of the second type semiconductor layer 102.

The first current blocking region 501 completely covers the sidewall of the light emitting layer 103.

The first current blocking region 501 partially covers the sidewall of the light emitting layer 103.

The first current blocking region 501 completely covers the sidewall of the first type semiconductor layer 101.

The first current blocking region 501 partially covers the sidewall of the first type semiconductor layer 101.

In the above-mentioned device(s), by controlling the depth and range of the first current blocking region 501, a preferable effect of reducing sidewall leakage current can be achieved and the light emitting efficiency of the micro light emitting diode can be improved.

The Micro-LED device may further include a transparent electrode 301 located above the second type semiconductor layer 102 and electrically connected to the second type semiconductor layer 102, and the transparent electrode 301 covers the first current blocking region 501. In such case, the upper surface 301-up of the transparent electrode 301 has an upper-surface high conductivity region $i_{H-up}$, wherein the upper surface 501-up of the first current blocking region 501 has an upper-surface low conductivity region $i_{L-up}$, and a conductivity distribution is gradually increased from the upper-surface low conductivity region $i_{L-up}$ toward the upper-surface high conductivity region $i_{H-up}$.

The Micro-LED device may further include an electrode 302 located above the second type semiconductor layer 102 and electrically connected to the transparent electrode 301, and the electrode 302 is in direct contact with the second limiting region 202, which can prevent the electrode from falling off and improve product stability. The transparent electrode has high light transmittance ratio, which can improve the light emitting efficiency of the micro light emitting diode.

The first current blocking area 501 is composed of dielectric material.

The width of the first current blocking area 501 is greater than or equal to 1 micrometer.

The sidewall-covering region of the first current blocking region 501 has a thickness H1, and the upper-surface-covering region of the first current blocking region 501 has a thickness H2, wherein the thickness H1 is greater than, less than, or equal to the thickness H2. The sidewall-covering region of the first current blocking region 501 has an arc corner. By controlling the geometric shape of the first current blocking region 501, a preferred effect of reducing sidewall leakage current can be achieved and the light emitting efficiency of the micro light emitting diode can be improved.

Regarding the upper surface 501-up and the outer surface 501-out of the first current blocking area 501, the options can be as following: the upper surface 501-up of the first current blocking area 501 has a first surface roughness RS-501-up not greater than 10 nanometers; the outer surface 501-out of the first current blocking area 501 has a second surface roughness RS-501-out not greater than 10 nanometers; the upper surface 501-up of the first current blocking area 501 has a first surface roughness RS-501-up, and the outer surface 501-out of the first current blocking area 501 has a second surface roughness RS-501-out, wherein the first surface roughness is greater than the second surface roughness; the upper surface 501-up of the first current blocking area 501 has a first surface roughness RS-501-up, and the outer surface 501-out of the first current blocking area 501 has a second surface roughness RS-501-out, wherein the first surface roughness is equal to the second surface roughness; and the upper surface 501-up of the first current blocking area 501 has a first surface roughness RS-501-up, and the outer surface 501-out of the first current blocking area 501 has a second surface roughness RS-501-out, wherein the first surface roughness is less than the second surface roughness.

In the above-mentioned device(s), leakage current can be reduced by controlling the surface roughness and sidewall roughness of the current blocking area 501, and the light emitting efficiency of the micro light emitting diode can be improved.

Optionally, the upper surface 501-up of the first current blocking area 501 has a surface low conductivity region $i_{L-up}$, the upper surface 102-up of the second type semiconductor layer has a surface high conductivity region $i_{H-up}$, and a conductivity distribution is gradually increased from the surface low conductivity region $i_{L-1}$ toward the surface high conductivity region $i_{H-up}$.

Optionally, the outer surface 501-out of the first current blocking area 501 has an outer surface low conductivity region $i_{L-out}$, the upper surface 501-up of the first current blocking area 501 has an upper surface low conductivity region $i_{L-up}$, and the conductivity of the outer surface low conductivity region $i_{L-out}$ is equal to the conductivity of the upper surface low conductivity region $i_{L-up}$.

Optionally, the outer surface 501-out of the first current blocking area 501 has an outer surface low conductivity region $i_{L-out}$, the upper surface 501-up of the first current blocking area 501 has an upper surface low conductivity region $i_{L-up}$, and the conductivity of the outer surface low conductivity region $i_{L-out}$ is greater than the conductivity of the upper surface low conductivity region $i_{L-up}$.

Optionally, the outer surface 501-out of the first current blocking area 501 has an outer surface low conductivity region $i_{L-out}$, the upper surface 501-up of the first current blocking area 501 has an upper surface low conductivity region $i_{L-up}$, and the conductivity of the outer surface low conductivity region $i_{L-out}$ is less than the conductivity of the upper surface low conductivity region $i_{L-up}$.

In the above-mentioned device(s), surface leakage current and sidewall leakage current can be reduced, and the light emitting efficiency of the micro light emitting diode can be improved.

An embodiment of the present invention further includes a display panel. The display panel includes a display substrate, and the display substrate includes an array of the Micro-LED devices, wherein a portion of the Micro-LED devices have sidewall current blocking areas 501, and a portion of the Micro-LED devices have sidewall current limiting areas 201.

Regarding the formation of the sidewall current blocking area, the options can be as following:

The sidewall current blocking area 501 can be formed through atomic layer chemical vapor deposition system (ALD) technique.

The sidewall current blocking area 501 can be formed through metal organic chemical vapor phase deposition (MOCVD) epitaxial regrowth technique.

The sidewall current blocking area 501 can be formed through molecular beam epitaxy (MBE) of epitaxial regrowth technique.

The sidewall current blocking area 501 can be formed through plasma enhanced chemical vapor deposition (PECVD) technique.

The sidewall current limiting area 201 can be formed through selective oxidation technique.

The sidewall current limiting area 201 can be formed through thermal oxidation technique.

The sidewall current limiting area 201 can be formed through wet thermal oxidation technique.

The sidewall current limiting area can be formed through ion implantation technique.

The maximum width of each of the Micro-LED devices is in a range from 1 micrometer to 100 micrometers.

Each of the Micro-LED devices includes a semiconductor material.

Each of the Micro-LED devices includes a first type semiconductor layer 101, a second type semiconductor layer 102 and a light emitting layer 103 located between the first type semiconductor layer 101 and the second type semiconductor layer 102.

The above-mentioned display panel further includes a circuit used to switch and drive the array of the Micro-LED devices and an array of microcontroller chips. In addition, each of the microcontroller chips is connected to a scan driving circuit and a data driving circuit.

An embodiment of the present invention further provides a flexible display including a flexible substrate 1010, and the flexible substrate further includes an array of the Micro-LED devices, wherein a portion of the Micro-LED devices have sidewall current blocking areas 501, and a portion of the Micro-LED devices have sidewall current limiting areas 201.

Optionally, the sidewall current blocking area 501 is composed of dielectric material.

Optionally, the sidewall current limiting area is formed by ion implantation technique.

The maximum width of each of the Micro-LED devices is in a range from 1 micrometer to 100 micrometers.

Each of the Micro-LED devices includes a semiconductor material.

Each of the Micro-LED devices includes a first type semiconductor layer 101, a second type semiconductor layer 102 and a light emitting layer 103 located between the first type semiconductor layer 101 and the second type semiconductor layer 102.

The flexible display may further include a circuit used to switch and drive the array of the Micro-LED devices and an array of microcontroller chips. Each of the microcontroller chips is connected to a scan driving circuit and a data driving circuit. The flexible substrate 1010 may further include a plurality of data lines 1015, wherein each of the micro-LED devices 1011 is electrically connected to a corresponding scan line 1014 and a corresponding data line 1015; a driving circuit used for driving the array of the micro-LED devices, wherein the driving circuit includes a gate driver 1012 and a source driver 1013.

Material of the flexible substrate may include ultra-thin glass, metal foil, fiber-reinforced composite material, plastic film, ceramic substrate or the combinations of any two or more of the above-mentioned materials. The thickness of the flexible substrate is preferable less than 200 micrometers, more preferable less than 50 micrometers, and even more preferable in a range from 25 micrometers to 50 micrometers. Metal foil may for example include stainless steel, aluminum, nickel, titanium, zirconium, copper, iron, cobalt, palladium or the combinations of any two or more of the above-mentioned materials. Wherein, the coefficient of thermal expansion of the metal foil is similar to the coefficient of thermal expansion of ultra-thin glass. The surface roughness Ra of the metal foil is less than 10 nanometers. The light transmittance of the plastic film is greater than 90% under a wavelength of 550 nanometer. The material of the plastic film may for example include polyethylene terephthalate (PET), polyethylene naphthalate (PEN) or polyethersulfone (PES). The fiber-reinforced composite material may for example include carbon fibers, silicon carbide fibers or boron filament.

According to even further aspect of the present invention, a flexible display including an array composed of the diode devices of the present invention is provided.

An embodiment of the present invention further provides a fabrication method of the flexible display, the fabrication method includes: providing a flexible substrate; disposing a plurality of scan lines, wherein the scan lines are disposed on the flexible substrate parallel to a first direction; disposing a plurality of data lines, wherein the data lines are disposed on the flexible substrate parallel to a second direction, wherein the first direction is perpendicular to the second direction; and disposing a plurality of micro light emitting diode arrays, wherein each of the micro light emitting diodes is electrically connected to a corresponding data line, and each of the micro light emitting diodes is electrically connected to a corresponding scan line.

A portion of the Micro-LED devices have sidewall current blocking area 501s, and a portion of the Micro-LED devices have sidewall current limiting areas 201.

The Micro-LED device achieved by 3D stacking of arrays of RGB pixels is provided by another embodiment of the present invention, and yields of massive transfer can be improved by ion implantation planarization technique. The spare LEDs can be disposed in the sub-pixel according to the technique of 3D stacking of arrays of RGB pixels, thus the production cost for exchanging the broken spot can be prevented. Besides, by shrinking the distance of the sub-pixels, the broken spot may not be easily detected by human eyes because the distance of the sub-pixels is less than the minimum resolution of human eyes, that is, technique of exchanging the broken spot is not needed. Furthermore, the micro-LED can be achieved through transmissive epitaxial substrate combined with 3D stacking of arrays of RGB pixels, and the technique of directly forming the epitaxial chip in the micro-LED display can be achieved, in which massive transfer technique is not needed.

Figure 29:
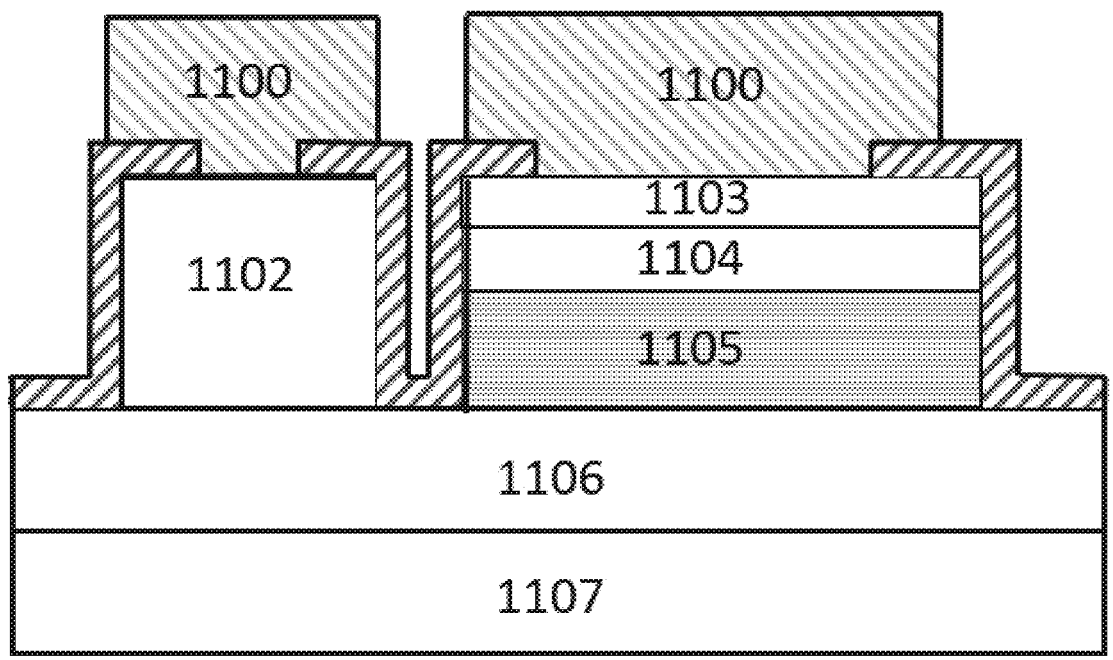
FIG. 29 schematically illustrates the structure of traditional flip chip micro light emitting diode.

Conventionally, a flip-chip micro LED structure is shown in FIG. 29, the size of the micro LED is that the side length of the micro LED is less than 100 micrometers. The side length ranged from 10 micrometers to 100 micrometers can be achieved by conventional manufacturing manners.

Figure 30:
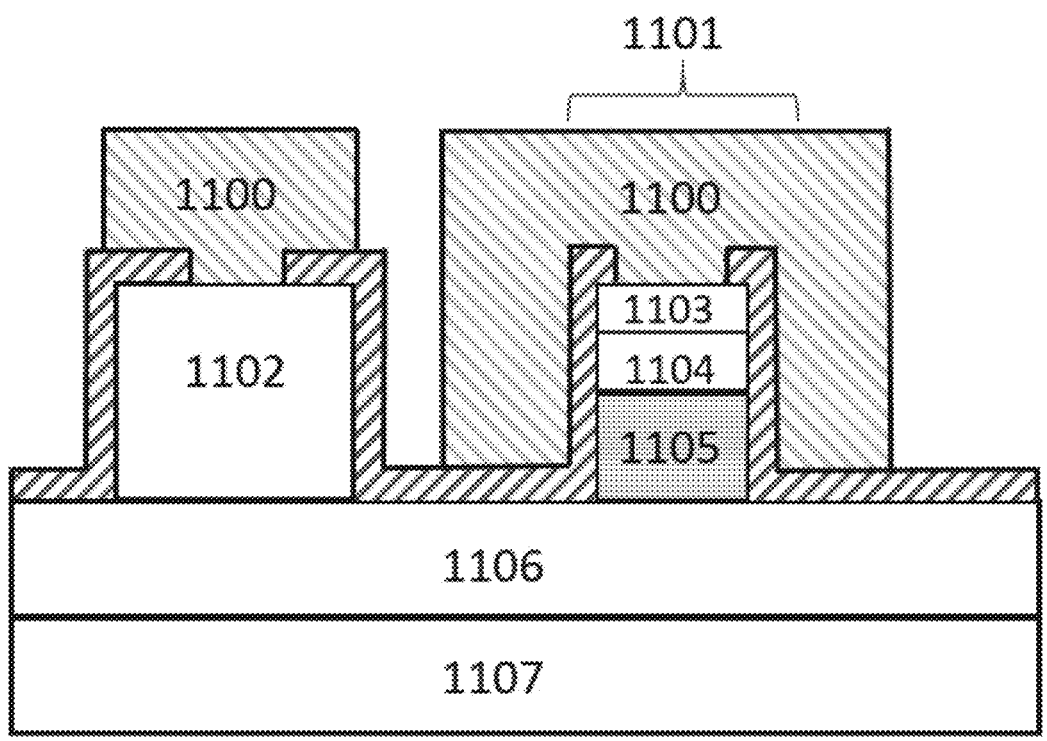
FIG. 30 schematically illustrates the structure of micro light emitting diode which the side length is reduced to lower than 10 micrometers.

When the size is shrunk to be less than 10 micrometers, as shown in FIG. 30, the micro-LED components with smaller pitch can be defined by etching (such as dry etching or wet etching) or cutting, however, the dangling bond (that is, the electrons not bonded) may be easily formed on the surface and sidewall of the components. The dangling bond contains extremely high activity, which can form trap centers easily and cause re-bonding of electron-hole pairs, thereby reducing lifespan of the carrier and reducing transfer efficiency, thereby increasing the ratio of leakage current to total current in the micro-LED, and the light emitting efficiency of the micro-LED may be reduced. The surface roughness and sidewall roughness of the components can be reduced by ion implantation technique in the present invention, thereby reducing the non-radiative recombination of the micro-LED, and the efficiency of the micro-LED can be improved.

As shown in FIG. 30, when the size is shrunk to be less than 10 micrometers, the ridge area is easily broken during etching, especially during flip chip process or massive transfer. Besides, because the metal bump is not flat, it would be broken during massive transfer, and production yields would be reduced.

Figure 31:
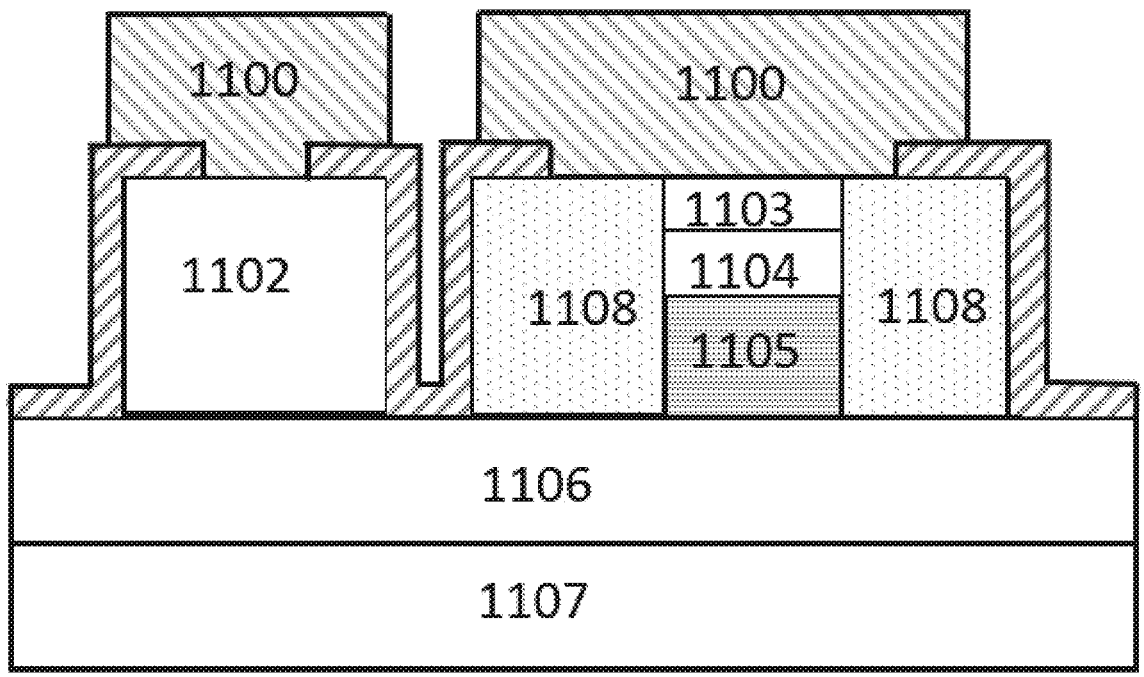
FIG. 31 schematically illustrates the structure of flip chip micro light emitting diode which the side length is reduced to lower than 10 micrometers by ion implantation.

As shown in FIG. 31, the size of the flip chip micro LED is shrunk by ion implantation technique, and because the surface flatness is increased, problems like broken of the etched ridge area or unflat of metal bump can be solved, and production yields can be improved.

Figure 32:
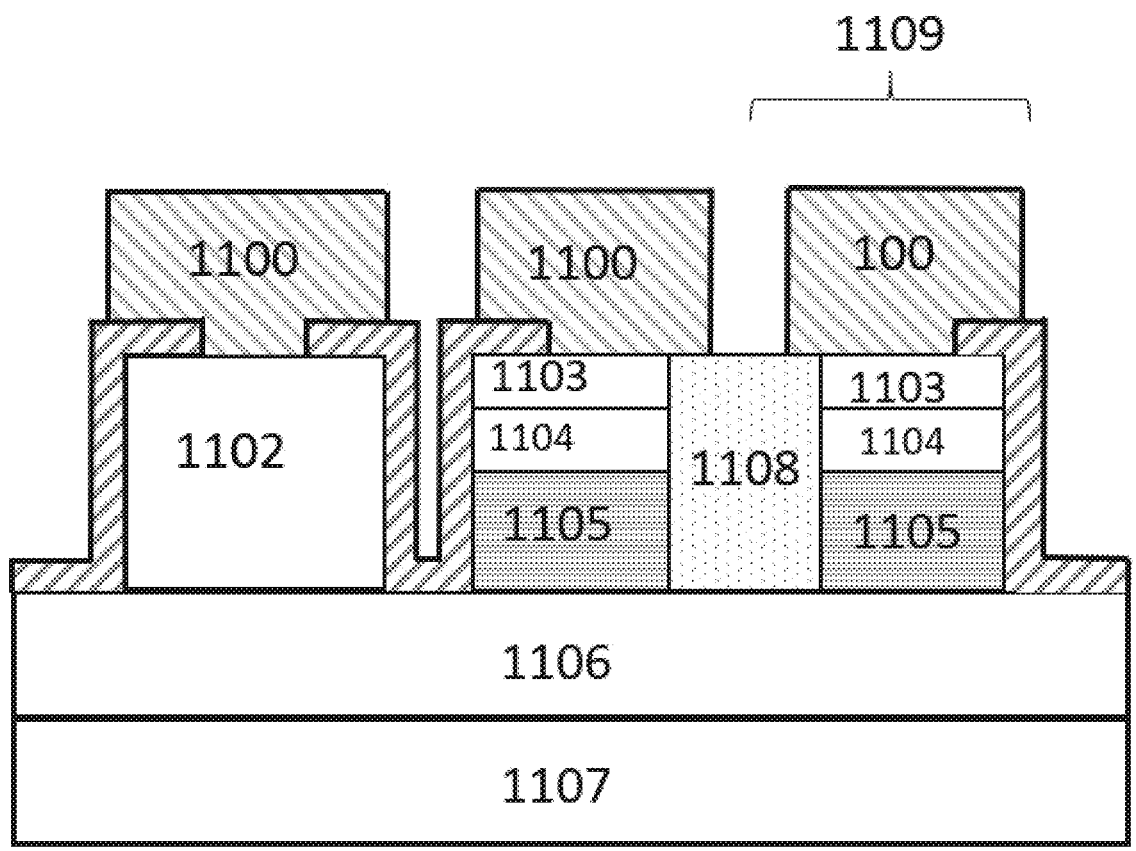
FIG. 32 schematically illustrates the structure including at least one redundancy micro light emitting diode formed through ion implantation technique.

As shown in FIG. 32, at least one spare LED is disposed in the structure by ion implantation technique to prevent extra cost for exchanging the broken spot.

Figures 1, 33:
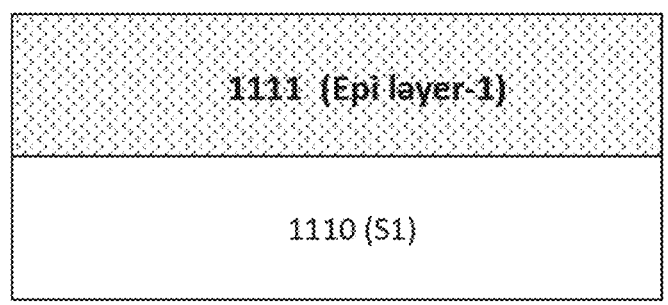
Figures 2, 33:
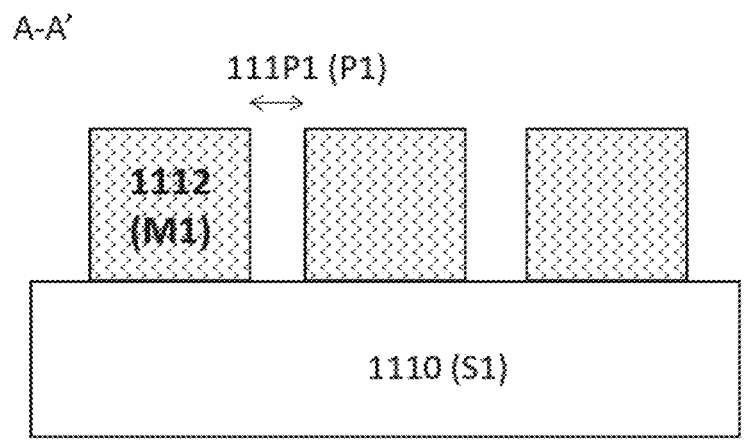
Figures 3, 33:
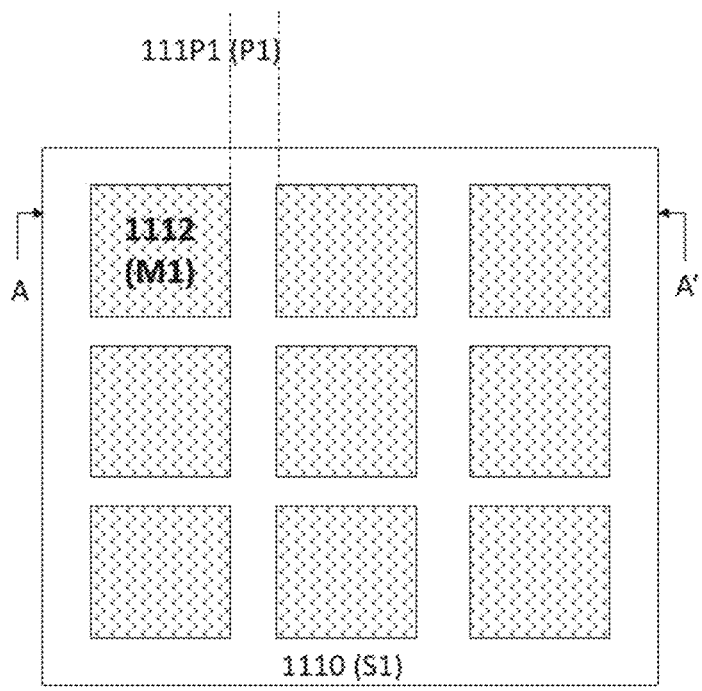

AS shown in FIG. 33-1, a first epitaxial layer structure (Epi layer-1) is formed on the first epitaxial substrate S1, and a first micro-LED M1 with the pitch P1 is formed by photolithography and etching process. FIG. 33-2 schematically illustrates a horizontal cross-sectional view along line A-A' in the top view of FIG. 33-3.

Figures 1, 34:
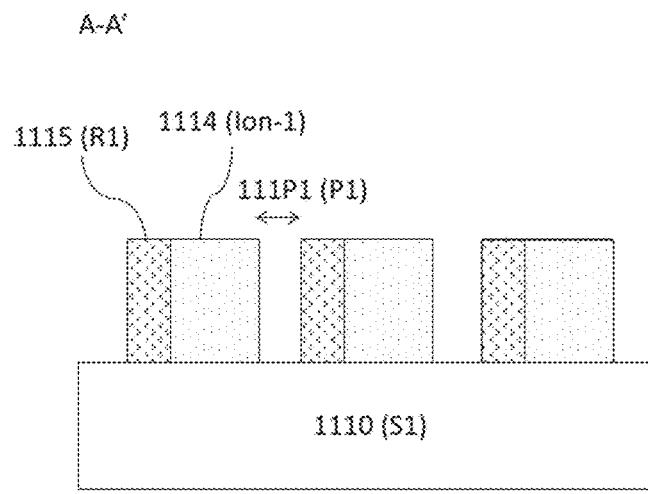
Figures 2, 34:
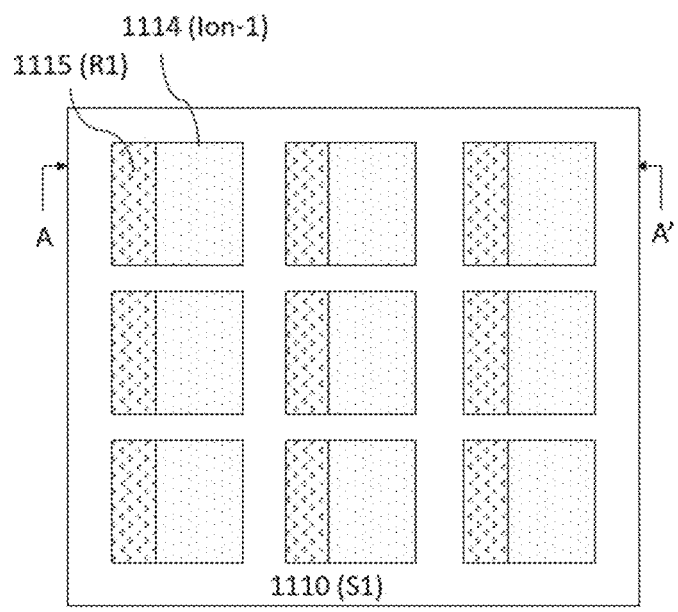

As shown in FIG. 34-1 and FIG. 34-2, the first ion implantation area Ion-1 and the first sub-pixel area R1 can be defined on the first micro-LEDs M1 by ion implantation technique.

Figures 1, 35:
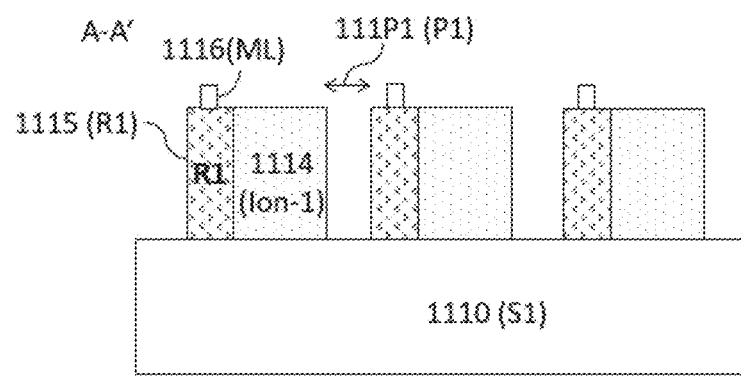
Figures 2, 35:
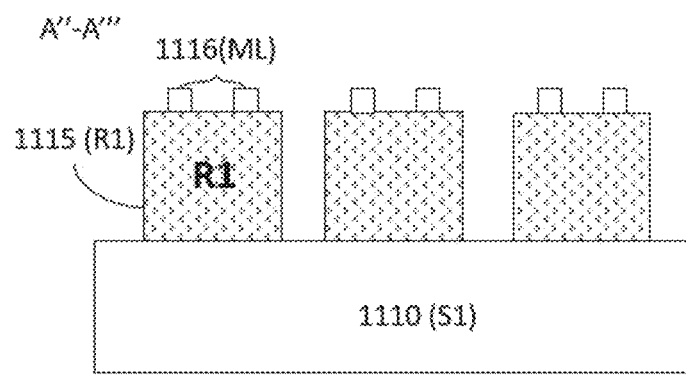
Figures 3, 35:
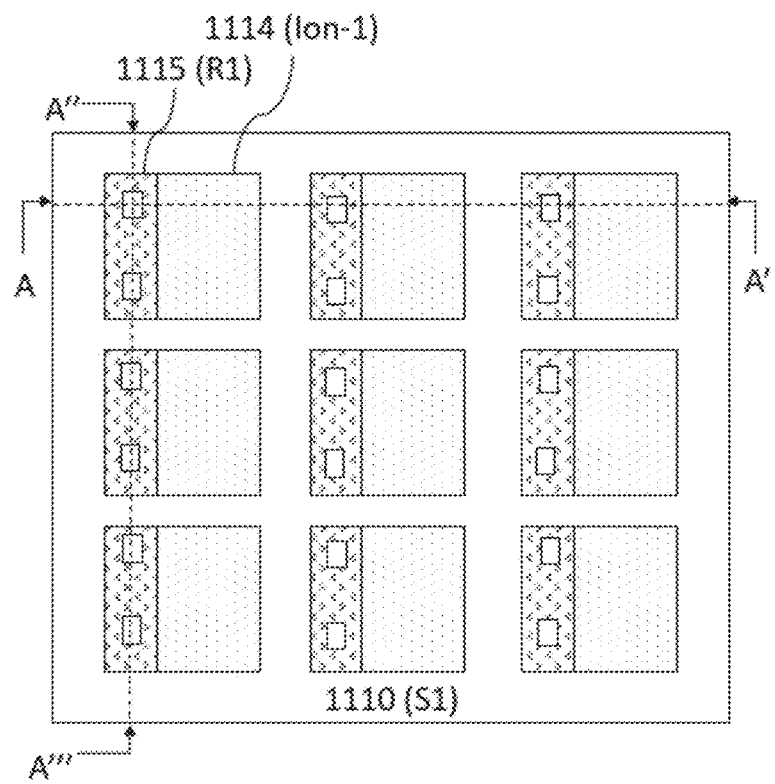

As shown in FIG. 35-1, FIG. 35-2 and FIG. 35-3, a conductive layer ML is formed above the first sub-pixel area R1. FIG. 35-1 and FIG. 35-2 schematically illustrates a horizontal cross-sectional view along line A-A and line A"-A'" in FIG. 35-3 respectively.

AS shown in FIG. 36-1, the first sub-pixels R1 including the conductive layer ML are electrically connected to the first transparent substrate T1 through a bonding pad respectively, and the first epitaxial substrate S1 is removed by etching or laser, as shown in FIG. 36-2. Then, a first light-transmissive intermediate layer B1 is filled between the first transparent substrate T1 and the first sub-pixels R1 to strengthen the mechanical structure, wherein the first micro-LEDs M1 located on the first transparent substrate T1 has a pitch P2, and the pitch P1 is equal to pitch P2. FIG. 36-2 schematically illustrates a first sub-pixel array structure.

As shown in FIG. 37-1, a second epitaxial layer structure (Epi layer-2) is formed on the second epitaxial substrate S2, and second micro-LEDs M2 with a pitch P3 are formed by photolithography and etching process. FIG. 37-2 schematically illustrates a horizontal cross-sectional view along line C-C' in the top view of FIG. 37-3.

As shown in FIG. 38-1 and FIG. 38-2, a first region Ion-2a of the second ion implantation area, a second region Ion-2b of the second ion implantation area and a second sub-pixel area G1 can be defined on each of the second micro-LEDs M2 by ion implantation technique.

As shown in FIG. 39-1, FIG. 39-2 and FIG. 39-3, a conductive layer ML is formed above the second sub-pixel area G1. FIG. 39-1 and FIG. 39-2 schematically illustrate a horizontal cross-sectional view along line C-C' and line C"-C'" in FIG. 39-3 respectively.

As shown in FIG. 40-1, the second sub-pixel area G1 including conductive layer ML is electrically connected to a second transparent substrate T2 through a bonding pad respectively, and the second epitaxial substrate S2 is removed by etching or laser, as shown in FIG. 40-2. Then, a second light-transmissive intermediate layer B2 is filled between the second transparent substrate T2 and the second sub-pixels G1 to strengthen the mechanical structure, wherein the second micro light emitting diodes M2 located in the second transparent substrate T2 has a second pitch P4, and the pitch P3 is equal to the second pitch P4. FIG. 40-2 schematically illustrates a second sub-pixel array structure.

As shown in FIG. 41-1, a third epitaxial layer structure (Epi layer-3) is formed on the third epitaxial substrate S3, and third micro-LEDs M3 with a pitch P5 are formed by photolithography and etching process. FIG. 41-2 schematically illustrates a horizontal cross-sectional view along line C-C' in the top view shown in FIG. 41-3.

As shown in FIG. 42-1 and FIG. 42-2, the third ion implantation area Ion-3 and the third sub-pixel area B1 can be defined on the third micro-LEDs M3 by ion implantation technique.

As shown in FIG. 43-1, FIG. 43-2 and FIG. 43-3, a conductive layer ML is formed above the third sub-pixel area B1. FIG. 43-1 and FIG. 43-2 schematically illustrate a horizontal cross-sectional view along line E-E' and line E"-E"' in the top view of FIG. 43-3 respectively.

As shown in FIG. 44-1, the third sub-pixel area B1 including conductive layer ML is electrically connected to a third transparent substrate T3 through a bonding pad, and the third epitaxial substrate S3 is removed by etching or laser, as shown in FIG. 44-2. Then, a third light-transmissive intermediate layer B3 is filled between the third transparent substrate T3 and the third sub-pixel B1 to strengthen the mechanical structure, wherein the third micro-LEDs M3 located in the third transparent substrate T3 have a pitch P6, and the pitch P5 is equal to the pitch P6. FIG. 44-2 schematically illustrates a third sub-pixel array structure, wherein the pitch P2 is equal to the pitch P4 and equal to the pitch P6.

FIG. 45-1 and FIG. 45-2 schematically illustrates stacking a first sub-pixel structure, a second sub-pixel structure, and a third sub-pixel structure by light-transmissive adhesive layers (A-1 and A-2) to form a three-dimensional (3-D) stack of RGB pixels array, thereby achieving the micro LED, wherein FIG. 45-2 schematically illustrates an enlargement view of the first pixel (pixel 1) and a horizontal cross-sectional view along line G-G' in FIG. 45-3. The first sub-pixel area R1 is equal to the first region Ion-2$a$ of the second ion implantation area, the third sub-pixel area B1 is equal to the second region Ion-2$b$ of the second ion implantation area, and the second sub-pixel area G1 plus the third sub-pixel area B1 are equal to the first ion implantation area Ion-1. The Micro-LED achieved by 3D stacking of RGB pixels arrays according to the present invention has a thickness D-1, wherein the thickness D-1 is less than 500 micrometers in an embodiment, the thickness D-1 is less than 200 micrometers in a preferable embodiment, the thickness D-1 is less than 100 micrometers in a more preferable embodiment, and the thickness D-1 is less than 50 micrometers in an even more preferable embodiment. In an embodiment, the sub-pixel with the longest wavelength is located at the bottom, and the sub-pixel with the shortest wavelength is located at the top, thereby preventing the sub-pixel with short wavelength from exciting the sub-pixel with a long wavelength, but the wavelength range of the light of the sub-pixels is not limited thereto. The Micro-LED is achieved by 3D stacking of RGB pixels arrays, wherein the light transmittance of the Micro-LED is greater than 60% in an embodiment, the light transmittance of the Micro-LED is greater than 70% in a preferable embodiment, the light transmittance of the Micro-LED is greater than 80% in a more preferable embodiment, and the light transmittance of the Micro-LED is greater than 90% in an even more preferable embodiment.

The transparent substrate T1,T2 and T3 of the present invention may be a flexible substrate, wherein the material of the flexible substrate may include ultra-thin glass, metal foil, fiber-reinforced composite material, plastic film, ceramic substrate or the combinations thereof, wherein a preferable thickness of the flexible substrate is less than 200 micrometers, a more preferable thickness of the flexible substrate is less than 50 micrometers, and an even more preferable thickness of the flexible substrate is in a range from 25 micrometers to 50 micrometers.

The coefficient of thermal expansion of the metal foil is similar to the coefficient of thermal expansion of the ultra-thin glass. The surface roughness Ra of the transparent metal foil is less than 10 nanometers. The light transmittance of the plastic film is greater than 90% under a wavelength of 550 nanometer. The material of the plastic film may for example include polyethylene terephthalate (PET), polyethylene naphthalate (PEN) or polyethersulfone (PES). The fiber-reinforced composite material may for example include carbon fibers, silicon carbide fibers or boron filament.

In another embodiment of the present invention shown in FIG. 46-1 and FIG. 46-2, R1-1 is the first sub-pixel, R1-2 is the first spare sub-pixel, G1-1 is the second sub-pixel, G1-2 is the second spare sub-pixel, B1-1 is the third sub-pixel, and B1-2 is the third spare sub-pixel. By controlling the sub-pixels through the circuit, only one of the sub-pixels R1-1 and R1-2 can emit light, only one of the sub-pixels G1-1 and G1-2 can emit light, and only one of the sub-pixels B1-1 and B1-2 can emit light. Besides, the first sub-pixel (R1-1) area plus the first spare sub-pixel (R1-2) area are equal to the first region Ion-2$a$ of the second ion implantation area, the third sub-pixel (B1-1) area plus the third spare sub-pixel (B1-2) area are equal to the second region Ion-2$b$ of the second ion implantation area, and the second sub-pixel (G1-1) area plus the second spare sub-pixel area (G1-2), the third sub-pixel (B1-1) area and the third spare sub-pixel (B1-2) area are equal to the first ion implantation area Ion-1.

$$(R1\text{-}1)+(R1\text{-}2)=\text{Ion-}2a$$

$$(B1\text{-}1)+(B1\text{-}2)=\text{Ion-}2b$$

$$(G1\text{-}1)+(G1\text{-}2)+(B1\text{-}1)+(B1\text{-}2)=\text{Ion-}1$$

In another embodiment of the present invention shown in FIG. 47-1 and FIG. 47-2, R1-1 is the first sub-pixel, R1-2, R1-3, R1-4, R1-5 and R1-6 are the first spare sub-pixels, G1-1 is the second sub-pixel, G1-2, G1-3 and G1-4 are the second spare sub-pixels, B1-1 is the third sub-pixel, and B1-2 is the third spare sub-pixel. By controlling the sub-pixels by the circuit, only one of the sub-pixels R1-1, R1-2, R1-3, R1-4, R1-5 and R1-6 can emit light, only one of the sub-pixels G1-1, G1-2, G1-3 and G1-4 can emit light, and only one of the sub-pixels B1-1 and B1-2 can emit light. The advantages of the design include that the usage of the spare sub-pixels is more flexible.

The first sub-pixel (R1-1) area plus the first spare sub-pixel (R1-2) area is equal to the second ion implantation area Ion-2.

$$(R1\text{-}1)+(R1\text{-}2)=\text{Ion-}2$$

$$(R1\text{-}3)+(R1\text{-}4)=(G1\text{-}1)+(G1\text{-}2)$$

$$(R1\text{-}5)+(R1\text{-}6)=(G1\text{-}3)+(G1\text{-}4)=(B1\text{-}1)+(B1\text{-}2)$$

$$(R1\text{-}1)+(R1\text{-}2)+(R1\text{-}3)+(R1\text{-}4)=\text{Ion-}3$$

In another embodiment of the present invention shown in FIG. 48-1 and FIG. 48-2, R1-1 is the first sub-pixel, R1-2, R1-3, R1-4, R1-5 and R1-6 are first spare sub-pixels, G1-1 is the second sub-pixel, G1-2, G1-3, G1-4, G1-5 and G1-6 are second spare sub-pixels, B1-1 is the third sub-pixel, B1-2, B1-3, B1-4, B1-5 and B1-6 are third spare sub-pixels. By controlling the sub-pixels by the circuit, only one of the sub-pixels R1-1, R1-2, R1-3, R1-4, R1-5 and R1-6 can emit light, only one of the sub-pixels G1-1, G1-2, G1-3, G1-4, G1-5 and G1-6 can emit light, and only one of the sub-pixels B1-1, B1-2, B1-3, B1-4, B1-5 and B1-6 can emit light. The advantages of the design include that the usage of the spare sub-pixels is more flexible. The relations between different sub-pixel areas are shown below:

$$(R1\text{-}1)=(G1\text{-}5)=(B1\text{-}3)$$

$$(R1\text{-}2)=(G1\text{-}6)=(B1\text{-}4)$$

$$(R1\text{-}3)=(G1\text{-}1)=(B1\text{-}5)$$

$$(R1\text{-}4)=(G1\text{-}2)=(B1\text{-}6)$$

$$(R1\text{-}5)=(G1\text{-}3)=(B1\text{-}1)$$

$$(R1\text{-}6)=(G1\text{-}4)=(B1\text{-}2)$$

In another embodiment of the present invention shown in FIG. 49-1 and FIG. 49-2, R1-1A, R1-2A, R1-3A, R1-4A, R1-5A and R1-6A are the first sub-pixels, G1-1A, G1-2A, G1-3A, G1-4A, G1-5A and G1-6A are the second sub-pixels, B1-1A, B1-2A, B1-3A, B1-4A, B1-5A and B1-6A are the third sub-pixels.

Pixel 1 is composed of pixel 1A to pixel 1F, because the width of any one of the pixel 1A to pixel 1F is less than the resolution of human eyes, spare pixel is not necessary. Because human eyes cannot recognize the broken dots when one of the pixel 1A to pixel 1F is broken, exchange of the broken dot is not necessary. According to an embodiment of the present invention, the resolution of the monitor may for example be 1440×960 (pixels), the pixel number per inch is 494.48 ppi (pixels per inch), and the dot pitch of the sub-pixels is less than 0.0514 micrometers, which is enough to make it impossible for human eyes to recognize the broken dots of a single pixel at normal viewing distance, such that the spare pixel is not necessary. In a preferable embodiment of the present invention, the resolution of the monitor is 1920×1280 (pixels), the pixel number per inch is 659.3 ppi, and the dot pitch of the sub-pixels is less than 0.0385 micrometers, which is enough to make it impossible for human eyes to recognize the broken dots of a single pixel at normal viewing distance, such that the spare pixel is not necessary even if any adjacent one of the micro light emitting diodes is out of order. In a better embodiment of the present invention, the resolution of the monitor is 3840× 2560 (pixels), the pixel number per inch is 1318.6 ppi, and the dot pitch of the sub-pixels is less than 0.0193 micrometers, which is enough to make it impossible for human eyes to recognize the broken dots of a single pixel at normal viewing distance, such that the spare pixel is not necessary even if any adjacent two of the micro light emitting diodes are out of order.

According to another embodiment of the present invention shown in FIG. 50, the epitaxial substrate S1, S2 and S3 are transparent substrates, that is, the micro LED can be formed through 3D stacking of RGB pixels without transfer to a transparent substrate, thereby simplifying the process.

According to an embodiment of the present invention shown in FIG. 51, a black mattress layer BM is further included to increase the contrast of the pixels.

According to another embodiment of the present invention shown in FIG. 52, each of the micro light emitting diodes further includes a magnetic layer ML to improve the precision of 3D stacking, wherein the magnetic layer can be formed through doping, ion implantation, diffusion or thin film deposition, and the magnetic material may for example include Fe, Co, Ni, Tb, Al, Pt, Sm, Cu, Cr or the combinations thereof.

According to another embodiment of the present invention shown in FIG. 53, each of the micro light emitting diodes further includes a current blocking area located on the surface and at the sidewall region of the micro light emitting diodes, the current blocking area can reduce the non-radiative recombination of the micro light emitting diodes, thereby improving the efficiency of the micro light emitting diodes. The current blocking area is composed of dielectric material such as silicon nitride, silicon dioxide or aluminum oxide ($Al_2O_3$), and the sidewall-covering region of the current blocking area of the present invention has an arc.

According to another embodiment of the present invention shown in FIG. 54, each of the micro light emitting diodes further includes a current limiting area located on the surface and at the sidewall region of the micro light emitting diodes, the current limiting area can reduce the non-radiative recombination of the micro light emitting diodes, thereby improving the efficiency of the micro light emitting diodes. The current limiting area can be formed through formed through ion implantation technique.

According to another embodiment of the present invention shown in FIG. 55-1, light emitting of the micro light emitting diodes can be controlled by electrically connecting an integrated control system to the micro-LED display, and the image displayed by the micro-LED display can be projected to an optical component through a lens system and reflected to human eyes. Human eyes can see an augmented reality (AR) formed by actual scene and the images produced by the micro-LED display through the optical component, wherein the optical component can be a transmissive windshield glass, a transparent resin glass, a transmissive eyeglasses lens or a foldable display which has light transmission and reflection function. The Micro-LED in the micro-LED display can be achieved by 3D stacking of RGB pixels arrays combined with ion implantation planarization technique. The preferable side length of the Micro-LED is less than 4 micrometers in the present invention.

FIG. 55-2 illustrates another embodiment of the present invention, one of the difference between this embodiment and the embodiment shown in FIG. 55-1 is that the RGB micro-LED display can be controlled independently by respectively electrically connecting the integrated control system and the RGB micro-LED display. Since the RGB micro-LED display can be controlled independently to display images by projection, massive transfer is not necessary, and the RGB micro-LED display can be formed in a single epitaxial chip. The Micro-LED in the micro-LED display can be achieved by 3D stacking of RGB pixels arrays combined with ion implantation planarization technique. The preferable side length of the Micro-LED is less than 4 micrometers in the present invention.

According to another embodiment of the present invention shown in FIG. 55-3, the micro-LED display and the lens system are integrated into an optical component, the images of the micro-LED display is projected to the lens system and reflected to human eyes by electrically connecting an integrated control system and the micro-LED display. Human eyes can see an augmented reality (AR) formed by actual scene and the images produced by the micro-LED display through the optical component, wherein the optical component can be a transmissive windshield glass, a transparent resin glass, a transmissive eyeglasses lens or a foldable display. The integrated control system can be disposed inside or outside the optical component. The Micro-LED in the micro-LED display can be achieved by 3D stacking of RGB pixels arrays combined with ion implantation planarization technique. The preferable side length of the Micro-LED is less than 4 micrometers in the present invention.

According to another embodiment of the present invention shown in FIG. 55-4, one of the difference between this embodiment and the embodiment shown in FIG. 55-3 is that the RGB micro-LED display can be controlled independently by respectively electrically connecting the integrated control system and the RGB micro-LED display, and the RGB micro-LED display can controlled independently and display image by projection, thus massive transfer is not necessary and the RGB micro-LED display can be achieved in a single epitaxial chip. The integrated control system can be disposed inside or outside the optical component. The Micro-LED in the micro-LED display can be achieved by 3D stacking of RGB pixels arrays combined with ion implantation planarization technique. The preferable side length of the Micro-LED is less than 4 micrometers in the present invention.

As shown in FIG. 55-5, the above-mentioned integrated control system further includes a multi-function sensor, microchip processors, a network interface to make the user capable of controlling the micro-LED display and provide an appropriate augmented reality, wherein the multi-function sensor may for example include ultrasonic sensor, thermal sensor, humidity sensor, gas sensor, pressure sensor, acceleration sensor, ultraviolet light sensor, magnetic-sensitive sensor, magnetic-resistive sensor, image sensor, electricity sensor, displacement sensor, touch sensor, infrared proximity/distance sensor, global positioning system module, gyroscope, accelerometer, fingerprint sensor, iris sensor, button, knob, switch, microphone, camera or RFID reader module. User can adjust or zoom in/zoom out the position and size of the augmented reality by the multi-function sensor, and the appropriate information of the augmented reality can be provided. In an embodiment, the position of the projection of the augmented reality can be adjusted by sensing the position and status of the pupil through the multi-function sensor cooperating with the microchip processors to make sure the actual scene perceived by human eyes through the optical component can fit the augmented reality, thereby preventing distortion of the augmented reality, and precise display can be achieved. Besides, data can be transferred to another network by cooperating with the network interface to provide appropriate information of the augmented reality.

A smart glass structure is shown in FIG. 56-1. An integrated control system and a display are disposed on a frame. An image is projected to an optical component by the display and reflected to human eyes. Human eyes can see an augmented reality formed by actual scene and the images produced by the micro-LED display through the optical component. The smart glass structure is limited to the size of light source, so it can't achieve the advantages such as thinness and shortness. The techniques of the display may be substantially divided into digital light processing (DLP), microelectromechanical system (MEMS) laser, liquid crystal on silicon (LCOS), etc., wherein the DLP technique is a digital micro-mirror device (DMD) based on a microelectromechanical system component. The volume of the complex periphery circuit of the DMD is greater, and switching of the MEMS component in high frequency also causes the problem of excessive power consumption. Besides, the disadvantages of LCOS technique include low light emitting efficiency and large volume. The present invention replaces the normal display with the micro-LED display, which not only improves the resolution, but also shrinks the size of the device to fit the size of wearable device(s). Therefore, competitiveness in the market can be improved because of the advantages like low power consumption and smaller size. Besides, the normal smart glass is limited to the size of the light source of the display and the design of reflective mirror, so the provided range of the augmented reality is also limited. Because the size of the display is shrunk in the present invention, the design of light path of the projection is more flexible, a wider range of the augmented reality can be provided, and a more comfortable environment when using the device can be provided. The Micro-LED in the micro-LED display can be achieved by 3D stacking of RGB pixels arrays combined with ion implantation planarization technique. The preferable side length of the Micro-LED is less than 4 micrometers in the present invention.

An embodiment of the present invention is shown in FIG. 56-2. An integrated control system combined with the display is disposed on a frame, an image is projected to an optical component by the display and reflected to human eyes. Human eyes can see an augmented reality formed by actual scene and the images produced by the micro-LED display through the optical component.

An embodiment of the present invention is shown in FIG. 56-3. An integrated control system combined with the micro-LED display is disposed at the top of the rims, and an image is projected to an optical component by the display and reflected to human eyes. Human eyes can see an augmented reality formed by actual scene and the images produced by the micro-LED display through the optical component.

An embodiment of the present invention is shown in FIG. 56-4. An integrated control system combined with the micro-LED display is disposed at any periphery position of the rims or disposed in the bridge connecting the rims which makes the combined structure not limited to the shape of the rims, and an image is projected to an optical component by the display and reflected to human eyes. Human eyes can see an augmented reality formed by actual scene and the images produced by the micro-LED display through the optical component.

An embodiment of the present invention is shown in FIG. 56-5. An integrated control system is disposed at the top of the rims, and the micro-LED display and the lens system are integrated into an optical component. The image of the micro-LED display can be projected to the lens system by electrically connecting the integrated control system and the micro-LED display and reflected to human eyes. Human eyes can see an augmented reality formed by actual scene and the images produced by the micro-LED display through the optical component.

Another embodiment of the present invention is shown in FIG. 57-1, wherein the micro LED structure in this embodiment has a magnetic layer. First, an epitaxial substrate is provided, and then, the magnetic layer ML is formed above the epitaxial substrate, wherein the material of the magnetic layer may include a semiconductor layer, a conductive layer and an oxide layer, and the magnetic layer can be formed through doping, ion implantation, diffusion, thin film deposition. The magnetic material formed by doping, ion implantation, diffusion or thin film deposition may include Fe, Co, Ni, Tb, Al, Pt, Sm, Cu, Cr or the combinations thereof. After that, a first type semiconductor layer, a light emitting layer and a second type semiconductor layer are sequentially formed on the magnetic layer.

A lateral magnetic micro LED structure is shown in FIG. 57-2. The lateral magnetic micro LED structure is formed by removing a portion of the second type semiconductor layer and the light emitting layer through etching, exposing a portion of the first type semiconductor layer, forming a metal layer ohm contacted with the first type semiconductor layer, forming another metal later ohm contacted with the second type semiconductor layer, and removing the epitaxial substrate.

A vertical magnetic micro LED structure is shown in FIG. 57-3. The vertical magnetic micro LED structure is formed by forming a metal layer ohm contacted with the second type semiconductor layer, exposing the magnetic layer by removing the epitaxial substrate, and forming another metal layer ohm contacted with the magnetic layer.

Another vertical magnetic micro-LED structure is shown in FIG. 57-4. The vertical magnetic micro-LED structure is formed by forming a metal layer ohm contacted with the second type semiconductor layer, exposing the first type semiconductor layer by removing the epitaxial substrate and a portion of the magnetic layer, and forming another metal layer ohm contacted with the first type semiconductor layer.

The magnetic micro-LED shown in FIG. 57-5, FIG. 57-6 and FIG. 57-7 further includes a first current blocking layer located at the surface and sidewall region of the magnetic micro-LED. The first current blocking layer can reduce the non-radiative recombination of the magnetic micro-LED, thereby improving the efficiency of the micro-LED. The first current blocking layer is composed of dielectric material such as silicon nitride, silicon dioxide or aluminum oxide ($Al_2O_3$).

The magnetic micro-LED shown in FIG. 57-8, FIG. 57-9 and FIG. 57-10 further includes a first current limiting layer located at the surface and sidewall region of the magnetic micro-LED. The first current limiting layer can reduce the non-radiative recombination of the magnetic micro-LED, thereby improving the efficiency of the micro-LED. The first current limiting layer is formed through ion implantation technique.

A lateral magnetic micro-LED structure is shown in FIG. 57-11. The lateral magnetic micro-LED structure is formed by removing a portion of the second type semiconductor layer and the light emitting layer through etching, exposing a portion of the first type semiconductor layer, forming a metal layer ohm contacted with the first type semiconductor layer, forming a second current blocking layer above the second type semiconductor layer, forming a transparent conductive layer above the second type semiconductor layer and in ohm contact with the second type semiconductor layer, wherein the transparent conductive layer covers the second current blocking layer, removing a portion of the transparent conductive layer and the second current blocking layer, exposing a portion of the second type semiconductor layer, forming another metal layer directly in contact with the second type semiconductor layer and electrically connected to the transparent conductive layer, forming a first current blocking layer covering the sidewall region and the transparent conductive layer and removing the epitaxial substrate.

The first current blocking layer can reduce the non-radiative recombination of the magnetic micro-LED, thereby improving the efficiency of the micro-LED, wherein the first current blocking layer is composed of dielectric material. The second current blocking layer can prevent the current crowding effect and improve the effect of current spreading, thereby increasing the probability of electron-hole recombination, and light emitting efficiency can be improved, wherein the second current blocking layer is composed of dielectric material. The another metal layer is directly in contact with the second type semiconductor layer, which gives the effect of stable bonding, and the stability of the structure can be improved.

A lateral magnetic micro-LED structure is shown in FIG. 57-12. The lateral magnetic micro-LED structure is formed by removing a portion of the second type semiconductor layer and the light emitting layer through etching, exposing a portion of the first type semiconductor layer, forming a metal layer ohm contacted with the first type semiconductor layer, forming a second current limiting layer at the top region inside the second type semiconductor layer, forming a transparent conductive layer above the second type semiconductor layer and in ohm contact with the second type semiconductor layer, wherein the transparent conductive layer covers the second current limiting layer, removing a portion of the transparent conductive layer, exposing a portion of the second type semiconductor layer, forming another metal layer directly in contact with the second type semiconductor layer and electrically connected to the transparent conductive layer, forming a first current limiting layer at the sidewall region and removing the epitaxial substrate. The first current limiting layer is located at the surface and sidewall region of the magnetic micro-LED. The first current limiting layer can reduce the non-radiative recombination of the magnetic micro-LED, thereby improving the efficiency of the magnetic micro-LED, wherein the first current limiting layer can be formed through ion implantation technique. The second current limiting layer can prevent the current crowding effect and improve the effect of current spreading, thereby increasing the probability of electron-hole recombination, and light emitting efficiency can be improved, wherein the second current limiting layer is formed by ion implantation technique. The another metal layer is directly in contact with the second type semiconductor layer, which gives the effect of stable bonding, and the stability of the structure can be improved.

A lateral magnetic micro-LED structure is shown in FIG. 57-13. The lateral magnetic micro-LED structure is formed by removing a portion of the second type semiconductor layer and the light emitting layer through etching, exposing a portion of the first type semiconductor layer, forming a metal layer ohm contacted with the first type semiconductor layer, forming a second current limiting layer at the top region inside the second type semiconductor layer, forming a transparent conductive layer above the second type semiconductor layer and in ohm contact with the second type semiconductor layer, wherein the transparent conductive layer covers the second current limiting layer, removing a portion of the transparent conductive layer, exposing a portion of the second type semiconductor layer, forming another metal layer directly in contact with the second type semiconductor layer and electrically connected to the transparent conductive layer, forming a first current blocking layer covering the sidewall region and the transparent conductive layer and removing the epitaxial substrate. The first current blocking layer can reduce the non-radiative recombination of the magnetic micro-LED, thereby improving the efficiency of the magnetic micro-LED, wherein the first current blocking layer is composed of dielectric material. The second current limiting layer can prevent the current crowding effect and improve the effect of current spreading, thereby increasing the probability of electron-hole recombination, and light emitting efficiency can be improved, wherein the second current limiting layer is formed by ion implantation technique. The another metal layer is directly in contact with the second type semiconductor layer, which gives the effect of stable bonding, and the stability of the structure can be improved.

A lateral magnetic micro-LED structure is shown in FIG. 57-14. The lateral magnetic micro-LED structure is formed by removing a portion of the second type semiconductor layer and the light emitting layer through etching, exposing a portion of the first type semiconductor layer, forming a metal layer ohm contacted with the first type semiconductor layer, forming a second current blocking layer above the second type semiconductor layer, forming a transparent conductive layer above the second type semiconductor layer and in ohm contact with the second type semiconductor layer, wherein the transparent conductive layer covers the second current blocking layer, removing a portion of the transparent conductive layer and the second current blocking layer, exposing a portion of the second type semiconductor layer, forming another metal layer directly in contact with the second type semiconductor layer and electrically connected to the transparent conductive layer, forming a first current limiting layer at the sidewall region and removing the epitaxial substrate. The first current limiting layer is located at the surface and sidewall region of the magnetic micro-LED. The first current limiting layer can reduce the non-radiative recombination of the magnetic micro-LED, thereby improving the efficiency of the magnetic micro-LED, wherein the first current limiting layer is formed through ion implantation technique. The second current blocking layer can prevent the current crowding effect and improve the effect of current spreading, thereby increasing the probability of electron-hole recombination, and light emitting efficiency can be improved, wherein the second current blocking layer is composed of dielectric material. The another metal layer is directly in contact with the second type semiconductor layer, which gives the effect of stable bonding, and the stability of the structure can be improved.

A vertical magnetic micro-LED structure is shown in FIG. 57-15, the vertical magnetic micro-LED structure is formed by forming a second current blocking layer above the second type semiconductor layer, forming a transparent conductive layer above the second type semiconductor layer and in ohm contact with the second type semiconductor layer, wherein the transparent conductive layer covers the second current blocking layer, removing a portion of the transparent conductive layer and the second current blocking layer, exposing a portion of the second type semiconductor layer, forming a metal layer directly in contact with the second type semiconductor layer and electrically connected to the transparent conductive layer, exposing the first type semiconductor layer by removing the epitaxial substrate and a portion of the magnetic layer, forming another metal layer ohm contacted with the first type semiconductor layer and forming a first current blocking layer covering the sidewall region and the transparent conductive layer. The first current blocking layer can reduce the non-radiative recombination of the magnetic micro-LED, thereby improving the efficiency of the magnetic micro-LED, wherein the first current blocking layer is formed through ion implantation technique. The second current blocking layer can prevent the current crowding effect and improve the effect of current spreading, thereby increasing the probability of electron-hole recombination, and light emitting efficiency can be improved, wherein the second current blocking layer is composed of dielectric material. The another metal layer is directly in contact with the second type semiconductor layer, which gives the effect of stable bonding, and the stability of the structure can be improved.

A vertical magnetic micro-LED structure is shown in FIG. 57-16, the vertical magnetic micro-LED structure is formed by forming a first current limiting layer at the sidewall region, forming a second current limiting layer at the top region inside the second type semiconductor layer, forming a transparent conductive layer located above the second type semiconductor layer and in ohm contact with the second type semiconductor layer, wherein the transparent conductive layer covers the second current limiting layer, removing a portion of the transparent conductive layer, exposing a portion of the second type semiconductor layer, forming a metal layer directly in contact with the second type semiconductor layer and electrically connected to the transparent conductive layer, forming a first current limiting layer at the sidewall region, exposing the first type semiconductor layer by removing the epitaxial substrate and a portion of the magnetic layer and forming another metal layer in ohm contact with the first type semiconductor layer. The first current limiting layer is located at the surface and sidewall region of the magnetic micro-LED. The first current limiting layer can reduce the non-radiative recombination of the magnetic micro-LED, thereby improving the efficiency of the magnetic micro-LED, wherein the first current limiting layer is formed through ion implantation technique. The second current limiting layer can prevent the current crowding effect and improve the effect of current spreading, thereby increasing the probability of electron-hole recombination, and light emitting efficiency can be improved, wherein the second current limiting layer is formed through ion implantation technique. The another metal layer is directly in contact with the second type semiconductor layer, which gives the effect of stable bonding, and the stability of the structure can be improved.

A vertical magnetic micro-LED structure is shown in FIG. 57-17, the vertical magnetic micro-LED structure is formed by forming a second current limiting layer at the top region inside the second type semiconductor layer, forming a transparent conductive layer above the second type semiconductor layer and in ohm contact with the second type semiconductor layer, wherein the transparent conductive layer covers the second current limiting layer, removing a portion of the transparent conductive layer, exposing a portion of the second type semiconductor layer, forming a metal layer directly in contact with the second type semiconductor layer and electrically connected to the transparent conductive layer, forming a first current blocking layer covering the sidewall region and the transparent conductive layer, exposing the first type semiconductor layer by removing the epitaxial substrate and a portion of the magnetic layer and forming another metal layer in ohm contact with the first type semiconductor layer.

The first current blocking layer can reduce the non-radiative recombination of the magnetic micro-LED, thereby improving the efficiency of the magnetic micro-LED, wherein the first current blocking layer is composed of dielectric material. The second current limiting layer can prevent the current crowding effect and improve the effect of current spreading, thereby increasing the probability of electron-hole recombination, and light emitting efficiency can be improved, wherein the second current limiting layer is formed through ion implantation technique. The another metal layer is directly in contact with the second type semiconductor layer, which gives the effect of stable bonding, and the stability of the structure can be improved.

A vertical magnetic micro-LED structure is shown in FIG. 57-18, the vertical magnetic micro-LED structure is formed by forming a first current limiting layer at the sidewall region, forming a second current blocking layer above the second type semiconductor layer, forming a transparent conductive layer located above the second type semiconductor layer and in ohm contact with the second type semiconductor layer, wherein the transparent conductive layer covers the second current blocking layer, removing a portion of the transparent conductive layer and the second current blocking layer, exposing a portion of the second type semiconductor layer, forming a metal layer directly in contact with the second type semiconductor layer and electrically connected to the transparent conductive layer, exposing the first type semiconductor layer by removing the epitaxial substrate and a portion of the magnetic layer and forming another metal layer in ohm contact with the first type semiconductor layer. The first current limiting layer is located at the surface and sidewall region of the magnetic micro-LED. The first current limiting layer can reduce the non-radiative recombination of the magnetic micro-LED, thereby improving the efficiency of the magnetic micro-LED, wherein the first current limiting layer is formed through ion implantation technique. The second current blocking layer can prevent the current crowding effect and improve the effect of current spreading, thereby increasing the probability of electron-hole recombination, and light emitting efficiency can be improved, wherein the second current blocking layer is composed of dielectric material. The another metal layer is directly in contact with the second type semiconductor layer, which gives the effect of stable bonding, and the stability of the structure can be improved.

As shown in FIG. 57-19, because the magnetic micro-LED has a magnetic layer, the micro-LED with the magnetic layer can be massively transferred to a target substrate by controlling a transferring head which is magnetically attractive and controllable. Because the magnetic force of the magnetic layer shows good attraction to the transferring head, yields of massive transfer can be improved.

As shown in FIG. 57-20, the magnetic micro-LED structure of the present invention is more suitable for fluid massive transfer. When the magnetic micro-LED is located in the fluid transfer system, because the magnetic micro-LED has a magnetic layer structure, the magnetic micro-LED can provide self-alignment function through the magnetic layer, and the probability of misalignment (for example, opposite polarity or wrong position) happened during the fluid transfer can be reduced, thereby improving the yields of massive transfer and reducing the cost.

A fluid transfer system including a main chamber is shown in FIG. 57-20. The main chamber includes a solution. A substrate is disposed in the main chamber, wherein the substrate has a plurality of recesses, the central of the recesses have a plurality of corresponding magnetic layers, the magnetic layer is located in the substrate, and a portion of the magnetic layer is exposed. The main chamber further includes an input end, an input valve, an output end and an output valve. By controlling the aperture ratio of the input valve and the output valve, the solution can form a fluid with a flow rate F. The fluid transfer system includes a first sub-chamber, a second sub-chamber and a third sub-chamber, the first sub-chamber has a plurality of magnetic micro-LEDs with a first color, the solution, a first valve and a first input port. When the first valve is opened, the plurality of magnetic micro-LEDs with the first color can be moved downward through the first valve to a main chamber by the solution injected from the first input port, and the magnetic micro-LEDs with the first color are respectively moved to the corresponding recess above the substrate by the fluid. The magnetic micro-LEDs with the first color may be attracted by the magnetic force of the magnetic layer on the substrate and to move to the recess in a perform self-alignment manner, wherein the shape of the recess and the shape of the magnetic micro-LEDs with the first color are the same. Accordingly, transfer of the magnetic micro-LEDs with the first color to the top of the substrate can be achieved.

The second sub-chamber has a plurality of magnetic micro-LEDs with a second color, the solution, a second valve and a second input port. When the second valve is opened, the plurality of magnetic micro-LEDs with the second color can be moved downward through the second valve to a main chamber by the solution injected from the second input port, and the magnetic micro-LEDs with the second color are respectively moved to the corresponding recess above the substrate by the fluid. The magnetic micro-LEDs with the second color may be attracted by the magnetic force of the magnetic layer on the substrate and move to the recess in a self-alignment manner, wherein the shape of the recess and the shape of the magnetic micro-LEDs with the second color are the same. Accordingly, transfer of the magnetic micro-LEDs with the second color to the top of the substrate can be achieved.

The third sub-chamber includes a plurality of magnetic micro-LEDs with the third color, a solution, a third valve and a third input port. When the third valve is opened, the plurality of magnetic micro-LEDs with the third color can be moved downward through the third valve to a main chamber by the solution injected from the third input port, and the magnetic micro-LEDs with the third color are respectively moved to the corresponding recess above the substrate by the fluid. The magnetic micro-LEDs with the third color may be attracted by the magnetic force of the magnetic layer on the substrate and to move to the recess in a self-alignment manner, wherein the shape of the recess and the shape of the magnetic micro-LEDs with the third color are the same. Accordingly, transfer of the magnetic micro-LEDs with the third color to the top of the substrate can be achieved.

FIG. 57-21-1 schematically illustrates a top view of the substrate of the fluid transfer system including a first recess with a first shape, a second recess with a second shape and a third recess with a third shape, wherein each of the recesses has a magnetic layer, the shape of the first recess is the same as the shape of the magnetic micro-LEDs with the first color, the shape of the second recess is the same as the shape of the magnetic micro-LEDs with the second color, and the shape of the third recess is the same as the shape of the magnetic micro-LEDs with the third color.

When the first valve is opened, the plurality of magnetic micro-LEDs with the first color can be moved downward through the first valve to a main chamber by the solution injected from the first input port, and the magnetic micro-LEDs with the first color are respectively moved to the corresponding recess above the substrate by the fluid. The magnetic micro-LEDs with the first color may be attracted by the magnetic force of the magnetic layer on the substrate and move to the recess in a self-alignment manner, wherein the shape of the recess and the shape of the magnetic micro-LEDs with the first color are the same. Accordingly, transfer of the magnetic micro-LEDs with the first color to the top of the substrate can be achieved. The magnetic micro-LEDs with the first color are located in the first recess above the substrate, and a first sub-pixel area is thereby formed.

When the second valve is opened, the plurality of magnetic micro-LEDs with the second color can be moved downward through the second valve to a main chamber by the solution injected from the second input port, and the magnetic micro-LEDs with the second color are respectively moved to the corresponding recess above the substrate by the fluid. The magnetic micro-LEDs with the second color may be attracted by the magnetic force of the magnetic layer on the substrate and move to the recess in a self-alignment manner, wherein the shape of the recess and the shape of the magnetic micro-LEDs with the second color are the same. Accordingly, transfer of the magnetic micro-LEDs with the second color to the top of the substrate can be achieved. The magnetic micro light emitting diodes with the second color are located in the second recess above the substrate, and a second sub-pixel area is thereby formed.

When the third valve is opened, the plurality of magnetic micro-LEDs with the third color can be moved downward through the third valve to a main chamber by the solution injected from the third input port, and the magnetic micro-LEDs with the third color are respectively moved to the corresponding recess above the substrate by the fluid. The magnetic micro-LED with the third color may be attracted by the magnetic force of the magnetic layer on the substrate and move to the recess in a self-alignment manner, wherein the shape of the recess and the shape of the magnetic micro-LEDs with the third color are the same. Accordingly, transfer of the magnetic micro-LEDs with the third color to the top of the substrate can be achieved. The magnetic micro-LEDs with the third color are located in the third recess above the substrate, and a third sub-pixel area is thereby formed.

The first sub-pixel area, the second sub-pixel area and the third sub-pixel area form a pixel area.

FIG. 57-21-2 schematically illustrates a top view of the substrate of the fluid transfer system including a first recess, a second recess and a third recess, wherein each of the recesses has a magnetic layer, and the magnetic layer can be programmatic controlled. For example, the magnetic layer can be controlled to have magnetic attraction or have no magnetic attraction by an electromagnetic force.

Before the first valve is opened, the magnetic layer in the first recess can be controlled to have magnetic attraction, and the second valve and the third valve are controlled to have no magnetic attraction. When the first valve is opened, the plurality of magnetic micro-LEDs with the first color can be moved downward through the first valve to a main chamber by the solution injected from the first input port, and the magnetic micro-LEDs with the first color are respectively moved to the corresponding recess above the substrate by the fluid. The magnetic micro-LEDs with the first color may be attracted by the magnetic force of the magnetic layer on the substrate and move to the recess in a self-alignment manner. When the magnetic micro-LEDs are dropped into the second recess or the third recess, because the magnetic layers in the second recess and the third recess are controlled to have no magnetic attraction, the magnetic micro-LEDs with the first color can be moved out from the second recess or the third recess until it is dropped into the first recess by controlling the flow rate such that the thrust of the flow rate is greater than the capturing force of the second recess and the third recess. Accordingly, transfer of the magnetic micro-LEDs with the first color to the top of the substrate can be achieved, wherein the magnetic micro-LEDs with the first color are located in the first recess above the substrate, and a first sub-pixel area is thereby formed.

Before the second valve is opened, the magnetic layer in the first recess and the second recess can be controlled to have magnetic attraction, and the third valve is controlled to have no magnetic attraction. When the second valve is opened, the plurality of magnetic micro-LEDs with the second color can be moved downward through the second valve to a main chamber by the solution injected from the second input port, and the magnetic micro-LEDs with the second color are respectively moved to the corresponding recess above the substrate by the fluid. The magnetic micro-LEDs with the second color may be attracted by the magnetic force of the magnetic layer on the substrate and move to the recess in a self-alignment manner. When the magnetic micro-LEDs are dropped into the third recess, because the magnetic layers in the third recess are controlled to have no magnetic attraction, the magnetic micro-LED with the second color can be moved out from the third recess until it is dropped into the second recess by controlling the flow rate such that the thrust of the flow rate is greater than the capturing force of the third recess. Accordingly, transfer of the magnetic micro-LEDs with the second color to the top of the substrate can be achieved, wherein the magnetic micro-LEDs with the second color is located in the second recess above the substrate, and a second sub-pixel area is thereby formed.

Before the third valve is opened, the magnetic layers of the first recess, the second recess and the third recess can be controlled to have magnetic attraction. When the third valve is opened, the plurality of magnetic micro-LEDs with the third color can be moved downward through the third valve to a main chamber by the solution injected from the third input port, and the magnetic micro-LEDs with the third color are respectively moved to the corresponding recess above the substrate by the fluid. The magnetic micro-LEDs with the third color may be attracted by the magnetic force of the magnetic layer on the substrate and move to the recess in a self-alignment manner, thereby achieving the transfer of the magnetic micro-LEDs with the third color to the top of the substrate, wherein the magnetic micro-LEDs with the third color is located in the third recess above the substrate, and a third sub-pixel area is thereby formed.

The first sub-pixel area, the second sub-pixel area and the third sub-pixel area form a pixel area.

FIG. 57-22-1 and FIG. 57-22-2 schematically illustrates a top view of the substrate of the fluid transfer system including the first recess, the second recess and the third recess, wherein the substrate of the fluid transfer system further includes a first spare recess, a second spare recess and a third spare recess, each of the recesses has a magnetic layer, each of the spare recesses has a spare magnetic layer, and the magnetic layer and the spare magnetic layer can be programmatic controlled. For example, the magnetic layer can be controlled to have magnetic attraction or have no magnetic attraction by an electromagnetic force. When a test is performed after the magnetic micro-LEDs are transferred, the position of the broken dot which is out of order is recorded, and a massive repair is performed by the spare recesses. The magnetic micro-LEDs are transferred to the corresponding spare recess to replace the abnormal broken dot, and the repair can be completed. Because a large amount of the broken dots can be repaired at the same time, time and cost for repairing can be drastically reduced. The shape of each of the spare recesses can be similar to or different from the shape of the first recess, the second recess and the third recess. The first recess and the first spare recess form a first sub-pixel area, the second recess and the second spare recess form a second sub-pixel area, the third recess and the third spare recess form a third sub-pixel area, wherein the first sub-pixel area, the second sub-pixel area and the third sub-pixel area form a pixel area.

FIG. 57-23 schematically illustrates a fluid transfer system, wherein the substrate of the fluid transfer system further includes a first valve of the substrate, a second valve of the substrate and a third valve of the substrate. The valves of the substrate can be programmatic controlled. When the valve of the substrate is opened, the recess of the substrate is exposed, such that the substrate can capture the micro-LEDs which are not limited to the magnetic micro-LEDs. The recess of the substrate further includes an attraction layer, wherein the attraction layer can provide an electrical attraction force, a magnetic attraction force, an electrostatic attraction force, a fluid attraction force, an air attraction force, a van der waals attraction force, a thermal attraction force and an attachment attraction force, and the produced attraction force can be used to capture the micro-LEDs in the fluid.

Before the first valve is opened, the first valve of the substrate is controlled to be opened, and the second valve of the substrate and the third valve of the substrate are controlled to be closed. When the first valve is opened, the plurality of micro-LEDs with the first color can be moved downward through the first valve to a main chamber by the solution injected from the first input port, and the micro-LEDs with the first color are respectively moved to the corresponding recess above the substrate by the fluid. The micro-LEDs with the first color may be attracted by the attraction of the attraction layer on the substrate and move to the recess in a self-alignment manner. Accordingly, transfer of the micro-LEDs with the first color to the top of the substrate can be achieved.

Before the second valve is opened, the second valve of the substrate is controlled to be opened, and the third valve of the substrate is controlled to be closed. When the second valve is opened, the plurality of micro-LEDs with the second color can be moved downward through the second valve to a main chamber by the solution injected from the second input port, and the micro-LEDs with the second color are respectively moved to the corresponding recess above the substrate by the fluid. The micro-LEDs with the second color may be attracted by the attraction of the attraction layer on the substrate and move to the recess in a self-alignment manner. Accordingly, transfer of the micro-LEDs with the second color to the top of the substrate can be achieved.

FIG. 57-24 schematically illustrates a fluid transfer system, wherein the substrate of the fluid transfer system further includes an attraction layer which can be programmatic controlled. The attraction layer can provide an electrical attraction force, a magnetic attraction force, an electrostatic attraction force, a fluid attraction force, an air attraction force, a van der waals attraction force, a thermal attraction force and an attachment attraction force, and the produced attraction force can be used to capture the micro-LEDs in the fluid.

Before the first valve is opened, the first attraction layer of the substrate can be controlled to have attraction, and the second attraction layer of the substrate and the third attraction layer of the substrate can be controlled to have no attraction. When the first valve is opened, the plurality of micro-LEDs with the first color can be moved downward through the first valve to a main chamber by the solution injected from the first input port, and the micro-LEDs with the first color are respectively moved to the corresponding recess above the substrate by the fluid. The micro-LEDs with the first color may be attracted by the attraction of the attraction layer on the substrate and move to the recess in a self-alignment manner. When the micro-LEDs with the first color is dropped into the second recess or the third recess, because the attraction layers in the second recess and the third recess are controlled to have no attraction, the micro-LEDs with the first color can be moved out from the second recess or the third recess until it is dropped into the first recess by controlling the flow rate such that the thrust of the flow rate is greater than the capturing force of the second recess and the third recess. Accordingly, transfer of the micro-LEDs with the first color to the top of the substrate can be achieved.

Before the second valve is opened, the first attraction layer of the substrate and the second attraction layer of the substrate can be controlled to have attraction, and the third attraction layer of the substrate can be controlled to have no attraction. When the second valve is opened, the plurality of micro-LEDs with the second color can be moved downward through the second valve to a main chamber by the solution injected from the second input port, and the micro-LEDs with the second color are respectively moved to the corresponding recess above the substrate by the fluid. The micro-LEDs with the second color may be attracted by the attraction of the attraction layer on the substrate and move to the recess in a self-alignment manner. When the micro-LEDs with the second color are dropped into the third recess, because the attraction layers in the third recess are controlled to have no attraction, the micro-LEDs with the second color can be moved out from the third recess until it is dropped into the second recess by controlling the flow rate such that the thrust of the flow rate is greater than the capturing force of the third recess. Accordingly, transfer of the micro-LEDs with the second color to the top of the substrate can be achieved.

Before the third valve is opened, the first attraction layer of the substrate, the second attraction layer of the substrate and the third attraction layer of the substrate can be controlled to have attraction. When the third valve is opened, the plurality of micro-LEDs with the third color can be moved downward through the third valve to a main chamber by the solution injected from the third input port, and the micro-LEDs with the third color are respectively moved to the corresponding recess above the substrate by the fluid. The micro-LEDs with the third color may be attracted by the attraction of the attraction layer on the substrate and move to the recess in a self-alignment manner. Accordingly, transfer of the micro-LEDs with the third color to the top of the substrate can be achieved.

FIG. 57-25 schematically illustrates a fluid transfer system, wherein the substrate of the fluid transfer system further includes a filling layer, and the filling layer may be a photoresist, a dielectric layer which is heat dissolved or a solid which can be dissolved by the liquid in the chamber. When the filling layer is irradiated by a laser source or a UV light source, it would be dissolved and brought by the fluid, that is, the filling layer can be removed by irradiation or liquid flow by controlling the first valve of the substrate, the second valve of the substrate and the third valve of the substrate to be opened or closed, such that the programmatically controllable attraction layer below the recess can be exposed. The programmatically controllable attraction layer and the attraction layer can provide an electrical attraction force, a magnetic attraction force, an electrostatic attraction force, a fluid attraction force, an air attraction force, a van der waals attraction force, a thermal attraction force and an attachment attraction force, and the produced attraction force can be used to capture the micro-LEDs in the fluid.

The substrate of the present invention may be a flexible substrate, wherein the material of the flexible substrate may include ultra-thin glass, metal foil, fiber-reinforced composite material, plastic film, ceramic substrate or the combinations thereof. A preferable thickness of the flexible substrate is less than 200 micrometers, a more preferable thickness of the flexible substrate is less than 50 micrometers, and the even more preferable thickness of the flexible substrate is in a range from 25 micrometers to 50 micrometers. Metal foil may for example include stainless steel, nickel, titanium, zirconium, copper, iron, cobalt, palladium or the combinations thereof, wherein the coefficient of thermal expansion of metal foil is similar to the coefficient of thermal expansion of ultra-thin glass. The surface roughness Ra of the metal foil is less than 10 nanometers. The light transmittance of the plastic film is greater than 90% under a wavelength of 550 nanometer. The material of the plastic film may for example include polyethylene terephthalate (PET), polyethylene naphthalate (PEN) or polyethersulfone (PES).

Fiber-reinforced composite material may for example include carbon fibers, silicon carbide fibers or boron filament.

A Micro-LED device is provided by the present invention, and in particular a Micro-LED device without spare design is provided. FIG. 58-1A, FIG. 58-2A and FIG. 58-3A schematically illustrates a traditional display, wherein the horizontal resolution of the display is 960 pixels, the vertical resolution of the display is 640 pixels, the diagonal distance of the display is 3.5 inches (8.89 centimeters (cm)), the size of the display is 2.91"×1.94" which equals to 5.65 in$^2$ (7.4 cm×4.93 cm=36.48 cm$^2$) at 329.65 PPI, the dot pitch of the display is 0.0771 mm, and the resolution of the screen of the display is 960×640 (329.65 PPI). The resolution is sufficient to make it impossible for human eyes to distinguish single pixel, such as the Retina display which the light emitting unit is for example a display equipment composed of three micro-LEDs R, G and B. However, in the traditional device, when one of the micro-LEDs is out of order, it cannot be displayed and perceived by human eyes. The traditional method to solve this problem may for example include spare circuit design or spare micro-LEDs, but the cost can be thereby increased.

The present invention provides a Micro-LED device without spare design. FIG. 58-1B, FIG. 58-2B and FIG. 58-3B schematically illustrate an embodiment of the present invention, the horizontal resolution of the display in this embodiment is 1920 pixels, the vertical resolution of the display is 1280 pixels, the diagonal distance of the display is 3.5 inches (8.89 cm), the size of the display is 2.91"×1.94" which equals to 5.65 in$^2$ (7.4 cm×4.93 cm=36.48 cm$^2$) at 659.3 PPI, the dot pitch of the display is 0.0385 mm, and the resolution of the screen is 1920×1280(659.3 PPI). An abnormal micro-LED between the two micro-LEDs with the same color is acceptable because that the abnormal micro-LED is not easily perceived by human eyes, that is, the spare circuit design or the spare micro-LED is not necessary. An abnormal pixel between the two pixels is acceptable because that the abnormal pixel is not easily perceived by human eyes, that is, the spare circuit design or the spare micro-LED is not necessary. An abnormal sub-pixel between the two sub-pixels with the same color is acceptable because that the abnormal sub-pixel is not easily perceived by human eyes, that is, the spare circuit design or the spare micro-LED is not necessary.

The present invention provides a Micro-LED device without spare device. FIG. 58-1C, FIG. 58-2C and FIG. 58-3C schematically illustrate another embodiment of the present invention. The horizontal resolution of the display in this embodiment is 3840 pixels, the vertical resolution of the display is 2560 pixels, the diagonal distance of the screen is 3.5 inches (8.89 cm), the size of the display is 2.91"×1.94" which equals to 5.65 in$^2$ (7.4 cm×4.93 cm=36.48 cm$^2$) at 1318.6 PPI, the dot pitch of the display is 0.0193 mm, and the resolution of the screen of the display is 3840×2560 (1318.6 PPI). Two abnormal micro-LEDs between the two micro-LEDs with the same color are acceptable because that the abnormal micro-LEDs are not easily perceived by human eyes, that is, the spare circuit design or the spare micro-LED is not necessary. Two abnormal pixels between the two pixels are acceptable because that the abnormal pixels are not easily perceived by human eyes, that is, the spare circuit design or the spare micro-LED is not necessary. Two abnormal sub-pixels between the two sub-pixels with the same color are acceptable because that the abnormal sub-pixels are not easily perceived by human eyes, that is, the spare circuit design or the spare micro-LED is not necessary.

The present invention provides a Micro-LED device without spare design. In an embodiment, the horizontal resolution of the display in the embodiment is 1440 pixels, the vertical resolution of the display is 960 pixels, the diagonal distance of the display is 3.5 inches (8.89 cm), the size of the display is 2.91"×1.94" which equals to 5.65 in$^2$ (7.4 cm×4.93 cm=36.48 cm$^2$) at 494.48 PPI, the dot pitch of the display is 0.0514 mm, and the resolution of the screen is 1440×960(494.48 PPI). An abnormal micro-LED between the two micro-LEDs with the same color is acceptable because that the abnormal micro-LED is not easily perceived by human eyes, that is, the spare circuit design or the spare micro-LED is not necessary. An abnormal sub-pixel between the two sub-pixels is acceptable because that the abnormal sub-pixel is not easily perceived by human eyes, that is, the spare circuit design or the spare micro-LED is not necessary.

As shown in FIG. 58-1B, FIG. 58-1C, FIG. 58-2B, FIG. 58-2C, FIG. 58-3B and FIG. 58-3C, the micro-LEDs surrounded by the dotted line region are abnormal.

As shown in FIG. 58-11B, FIG. 58-1C, FIG. 58-2B, FIG. 58-2C, FIG. 58-3B and FIG. 58-3C, the sub-pixels surrounded by the dotted line region are abnormal.

The pixel of the present invention is composed of micro-LEDs with three different colors (red, green and blue).

The pixel of the present invention is composed of sub-pixels with three different colors (red, green and blue).

The dot pitch which describes the distance between the sub-pixels can also be called as line pitch, stripe pitch, phosphor pitch or pixel pitch.

$$PPI = \frac{\sqrt{[\text{Horizontal resolution (pixel)}]^\wedge 2 + [\textit{Vertic}\text{al resolution (pixel)}]^\wedge 2)}}{\text{Diagonal (inch)}}$$

The normal formula for designing a Retina display is as follows:

$a$=2 arctan($h$/2$d$)

As shown in FIG. 59, "a" is the viewing angle of human eyes, "h" is the dot pitch, and "d" is the distance between human eyes and screen. The screen fits the following requirements can make it impossible for human eyes to see a single pixel, and can be called as Retina display.

$h/2 = d \times \tan(a/2)$ $a = 1/53.53$ degree $d$ = viewing distance = 10 inches $h$ = recognization limit $h = 2 \times d \times \tan(1/53.53/2) \times \pi/180$ if $d = 10$ inch $h = 2 \times 10 \times \tan(1/53.53/2) \times \pi/180$ $= 0.003258911$ inch $1/h = 306.85$ PPI if $d = 15$ inch $h = 2 \times 15 \times \tan(1/53.53/2) \times \pi/180$ $= 0.004888366831$ inch $1/h = 204.57$ PPI if $d = 20$ inch $h = 2 \times 15 \times \tan(1/53.53/2) \times \pi/180$ $= 0.00651788224416$ inch $1/h = 153.42$ PPI Referring to FIG. 60A, the light emitting diode structure 4000 includes a stack of layers which at least having a first type semiconductor layer 4001, a second type semiconductor layer 4002, an light emitting layer 4003 interposed between the first type semiconductor layer 4001 and the second type semiconductor layer 4002, a first electrode layer 4000n disposed on a surface of the first type semiconductor layer 4001, a second electrode layer 4000p disposed on a surface of the second type semiconductor layer 4002, and structural regions 4000sr covering at least a portion of the first type semiconductor layer 4001, the light emitting layer 4003 and the second type semiconductor layer 4002.

As the embodiment shown in the FIG. 60A, the light emitting diode structure 4000 is a lateral LED structure of which the first electrode layer 4000n and the second electrode layer 4000p are disposed at the same side of the first type semiconductor layer 4001, but the invention is not limited thereto.

In the embodiment of the FIG. 60A, the structural regions 4000sr may include current blocking regions, but not limited thereto. In one embodiment, the structural regions 4000sr. In one embodiment, the structural regions 4000sr may include current limiting regions.

In an embodiment, the structural regions 4000sr may include dielectric layer or layers. Material of the dielectric layer or layers may be, but not limited thereto, silicon oxide ($SiO_2$), silicon nitride ($Si_3N_4$), aluminum oxide ($Al_2O_3$), yttrium oxide ($Y_2O_3$), titanium oxide ($TiO_2$), hafnium oxide ($HfO_2$), zirconium oxide ($ZrO_2$), barium zirconate ($BaZrO_3$), barium titanate ($BaTiO_3$), tantalum pentoxide ($Ta_2O_5$) and Silica, etc. In an embodiment, the dielectric layer or layers may be passivation layer(s). In an embodiment, the dielectric layers may be optical multilayer thin films which are interlaced higher dielectric index films and

| screen size (inch) | distance between eyes and screen (inch) | pixels per inch of retina display (PPI) | dot pitch (×1)(mm) | dot pitch (×1.5)(mm) | dot pitch (×2)(mm) | dot pitch (×4)(mm) |
|---|---|---|---|---|---|---|
| 1-7 | 10 | 306.85 | 0.082776601 | 0.055184401 | 0.0413883 | 0.02069415 |
| 7-12 | 15 | 204.57 | 0.124162878 | 0.082775252 | 0.062081439 | 0.03104072 |
| 12-30 | 20 | 153.42 | 0.165558597 | 0.110372398 | 0.082779299 | 0.041389649 |

The resolution is increased and the distance between the sub-pixels is reduced to make it impossible for human eyes to perceive the abnormal sub-pixel in the present invention, that is, the Micro-LED device with spare design is not necessary. Take an embodiment of the present invention shown in the table above for example, the table shown above lists different screen size and the suitable distance between human eyes and screen for each case. That is, PPI and dot pitch of the Retina display which makes it impossible for human eyes to see a single pixel can be calculated. The human eyes cannot easily perceive the abnormal sub-pixel by shrinking the dot pitch to 1/1.5, ½ and ¼ of the original dot pitch, such that the Micro-LED device with spare design is not necessary.

The resolution is increased and the distance between the sub-pixels is reduced to make it impossible for human eyes to perceive the abnormal sub-pixel in an embodiment of the present invention, and the device can combine with the Micro-LED device with spare design to adapt to the application with greater resolution.

FIG. 60A is a schematic cross-section view of a light emitting diode structure 4000 according to an embodiment.

lower dielectric index films. In an embodiment, the optical multilayer thin films may perform as a reflecting mirror according to the wavelength of the light emitting diode.

In an embodiment, the first type semiconductor layer 4001, the second type semiconductor layer 4002 and/or the light emitting layer 4003 may be multi-layered, but the invention is not limited thereto.

Further referring to the embodiment of FIG. 60A, a length L of the light emitting diode structure 4000 may not be greater than 100 micrometers. In the embodiment of the FIG. 60A, the light emitting diode structure 4000 includes a light outputting surface 4000sl and a bonding surface 4000sb. The surface 4000sb of the light emitting diode structure 4000 may be a planar surface with roughness not greater than 10 nanometers (nm). The surface 4000sb may be composited with surfaces of the dielectric layer 4000sr, the first electrode layer 4000n and/or the second electrode layer 4000p. In the embodiment of FIG. 60A, the surface 4000sb of the light emitting diode structure 4000 may be applied as a boning surface for attaching to a circuit substrate.

FIG. 60B is a schematic cross-section view of a light emitting diode structure 4000' according to another embodiment which is similar to FIG. 60A. Referring to the embodiment of FIG. 60B, the structural regions 4000sr may cover the side surface of the light emitting diode structure 4000' and extend from the surface 4000sb to the light outputting surface 4000sl.

FIG. 60C is a schematic cross-section view of a light emitting diode structure 4000" according to an embodiment. Referring to the embodiment of FIG. 60C, a width w42 of the first electrode layer 4000n near the surface 4000sb may be wider than a width w41 of the first electrode layer 4000n near the first type semiconductor layer 4001. In the embodiment, the wider portion w42 of the first electrode layer 4000n may perform as a reflecting mirror to reflect the light emitted from the light emitting layer 4003, and then the outputting intensity of the light from the light outputting surface 4000sl may be enhanced. In another embodiment, the second electrode layer 4000p may also have a wider portion near the surface 4000sb and the wider portion of the second electrode layer 4000p may perform as a reflecting mirror.

FIG. 60D is a schematic cross-section view of a light emitting device 4000D according to an embodiment. Referring to the embodiment of FIG. 60D, the light emitting device 4000D includes a plurality of light emitting diode elements 4000 arranged in an array and the arrayed light emitting diode elements 4000 are sandwiched between a first substrate 4000w1 and a second substrate 4000w2.

In the embodiment of FIG. 60D, the first substrate 4000w1 may be a carrier substrate and the second substrate 4000w2 may be a circuit substrate, but the invention is not limited thereto. The second substrate (circuit substrate) 4000w2 may include driver circuits, such as thin-film transistor (TFT) drivers. The plurality of light emitting diode elements 4000 may be transferred and array placed to the first substrate 4000w1, and then electrode pads of the arrayed light emitting diode elements 4000 are respectively bonded to contact pads of the driver circuits through the bonding surface 4000sb of the arrayed light emitting diode elements 4000 and a bonding surface 4000sb' of the second substrate 4000w2.

In the embodiment of FIG. 60D, the surface 4000sb of each light emitting diode element 4000 may be a planar surface with roughness not greater than 10 nm. Referring back to the embodiment of FIG. 60A, the surface 4000sb may be composited with surfaces of the dielectric layer 4000sr, the first electrode layer 4000n and/or the second electrode layer 4000p. In other words, at least portion surfaces of the dielectric layer 4000sr, the first electrode layer 4000n and/or the second electrode layer 4000p are coplanar. Accordingly, the bonding surface 4000sb' of the second substrate (circuit substrate) 4000w2 may be a planar surface including surfaces of contact pads of the driver circuits. In the embodiment of FIG. 60D, bonding interfaces of the surfaces 4000sb and 4000sb' may include dielectric layer, such as silicon oxide layer, and copper layer, but the invention is not limited thereto. The bonding surface 4000sb can be directly bonded to the bonding surface 4000sb at a lower temperature which may be not greater than 150° C., therefore thermal stress induced by coefficient of thermal expansion (CTE) mismatch can be decreased and open contacts between the electrodes of the light emitting diode elements 4000 and the contact pads of the driver circuits can be prevented.

The structural description of the word "coplanar" should be understood to allow for typical variations that occur during the semiconductor manufacturing, such as from dishing from planarization, from subsequent cleaning processes, etc.

In one embodiment, the first substrate 4000w1 may be an epitaxy substrate or a growing substrate of the arrayed light emitting diode elements 4000. The first substrate 4000w1 may be light-transmittable according to the wavelength of the light emitted from the light emitting layer 4003. In one embodiment, the first substrate 4000w1 may be removed or thinned after the bonding process.

In another embodiment, the second substrate 4000w2 may be a circuit substrate and also perform as a carrier substrate, each light emitting diode element 4000 is transferred to the second substrate 4000w1 and then electrode pads of each light emitting diode element 4000 are bonded to contact pads of the driver circuits through the bonding surface 4000sb of the light emitting diode element 4000 and the bonding surface 4000sb' of the second substrate 4000w2.

In the embodiment of FIG. 60D, gaps between the light emitting diode elements 4000 may be filled with sealing materials 4000f. In one embodiment, the sealing materials 4000f may include light-absorber materials to prevent light crosstalk between adjacent light emitting diode elements, and the light-absorber materials may be polymer filled with black or dark particles, but the invention is not limited thereto. In one embodiment, the sealing materials 4000f may include inorganic insulting materials such as silicon oxide, silicon nitride. In another embodiment, the structural regions 4000sr at side surfaces of each light emitting diode elements 4000 may perform as passivation layer(s), therefore the sealing materials 4000f may include heat conducting particles, such as metal particles, ceramic particles, and the passivation layer(s) can prevent short circuits induced by the metal particles between adjacent light emitting diode elements.

FIG. 60E-1 is a top view of a light emitting device 4000E' according to an embodiment and FIG. 60E-2 is a schematic cross-section view of the light emitting device 4000E. Referring to the embodiment of FIG. 60E-1, the wavelength conversion layer 4000ps includes windows F, F1, F2 and F3 in matrix form and a matrix frame FM surrounding the windows F, F1, F2 and F3. The matrix frame FM may be not light transmissive or may absorb light, but the invention is not limited thereto.

In the embodiment of FIG. 60E-1, the windows F, F1, F2 and F3 is light transmissive and phosphors included in the windows F, F1, F2 and F3 may be different from each other, so that colors of light radiated from the windows F, F1, F2 and F3 may be different from each other. For example, phosphors included in the windows F1 may be excited by light of the underneath light emitting diode elements 4000 and radiate red light, phosphors included in the windows F2 may be excited by light of the underneath light emitting diode elements 4000 and radiate yellow light, phosphors included in the windows F3 may be excited by light of the underneath light emitting diode elements 4000 and radiate green light, but the invention is not limited thereto. In one embodiment, one or more types of phosphors may be included in one window.

The amount of the light emitting diode elements 4000 below each one of the window F, F1, F2 and F3 may be one or more, and the amount of the light emitting diode elements 4000 below at least two of the window F, F1, F2 and F3 may be different from each other.

When the amount of the light emitting diode elements 4000, below one common window, is more than one and each of the light emitting diode elements 4000 can be individually controlled, the brightness of the light radiated from the common window can be tuned by switching an amount of the light emitting diode elements 4000 which is turned on. For example, referring to the window region F1 shown in FIG. 60E-1, brightest red light is radiated from the window F1 when all the six underneath light emitting diode elements 4000 are turned on and darkest red light is radiated from the window F1 when only one underneath light emitting diode element 4000 is turned on.

Referring to the embodiment of FIG. 60E-2, there are plural of light emitting diode elements 4000 arranged in an array under the window F3 of the light emitting device 4000E' and a wavelength conversion layer 4000ps that covers the light emitting element array. In the embodiment of FIG. 60E-2, the wavelength conversion layer 4000ps, for example, contains a light transmissive resin and phosphors, but the invention is not limited thereto. The matrix frame FM, which surrounds the window F3, may be a light non-transmissive wall structure for preventing light crosstalk to adjacent regions such as the adjacent windows F and F2.

In an embodiment, the wavelength conversion layer 4000ps may include light scattering particles therein. The light, entering the wavelength conversion layer 4000ps, can be scattered by the light scattering particles for many times so as to fully interact with the phosphors inside the wavelength conversion layer 4000ps and uniformly radiate out from the wavelength conversion layer 4000ps.

Referring to the embodiment of FIG. 60E-2, under the common window F3, the filling material 4000f filled between adjacent light emitting diode elements 4000, for example, may further include the aforementioned light transmissive resin, phosphors and/or light scattering particles, but the invention is not limited thereto.

The phosphors may include cerium-activated yttrium aluminum garnet-based phosphors (YAG:Ce); cerium-activated lutetium aluminum garnet-based phosphors (LAG:Ce); europium-activated and/or chromium-activated nitrogen-containing calcium aluminosilicate-based phosphors (for example, $CaO-Al_2O_3-SiO_2:Eu$); europium-activated silicate-based phosphors $((Sr,Ba)_2SiO_4:Eu)$; nitride-based phosphors, such as β-SiAlON phosphors, CASN-based phosphors $(CaAlSiN_3:Eu)$, SCASN-based phosphors $((Sr,Ca)AlSiN_3:Eu)$; KSF-based phosphors $(K_2SiF_6:Mn)$; sulfide-base phosphors, and/or quantum dot phosphors, but the invention is not limited thereto. In an embodiment, through combining these phosphors with a blue or ultraviolet light emitting element, various colors of light (e.g., a white light emitting device) can be produced by the light emitting device.

The phosphors, for example, may include a blue phosphor, a green phosphor, a yellow phosphor, a red phosphor, or quantum dots (QDs). For example, blue phosphors may include BAM-based, halo-phosphate-based, or aluminate-based phosphors, and may include, for example, $BaMgAl_{10}O_{17}:Mn^{2+}$, $BaMgAl_{12}O_{19}:Mn^{2+}$ or $(Sr,Ca,Ba)PO_4Cl:Eu^{2+}$.

Green or yellow phosphors may include $LuAG(Lu_3(Al,Gd)_5O_{12}:Ce^{3+})$, $YAG(Y_3(Al,Gd)_5O_{12}:Ce^{3+})$, $Ga-LuAG((Lu,Ga)_3(Al,Gd)_5O_{12}:Ce^{3+})$, $Ga-YAG((Ga,Y)_3(Al,Gd)_5O_{12}:Ce^{3+})$, $LuYAG((Lu,Y)_3(Al,Gd)_5O_{12}:Ce^{3+})$, $((Sr,Ba,Ca,Mg)_2SiO_4:Eu^{2+})$, $((Ba,Sr,Ca)Si_2O_2N_2:Eu^{2+})$ or thio-gallate $(SrGa_2S_4:Eu^{2+})$.

Red phosphors may include nitride, sulfide, fluoride, or oxynitride, and more specifically, $CASN(CaAlSiN_3:Eu^{2+})$, $(Ba,Sr,Ca)_2Si_5N_8:Eu^{2+}$, $(Ca,Sr)S_2:Eu^{2+})$ or $(Sr,Ca)_2SiS_4:Eu^{2+}$.

Quantum dots (QDs) may include Si, Ge, GaN, GaP, GaAs, GaSb, AlN, AlP, AlAs, AlSb, InN, InP, InAs, InSb, SnS, SnSe, SnTe, PbS, PbSe, PbTe, CdO, CdS, CdSe, CdTe, ZnO, ZnS, ZnSe, ZnTe, HgS, HgSe, HgTe, MgSe, MgS, SiC, SiGe, GaNP, GaNAs, GaNSb, GaPAs, GaPSb, AlNP, AlNAs, AlNSb, AlPAs, AlPSb, InNP, InNAs, InNSb, InPAs, InPSb, SnSeS, SnSeTe, SnSTe, PbSeS, PbSeTe, PbSTe, SnPbS, SnPbSe, SnPbTe, GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, CdZnSeS, CdZnSeTe, CdZnSTe, CdHgSeS, CdHgSeTe, CdHgSTe, HgZnSeS, HgZnSeTe, HgZnSTe, SnPbSSe, SnPbSeTe, SnPbSTe, Graphene quantum dots (GQDs) and/or mixtures thereof. For example, a spectrum distribution of a light transferred from the quantum dots may having a full width at half maximum (FWHM) from 10 nm to 60 nm in a wavelength band of green light. For example, a spectrum distribution of a light transferred from the quantum dots may having a full width at half maximum (FWHM) from nm to 80 nm in a wavelength band of red light. For example, a spectrum distribution of a light transferred from the quantum dots may having a full width at half maximum (FWHM) lower than 60 nm for wide color gamut application.

The wavelength conversion member may comprise at least one of epoxy resin, silicones, polystyrene resin and acrylate.

FIG. 60E-3 is an enlarged top view of a window region F' of a light emitting device according to an embodiment. Referring to the embodiment of FIG. 60E-3, the six light emitting diode elements 4000 can be categorized into two groups Ua and Ub, and the three light emitting diode elements Ub are provided as backups for the three light emitting diode elements Ua. In a normal operation, light from the window region F' is mainly provided by the three light emitting diode elements Ua and the three light emitting diode elements Ub are kept in off status or disabled. When a light emitting diode element Ua is broken, a controller or a switch circuit, coupled to the broken light emitting diode element Ua, disables the broken light emitting diode element Ua and enables an adjacent light emitting diode element Ub for replacing the broken light emitting diode element Ua.

In the embodiments of FIGS. 60F-60K, the structural regions 4000sr may have an arc corner. By controlling the geometric shape of the structural regions 4000sr, a preferred effect of reducing sidewall leakage current can be achieved and the light emitting efficiency of the micro light emitting diode can be improved. When the pitch of light emitting diode elements is reduced, the arc corner can effectively avoid Electrostatic Discharge (ESD) caused by the point discharge, corona discharge or electrical breakdown of the light emitting diode elements, and then improve the production yield rate.

In addition, the production yield of mass transfer can be improved by shaping the corner of the Micro-LEDs in arc shape. In one embodiment, for the electrostatic transfer process, crack or damages induced by collisions between the sharp corner of the Micro-LEDs and the electronic components on the transferred circuit substrate can be effectively avoid. In one embodiment, for the micro transfer printing process, the arc corner shape of the Micro-LED can effectively solve the tolerance issue of the mounting surfaces. In one embodiment, for the fluid transfer process, crack induced by collisions between the Micro-LEDs can be effectively avoid.

Further referring to the embodiment shown in FIG. 60K, the production yield of the redistribution layers 4000RDL can be improved by controlling the geometric shape of the structural regions 4000sr. In the embodiment, the arc corner at the structural region 4000sr of the Micro-LED can effectively prevent disconnect redistribution layers 4000RDL, and the arc corner at the structural region 4000sr also can improve the flexibility of arranging the redistribution layers 4000RDL.

The above-mentioned embodiments are not intended to limit the scope of the present invention. Those skilled in the art should realize the contents of the present invention can be modified, combined or displaced according to the demands of design and other factors. Any modification, replacement and improvement according to the spirit and principle of the present invention should be included in the scope of the present invention.

What is claimed is:

1. A diode array, comprising:
   a substrate; and
   a plurality of light emitting diodes disposed on the substrate and arranged in an array, wherein each of the light emitting diodes includes a stack of functional layers comprising a first type semiconductor layer, a second type semiconductor layer, and a light emitting layer located between the first type semiconductor layer and the second type semiconductor layer,
   wherein at least one of the light emitting diodes includes:
   a first current blocking region abutting a vertically extending boundary of the second type semiconductor layer;
   wherein, with respect to a top-down view, the first current blocking region is formed about an outer edge of the light emitting diode and an outer perimeter of the first current blocking region is equal to or less than 400 micrometers;
   wherein, with respect to a cross-sectional view, an arc corner about the outer edge of the light emitting diode;
   wherein, the first current blocking region covering a sidewall region has a first thickness, and the first current blocking region covering the upper surface region has a second thickness, wherein the first thickness is less than or equal to the second thickness.

2. The diode array of claim 1, wherein the first current blocking region further comprises an upper surface and an outer surface, and a roughness of the upper surface is not greater than 10 nanometers or a roughness of the outer surface is not greater than 10 nanometers (nm).

3. The diode array of claim 1, wherein the first current blocking region further comprises a bonding surface and an outer surface, and a roughness of the bonding surface is not greater than 10 nanometers or a roughness of the outer surface is not greater than 10 nanometers (nm).

4. The diode array of claim 1, wherein the substrate further comprising a first redistribution layer and a second redistribution layer respectively electrical connected to the first type semiconductor layer, and the second type semiconductor layer; wherein, the first redistribution layer and the second redistribution layer are located at different levels in the substrate.

5. The diode array of claim 1, wherein further comprising a second current blocking region surrounded by the first current blocking region, wherein a shortest distance between the first current blocking region and the second current blocking region is equal to or less than 50 micrometers.

6. The diode array of claim 1, wherein the first current blocking region at least covers a sidewall of the first type semiconductor layer, the sidewall of the second type semiconductor layer and the sidewall of the light emitting layer, wherein, with respect to a top-down view, a width of the first current blocking region is greater than or equal to 1 micrometer.

7. The diode array of claim 1, wherein further comprising a current limiting region surrounded by the first current blocking region, wherein the current limiting region further comprises a first upper surface, the second type semiconductor layer comprises a second upper surface, and the second upper surface and the first upper surface are coplanar.

8. The diode array of claim 1, wherein at least one of the light emitting diodes further includes a redundancy micro light emitting diode.

9. The diode array of claim 1, wherein a first group of the plurality of light emitting diodes radiate a first color of light; and
   a second group of the plurality of light emitting diodes radiate a second color of light;
   wherein the first color is different from the second color, and at least one of the second group of the light emitting diodes is located between adjacent ones of the first group of the light emitting diodes.

10. The diode array of claim 1, wherein the first current blocking region located at the first type semiconductor layer has a first lateral width, the first current blocking region located at the light emitting layer has a second lateral width, and the first current blocking region located at the second semiconductor layer has a third lateral width, wherein a vertical projection of the first lateral width is partially overlapped with a vertical projections of the second lateral width and the third lateral width.

11. The diode array of claim 1, further comprising:
    a wall structure located between adjacent light emitting diodes; and
    a wavelength conversion material covers the at least one of the light emitting diodes, wherein a first wavelength of light radiated from the wavelength conversion material is different from a second wavelength of light radiated from the at least one of the light emitting diodes, wherein the wavelength conversion material includes a blue phosphor, a green phosphor, a yellow phosphor, a red phosphor, or quantum dots.

12. The diode array of claim 1, further comprising sealing materials located between adjacent ones of the plurality of light emitting diodes, and the sealing materials include light-absorber materials.

13. The diode array of claim 1, further comprising at least one wall structure located between adjacent ones of the plurality of light emitting diodes, and the wall structure includes a reflecting mirror.

14. A diode array, comprising:
    a substrate; and
    a plurality of light emitting diodes disposed on the substrate and arranged in an array, wherein each of the light emitting diodes includes a stack of functional layers comprising a first semiconductor layer, a second semiconductor layer, and a light emitting layer located between the first semiconductor layer and the second semiconductor layer,
    wherein at least one of the light emitting diodes includes:
    a first current blocking region covering at least a portion of the first semiconductor layer, the light emitting layer or the second semiconductor layer;

a first electrode electrically connected to the first semiconductor layer; and a second electrode electrically connected to the second semiconductor layer, wherein the first electrode and the second electrode are disposed at the same side of the first semiconductor layer;

wherein a first width of the first electrode near the substrate is equal to or narrower than a second width of the second electrode near the substrate;

wherein at least a portion of the first current blocking region is formed about an outer edge of the at least one of the light emitting diodes;

wherein the first electrode and the second electrode are coplanar.

15. The diode array of claim 14, wherein a third width of the first electrode near the first semiconductor layer is narrower than the first width of the first electrode near the substrate.

16. The diode array of claim 14, wherein, with respect to a top down view, the first current blocking region is formed about an outer edge of the light emitting diode and an outer perimeter of the first current blocking region is equal to or less than 400 micrometers (µm).

17. A light emitting diode structure, comprising:
a stack of layers which at least having a first type semiconductor layer, a second type semiconductor layer, an light emitting layer interposed between the first type semiconductor layer and the second type semiconductor layer, a first electrode layer disposed on a surface of the first type semiconductor layer, a second electrode layer disposed on a surface of the second type semiconductor layer, and structural regions covering at least a portion of the first type semiconductor layer, the light emitting layer and the second type semiconductor layer;

wherein the structural regions include current blocking regions or current limiting regions;

wherein the first electrode layer and the second electrode layer are disposed at the same side of the first type semiconductor layer;

wherein a length of the light emitting diode structure not greater than 100 micrometers;

a light outputting surface, a bonding surface, and a side surface between the light outputting surface and the bonding surface;

wherein the structural regions cover the side surface and extend from the bonding surface to the light outputting surface;

wherein a first width of the first electrode layer near the bonding surface is wider than a second width of the first electrode layer near the first type semiconductor layer.

18. The light emitting diode structure of claim 17, wherein the first electrode layer and the second electrode layer are coplanar.

19. The light emitting diode structure of claim 17, wherein, at least portion surfaces of the bonding surface, the first electrode layer and/or the second electrode layer are coplanar.

20. The light emitting diode structure of claim 17, wherein a roughness of the bonding surface is not greater than 10 nanometers.

* * * * *